US008487480B1

(12) United States Patent
Kesler et al.

(10) Patent No.: US 8,487,480 B1
(45) Date of Patent: Jul. 16, 2013

(54) WIRELESS ENERGY TRANSFER RESONATOR KIT

(75) Inventors: Morris P. Kesler, Bedford, MA (US); Aristeidis Karalis, Boston, MA (US); Andre B. Kurs, Chestnut Hill, MA (US); Andrew J. Campanella, Waltham, MA (US); Ron Fiorello, Tewksbury, MA (US); Qiang Li, Malden, MA (US); Konrad J. Kulikowski, Somerville, MA (US); Eric R. Giler, Wellesley, MA (US); David A. Schatz, Needham, MA (US); Katherine L. Hall, Westford, MA (US); Marin Soljacic, Belmont, MA (US)

(73) Assignee: WiTricity Corporation, Watertown, MA (US)

( * ) Notice: Subject to any disclaimer, the term of this patent is extended or adjusted under 35 U.S.C. 154(b) by 715 days.

(21) Appl. No.: 12/639,718

(22) Filed: Dec. 16, 2009

Related U.S. Application Data

(63) Continuation-in-part of application No. 12/567,716, filed on Sep. 25, 2009, now Pat. No. 8,461,719.

(60) Provisional application No. 61/100,721, filed on Sep. 27, 2008, provisional application No. 61/108,743, filed on Oct. 27, 2008, provisional application No. 61/147,386, filed on Jan. 26, 2009, provisional application No. 61/152,086, filed on Feb. 12, 2009, provisional application No. 61/178,508, filed on May 15, 2009, provisional application No. 61/182,768, filed on Jun. 1, 2009, provisional application No. 61/121,159, filed on Dec. 9, 2008, provisional application No. 61/142,977, filed on Jan. 7, 2009, provisional application No. 61/142,885, filed on Jan. 6, 2009, provisional application No. 61/142,796, filed on Jan. 6, 2009, provisional application No. 61/142,889, filed on Jan. 6, 2009, provisional application No. 61/142,880, filed on Jan. 6, 2009, provisional application No. 61/142,818, filed on Jan. 6, 2009, provisional application No. 61/142,887, filed on Jan. 6, 2009, provisional application No. 61/156,764, filed on Mar. 2, 2009, provisional application No. 61/143,058, filed on Jan. 7, 2009, provisional application No. 61/152,390, filed on Feb. 13, 2009, provisional application No. 61/163,695, filed on Mar. 26, 2009, provisional application No. 61/172,633, filed on Apr. 24, 2009, provisional application No. 61/169,240, filed on Apr. 14, 2009, provisional application No. 61/173,747, filed on Apr. 29, 2009.

(51) Int. Cl.
*H01F 37/00* (2006.01)

(52) U.S. Cl.
USPC .......................................... 307/104

(58) Field of Classification Search
USPC .......................................... 307/104
See application file for complete search history.

(56) References Cited

U.S. PATENT DOCUMENTS

| | | | |
|---|---|---|---|
| 645,576 | A | 3/1900 | Telsa |
| 649,621 | A | 5/1900 | Tesla |
| 787,412 | A | 4/1905 | Tesla |
| 1,119,732 | A | 12/1914 | Tesla |
| 2,133,494 | A | 10/1938 | Waters |
| 3,517,350 | A | 6/1970 | Beaver |
| 3,535,543 | A | 10/1970 | Dailey |
| 3,780,425 | A | 12/1973 | Penn et al. |
| 3,871,176 | A | 3/1975 | Schukei |
| 4,088,999 | A | 5/1978 | Fletcher et al. |
| 4,095,998 | A | 6/1978 | Hanson |
| 4,280,129 | A | 7/1981 | Wells |
| 5,027,709 | A | 7/1991 | Slagle |
| 5,053,774 | A | 10/1991 | Schuermann et al. |
| 5,070,293 | A | 12/1991 | Ishii et al. |
| 5,118,997 | A | 6/1992 | El-hamamsy |
| 5,216,402 | A | 6/1993 | Carosa |
| 5,287,112 | A | 2/1994 | Schuermann |
| 5,341,083 | A | 8/1994 | Klontz et al. |
| 5,367,242 | A | 11/1994 | Hulman |
| 5,408,209 | A | 4/1995 | Tanzer et al. |

| | | |
|---|---|---|
| 5,437,057 A | 7/1995 | Richley et al. |
| 5,455,467 A | 10/1995 | Young et al. |
| 5,493,691 A | 2/1996 | Barrett |
| 5,522,856 A | 6/1996 | Reineman |
| 5,528,113 A | 6/1996 | Boys et al. |
| 5,550,452 A | 8/1996 | Shirai et al. |
| 5,565,763 A | 10/1996 | Arrendale et al. |
| 5,630,835 A | 5/1997 | Brownlee |
| 5,697,956 A | 12/1997 | Bornzin |
| 5,742,471 A | 4/1998 | Barbee, Jr. et al. |
| 5,821,731 A | 10/1998 | Kuki et al. |
| 5,898,579 A | 4/1999 | Boys et al. |
| 5,940,509 A | 8/1999 | Jovanovich et al. |
| 5,957,956 A | 9/1999 | Kroll et al. |
| 5,986,895 A | 11/1999 | Stewart et al. |
| 5,993,996 A | 11/1999 | Firsich |
| 5,999,308 A | 12/1999 | Nelson et al. |
| 6,012,659 A | 1/2000 | Nakazawa et al. |
| 6,066,163 A | 5/2000 | John |
| 6,067,473 A | 5/2000 | Greeninger et al. |
| 6,108,579 A | 8/2000 | Snell et al. |
| 6,127,799 A | 10/2000 | Krishnan |
| 6,184,651 B1 | 2/2001 | Fernandez et al. |
| 6,207,887 B1 | 3/2001 | Bass et al. |
| 6,252,762 B1 | 6/2001 | Amatucci |
| 6,436,299 B1 | 8/2002 | Baarman et al. |
| 6,450,946 B1 | 9/2002 | Forsell |
| 6,452,465 B1 | 9/2002 | Brown et al. |
| 6,483,202 B1 | 11/2002 | Bozs |
| 6,515,878 B1 | 2/2003 | Meins et al. |
| 6,535,133 B2 | 3/2003 | Gohara |
| 6,597,076 B2 | 7/2003 | Scheible et al. |
| 6,609,023 B1 | 8/2003 | Fischell et al. |
| 6,631,072 B1 | 10/2003 | Paul et al. |
| 6,664,770 B1 | 12/2003 | Bartels |
| 6,673,250 B2 | 1/2004 | Kuennen et al. |
| 6,731,071 B2 | 5/2004 | Baarman |
| 6,749,119 B2 | 6/2004 | Scheible et al. |
| 6,772,011 B2 | 8/2004 | Dolgin |
| 6,798,716 B1 | 9/2004 | Charych |
| 6,806,649 B2 | 10/2004 | Mollema et al. |
| 6,812,645 B2 | 11/2004 | Baarman |
| 6,825,620 B2 | 11/2004 | Kuennen et al. |
| 6,831,417 B2 | 12/2004 | Baarman |
| 6,844,702 B2 | 1/2005 | Giannopoulos et al. |
| 6,856,291 B2 | 2/2005 | Mickle et al. |
| 6,858,970 B2 | 2/2005 | Malkin et al. |
| 6,906,495 B2 | 6/2005 | Cheng et al. |
| 6,917,163 B2 | 7/2005 | Baarman |
| 6,917,431 B2 | 7/2005 | Soljacic et al. |
| 6,937,130 B2 | 8/2005 | Scheible et al. |
| 6,960,968 B2 | 11/2005 | Odendaal et al. |
| 6,961,619 B2 | 11/2005 | Casey |
| 6,967,462 B1 | 11/2005 | Landis |
| 6,975,198 B2 | 12/2005 | Baarman et al. |
| 7,027,311 B2 | 4/2006 | Vanderelli et al. |
| 7,035,076 B1 | 4/2006 | Stevenson |
| 7,042,196 B2 | 5/2006 | Ka-Lai et al. |
| 7,069,064 B2 | 6/2006 | Gevorgian et al. |
| 7,084,605 B2 | 8/2006 | Mickle et al. |
| 7,116,200 B2 | 10/2006 | Baarman et al. |
| 7,118,240 B2 | 10/2006 | Baarman et al. |
| 7,126,450 B2 | 10/2006 | Baarman et al. |
| 7,127,293 B2 | 10/2006 | MacDonald |
| 7,132,918 B2 | 11/2006 | Baarman et al. |
| 7,147,604 B1 | 12/2006 | Allen et al. |
| 7,180,248 B2 | 2/2007 | Kuennen et al. |
| 7,191,007 B2 | 3/2007 | Desai et al. |
| 7,212,414 B2 | 5/2007 | Baarman |
| 7,233,137 B2 | 6/2007 | Nakamura et al. |
| 7,239,110 B2 | 7/2007 | Cheng et al. |
| 7,248,017 B2 | 7/2007 | Cheng et al. |
| 7,251,527 B2 | 7/2007 | Lyden |
| 7,288,918 B2 | 10/2007 | DiStefano |
| 7,340,304 B2 | 3/2008 | MacDonald |
| 7,375,492 B2 | 5/2008 | Calhoon et al. |
| 7,375,493 B2 | 5/2008 | Calhoon et al. |
| 7,378,817 B2 | 5/2008 | Calhoon et al. |
| 7,382,636 B2 | 6/2008 | Baarman et al. |
| 7,385,357 B2 | 6/2008 | Kuennen et al. |
| 7,462,951 B1 | 12/2008 | Baarman |
| 7,466,213 B2 | 12/2008 | Löbl et al. |
| 7,474,058 B2 | 1/2009 | Baarman |
| 7,492,247 B2 | 2/2009 | Schmidt et al. |
| 7,514,818 B2 * | 4/2009 | Abe et al. .................. 307/104 |
| 7,518,267 B2 | 4/2009 | Baarman |
| 7,525,283 B2 | 4/2009 | Cheng et al. |
| 7,599,743 B2 | 10/2009 | Hassler, Jr. et al. |
| 7,615,936 B2 | 11/2009 | Baarman et al. |
| 7,639,514 B2 | 12/2009 | Baarman |
| 7,741,734 B2 | 6/2010 | Joannopoulos et al. |
| 7,795,708 B2 | 9/2010 | Katti |
| 7,825,543 B2 | 11/2010 | Karalis et al. |
| 7,843,288 B2 | 11/2010 | Lee et al. |
| 7,863,859 B2 | 1/2011 | Soar |
| 7,885,050 B2 | 2/2011 | Lee |
| 7,919,886 B2 * | 4/2011 | Tanaka ...................... 307/104 |
| 7,999,506 B1 | 8/2011 | Hollar et al. |
| 8,022,576 B2 | 9/2011 | Joannopoulos et al. |
| 8,035,255 B2 | 10/2011 | Kurs et al. |
| 8,076,800 B2 | 12/2011 | Joannopoulos et al. |
| 8,076,801 B2 | 12/2011 | Karalis et al. |
| 8,084,889 B2 | 12/2011 | Joannopoulos et al. |
| 8,097,983 B2 | 1/2012 | Karalis et al. |
| 8,106,539 B2 | 1/2012 | Schatz et al. |
| 8,115,448 B2 | 2/2012 | John |
| 2002/0032471 A1 | 3/2002 | Loftin et al. |
| 2002/0105343 A1 | 8/2002 | Scheible et al. |
| 2002/0118004 A1 | 8/2002 | Scheible et al. |
| 2002/0130642 A1 | 9/2002 | Ettes et al. |
| 2002/0167294 A1 | 11/2002 | Odaohhara |
| 2003/0038641 A1 | 2/2003 | Scheible |
| 2003/0062794 A1 | 4/2003 | Scheible et al. |
| 2003/0062980 A1 | 4/2003 | Scheible et al. |
| 2003/0124050 A1 | 7/2003 | Yadav et al. |
| 2003/0126948 A1 | 7/2003 | Yadav et al. |
| 2003/0199778 A1 | 10/2003 | Mickle et al. |
| 2003/0214255 A1 | 11/2003 | Baarman et al. |
| 2004/0000974 A1 | 1/2004 | Odenaal et al. |
| 2004/0100338 A1 | 5/2004 | Clark |
| 2004/0113847 A1 | 6/2004 | Qi et al. |
| 2004/0130915 A1 | 7/2004 | Baarman |
| 2004/0130916 A1 | 7/2004 | Baarman |
| 2004/0142733 A1 | 7/2004 | Parise |
| 2004/0150934 A1 | 8/2004 | Baarman |
| 2004/0189246 A1 | 9/2004 | Bulai et al. |
| 2004/0201361 A1 | 10/2004 | Koh et al. |
| 2004/0222751 A1 | 11/2004 | Mollema et al. |
| 2004/0227057 A1 | 11/2004 | Tuominen et al. |
| 2004/0232845 A1 | 11/2004 | Baarman |
| 2004/0233043 A1 | 11/2004 | Yazawa et al. |
| 2004/0267501 A1 | 12/2004 | Freed et al. |
| 2005/0007067 A1 | 1/2005 | Baarman et al. |
| 2005/0021134 A1 | 1/2005 | Opie |
| 2005/0033382 A1 | 2/2005 | Single |
| 2005/0085873 A1 | 4/2005 | Gord et al. |
| 2005/0093475 A1 | 5/2005 | Kuennen et al. |
| 2005/0104064 A1 | 5/2005 | Hegarty et al. |
| 2005/0104453 A1 | 5/2005 | Vanderelli et al. |
| 2005/0116650 A1 | 6/2005 | Baarman |
| 2005/0122058 A1 | 6/2005 | Baarman et al. |
| 2005/0122059 A1 | 6/2005 | Baarman et al. |
| 2005/0127849 A1 | 6/2005 | Baarman et al. |
| 2005/0127850 A1 | 6/2005 | Baarman et al. |
| 2005/0127866 A1 | 6/2005 | Hamilton et al. |
| 2005/0140482 A1 | 6/2005 | Cheng et al. |
| 2005/0156560 A1 | 7/2005 | Shimaoka et al. |
| 2005/0194926 A1 | 9/2005 | DiStefano |
| 2005/0253152 A1 | 11/2005 | Klimov et al. |
| 2005/0288739 A1 | 12/2005 | Hassler, Jr. et al. |
| 2005/0288740 A1 | 12/2005 | Hassler, Jr. |
| 2005/0288742 A1 | 12/2005 | Giordano et al. |
| 2006/0022636 A1 | 2/2006 | Xian et al. |
| 2006/0061323 A1 | 3/2006 | Cheng et al. |
| 2006/0066443 A1 | 3/2006 | Hall |
| 2006/0132045 A1 | 6/2006 | Baarman |
| 2006/0164866 A1 | 7/2006 | Vanderelli et al. |
| 2006/0181242 A1 | 8/2006 | Freed et al. |

| | | | | | | |
|---|---|---|---|---|---|---|
| 2006/0184209 A1 | 8/2006 | John et al. | | 2009/0237194 A1 | 9/2009 | Waffenschmidt et al. |
| 2006/0184210 A1 | 8/2006 | Singhal et al. | | 2009/0243394 A1 | 10/2009 | Levine |
| 2006/0185809 A1 | 8/2006 | Elfrink et al. | | 2009/0243397 A1 | 10/2009 | Cook et al. |
| 2006/0199620 A1 | 9/2006 | Greene et al. | | 2009/0251008 A1 | 10/2009 | Sugaya |
| 2006/0202665 A1 | 9/2006 | Hsu | | 2009/0261778 A1 | 10/2009 | Kook |
| 2006/0205381 A1 | 9/2006 | Beart et al. | | 2009/0267558 A1 | 10/2009 | Jung |
| 2006/0214626 A1 | 9/2006 | Nilson et al. | | 2009/0267709 A1 | 10/2009 | Joannopoulos et al. |
| 2006/0238365 A1 | 10/2006 | Vecchione et al. | | 2009/0267710 A1 | 10/2009 | Joannopoulos et al. |
| 2006/0270440 A1 | 11/2006 | Shearer et al. | | 2009/0271047 A1 | 10/2009 | Wakamatsu |
| 2006/0281435 A1 | 12/2006 | Shearer et al. | | 2009/0271048 A1 | 10/2009 | Wakamatsu |
| 2007/0010295 A1 | 1/2007 | Greene et al. | | 2009/0273242 A1 | 11/2009 | Cook |
| 2007/0013483 A1 | 1/2007 | Stewart | | 2009/0281678 A1 | 11/2009 | Wakamatsu |
| 2007/0016089 A1 | 1/2007 | Fischell et al. | | 2009/0284082 A1 | 11/2009 | Mohammadian |
| 2007/0021140 A1 | 1/2007 | Keyes, IV et al. | | 2009/0284083 A1 | 11/2009 | Karalis |
| 2007/0024246 A1 | 2/2007 | Flaugher | | 2009/0284218 A1 | 11/2009 | Mohammadian et al. |
| 2007/0064406 A1 | 3/2007 | Beart | | 2009/0284220 A1 | 11/2009 | Toncich et al. |
| 2007/0069687 A1 | 3/2007 | Suzuki | | 2009/0284227 A1 | 11/2009 | Mohammadian et al. |
| 2007/0096875 A1 | 5/2007 | Waterhouse et al. | | 2009/0284245 A1 | 11/2009 | Kirby et al. |
| 2007/0117596 A1 | 5/2007 | Greene et al. | | 2009/0284369 A1 | 11/2009 | Toncich et al. |
| 2007/0145830 A1 | 6/2007 | Lee et al. | | 2009/0286470 A1 | 11/2009 | Mohammadian et al. |
| 2007/0171681 A1 | 7/2007 | Baarman | | 2009/0286475 A1 | 11/2009 | Toncich et al. |
| 2007/0176840 A1 | 8/2007 | Pristas et al. | | 2009/0286476 A1 | 11/2009 | Toncich et al. |
| 2007/0178945 A1 | 8/2007 | Cook et al. | | 2009/0289595 A1 | 11/2009 | Chen et al. |
| 2007/0182367 A1 | 8/2007 | Partovi | | 2009/0299918 A1 | 12/2009 | Cook et al. |
| 2007/0208263 A1 | 9/2007 | John et al. | | 2010/0017249 A1 | 1/2010 | Fincham et al. |
| 2007/0222542 A1 | 9/2007 | Joannopoulos et al. | | 2010/0033021 A1 | 2/2010 | Bennett |
| 2007/0267918 A1 | 11/2007 | Gyland | | 2010/0034238 A1 | 2/2010 | Bennett |
| 2007/0276538 A1 | 11/2007 | Kjellsson et al. | | 2010/0036773 A1 | 2/2010 | Bennett |
| 2008/0012569 A1 | 1/2008 | Hall et al. | | 2010/0038970 A1 | 2/2010 | Cook et al. |
| 2008/0014897 A1 | 1/2008 | Cook et al. | | 2010/0045114 A1 | 2/2010 | Sample |
| 2008/0030415 A1 | 2/2008 | Homan et al. | | 2010/0052431 A1 | 3/2010 | Mita |
| 2008/0036588 A1 | 2/2008 | Iverson et al. | | 2010/0052811 A1 | 3/2010 | Smith et al. |
| 2008/0067874 A1 | 3/2008 | Tseng | | 2010/0060077 A1 | 3/2010 | Paulus et al. |
| 2008/0154331 A1 | 6/2008 | John et al. | | 2010/0065352 A1 | 3/2010 | Ichikawa |
| 2008/0191638 A1 | 8/2008 | Kuennen et al. | | 2010/0066349 A1 | 3/2010 | Lin et al. |
| 2008/0197710 A1 | 8/2008 | Kreitz et al. | | 2010/0081379 A1 | 4/2010 | Cooper et al. |
| 2008/0211320 A1 | 9/2008 | Cook et al. | | 2010/0094381 A1 | 4/2010 | Kim et al. |
| 2008/0265684 A1 | 10/2008 | Farkas | | 2010/0096934 A1 | 4/2010 | Joannopoulos |
| 2008/0266748 A1 | 10/2008 | Lee | | 2010/0102639 A1 | 4/2010 | Joannopoulos |
| 2008/0273242 A1 | 11/2008 | Woodgate et al. | | 2010/0102640 A1 | 4/2010 | Joannopoulos |
| 2008/0278264 A1 | 11/2008 | Karalis et al. | | 2010/0102641 A1 | 4/2010 | Joannopoulos |
| 2008/0300657 A1 | 12/2008 | Stultz | | 2010/0109443 A1 | 5/2010 | Cook et al. |
| 2008/0300660 A1 | 12/2008 | John | | 2010/0109445 A1 | 5/2010 | Kurs et al. |
| 2009/0010028 A1 | 1/2009 | Baarman et al. | | 2010/0109604 A1 | 5/2010 | Boys |
| 2009/0015075 A1 | 1/2009 | Cook et al. | | 2010/0115474 A1 | 5/2010 | Takada et al. |
| 2009/0033564 A1 | 2/2009 | Cook et al. | | 2010/0117454 A1 | 5/2010 | Cook et al. |
| 2009/0045772 A1 | 2/2009 | Cook et al. | | 2010/0117455 A1 | 5/2010 | Joannopoulos |
| 2009/0051224 A1 | 2/2009 | Cook et al. | | 2010/0117456 A1 | 5/2010 | Karalis |
| 2009/0058189 A1 | 3/2009 | Cook et al. | | 2010/0117596 A1 | 5/2010 | Cook et al. |
| 2009/0058361 A1 | 3/2009 | John | | 2010/0123353 A1 | 5/2010 | Joannopoulos |
| 2009/0067198 A1 | 3/2009 | Graham et al. | | 2010/0123354 A1 | 5/2010 | Joannopoulos |
| 2009/0072627 A1 | 3/2009 | Cook et al. | | 2010/0123355 A1 | 5/2010 | Joannopoulos |
| 2009/0072628 A1 | 3/2009 | Cook et al. | | 2010/0123452 A1 | 5/2010 | Amano et al. |
| 2009/0072629 A1 | 3/2009 | Cook et al. | | 2010/0123530 A1 | 5/2010 | Park et al. |
| 2009/0072782 A1 | 3/2009 | Randall | | 2010/0127573 A1 | 5/2010 | Joannopoulos |
| 2009/0079268 A1 | 3/2009 | Cook et al. | | 2010/0127574 A1 | 5/2010 | Joannopoulos |
| 2009/0085408 A1 | 4/2009 | Bruhn et al. | | 2010/0127575 A1 | 5/2010 | Joannopoulos |
| 2009/0085706 A1 | 4/2009 | Baarman et al. | | 2010/0127660 A1 | 5/2010 | Cook et al. |
| 2009/0096413 A1 | 4/2009 | Partovi et al. | | 2010/0133918 A1 | 6/2010 | Joannopoulos |
| 2009/0102292 A1 | 4/2009 | Cook et al. | | 2010/0133919 A1 | 6/2010 | Joannopoulos |
| 2009/0108679 A1 | 4/2009 | Porwal | | 2010/0133920 A1 | 6/2010 | Joannopoulos |
| 2009/0108997 A1 | 4/2009 | Petterson et al. | | 2010/0141042 A1 | 6/2010 | Kesler et al. |
| 2009/0127937 A1 | 5/2009 | Widmer et al. | | 2010/0148589 A1 | 6/2010 | Hamam |
| 2009/0134712 A1 | 5/2009 | Cook et al. | | 2010/0148723 A1 | 6/2010 | Cook et al. |
| 2009/0146892 A1 | 6/2009 | Shimizu et al. | | 2010/0151808 A1 | 6/2010 | Toncich et al. |
| 2009/0153273 A1 | 6/2009 | Chen et al. | | 2010/0156346 A1 | 6/2010 | Takada et al. |
| 2009/0160261 A1 | 6/2009 | Elo | | 2010/0156355 A1 | 6/2010 | Bauerle et al. |
| 2009/0167449 A1 | 7/2009 | Cook et al. | | 2010/0156570 A1 | 6/2010 | Hong et al. |
| 2009/0174263 A1 | 7/2009 | Baarman et al. | | 2010/0164295 A1 | 7/2010 | Ichikawa et al. |
| 2009/0179502 A1 | 7/2009 | Cook et al. | | 2010/0164296 A1 | 7/2010 | Kurs et al. |
| 2009/0189458 A1 | 7/2009 | Kawasaki | | 2010/0164297 A1 | 7/2010 | Kurs et al. |
| 2009/0195332 A1 | 8/2009 | Joannopoulos et al. | | 2010/0164298 A1 | 7/2010 | Karalis et al. |
| 2009/0195333 A1 | 8/2009 | Joannopoulos et al. | | 2010/0171368 A1 | 7/2010 | Schatz et al. |
| 2009/0212636 A1 | 8/2009 | Cook et al. | | 2010/0171370 A1 | 7/2010 | Karalis et al. |
| 2009/0213028 A1 | 8/2009 | Cook et al. | | 2010/0181843 A1 | 7/2010 | Schatz et al. |
| 2009/0224608 A1 | 9/2009 | Cook et al. | | 2010/0181844 A1 | 7/2010 | Karalis et al. |
| 2009/0224609 A1 | 9/2009 | Cook et al. | | 2010/0181845 A1 | 7/2010 | Fiorello et al. |
| 2009/0224856 A1 | 9/2009 | Karalis | | 2010/0181961 A1 | 7/2010 | Von Novak et al. |
| 2009/0230777 A1 | 9/2009 | Baarman et al. | | 2010/0184371 A1 | 7/2010 | Cook et al. |

| | | |
|---|---|---|
| 2010/0187911 A1 | 7/2010 | Joannopoulos |
| 2010/0187913 A1 | 7/2010 | Smith et al. |
| 2010/0190435 A1 | 7/2010 | Cook et al. |
| 2010/0190436 A1 | 7/2010 | Cook et al. |
| 2010/0194206 A1 | 8/2010 | Burdo et al. |
| 2010/0194207 A1 | 8/2010 | Graham |
| 2010/0194334 A1 | 8/2010 | Kirby et al. |
| 2010/0194335 A1 | 8/2010 | Kirby et al. |
| 2010/0201189 A1 | 8/2010 | Kirby et al. |
| 2010/0201201 A1 | 8/2010 | Mobarhan et al. |
| 2010/0201202 A1 | 8/2010 | Kirby et al. |
| 2010/0201203 A1 | 8/2010 | Schatz et al. |
| 2010/0201204 A1 | 8/2010 | Sakoda et al. |
| 2010/0201205 A1 | 8/2010 | Karalis et al. |
| 2010/0201310 A1 | 8/2010 | Vorenkamp et al. |
| 2010/0201313 A1 | 8/2010 | Vorenkamp et al. |
| 2010/0201316 A1 | 8/2010 | Takada et al. |
| 2010/0201513 A1 | 8/2010 | Vorenkamp et al. |
| 2010/0207458 A1 | 8/2010 | Joannopoulos et al. |
| 2010/0210233 A1 | 8/2010 | Cook et al. |
| 2010/0213770 A1 | 8/2010 | Kikuchi |
| 2010/0213895 A1 | 8/2010 | Keating et al. |
| 2010/0217553 A1 | 8/2010 | Von Novak et al. |
| 2010/0219694 A1 | 9/2010 | Kurs |
| 2010/0219695 A1 | 9/2010 | Komiyama et al. |
| 2010/0219696 A1 | 9/2010 | Kojima |
| 2010/0222010 A1 | 9/2010 | Ozaki et al. |
| 2010/0225175 A1 | 9/2010 | Karalis et al. |
| 2010/0225270 A1 | 9/2010 | Jacobs et al. |
| 2010/0225271 A1 | 9/2010 | Oyobe et al. |
| 2010/0225272 A1 | 9/2010 | Kirby et al. |
| 2010/0231053 A1 | 9/2010 | Karalis et al. |
| 2010/0231163 A1 | 9/2010 | Mashinsky |
| 2010/0231340 A1 | 9/2010 | Fiorello |
| 2010/0235006 A1 | 9/2010 | Brown |
| 2010/0237706 A1 | 9/2010 | Karalis |
| 2010/0237707 A1 | 9/2010 | Karalis |
| 2010/0237708 A1 | 9/2010 | Karalis et al. |
| 2010/0237709 A1 | 9/2010 | Hall et al. |
| 2010/0244576 A1 | 9/2010 | Hillan et al. |
| 2010/0244577 A1 | 9/2010 | Shimokawa |
| 2010/0244578 A1 | 9/2010 | Yoshikawa |
| 2010/0244579 A1 | 9/2010 | Sogabe et al. |
| 2010/0244580 A1 | 9/2010 | Uchida et al. |
| 2010/0244581 A1 | 9/2010 | Uchida |
| 2010/0244582 A1 | 9/2010 | Yoshikawa |
| 2010/0244583 A1 | 9/2010 | Shimokawa |
| 2010/0244839 A1 | 9/2010 | Yoshikawa |
| 2010/0248622 A1 | 9/2010 | Lyell Kirby et al. |
| 2010/0253152 A1 | 10/2010 | Karalis et al. |
| 2010/0253281 A1 | 10/2010 | Li |
| 2010/0256831 A1 | 10/2010 | Abramo et al. |
| 2010/0259108 A1 | 10/2010 | Giler et al. |
| 2010/0259109 A1 | 10/2010 | Sato |
| 2010/0259110 A1 | 10/2010 | Kurs et al. |
| 2010/0264745 A1 | 10/2010 | Karalis et al. |
| 2010/0264746 A1 | 10/2010 | Kazama et al. |
| 2010/0264747 A1 | 10/2010 | Hall et al. |
| 2010/0276995 A1 | 11/2010 | Marzetta et al. |
| 2010/0277003 A1 | 11/2010 | Von Novak et al. |
| 2010/0277004 A1 | 11/2010 | Suzuki et al. |
| 2010/0277005 A1 | 11/2010 | Karalis et al. |
| 2010/0277120 A1 | 11/2010 | Cook et al. |
| 2010/0277121 A1 | 11/2010 | Hall et al. |
| 2010/0289341 A1 | 11/2010 | Ozaki et al. |
| 2010/0289449 A1 | 11/2010 | Elo |
| 2010/0295505 A1 | 11/2010 | Jung et al. |
| 2010/0295506 A1 | 11/2010 | Ichikawa |
| 2010/0308939 A1 | 12/2010 | Kurs |
| 2010/0327660 A1 | 12/2010 | Karalis et al. |
| 2010/0327661 A1 | 12/2010 | Karalis et al. |
| 2011/0004269 A1 | 1/2011 | Strother et al. |
| 2011/0012431 A1 | 1/2011 | Karalis et al. |
| 2011/0018361 A1 | 1/2011 | Karalis et al. |
| 2011/0025131 A1 | 2/2011 | Karalis et al. |
| 2011/0043046 A1 | 2/2011 | Joannopoulos et al. |
| 2011/0043047 A1 | 2/2011 | Karalis et al. |
| 2011/0043048 A1 | 2/2011 | Karalis et al. |
| 2011/0043049 A1 | 2/2011 | Karalis et al. |
| 2011/0049996 A1 | 3/2011 | Karalis et al. |
| 2011/0049998 A1 | 3/2011 | Karalis et al. |
| 2011/0074218 A1 | 3/2011 | Karalis et al. |
| 2011/0074346 A1 | 3/2011 | Hall et al. |
| 2011/0074347 A1 | 3/2011 | Karalis et al. |
| 2011/0089895 A1 | 4/2011 | Karalis et al. |
| 2011/0095618 A1 | 4/2011 | Schatz et al. |
| 2011/0115303 A1 | 5/2011 | Baarman et al. |
| 2011/0121920 A1 | 5/2011 | Kurs et al. |
| 2011/0140544 A1 | 6/2011 | Karalis et al. |
| 2011/0148219 A1 | 6/2011 | Karalis et al. |
| 2011/0162895 A1 | 7/2011 | Karalis et al. |
| 2011/0169339 A1 | 7/2011 | Karalis et al. |
| 2011/0181122 A1 | 7/2011 | Karalis et al. |
| 2011/0193416 A1 | 8/2011 | Campanella et al. |
| 2011/0193419 A1 | 8/2011 | Karalis et al. |
| 2011/0198939 A1 | 8/2011 | Karalis et al. |
| 2011/0221278 A1 | 9/2011 | Karalis et al. |
| 2011/0227528 A1 | 9/2011 | Karalis et al. |
| 2011/0227530 A1 | 9/2011 | Karalis et al. |
| 2011/0241618 A1 | 10/2011 | Karalis et al. |
| 2011/0254377 A1 | 10/2011 | Wildmer et al. |
| 2011/0254503 A1 | 10/2011 | Widmer et al. |
| 2012/0001492 A9 | 1/2012 | Cook et al. |
| 2012/0007441 A1 | 1/2012 | John |
| 2012/0032522 A1 | 2/2012 | Schatz et al. |
| 2012/0062345 A1 | 3/2012 | Kurs et al. |
| 2012/0068549 A1 | 3/2012 | Karalis et al. |
| 2012/0086284 A1 | 4/2012 | Capanella et al. |
| 2012/0086867 A1 | 4/2012 | Kesler et al. |
| 2012/0091794 A1 | 4/2012 | Campanella et al. |
| 2012/0091795 A1 | 4/2012 | Fiorello et al. |
| 2012/0091796 A1 | 4/2012 | Kesler et al. |
| 2012/0091797 A1 | 4/2012 | Kesler et al. |
| 2012/0091819 A1 | 4/2012 | Kulikowski et al. |
| 2012/0091820 A1 | 4/2012 | Campanella et al. |
| 2012/0091949 A1 | 4/2012 | Campanella et al. |
| 2012/0091950 A1 | 4/2012 | Campanella et al. |
| 2012/0098350 A1 | 4/2012 | Campanella et al. |
| 2012/0112531 A1 | 5/2012 | Kesler et al. |
| 2012/0112532 A1 | 5/2012 | Kesler et al. |
| 2012/0112534 A1 | 5/2012 | Kesler et al. |
| 2012/0112535 A1 | 5/2012 | Karalis et al. |
| 2012/0112536 A1 | 5/2012 | Karalis et al. |
| 2012/0112538 A1 | 5/2012 | Kesler et al. |
| 2012/0112691 A1 | 5/2012 | Kurs et al. |
| 2012/0119569 A1 | 5/2012 | Karalis et al. |
| 2012/0119575 A1 | 5/2012 | Kurs et al. |
| 2012/0119576 A1 | 5/2012 | Kesler et al. |
| 2012/0119698 A1 | 5/2012 | Karalis et al. |
| 2012/0139355 A1 | 6/2012 | Ganem et al. |
| 2012/0153732 A1 | 6/2012 | Kurs et al. |
| 2012/0153733 A1 | 6/2012 | Schatz et al. |
| 2012/0153734 A1 | 6/2012 | Kurs et al. |
| 2012/0153735 A1 | 6/2012 | Karalis et al. |
| 2012/0153736 A1 | 6/2012 | Karalis et al. |
| 2012/0153737 A1 | 6/2012 | Karalis et al. |
| 2012/0153738 A1 | 6/2012 | Karalis et al. |
| 2012/0153893 A1 | 6/2012 | Schatz et al. |
| 2012/0184338 A1 | 7/2012 | Kesler et al. |
| 2012/0206096 A1 | 8/2012 | John |
| 2012/0223573 A1 | 9/2012 | Schatz et al. |

FOREIGN PATENT DOCUMENTS

| | | |
|---|---|---|
| CA | 142352 | 8/1912 |
| CN | 102239633 A | 11/2011 |
| DE | 3824972 | 1/1989 |
| DE | 10029147 | 12/2001 |
| DE | 10304584 | 8/2004 |
| DE | 102005036290 | 2/2007 |
| DE | 102006044057 | 4/2008 |
| EP | 1335477 | 8/2003 |
| EP | 2340611 A1 | 7/2011 |
| EP | 2396796 A1 | 12/2011 |
| IN | 1734/KOLNP/2011 | 9/2011 |
| JP | 02097005 A | 4/1990 |
| JP | 11188113 A | 7/1999 |
| JP | 2012504387 A | 2/2012 |
| WO | WO-92/17929 | 10/1992 |

| | | |
|---|---|---|
| WO | WO-92/17929 | 10/1993 |
| WO | WO-93/23908 | 11/1993 |
| WO | WO-94/28560 | 12/1994 |
| WO | WO-96/02970 | 2/1996 |
| WO | WO-98/50993 | 11/1998 |
| WO | WO-00/77910 | 12/2000 |
| WO | WO-03/092329 | 11/2003 |
| WO | WO 03/092329 | 11/2003 |
| WO | WO-03/096361 | 11/2003 |
| WO | WO-03/096512 | 11/2003 |
| WO | WO-2004/038888 | 5/2004 |
| WO | WO-2004/055654 | 7/2004 |
| WO | WO-2004/073150 | 8/2004 |
| WO | WO-2004/073166 | 8/2004 |
| WO | WO-2004/073176 | 8/2004 |
| WO | WO-2004/073177 | 8/2004 |
| WO | WO-2004/112216 | 12/2004 |
| WO | WO-2005/024865 | 3/2005 |
| WO | WO-2005/060068 | 6/2005 |
| WO | WO-2005/109597 | 11/2005 |
| WO | WO-2005/109598 | 11/2005 |
| WO | 2006011769 A1 | 2/2006 |
| WO | WO-2007/008646 A2 | 1/2007 |
| WO | WO A2 WO-2007/008646 | 1/2007 |
| WO | WO-2007/020583 | 2/2007 |
| WO | WO-2007/042952 | 4/2007 |
| WO | WO-2007/084716 | 7/2007 |
| WO | WO-2007/084717 | 7/2007 |
| WO | WO-2008/109489 | 9/2008 |
| WO | WO-2008/118178 | 10/2008 |
| WO | WO-2009/009559 | 1/2009 |
| WO | WO-2009/018568 | 2/2009 |
| WO | WO-2009/023155 | 2/2009 |
| WO | WO-2009/023646 | 2/2009 |
| WO | WO-2009/033043 | 3/2009 |
| WO | WO-2009/070730 | 6/2009 |
| WO | WO-2009/126963 | 10/2009 |
| WO | WO-2009/140506 | 11/2009 |
| WO | WO-2009/149464 | 12/2009 |
| WO | WO-2009/155000 | 12/2009 |
| WO | WO-2010/030977 | 3/2010 |
| WO | WO-2010/039967 | 4/2010 |
| WO | WO-2010036980 A1 | 4/2010 |
| WO | WO-2010/090538 | 8/2010 |
| WO | WO-2010/090539 | 8/2010 |
| WO | WO-2010/093997 | 8/2010 |
| WO | 2011062827 A2 | 5/2011 |
| WO | 2011112795 A1 | 9/2011 |
| WO | 2012037279 A1 | 3/2012 |

OTHER PUBLICATIONS

U.S. Appl. No. 12/466,065, filed Nov. 19, 2009, Karalis, Aristeidis et al.
U.S. Appl. No. 12/553,957, filed Apr. 29, 2010, Joannopoulos, John D., et al.
U.S. Appl. No. 12/571,949, filed Jun. 17, 2010, Hamam, Rafif E., et al.
U.S. Appl. No. 12/639,958, filed Aug. 19, 2010, Joannopoulos, John D.
U.S. Appl. No. 12/639,961, filed May 27, 2010, Joannopoulos, John D.
U.S. Appl. No. 12/639,962, filed May 27, 2010, Joannopoulos, John D.
U.S. Appl. No. 12/639,963, filed May 27, 2010, Joannopoulos, John D.
U.S. Appl. No. 12/639,966, filed May 20, 2010, Joannopoulos, John D.
U.S. Appl. No. 12/639,967, filed May 20, 2010, Joannopoulos, John D.
U.S. Appl. No. 12/639,972, filed May 20, 2010, Joannopoulos, John D.
U.S. Appl. No. 12/646,442, filed Apr. 22, 2010, Joannopoulos, John D.
U.S. Appl. No. 12/646,524.
U.S. Appl. No. 12/649,635, filed Apr. 29, 2010, Joannopoulos, John D.
U.S. Appl. No. 12/649,777, filed Jun. 3, 2010, Joannopoulos, John D.
U.S. Appl. No. 12/649,813, filed Jun. 3, 2010, Joannopoulos, John D.
U.S. Appl. No. 12/649,852, filed Jun. 3, 2010, Joannopoulos, John D.
U.S. Appl. No. 12/649,904, filed Jul. 29, 2010, Joannopoulos, John D.
U.S. Appl. No. 12/649,973, filed Apr. 29, 2010, Joannopoulos, John D.
U.S. Appl. No. 12/688,305, filed May 13, 2010, Joannopoulos, John D.
U.S. Appl. No. 12/688,339, filed May 13, 2010, Karalis, Aristeidis.
U.S. Appl. No. 12/708,850, filed Sep. 23, 2010, Karalis, Aristeidis.
U.S. Appl. No. 12/713,556, filed Sep. 23, 2010, Karalis, Aristeidis.
U.S. Appl. No. 12/717,559, filed Oct. 7, 2010, Karalis, Aristeidis.
""HF Antenna Design Notes—Technical Application Report"", *Texas Instruments Literature No. 11/08/003* Sep. 2003 , 47 pages.
""In pictures: A year in technology"", *BBC News* Dec. 28, 2007.
""Intel CTO Says Gap between Humans, Machines Wll Close by 2050"", *Intel News Release* (see intel.com/.../20080821comp.htm?iid-S . . . ) Printed Nov. 6, 2009.
"microID 13.56 MHz Design Guide—MCRF355/360 Reader Reference Design", *Microchip Technology, Inc.* 2001 , 24 pages.
""Physics Update, Unwired Energy"", *Physics Today*, (see http://arxiv.org/abs/physics/0611063) Jan. 2007 , 26.
""Recharging gadgets without cables"", *Infotech Online* Printed from infortech.indiatimes.com Nov. 17, 2006.
"Scientists light bulb with 'wireless electricity'", www.chinaview.cn (see http://news.xinhuanet.com/english/2007-06/08/content_6215681.htm) Jun. 2007.
""The Big Story for CES 2007: The public debut of eCoupled Intelligent Wireless Power"", *Press Release Fulton Innovation LLC* Las Vegas, NV Dec. 27, 2006.
""The world's first sheet-type wireless power transmission system: Will a socket be replaced by e-wall?"", *Press Release*, Tokyo, Japan Dec. 12, 2006.
"Tutorial overview of inductively coupled RFID systems", *UPM Rafsec* May 2003 , 7 pages.
""Unwired energy questions asked, answered"", *Physics Today* Sep. 2007 , 16-17.
""White Paper"", *Pwercast LLC Pwercast simply wire free* 2003.
""Wireless Energy Transfer Can Potentially Recharge Laptops, Cell Phones Without Cords"", Soljacic, Marin : *Massachusetts Institute of Technology* and Castelvecchi : *American Institue of Physics* Nov. 14, 2006.
""Wireless power transfer possible"", *PressTV* (See http://www.presstv.ir/detail.aspx?id-12754§ionid-3510208) Jun. 11, 2007.
""Wirelss Energy Transfer May Power Devices at a Distance"", ScientificAmerican.com Nov. 14, 2006.
"Australian Application No. 2006069374—Examination Report", Sep. 18, 2008.
"Electricity Unplugged, Feature Wireless Energy", *Physics World* Feb. 2009 , 23-25.
"European Examination Report", Application No. 06 786 588.1-1242 Jan. 15, 2009, all.
"International Application Serial No. PCT/US09/58499, Search Report and Written Opinion mailed Dec. 10, 2009".
"International Search Report & WO for PCT/US09/43970", Jul. 17, 2009 , all.
"International Search Report & WO for PCTUS0959244", Dec. 7, 2009 , 1-12.
"ISR and WO for Int'l Appl. No. PCT/US2006/026480", Dec. 21, 2007.
"ISR and WO for Int'l Appl. No. PCT/US2007/070892", Mar. 3, 2008.
"ISR on Patentability for Int'l Appl. No. PCT/US2006/026480", Jan. 29, 2008.
"PCT/US2007/070892—Int'l Prelim Report on Patentability", Oct. 8, 2009.
U.S. Appl. No. 60/908,383, filed Mar. 27, 2007.
Abe, et al., ""A noncontact Charger Using a Resonant Converter with Parallel Capacitor of the Secondary Coil"", *IEEE* 36(2) Mar./Apr. 2000 , 444-451.

Altech, et al., ""Efficient Resonant Inductive Coupling Energy Transfer Using New Magnetic and Design Criteria"", *IEEE* 2005, 1293-1298.

Aoki, T. et al., ""Observation of strong coupling between one atom and a monolithic microresonator"", *Nature 443* 2006, 671-674.

Apneseth, et al., ""Introducing wireless proximity switches"", *ABB Review* Apr. 2002.

Baker, et al., ""Feedback Analysis and Design of RF Power Linksw for Low-Power Bionic Systems"", *IEEE Transactions on Biomedical Circuits and Systems* 1(1):28-38 Mar. 2007.

Balanis, C A., ""Antenna Theory: Analysis and Design"", 3rd Edition Sections 4.2, 4.3, 5.2, 5.3 Wiley, New Jersey, 2005.

Berardelli, Phil, ""Outlets Are Out"", *ScienceNOW Daily News, Science Now* (See http://sciencenow.sciencemag.org/cgi/content/full/2006/1114/2) Nov. 14, 2006.

Biever, Celeste, """Evanescent coupling' could power gadgets wirelessly"", NewScientistsTech.com (see http://newscientisttech.com/article.ns?id=dn575&print=true) Nov. 15, 2006.

Borenstein, Seth, ""Man tries wirelessly boosting batteries"", *AP Science Writer* Boston.com (See http://www.boston.com/business/technology/articles/2006/11/15/man_tries_wirelessly_boosting_batteries) Nov. 15, 2006.

Borenstein, Seth, ""Man tries wirelessly boosting batteries"", *The Associated Press USA Today* Nov. 16, 2006.

Boyle, Alan, ""Electro-nirvana? Not so fast"", *MSNBC* Jun. 8, 2007.

Bulkeley, William M., ""MIT Scientists Pave the Way for Wireless Battery Charging"", *The Wall Street Journal* (See http://online.wsj.com/article/SB118123955549228045.html?mod=googlenews_wsj) Jun. 8, 2007.

Burri, et al., ""Invention Description"", Feb. 5, 2008.

Cass, Stephen, ""Air Power—Wireless data connections are common—now scientists are working on wireless power"", *Sponsored by Spectrum* (see http://spectrum.ieee.org/computing/hardware/airpower) Nov. 2006.

Castelvecchi, Davide, ""The Power of Induction—Cutting the last cord could resonate with our increasingly gadget-dependent lives"", *Science News Online* vol. 172 No. 3 week of Jul. 21, 2007.

Chang, Angela, ""Recharging, The Wireless Way—Even physicists forget to recharge their cell phones sometimes."", *PC Magazine, ABC News Internet Ventures* 2006.

Cooks, Gareth, "The vision of an MIT physicist: Getting rid of pesky rechargers", *Globe Staff* Boston.com Dec. 11, 2006.

Derbyshire, David, ""The end of the plug? Scientists invent wireless device that beams electricity through your home"", *Daily Mail* (see http://www.dailymail.co.uk/pages/live/articles/technology.html?in_article_id=4) Jun. 7, 2007.

Esser, et al., ""A New Approach to Power Supplies for Robots"", *Transactions of Industry Applications* vol. 27, No. 5 Sep. / Oct. 1991, 872-875.

Fenske, et al., ""Dielectric Materials at Microwave Frequencies"", *Applied Microwave & Wireless* 2000, 92-100.

Fernandez, C et al., ""A simple dc-dc converter for the power supply of a cochlear implant"", *IEEE* 2003, 1965-1970.

Fildes, Jonathan, ""Physics Promises Wireless Power"", *Science and Technology Reporter, BBC News* Nov. 15, 2006.

Fildes, Jonathan, ""The technology with impact 2007"", *BBC News* Dec. 27, 2007.

Fildes, Jonathan, ""Wireless energy promise powers up"", *Science and Technology Report BBC News* (see http://news.bbc.co.uk/2/hi/technology/67259585.stm) Jun. 7, 2007.

Freedman, D. H., ""Power on a Chip"", *MIT Technology Review* Nov. 2004.

Geyi, Wen, ""A Method for the Evaluation of Small Antenna Q."", *IEEE Transactions on Antennas and Propagation* vol. 51, No. 8 Aug. 2003.

Hadley, Franklin, "MIT Team Experimentally Demonstrates Wireless Power Transfer, Potentially Useful for Power Laptops, Cell-Phones Without Cords,—Good-Bye Wires . . . ", *Institute for Soldier Nanotechnologies, Massachusetts Institute of Technology* Jun. 7, 2007.

Haus, H A., ""Waves and Fields in Optoelectronics"", *Coupling of Modes—Resonators and Couplers* Chapter 7 Prentice-Hall, New Jersey, 134.

Heikkinen, et al., ""Performance and Efficiency of Planar Rectennas for Short-Range Weireless Power Transfer at 2.45 GHz"", *Microwave and Optical Technology Letters* 31(2) Oct. 20, 2001, 86-91.

Highfield, Roger, ""Wireless revolution could spell end of plugs"", *Science Editor* Telegraph.co.uk (see http://www.telegraph.co.uk/news/main.jhtml?xml=/news/2007/06/07/nwirelss107.xml) Jun. 7, 2007.

Hirai, et al., ""Integral Motor with Driver and Wireless Transmission of Power and Information for Autonomous Subspindle Drive"", *IEEE* 15(1) Jan. 2000, 13-20.

Hirai, et al., ""Practical Study on Wireless Transmission of Power and Information for Autonomous Decentralized Manufacturing System"", *Transactions on Industrial Electronics IEEE* vol. 46, No. 2 Apr. 1999, 349-359.

Hirai, et al., ""Study on Intelligent Battery Charging Using Inductive Transmission of Power and Information"", *IEEE* 15(2) Mar. 2000, 335-345.

Hirai, et al., ""Wireless Transmission of Power and Information and Information for Cableless Linear Motor Drive"", *IEEE* vol. 15 No. 1 *Transactions on Power Electronics* Jan. 2000, 21-27.

Jackson, J. D., ""Classical Electrdynamics"", 3rd Edition Sections 1.11, 5.5, 5.17, 6.9, 8.1, 8.8, 9.2, 9.3 Wiley, New York 1999.

Jacob, M V. et al., ""Lithium Tantalate—A High Permittivity Dielectric Material for Microwave Communication Systems"", *Proceedings of IEEE Tencon Poster papers* 2003, 1362-1366.

Karalis, Aristeidis et al., ""Efficient Wireless non-readiative mid-range energy transfer"", *Annals of Physics* vol. 323 2008, 34-48.

Kawamura, et al., ""Wireless Transmission of Power and Information Through One High-Frequency Resonant AC Link Inverter for Robot Manipulator Applications"", *IEEE* 32(3) May / Jun. 1996, 503-508.

Kurs, Andre et al., ""Wireless Power Transfer via Strongly Coupled Magnetic Resonances"", *Science* vol. 317 Jul. 6, 2007, 83-86.

Lamb, Gregory M., ""Look, Ma—no wires!—Electricity broadcast through the air may someday run your home"", *Staff Writer The Christian Science Monitor* (see http://www.csmonitor.com/2006/1116/p14s01-stct.html) Nov. 15, 2006.

Lee, ""Antenna Circuit Design for RFID Applications" Microchip Technology Inc", AN710 2003, 50 pages.

Lee, , ""RFID Coil Design"", *Microchip Technology, Inc. AN678* 1998, 21 Pages.

Liang, et al., ""Silicon waveguide two-photon absorption detector at 1.5 μm wavelength for autocorrelation measurements"", *Applied Physics Letters* 81(7) Aug. 12, 2002, 1323-1325.

Markoff, John, ""Intel Moves to Free Gadgets of Their Recharging Cords"", *The New York Times*—nytimes.com Aug. 21, 2008.

Minkel, J R., ""Wireless Energy Lights Bulb from Seven Feet Away—Physicists vow to cut the cord between your laptop battery and the wall socket—with just a simple loop of wire"", ScientificAmerican.com (see http://www.sciam.com/article.cfm?articleid-07511C52-E7F2-99DF-3FA6ED2D7DC9AA2 . . . ) Jun. 7, 2007.

Morgan, James, ""Lab report: Pull the plug for a positive charge"", *The Herald, Web Issue 2680* Nov. 16, 2006.

O'Brien, et al., ""Analysis of Wireless Power Supplies for Industrial Automation Systems"", *IEEE* 2003, 367-372.

O'Brien, et al., ""Design of Large Air-Gap Transformers for Wireless Power Supplies"", *IEEE* 2003, 1257-1562.

Pendry, J B., ""A Chiral Route to Negative Refraction"", *Science 306* 2004, 1353-1355.

Peterson, Gary, ""MIT WiTricity Not So Original After All"", *Feed Line No. 9* (See http://www.tfcbooks.com/articles/witricity.htm) printed Nov. 12, 2009.

Reidy, Clark, ""MIT discovery could unplug your iPod forever"", *Globe staff* Boston.com (see http://www.boston.com/business/ticker/2007/06/mit_discovery_c.html) Jun. 7, 2007.

Risen, Clay, ""Wireless Energy"", *The New York Times* Dec. 9, 2007.

Sakamoto, et al., ""A Novel Circuit for Non-Contact Charging Through Electro-Magnetic Coupling"", *IEEE 1992* 1992, 168-174.

Scheible, G et al., ""Novel Wireless Power Supply System for Wireless Communication Devices in Industrial Automation Systems"", *IEEE 2002* 2002.

Schutz, J et al., ""Load Adaptive Medium Frequency Resonant Power Supply"", *IEEE 2002*.
Sekitani, et al., ""A large-area flexible wireless power transmission sheet using printed plastic MLMS switches and organic field-effect transistors"", Publication Unknown.
Sekitani, et al., ""A large-area wireless power transmission sheet using printed organic transistors and plastic MEMS switches"", www.nature.com/naturematerials Published online Apr. 29, 2007.
Senge, Miebi , ""MIT's wireless electricity for mobile phones"", Vanguard (see http://www.vanguardngr.com/articles/2002/features/gsm/gsm211062007.htm) Jun. 11, 2007.
Sensiper, S. , "Electromagnetic wave propogation on helical conductors", *PhD Thesis Massachusetts Institute of Technology* 1951.
Soljacic, Marin et al., ""Photonic-crystal slow light enhancement of nonlinear phase sensitivity"", *J. Opt. Soc. Am B* vol. 19, No. 9 Sep. 2002, 2052-2059.
Soljacic, Marin , ""Wireless Non-Radiative Energy Transfer"", *Power Point Presentation Massachusetts Institute of Technology* Oct. 6, 2005.
Someya, Takao , ""The world's first sheet-type wireless power transmission system"", *University of Tokyo* Dec. 12, 2006.
Splashpower, , ""Splashpower—World Leaders in Wireless Power"", *Powerpoint presentation* Sep. 3, 2007 , 30 pages.
Staelin, David H. et al., *Electromagnetic Waves*, Chapters 2,3,4, and 8 Prentice Hall Upper Saddle River, New Jersey 1998 , 46-176 and 336-405.
Tesla, Nikola , ""High Frequency Oscillators for Electro-Therapeutic and Other Purposes"", *The Electrical Engineer* vol. XXVI, No. 50 Nov. 17, 1898.
Tesla, Nikola , ""High Frequency Oscillators for Electro-Therapeutic and Other Purposes"", *Proceedings of the IEEE*, vol. 87 Jul. 1999 , 1282-1292.
Thomsen, et al., ""Ultrahigh speed all-optical demultiplexing based on two-photo absorption in a laser diode"", *Electronics Letters*, 34(19) Sep. 17, 1998 , 1871-1872.
Vandevoorde, et al., ""Wireless energy transfer for stand-alone systems: a comparison between low and high power applicability"", *Sensors and Actuators A 92* 2001 , 305-311.
Vilkomerson, David et al., ""Implantable Doppler System for Self-Monitoring Sascular Grafts"", *IEEE Ultrasonics Symposium* 2004 , 461-465.
Yariv, Amnon et al., ""Coupled-resonator optical waveguide: a proposal and analysis"", *Optics Letters* vol. 24, No. 11 Jun. 1, 1999 , 711-713.
Yoshihiro, Konishi , *Microwave Electronic Circuit Technology Chapter 4* (Marcel Dekker, Inc., New York, NY 1998) , 145-197.
Zierhofer, Clemens et al., ""High Efficiency Coupling-Insensitive Transcutaneous Power and Data Transmission Via an Inductive link"", *IEEE Transactions on Biomedical Engineering*, vol. 37, No. 7 Jul. 1990 , 716-722.
"U.S. Appl. No. 12/613,686, Notice of Allowance mailed Jan. 6, 2011", Jan. 6, 2011 , 10.
, "International Application Serial No. PCT/US2010/024199, Search Report and Written Opinion mailed May 14, 2010", PCT/US2010/024199 May 14, 2010 , 12.
Mediano, A et al., "Design of class E amplifier with nonlinear and linear shunt capacitances for any duty cycle", *IEEE Trans. Microwave Theor.* vol. 55 No. 3, Mar. 2007 , 484-492.
Sekiya, H. et al., "FM/PWM control scheme in class DE inverter.", *IEEE Trans. Circuits Syst. 1*, vol. 51, No. 7, Jul. 2004, Jul. 2007 , 1250-1260.
"International Search Report & WO for PCT/US09/43970", PCT/US09/43970 Jul. 14, 2009 , all.
"U.S. Appl. No. 12/613,686, Notice of Allowance mailed Mar. 7, 2011", U.S. Appl. No. 12/613,686 , 27.
International Application No. PCT/US2011/027868, International Search Report and Written Opinion mailed Jul. 5, 2011, 9 pages.
International Application Serial No. PCT/US2009/058499, International Preliminary Report on Patentability issued on Mar. 29, 2011, 5 pages.
International Application Serial No. PCT/US2010/024199, International Preliminary Report on Patentability, Aug. 25, 2011, 7 pages.
International Application Serial No. PCT/US2011/051634, International Search Report and Written Opinion mailed on Jan. 6, 2012, 11 pages.
International Application Serial No. PCT/US2011/054544, International Search Report mailed on Jan. 30, 2012, 2 pages.
Kurs et al., "Optimized design of a low-resistance electrical conductor for the multimegahertz range," Applied Physics Letter, vol. 98, Issue 17, Apr. 28, 2011, pp. 172504-1-172504-3.
Kurs et al., "Simultaneous mid-range power transfer to multiple devices", Applied Physics Letters, vol. 96, No. 044102, Feb. 2, 2010, pp. 044102-1-044102-3.
Schneider, David, "Electrons Unplugged, Wireless power at a distance is still far away," IEEE Spectrum, May 2010, pp. 35-39.
Schuder, David, "Energy Transport Into the Closed Chest From a Set of Very-Large Mutually Orthogonal Coils", Communication Electronics, vol. 64, Jan. 1963, pp. 527-534.
Schuder et al., "An Inductively Coupled RF System for the Transmission of 1 kW of Power Through the Skin", IEEE Transactions on Bio-Medical Engineering, vol. BME-18, No. 4, Jul. 1971, pp. 265-273.
Schuder, John C., "Powering an Artificial Heart: Birth of the Inductively Coupled-Radio Frequency System in 1960", Artificial Organs, vol. 26, No. 11, Jun. 2002, pp. 909-915.
Soljacic, Marin, "Wireless non-radiative energy transfer", Visions of Discovery New Light on Physics, Cosmology, and Consciousness, Cambridge University Press, New York, 2011, pp. 530-542.
Stark III, Joseph C., "Wireless Power Transmission Utilizing a Phased Array of Tesla Coils", Master Thesis, Massachusetts Institute of Technology, May 2004, 247 pages.
U.S. Appl. No. 60/698,442, "Wireless Non-Radiative Energy Transfer", filed on Jul. 12, 2005, 14 pages.
U.S. Appl. No. 60/908,666, "Wireless Energy Transfer", filed on Mar. 28, 2007, 108 pages.

\* cited by examiner

*Primary Examiner* — Hal Kaplan

(74) *Attorney, Agent, or Firm* — GTC Law Group LLP & Affiliates

(57) ABSTRACT

Described herein are improved capabilities for a source resonator having a Q-factor $Q_1 > 100$ and a characteristic size $x_1$ coupled to an energy source, and a second resonator having a Q-factor $Q_2 > 100$ and a characteristic size $x_2$ coupled to an energy drain located a distance D from the source resonator, where the source resonator and the second resonator are coupled to exchange energy wirelessly among the source resonator and the second resonator.

8 Claims, 53 Drawing Sheets

WIRELESS ENERGY TRANSFER RESONATOR KIT

CROSS-REFERENCE TO RELATED APPLICATIONS

This application is a continuation-in-part of the following U.S. patent application, U.S. Ser. No. 12/567,716 filed Sep. 25, 2009 which claims the benefit of the following U.S. provisional applications, U.S. App. No. 61/100,721 filed Sep. 27, 2008; U.S. App. No. 61/108,743 filed Oct. 27, 2008; U.S. App. No. 61/147,386 filed Jan. 26, 2009; U.S. App. No. 61/152,086 filed Feb. 12, 2009; U.S. App. No. 61/178,508 filed May 15, 2009; U.S. App. No. 61/182,768 filed Jun. 1, 2009; U.S. App. No. 61/121,159 filed Dec. 9, 2008; U.S. App. No. 61/142,977 filed Jan. 7, 2009; U.S. App. No. 61/142,885 filed Jan. 6, 2009; U.S. App. No. 61/142,796 filed Jan. 6, 2009; U.S. App. No. 61/142,889 filed Jan. 6, 2009; U.S. App. No. 61/142,880 filed Jan. 6, 2009; U.S. App. No. 61/142,818 filed Jan. 6, 2009; U.S. App. No. 61/142,887 filed Jan. 6, 2009; U.S. App. No. 61/156,764 filed Mar. 2, 2009; U.S. App. No. 61/143,058 filed Jan. 7, 2009; U.S. App. No. 61/152,390 filed Feb. 13, 2009; U.S. App. No. 61/163,695 filed Mar. 26, 2009; U.S. App. No. 61/172,633 filed Apr. 24, 2009; U.S. App. No. 61/169,240 filed Apr. 14, 2009, U.S. App. No. 61/173,747 filed Apr. 29, 2009.

Each of the foregoing applications is incorporated herein by reference in its entirety.

BACKGROUND

1. Field

This disclosure relates to wireless energy transfer, also referred to as wireless power transmission.

2. Description of the Related Art

Energy or power may be transferred wirelessly using a variety of known radiative, or far-field, and non-radiative, or near-field, techniques. For example, radiative wireless information transfer using low-directionality antennas, such as those used in radio and cellular communications systems and home computer networks, may be considered wireless energy transfer. However, this type of radiative transfer is very inefficient because only a tiny portion of the supplied or radiated power, namely, that portion in the direction of, and overlapping with, the receiver is picked up. The vast majority of the power is radiated away in all the other directions and lost in free space. Such inefficient power transfer may be acceptable for data transmission, but is not practical for transferring useful amounts of electrical energy for the purpose of doing work, such as for powering or charging electrical devices. One way to improve the transfer efficiency of some radiative energy transfer schemes is to use directional antennas to confine and preferentially direct the radiated energy towards a receiver. However, these directed radiation schemes may require an uninterruptible line-of-sight and potentially complicated tracking and steering mechanisms in the case of mobile transmitters and/or receivers. In addition, such schemes may pose hazards to objects or people that cross or intersect the beam when modest to high amounts of power are being transmitted. A known non-radiative, or near-field, wireless energy transfer scheme, often referred to as either induction or traditional induction, does not (intentionally) radiate power, but uses an oscillating current passing through a primary coil, to generate an oscillating magnetic near-field that induces currents in a near-by receiving or secondary coil. Traditional induction schemes have demonstrated the transmission of modest to large amounts of power, however only over very short distances, and with very small offset tolerances between the primary power supply unit and the secondary receiver unit. Electric transformers and proximity chargers are examples of devices that utilize this known short range, near-field energy transfer scheme.

Therefore a need exists for a wireless power transfer scheme that is capable of transferring useful amounts of electrical power over mid-range distances or alignment offsets. Such a wireless power transfer scheme should enable useful energy transfer over greater distances and alignment offsets than those realized with traditional induction schemes, but without the limitations and risks inherent in radiative transmission schemes.

SUMMARY

There is disclosed herein a non-radiative or near-field wireless energy transfer scheme that is capable of transmitting useful amounts of power over mid-range distances and alignment offsets. This inventive technique uses coupled electromagnetic resonators with long-lived oscillatory resonant modes to transfer power from a power supply to a power drain. The technique is general and may be applied to a wide range of resonators, even where the specific examples disclosed herein relate to electromagnetic resonators. If the resonators are designed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators. If the resonators are designed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators. Either type of resonator may also be referred to as an electromagnetic resonator. Both types of resonators are disclosed herein.

The omni-directional but stationary (non-lossy) nature of the near-fields of the resonators we disclose enables efficient wireless energy transfer over mid-range distances, over a wide range of directions and resonator orientations, suitable for charging, powering, or simultaneously powering and charging a variety of electronic devices. As a result, a system may have a wide variety of possible applications where a first resonator, connected to a power source, is in one location, and a second resonator, potentially connected to electrical/electronic devices, batteries, powering or charging circuits, and the like, is at a second location, and where the distance from the first resonator to the second resonator is on the order of centimeters to meters. For example, a first resonator connected to the wired electricity grid could be placed on the ceiling of a room, while other resonators connected to devices, such as robots, vehicles, computers, communication devices, medical devices, and the like, move about within the room, and where these devices are constantly or intermittently receiving power wirelessly from the source resonator. From this one example, one can imagine many applications where the systems and methods disclosed herein could provide wireless power across mid-range distances, including consumer electronics, industrial applications, infrastructure power and lighting, transportation vehicles, electronic games, military applications, and the like.

Energy exchange between two electromagnetic resonators can be optimized when the resonators are tuned to substantially the same frequency and when the losses in the system are minimal. Wireless energy transfer systems may be designed so that the "coupling-time" between resonators is much shorter than the resonators' "loss-times". Therefore, the systems and methods described herein may utilize high quality factor (high-Q) resonators with low intrinsic-loss rates. In addition, the systems and methods described herein may use sub-wavelength resonators with near-fields that extend significantly longer than the characteristic sizes of the resonators, so that the near-fields of the resonators that exchange energy overlap at mid-range distances. This is a regime of operation that has not been practiced before and that differs significantly from traditional induction designs.

It is important to appreciate the difference between the high-Q magnetic resonator scheme disclosed here and the known close-range or proximity inductive schemes, namely, that those known schemes do not conventionally utilize high-Q resonators. Using coupled-mode theory (CMT), (see, for example, *Waves and Fields in Optoelectronics*, H. A. Haus, Prentice Hall, 1984), one may show that a high-Q resonator-coupling mechanism can enable orders of magnitude more efficient power delivery between resonators spaced by mid-range distances than is enabled by traditional inductive schemes. Coupled high-Q resonators have demonstrated efficient energy transfer over mid-range distances and improved efficiencies and offset tolerances in short range energy transfer applications.

The systems and methods described herein may provide for near-field wireless energy transfer via strongly coupled high-Q resonators, a technique with the potential to transfer power levels from picowatts to kilowatts, safely, and over distances much larger than have been achieved using traditional induction techniques. Efficient energy transfer may be realized for a variety of general systems of strongly coupled resonators, such as systems of strongly coupled acoustic resonators, nuclear resonators, mechanical resonators, and the like, as originally described by researchers at M.I.T. in their publications, "Efficient wireless non-radiative mid-range energy transfer", *Annals of Physics*, vol. 323, Issue 1, p. 34 (2008) and "Wireless Power Transfer via Strongly Coupled Magnetic Resonances", *Science*, vol. 317, no. 5834, p. 83, (2007). Disclosed herein are electromagnetic resonators and systems of coupled electromagnetic resonators, also referred to more specifically as coupled magnetic resonators and coupled electric resonators, with operating frequencies below 10 GHz.

This disclosure describes wireless energy transfer technologies, also referred to as wireless power transmission technologies. Throughout this disclosure, we may use the terms wireless energy transfer, wireless power transfer, wireless power transmission, and the like, interchangeably. We may refer to supplying energy or power from a source, an AC or DC source, a battery, a source resonator, a power supply, a generator, a solar panel, and thermal collector, and the like, to a device, a remote device, to multiple remote devices, to a device resonator or resonators, and the like. We may describe intermediate resonators that extend the range of the wireless energy transfer system by allowing energy to hop, transfer through, be temporarily stored, be partially dissipated, or for the transfer to be mediated in any way, from a source resonator to any combination of other device and intermediate resonators, so that energy transfer networks, or strings, or extended paths may be realized. Device resonators may receive energy from a source resonator, convert a portion of that energy to electric power for powering or charging a device, and simultaneously pass a portion of the received energy onto other device or mobile device resonators. Energy may be transferred from a source resonator to multiple device resonators, significantly extending the distance over which energy may be wirelessly transferred. The wireless power transmission systems may be implemented using a variety of system architectures and resonator designs. The systems may include a single source or multiple sources transmitting power to a single device or multiple devices. The resonators may be designed to be source or device resonators, or they may be designed to be repeaters. In some cases, a resonator may be a device and source resonator simultaneously, or it may be switched from operating as a source to operating as a device or a repeater. One skilled in the art will understand that a variety of system architectures may be supported by the wide range of resonator designs and functionalities described in this application.

In the wireless energy transfer systems we describe, remote devices may be powered directly, using the wirelessly supplied power or energy, or the devices may be coupled to an energy storage unit such as a battery, a super-capacitor, an ultra-capacitor, or the like (or other kind of power drain), where the energy storage unit may be charged or re-charged wirelessly, and/or where the wireless power transfer mechanism is simply supplementary to the main power source of the device. The devices may be powered by hybrid battery/energy storage devices such as batteries with integrated storage capacitors and the like. Furthermore, novel battery and energy storage devices may be designed to take advantage of the operational improvements enabled by wireless power transmission systems.

Other power management scenarios include using wirelessly supplied power to recharge batteries or charge energy storage units while the devices they power are turned off, in an idle state, in a sleep mode, and the like. Batteries or energy storage units may be charged or recharged at high (fast) or low (slow) rates. Batteries or energy storage units may be trickle charged or float charged. Multiple devices may be charged or powered simultaneously in parallel or power delivery to multiple devices may be serialized such that one or more devices receive power for a period of time after which other power delivery is switched to other devices. Multiple devices may share power from one or more sources with one or more other devices either simultaneously, or in a time multiplexed manner, or in a frequency multiplexed manner, or in a spatially multiplexed manner, or in an orientation multiplexed manner, or in any combination of time and frequency and spatial and orientation multiplexing. Multiple devices may share power with each other, with at least one device being reconfigured continuously, intermittently, periodically, occasionally, or temporarily, to operate as wireless power sources. It would be understood by one of ordinary skill in the art that there are a variety of ways to power and/or charge devices, and the variety of ways could be applied to the technologies and applications described herein.

Wireless energy transfer has a variety of possible applications including for example, placing a source (e.g. one connected to the wired electricity grid) on the ceiling, under the floor, or in the walls of a room, while devices such as robots, vehicles, computers, PDAs or similar are placed or move freely within the room. Other applications may include powering or recharging electric-engine vehicles, such as buses and/or hybrid cars and medical devices, such as wearable or implantable devices. Additional example applications include the ability to power or recharge autonomous electronics (e.g. laptops, cell-phones, portable music players, household robots, GPS navigation systems, displays, etc), sensors, industrial and manufacturing equipment, medical devices and monitors, home appliances and tools (e.g. lights, fans, drills, saws, heaters, displays, televisions, counter-top appliances, etc.), military devices, heated or illuminated clothing, communications and navigation equipment, including equipment built into vehicles, clothing and protective-wear such as helmets, body armor and vests, and the like, and the ability to transmit power to physically isolated devices such as to implanted medical devices, to hidden, buried, implanted or embedded sensors or tags, to and/or from roof-top solar panels to indoor distribution panels, and the like.

In one aspect, disclosed herein is a system including a source resonator having a Q-factor $Q_1$ and a characteristic $size_{x1}$, coupled to a power generator with direct electrical connections; and a second resonator having a Q-factor $Q_2$ and a characteristic size $x_2$, coupled to a load with direct electrical connections, and located a distance D from the source resonator, wherein the source resonator and the second resonator are coupled to exchange energy wirelessly among the source resonator and the second resonator in order to transmit power from the power generator to the load, and wherein $\sqrt{Q_1 Q_2}$ is greater than 100.

$Q_1$ may be greater than 100 and $Q_2$ may be less than 100. $Q_1$ may be greater than 100 and $Q_2$ may be greater than 100. A useful energy exchange may be maintained over an operating distance from 0 to D, where D is larger than the smaller of $x_1$ and $x_2$. At least one of the source resonator and the second resonator may be a coil of at least one turn of a conducting material connected to a first network of capacitors. The first network of capacitors may include at least one tunable capacitor. The direct electrical connections of at least one of the source resonator to the ground terminal of the power generator and the second resonator to the ground terminal of the load may be made at a point on an axis of electrical symmetry of the first network of capacitors. The first network of capacitors may include at least one tunable butterfly-type capacitor, wherein the direct electrical connection to the ground terminal is made on a center terminal of the at least one tunable butterfly-type capacitor. The direct electrical connection of at least one of the source resonator to the power generator and the second resonator to the load may be made via a second network of capacitors, wherein the first network of capacitors and the second network of capacitors form an impedance matching network. The impedance matching network may be designed to match the coil to a characteristic impedance of the power generator or the load at a driving frequency of the power generator.

At least one of the first network of capacitors and the second network of capacitors may include at least one tunable capacitor. The first network of capacitors and the second network of capacitors may be adjustable to change an impedance of the impedance matching network at a driving frequency of the power generator. The first network of capacitors and the second network of capacitors may be adjustable to match the coil to the characteristic impedance of the power generator or the load at a driving frequency of the power generator. At least one of the first network of capacitors and the second network of capacitors may include at least one fixed capacitor that reduces a voltage across the at least one tunable capacitor. The direct electrical connections of at least one of the source resonator to the power generator and the second resonator to the load may be configured to substantially preserve a resonant mode. At least one of the source resonator and the second resonator may be a tunable resonator. The source resonator may be physically separated from the power generator and the second resonator may be physically separated from the load. The second resonator may be coupled to a power conversion circuit to deliver DC power to the load. The second resonator may be coupled to a power conversion circuit to deliver AC power to the load. The second resonator may be coupled to a power conversion circuit to deliver both AC and DC power to the load. The second resonator may be coupled to a power conversion circuit to deliver power to a plurality of loads.

In another aspect, a system disclosed herein includes a source resonator having a Q-factor $Q_1$ and a characteristic size $x_1$, and a second resonator having a Q-factor $Q_2$ and a characteristic size $x_2$, and located a distance D from the source resonator; wherein the source resonator and the second resonator are coupled to exchange energy wirelessly among the source resonator and the second resonator; and wherein $\sqrt{Q_1 Q_2}$ is greater than 100, and wherein at least one of the resonators is enclosed in a low loss tangent material.

In another aspect, a system disclosed herein includes a source resonator having a Q-factor $Q_1$ and a characteristic size $x_1$, and a second resonator having a Q-factor $Q_2$ and a characteristic size $x_2$, and located a distance D from the source resonator; wherein the source resonator and the second resonator are coupled to exchange energy wirelessly among the source resonator and the second resonator, and wherein $\sqrt{Q_1 Q_2}$ is greater than 100; and wherein at least one of the resonators includes a coil of a plurality of turns of a conducting material connected to a network of capacitors, wherein the plurality of turns are in a common plane, and wherein a characteristic thickness of the at least one of the resonators is much less than a characteristic size of the at least one of the resonators.

Throughout this disclosure we may refer to the certain circuit components such as capacitors, inductors, resistors, diodes, switches and the like as circuit components or elements. We may also refer to series and parallel combinations of these components as elements, networks, topologies, circuits, and the like. We may describe combinations of capacitors, diodes, varactors, transistors, and/or switches as adjustable impedance networks, tuning networks, matching networks, adjusting elements, and the like. We may also refer to "self-resonant" objects that have both capacitance, and inductance distributed (or partially distributed, as opposed to solely lumped) throughout the entire object. It would be understood by one of ordinary skill in the art that adjusting and controlling variable components within a circuit or network may adjust the performance of that circuit or network and that those adjustments may be described generally as tuning, adjusting, matching, correcting, and the like. Other methods to tune or adjust the operating point of the wireless power transfer system may be used alone, or in addition to adjusting tunable components such as inductors and capacitors, or banks of inductors and capacitors.

Unless otherwise defined, all technical and scientific terms used herein have the same meaning as commonly understood by one of ordinary skill in the art to which this disclosure belongs. In case of conflict with publications, patent applications, patents, and other references mentioned or incorporated herein by reference, the present specification, including definitions, will control.

Any of the features described above may be used, alone or in combination, without departing from the scope of this disclosure. Other features, objects, and advantages of the systems and methods disclosed herein will be apparent from the following detailed description and figures.

DETAILED DESCRIPTION

As described above, this disclosure relates to coupled electromagnetic resonators with long-lived oscillatory resonant modes that may wirelessly transfer power from a power supply to a power drain. However, the technique is not restricted to electromagnetic resonators, but is general and may be applied to a wide variety of resonators and resonant objects. Therefore, we first describe the general technique, and then disclose electromagnetic examples for wireless energy transfer.

Resonators

A resonator may be defined as a system that can store energy in at least two different forms, and where the stored energy is oscillating between the two forms. The resonance has a specific oscillation mode with a resonant (modal) frequency, f, and a resonant (modal) field. The angular resonant frequency, ω, may be defined as $\omega = 2\pi f$, the resonant wavelength, λ, may be defined as $\lambda = c/f$, where c is the speed of light, and the resonant period, T, may be defined as $T = 1/f = 2\pi/\omega$. In the absence of loss mechanisms, coupling mechanisms or external energy supplying or draining mechanisms, the total resonator stored energy, W, would stay fixed and the two forms of energy would oscillate, wherein one would be maximum when the other is minimum and vice versa.

Figure 1:
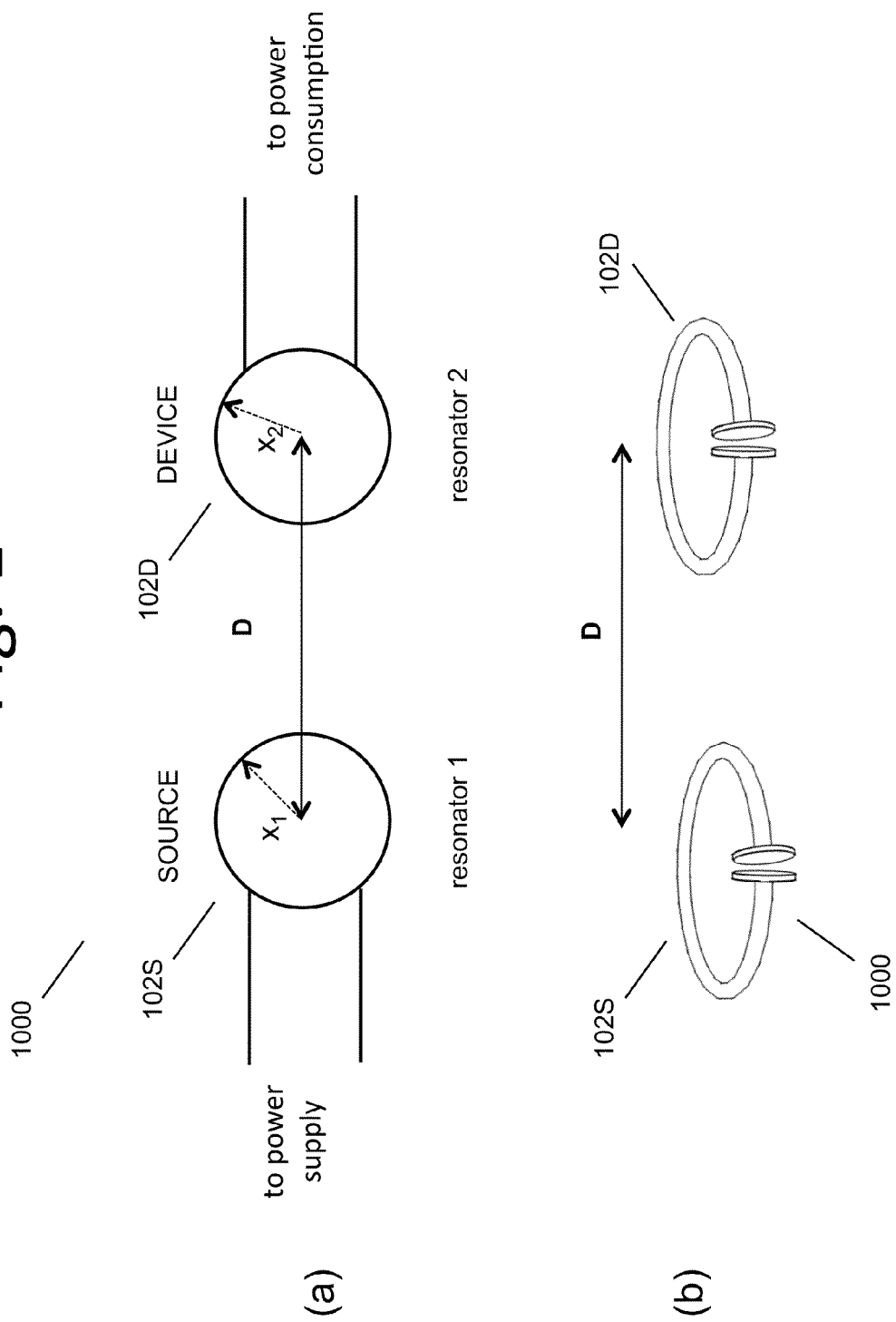
FIG. 1(a) and (b) depict exemplary wireless power systems containing a source resonator 1 and device resonator 2 separated by a distance D.

In the absence of extraneous materials or objects, the energy in the resonator 102 shown in FIG. 1 may decay or be lost by intrinsic losses. The resonator fields then obey the following linear equation:

$$\frac{da(t)}{dt} = -i(\omega - i\Gamma)a(t),$$

where the variable a(t) is the resonant field amplitude, defined so that the energy contained within the resonator is given by $|a(t)|^2$. Γ is the intrinsic energy decay or loss rate (e.g. due to absorption and radiation losses).

The Quality Factor, or Q-factor, or Q, of the resonator, which characterizes the energy decay, is inversely proportional to these energy losses. It may be defined as $Q = \omega \cdot W/P$, where P is the time-averaged power lost at steady state. That is, a resonator 102 with a high-Q has relatively low intrinsic losses and can store energy for a relatively long time. Since the resonator loses energy at its intrinsic decay rate, 2Γ, its Q, also referred to as its intrinsic Q, is given by $Q = \omega/2\Gamma$. The quality factor also represents the number of oscillation periods, T, it takes for the energy in the resonator to decay by a factor of e.

Figure 2:
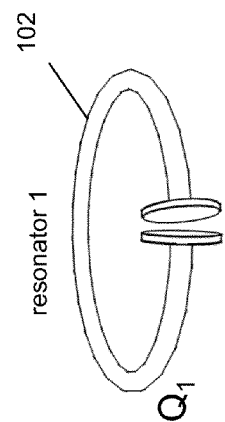
FIG. 2 shows an exemplary resonator labeled according to the labeling convention described in this disclosure. Note that there are no extraneous objects or additional resonators shown in the vicinity of resonator 1.

As described above, we define the quality factor or Q of the resonator as that due only to intrinsic loss mechanisms. A subscript index such as $Q_1$, indicates the resonator (resonator 1 in this case) to which the Q refers. FIG. 2 shows an electromagnetic resonator 102 labeled according to this convention. Note that in this figure, there are no extraneous objects or additional resonators in the vicinity of resonator 1.

Extraneous objects and/or additional resonators in the vicinity of a first resonator may perturb or load the first resonator, thereby perturbing or loading the Q of the first resonator, depending on a variety of factors such as the distance between the resonator and object or other resonator, the material composition of the object or other resonator, the structure of the first resonator, the power in the first resonator, and the like. Unintended external energy losses or coupling mechanisms to extraneous materials and objects in the vicinity of the resonators may be referred to as "perturbing" the Q of a resonator, and may be indicated by a subscript within rounded parentheses, ( ). Intended external energy losses, associated with energy transfer via coupling to other resonators and to generators and loads in the wireless energy transfer system may be referred to as "loading" the Q of the resonator, and may be indicated by a subscript within square brackets, [ ].

Figure 3:
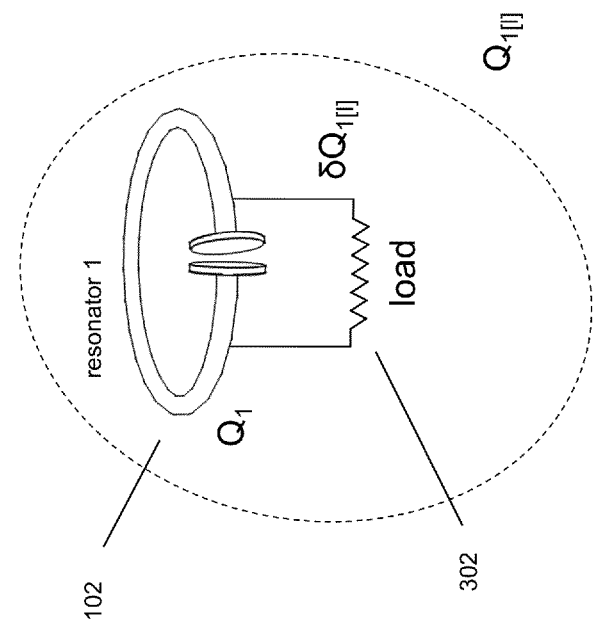
FIG. 3 shows an exemplary resonator in the presence of a "loading" object, labeled according to the labeling convention described in this disclosure.

The Q of a resonator 102 connected or coupled to a power generator, g, or load 302, l, may be called the "loaded quality factor" or the "loaded Q" and may be denoted by $Q_{[g]}$ or $Q_{[l]}$, as illustrated in FIG. 3. In general, there may be more than one generator or load 302 connected to a resonator 102. However, we do not list those generators or loads separately but rather use "g" and "l" to refer to the equivalent circuit loading imposed by the combinations of generators and loads. In general descriptions, we may use the subscript "l" to refer to either generators or loads connected to the resonators.

In some of the discussion herein, we define the "loading quality factor" or the "loading Q" due to a power generator or load connected to the resonator, as $\delta Q_{[l]}$, where, $1/\delta Q_{[l]} \equiv 1/Q_{[l]} - 1/Q$. Note that the larger the loading Q, $\delta Q_{[l]}$, of a generator or load, the less the loaded Q, $Q_{[l]}$, deviates from the unloaded Q of the resonator.

Figure 4:
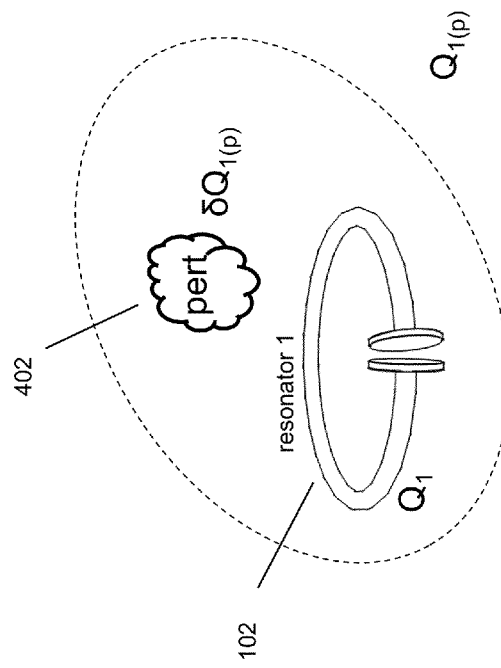
FIG. 4 shows an exemplary resonator in the presence of a "perturbing" object, labeled according to the labeling convention described in this disclosure.

The Q of a resonator in the presence of an extraneous object 402, p, that is not intended to be part of the energy transfer system may be called the "perturbed quality factor" or the "perturbed Q" and may be denoted by $Q_{(p)}$, as illustrated in FIG. 4. In general, there may be many extraneous objects, denoted as p1, p2, etc., or a set of extraneous objects {p}, that perturb the Q of the resonator 102. In this case, the perturbed Q may be denoted $Q_{(p1+p2+\ldots)}$ or $Q_{(\{p\})}$. For example, $Q_{1(brick+wood)}$ may denote the perturbed quality factor of a first resonator in a system for wireless power exchange in the presence of a brick and a piece of wood, and $Q_{2(\{office\})}$ may denote the perturbed quality factor of a second resonator in a system for wireless power exchange in an office environment.

In some of the discussion herein, we define the "perturbing quality factor" or the "perturbing Q" due to an extraneous object, p, as $\delta Q_{(p)}$, where $1/\delta Q_{(p)} \equiv 1/Q_{(p)} - 1/Q$. As stated before, the perturbing quality factor may be due to multiple extraneous objects, p1, p2, etc. or a set of extraneous objects, {p}. The larger the perturbing Q, $\delta Q_{(p)}$, of an object, the less the perturbed Q, $Q_{(p)}$, deviates from the unperturbed Q of the resonator.

In some of the discussion herein, we also define $\Theta_{(p)} \equiv Q_{(p)}/Q$ and call it the "quality factor insensitivity" or the "Q-insensitivity" of the resonator in the presence of an extraneous object. A subscript index, such as $\Theta_{1(p)}$, indicates the resonator to which the perturbed and unperturbed quality factors are referring, namely, $\Theta_{1(p)} \equiv Q_{1(p)}/Q_1$.

Note that the quality factor, Q, may also be characterized as "unperturbed", when necessary to distinguish it from the perturbed quality factor, $Q_{(p)}$, and "unloaded", when necessary to distinguish it from the loaded quality factor, $Q_{[l]}$. Similarly, the perturbed quality factor, $Q_{(p)}$, may also be characterized as "unloaded", when necessary to distinguish them from the loaded perturbed quality factor, $Q_{(p)[l]}$.

Coupled Resonators

Resonators having substantially the same resonant frequency, coupled through any portion of their near-fields may interact and exchange energy. There are a variety of physical pictures and models that may be employed to understand, design, optimize and characterize this energy exchange. One way to describe and model the energy exchange between two coupled resonators is using coupled mode theory (CMT).

In coupled mode theory, the resonator fields obey the following set of linear equations:

$$\frac{da_m(t)}{dt} = -i(\omega_m - i\Gamma_m)a_m(t) + i\sum_{n\ne m}\kappa_{mn}a_n(t)$$

where the indices denote different resonators and $\kappa_{mn}$ are the coupling coefficients between the resonators. For a reciprocal system, the coupling coefficients may obey the relation $\kappa_{mn} = \kappa_{nm}$. Note that, for the purposes of the present specification, far-field radiation interference effects will be ignored and thus the coupling coefficients will be considered real. Furthermore, since in all subsequent calculations of system performance in this specification the coupling coefficients appear only with their square, $\kappa_{mn}^2$, we use $\kappa_{mn}$ to denote the absolute value of the real coupling coefficients.

Note that the coupling coefficient, $\kappa_{mn}$, from the CMT described above is related to the so-called coupling factor, $k_{mn}$, between resonators m and n by $k_{mn} = 2\kappa_{mn}/\sqrt{\omega_m\omega_n}$. We define a "strong-coupling factor", $U_{mn}$, as the ratio of the coupling and loss rates between resonators m and n, by $U_{mn} = \kappa_{mn}/\sqrt{\Gamma_m\Gamma_n} = k_{mn}\sqrt{Q_m Q_n}$.

The quality factor of a resonator m, in the presence of a similar frequency resonator n or additional resonators, may be loaded by that resonator n or additional resonators, in a fashion similar to the resonator being loaded by a connected power generating or consuming device. The fact that resonator m may be loaded by resonator n and vice versa is simply a different way to see that the resonators are coupled.

The loaded Q's of the resonators in these cases may be denoted as $Q_{m[n]}$ and $Q_{n[m]}$. For multiple resonators or loading supplies or devices, the total loading of a resonator may be determined by modeling each load as a resistive loss, and adding the multiple loads in the appropriate parallel and/or series combination to determine the equivalent load of the ensemble.

In some of the discussion herein, we define the "loading quality factor" or the "loading $Q_m$" of resonator m due to resonator n as $\delta Q_{m[n]}$, where $1/\delta Q_{m[n]} \equiv 1/Q_{m[n]} - 1/Q_m$. Note that resonator n is also loaded by resonator m and its "loading $Q_n$" is given by $1/\delta Q_{n[m]} \equiv 1/Q_{n[m]} - 1/Q_n$.

When one or more of the resonators are connected to power generators or loads, the set of linear equations is modified to:

$$\frac{da_m(t)}{dt} = -i(\omega_m - i\Gamma_m)a_m(t) + i\sum_{n\ne m}\kappa_{mn}a_n(t) - \kappa_m a_m(t) + \sqrt{2\kappa_m}\, s_{+m}(t)$$

$$s_{-m}(t) = \sqrt{2\kappa_m}\, a_m(t) - s_{+m}(t),$$

where $s_{+m}(t)$ and $s_{-m}(t)$ are respectively the amplitudes of the fields coming from a generator into the resonator m and going out of the resonator m either back towards the generator or into a load, defined so that the power they carry is given by $|s_{+m}(t)|^2$ and $|s_{-m}(t)|^2$. The loading coefficients $\kappa_m$ relate to the rate at which energy is exchanged between the resonator m and the generator or load connected to it.

Note that the loading coefficient, $\kappa_m$, from the CMT described above is related to the loading quality factor, $\delta Q_{m[l]}$, defined earlier, by $\delta Q_{m[l]} = \omega_m/2\kappa_m$.

We define a "strong-loading factor", $U_{m[l]}$, as the ratio of the loading and loss rates of resonator m, $U_{m[l]} = \kappa_m/\Gamma_m = Q_m/\delta Q_{m[l]}$.

FIG. 1(a) shows an example of two coupled resonators 1000, a first resonator 102S, configured as a source resonator and a second resonator 102D, configured as a device resonator. Energy may be transferred over a distance D between the resonators. The source resonator 102S may be driven by a power supply or generator (not shown). Work may be extracted from the device resonator 102D by a power consuming drain or load (e.g. a load resistor, not shown). Let us use the subscripts "s" for the source, "d" for the device, "g" for the generator, and "l" for the load, and, since in this example there are only two resonators and $\kappa_{sd} = \kappa_{ds}$, let us drop the indices on $\kappa_{sd}$, $k_{sd}$, and $U_{sd}$, and denote them as $\kappa$, k, and U, respectively.

The power generator may be constantly driving the source resonator at a constant driving frequency, f, corresponding to an angular driving frequency, $\omega$, where $\omega = 2\pi f$.

In this case, the efficiency, $\eta = |s_{-d}|^2/|s_{+s}|^2$, of the power transmission from the generator to the load (via the source and device resonators) is maximized under the following conditions: The source resonant frequency, the device resonant frequency and the generator driving frequency have to be matched, namely $$\omega_s = \omega_d = \omega.$$

Furthermore, the loading Q of the source resonator due to the generator, $\delta Q_{s[g]}$, has to be matched (equal) to the loaded Q of the source resonator due to the device resonator and the load, $Q_{s[dl]}$, and inversely the loading Q of the device resonator due to the load, $\delta Q_{d[l]}$, has to be matched (equal) to the loaded Q of the device resonator due to the source resonator and the generator, $Q_{d[sg]}$, namely $$\delta Q_{s[g]} = Q_{s[dl]} \text{ and } \delta Q_{d[l]} = Q_{d[sg]}.$$

These equations determine the optimal loading rates of the source resonator by the generator and of the device resonator by the load as $$U_{d[l]} = \kappa_d/\Gamma_d = Q_d/\delta Q_{d[l]} = \sqrt{1+U^2} = \sqrt{1+(\kappa/\sqrt{\Gamma_s\Gamma_d})^2} = Q_s/\delta Q_{s[g]} = \kappa_s/\Gamma_s = U_{s[g]}.$$

Note that the above frequency matching and Q matching conditions are together known as "impedance matching" in electrical engineering.

Figure 5:
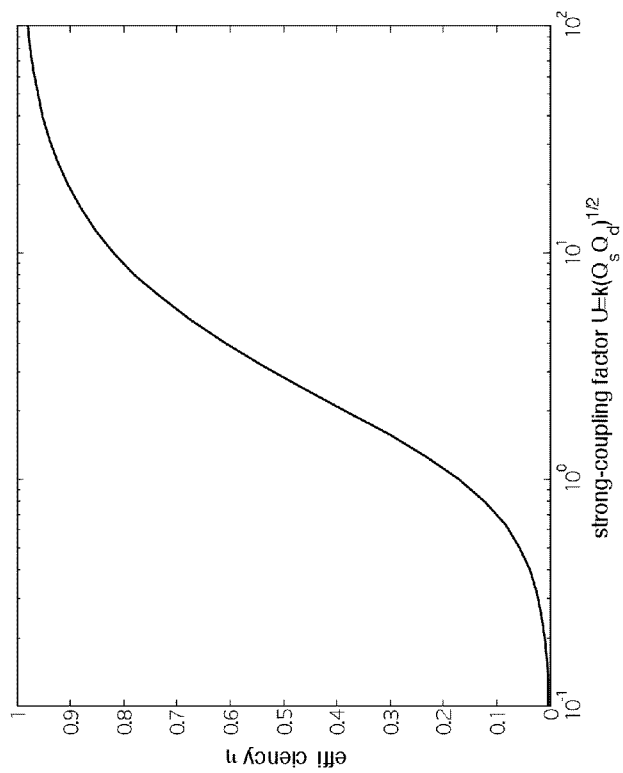
FIG. 5 shows a plot of efficiency, η, vs. strong coupling factor, $U=\kappa/\sqrt{\Gamma_s\Gamma_d}=k\sqrt{Q_1Q_2}$.

Under the above conditions, the maximized efficiency is a monotonically increasing function of only the strong-coupling factor, $U=\kappa/\sqrt{\Gamma_s\Gamma_d}=k\sqrt{Q_sQ_d}$, between the source and device resonators and is given by, $\eta=U^2/(1+\sqrt{1+U^2})^2$, as shown in FIG. 5. Note that the coupling efficiency, $\eta$, is greater than 1% when U is greater than 0.2, is greater than 10% when U is greater than 0.7, is greater than 17% when U is greater than 1, is greater than 52% when U is greater than 3, is greater than 80% when U is greater than 9, is greater than 90% when U is greater than 19, and is greater than 95% when U is greater than 45. In some applications, the regime of operation where U>1 may be referred to as the "strong-coupling" regime.

Since a large $U=\kappa/\sqrt{\Gamma_s\Gamma_d}=(2\kappa/\sqrt{\omega_s\omega_d})\sqrt{Q_sQ_d}$ is desired in certain circumstances, resonators may be used that are high-Q. The Q of each resonator may be high. The geometric mean of the resonator Q's, $\sqrt{Q_sQ_d}$ may also or instead be high.

The coupling factor, k, is a number between $0 \leq k \leq 1$, and it may be independent (or nearly independent) of the resonant frequencies of the source and device resonators, rather it may determined mostly by their relative geometry and the physical decay-law of the field mediating their coupling. In contrast, the coupling coefficient, $\kappa=k\sqrt{\omega_s\omega_d}/2$, may be a strong function of the resonant frequencies. The resonant frequencies of the resonators may be chosen preferably to achieve a high Q rather than to achieve a low $\Gamma$, as these two goals may be achievable at two separate resonant frequency regimes.

A high-Q resonator may be defined as one with Q>100. Two coupled resonators may be referred to as a system of high-Q resonators when each resonator has a Q greater than 100, $Q_s>100$ and $Q_d>100$. In other implementations, two coupled resonators may be referred to as a system of high-Q resonators when the geometric mean of the resonator Q's is greater than 100, $\sqrt{Q_sQ_d}>100$.

The resonators may be named or numbered. They may be referred to as source resonators, device resonators, first resonators, second resonators, repeater resonators, and the like. It is to be understood that while two resonators are shown in FIG. 1, and in many of the examples below, other implementations may include three (3) or more resonators. For example, a single source resonator 102S may transfer energy to multiple device resonators 102D or multiple devices. Energy may be transferred from a first device to a second, and then from the second device to the third, and so forth. Multiple sources may transfer energy to a single device or to multiple devices connected to a single device resonator or to multiple devices connected to multiple device resonators. Resonators 102 may serve alternately or simultaneously as sources, devices, or they may be used to relay power from a source in one location to a device in another location. Intermediate electromagnetic resonators 102 may be used to extend the distance range of wireless energy transfer systems. Multiple resonators 102 may be daisy chained together, exchanging energy over extended distances and with a wide range of sources and devices. High power levels may be split between multiple sources 102S, transferred to multiple devices and recombined at a distant location.

The analysis of a single source and a single device resonator may be extended to multiple source resonators and/or multiple device resonators and/or multiple intermediate resonators. In such an analysis, the conclusion may be that large strong-coupling factors, $U_{mn}$, between at least some or all of the multiple resonators is preferred for a high system efficiency in the wireless energy transfer. Again, implementations may use source, device and intermediate resonators that have a high Q. The Q of each resonator may be high. The geometric mean $\sqrt{Q_mQ_n}$ of the Q's for pairs of resonators m and n, for which a large $U_{mn}$ is desired, may also or instead be high.

Note that since the strong-coupling factor of two resonators may be determined by the relative magnitudes of the loss mechanisms of each resonator and the coupling mechanism between the two resonators, the strength of any or all of these mechanisms may be perturbed in the presence of extraneous objects in the vicinity of the resonators as described above.

Continuing the conventions for labeling from the previous sections, we describe k as the coupling factor in the absence of extraneous objects or materials. We denote the coupling factor in the presence of an extraneous object, p, as $k_{(p)}$, and call it the "perturbed coupling factor" or the "perturbed k". Note that the coupling factor, k, may also be characterized as "unperturbed", when necessary to distinguish from the perturbed coupling factor $k_{(p)}$.

We define $\delta k_{(p)} \equiv k_{(p)} - k$ and we call it the "perturbation on the coupling factor" or the "perturbation on k" due to an extraneous object, p.

We also define $\beta_{(p)} \equiv k_{(p)}/k$ and we call it the "coupling factor insensitivity" or the "k-insensitivity". Lower indices, such as $\beta_{12(p)}$, indicate the resonators to which the perturbed and unperturbed coupling factor is referred to, namely $\beta_{12(p)} \equiv k_{12(p)}/k_{12}$.

Similarly, we describe U as the strong-coupling factor in the absence of extraneous objects. We denote the strong-coupling factor in the presence of an extraneous object, p, as $U_{(p)}$, $U_{(p)}=k_{(p)}\sqrt{Q_{1(p)}Q_{2(p)}}$, and call it the "perturbed strong-coupling factor" or the "perturbed U". Note that the strong-coupling factor U may also be characterized as "unperturbed", when necessary to distinguish from the perturbed strong-coupling factor $U_{(p)}$. Note that the strong-coupling factor U may also be characterized as "unperturbed", when necessary to distinguish from the perturbed strong-coupling factor $U_{(p)}$.

We define $\delta U_{(p)} \equiv U_{(p)} - U$ and call it the "perturbation on the strong-coupling factor" or the "perturbation on U" due to an extraneous object, p.

We also define $\Xi_{(p)} \equiv U_{(p)}/U$ and call it the "strong-coupling factor insensitivity" or the "U-insensitivity". Lower indices, such as $\Xi_{12(p)}$, indicate the resonators to which the perturbed and unperturbed coupling factor refers, namely $\Xi_{12(p)} \equiv U_{12(p)}/U_{12}$.

The efficiency of the energy exchange in a perturbed system may be given by the same formula giving the efficiency of the unperturbed system, where all parameters such as strong-coupling factors, coupling factors, and quality factors are replaced by their perturbed equivalents. For example, in a system of wireless energy transfer including one source and one device resonator, the optimal efficiency may calculated as $$\eta_{(p)} = \left[ U_{(p)} \Big/ \left(1 + \sqrt{1 + U_{(p)}^2}\right) \right]^2.$$

Therefore, in a system of wireless energy exchange which is perturbed by extraneous objects, large perturbed strong-coupling factors, $U_{mn(p)}$, between at least some or all of the multiple resonators may be desired for a high system efficiency in the wireless energy transfer. Source, device and/or intermediate resonators may have a high $Q_{(p)}$.

Some extraneous perturbations may sometimes be detrimental for the perturbed strong-coupling factors (via large perturbations on the coupling factors or the quality factors). Therefore, techniques may be used to reduce the effect of extraneous perturbations on the system and preserve large strong-coupling factor insensitivites.

Efficiency of Energy Exchange

The so-called "useful" energy in a useful energy exchange is the energy or power that must be delivered to a device (or devices) in order to power or charge the device. The transfer efficiency that corresponds to a useful energy exchange may be system or application dependent. For example, high power vehicle charging applications that transfer kilowatts of power may need to be at least 80% efficient in order to supply useful amounts of power resulting in a useful energy exchange sufficient to recharge a vehicle battery, without significantly heating up various components of the transfer system. In some consumer electronics applications, a useful energy exchange may include any energy transfer efficiencies greater than 10%, or any other amount acceptable to keep rechargeable batteries "topped off" and running for long periods of time. For some wireless sensor applications, transfer efficiencies that are much less than 1% may be adequate for powering multiple low power sensors from a single source located a significant distance from the sensors. For still other applications, where wired power transfer is either impossible or impractical, a wide range of transfer efficiencies may be acceptable for a useful energy exchange and may be said to supply useful power to devices in those applications. In general, an operating distance is any distance over which a useful energy exchange is or can be maintained according to the principles disclosed herein.

A useful energy exchange for a wireless energy transfer in a powering or recharging application may be efficient, highly efficient, or efficient enough, as long as the wasted energy levels, heat dissipation, and associated field strengths are within tolerable limits. The tolerable limits may depend on the application, the environment and the system location. Wireless energy transfer for powering or recharging applications may be efficient, highly efficient, or efficient enough, as long as the desired system performance may be attained for the reasonable cost restrictions, weight restrictions, size restrictions, and the like. Efficient energy transfer may be determined relative to that which could be achieved using traditional inductive techniques that are not high-Q systems. Then, the energy transfer may be defined as being efficient, highly efficient, or efficient enough, if more energy is delivered than could be delivered by similarly sized coil structures in traditional inductive schemes over similar distances or alignment offsets.

Note that, even though certain frequency and Q matching conditions may optimize the system efficiency of energy transfer, these conditions may not need to be exactly met in order to have efficient enough energy transfer for a useful energy exchange. Efficient energy exchange may be realized so long as the relative offset of the resonant frequencies $(|\omega_m - \omega_n|/\sqrt{\omega_m \omega_n})$ is less than approximately the maximum among $1/Q_{m(p)}$, $1/Q_{n(p)}$ and $k_{mn(p)}$. The Q matching condition may be less critical than the frequency matching condition for efficient energy exchange. The degree by which the strong-loading factors, $U_{m[l]}$, of the resonators due to generators and/or loads may be away from their optimal values and still have efficient enough energy exchange depends on the particular system, whether all or some of the generators and/or loads are Q-mismatched and so on.

Therefore, the resonant frequencies of the resonators may not be exactly matched, but may be matched within the above tolerances. The strong-loading factors of at least some of the resonators due to generators and/or loads may not be exactly matched to their optimal value. The voltage levels, current levels, impedance values, material parameters, and the like may not be at the exact values described in the disclosure but will be within some acceptable tolerance of those values. The system optimization may include cost, size, weight, complexity, and the like, considerations, in addition to efficiency, Q, frequency, strong coupling factor, and the like, considerations. Some system performance parameters, specifications, and designs may be far from optimal in order to optimize other system performance parameters, specifications and designs.

In some applications, at least some of the system parameters may be varying in time, for example because components, such as sources or devices, may be mobile or aging or because the loads may be variable or because the perturbations or the environmental conditions are changing etc. In these cases, in order to achieve acceptable matching conditions, at least some of the system parameters may need to be dynamically adjustable or tunable. All the system parameters may be dynamically adjustable or tunable to achieve approximately the optimal operating conditions. However, based on the discussion above, efficient enough energy exchange may be realized even if some system parameters are not variable. In some examples, at least some of the devices may not be dynamically adjusted. In some examples, at least some of the sources may not be dynamically adjusted. In some examples, at least some of the intermediate resonators may not be dynamically adjusted. In some examples, none of the system parameters may be dynamically adjusted.

Electromagnetic Resonators

The resonators used to exchange energy may be electromagnetic resonators. In such resonators, the intrinsic energy decay rates, $\Gamma_m$, are given by the absorption (or resistive) losses and the radiation losses of the resonator.

The resonator may be constructed such that the energy stored by the electric field is primarily confined within the structure and that the energy stored by the magnetic field is primarily in the region surrounding the resonator. Then, the energy exchange is mediated primarily by the resonant magnetic near-field. These types of resonators may be referred to as magnetic resonators.

The resonator may be constructed such that the energy stored by the magnetic field is primarily confined within the structure and that the energy stored by the electric field is primarily in the region surrounding the resonator. Then, the energy exchange is mediated primarily by the resonant electric near-field. These types of resonators may be referred to as electric resonators.

Note that the total electric and magnetic energies stored by the resonator have to be equal, but their localizations may be quite different. In some cases, the ratio of the average electric field energy to the average magnetic field energy specified at a distance from a resonator may be used to characterize or describe the resonator.

Electromagnetic resonators may include an inductive element, a distributed inductance, or a combination of inductances with inductance, L, and a capacitive element, a distributed capacitance, or a combination of capacitances, with capacitance, C. A minimal circuit model of an electromagnetic resonator 102 is shown in FIG. 6a. The resonator may include an inductive element 108 and a capacitive element 104. Provided with initial energy, such as electric field energy stored in the capacitor 104, the system will oscillate as the capacitor discharges transferring energy into magnetic field energy stored in the inductor 108 which in turn transfers energy back into electric field energy stored in the capacitor 104.

The resonators 102 shown in FIGS. 6(b)(c)(d) may be referred to as magnetic resonators. Magnetic resonators may be preferred for wireless energy transfer applications in populated environments because most everyday materials including animals, plants, and humans are non-magnetic (i.e., $\mu_r \approx 1$), so their interaction with magnetic fields is minimal and due primarily to eddy currents induced by the time-variation of the magnetic fields, which is a second-order effect. This characteristic is important both for safety reasons and because it reduces the potential for interactions with extraneous environmental objects and materials that could alter system performance.

FIG. 6d shows a simplified drawing of some of the electric and magnetic field lines associated with an exemplary magnetic resonator 102B. The magnetic resonator 102B may include a loop of conductor acting as an inductive element 108 and a capacitive element 104 at the ends of the conductor loop. Note that this drawing depicts most of the energy in the region surrounding the resonator being stored in the magnetic field, and most of the energy in the resonator (between the capacitor plates) stored in the electric field. Some electric field, owing to fringing fields, free charges, and the time varying magnetic field, may be stored in the region around the resonator, but the magnetic resonator may be designed to confine the electric fields to be close to or within the resonator itself, as much as possible.

The inductor 108 and capacitor 104 of an electromagnetic resonator 102 may be bulk circuit elements, or the inductance and capacitance may be distributed and may result from the way the conductors are formed, shaped, or positioned, in the structure. For example, the inductor 108 may be realized by shaping a conductor to enclose a surface area, as shown in FIGS. 6(b)(c)(d). This type of resonator 102 may be referred to as a capacitively-loaded loop inductor. Note that we may use the terms "loop" or "coil" to indicate generally a conducting structure (wire, tube, strip, etc.), enclosing a surface of any shape and dimension, with any number of turns. In FIG. 6b, the enclosed surface area is circular, but the surface may be any of a wide variety of other shapes and sizes and may be designed to achieve certain system performance specifications. As an example to indicate how inductance scales with physical dimensions, the inductance for a length of circular conductor arranged to form a circular single-turn loop is approximately, $$L = \mu_0 x \left( \ln \frac{8x}{a} - 2 \right),$$

where $\mu_0$ is the magnetic permeability of free space, x, is the radius of the enclosed circular surface area and, a, is the radius of the conductor used to form the inductor loop. A more precise value of the inductance of the loop may be calculated analytically or numerically.

The inductance for other cross-section conductors, arranged to form other enclosed surface shapes, areas, sizes, and the like, and of any number of wire turns, may be calculated analytically, numerically or it may be determined by measurement. The inductance may be realized using inductor elements, distributed inductance, networks, arrays, series and parallel combinations of inductors and inductances, and the like. The inductance may be fixed or variable and may be used to vary impedance matching as well as resonant frequency operating conditions.

There are a variety of ways to realize the capacitance required to achieve the desired resonant frequency for a resonator structure. Capacitor plates 110 may be formed and utilized as shown in FIG. 6b, or the capacitance may be distributed and be realized between adjacent windings of a multi-loop conductor 114, as shown in FIG. 6c. The capacitance may be realized using capacitor elements, distributed capacitance, networks, arrays, series and parallel combinations of capacitances, and the like. The capacitance may be fixed or variable and may be used to vary impedance matching as well as resonant frequency operating conditions.

It is to be understood that the inductance and capacitance in an electromagnetic resonator 102 may be lumped, distributed, or a combination of lumped and distributed inductance and capacitance and that electromagnetic resonators may be realized by combinations of the various elements, techniques and effects described herein.

Electromagnetic resonators 102 may be include inductors, inductances, capacitors, capacitances, as well as additional circuit elements such as resistors, diodes, switches, amplifiers, diodes, transistors, transformers, conductors, connectors and the like.

Resonant Frequency of an Electromagnetic Resonator

An electromagnetic resonator 102 may have a characteristic, natural, or resonant frequency determined by its physical properties. This resonant frequency is the frequency at which the energy stored by the resonator oscillates between that stored by the electric field, $W_E$, ($W_E = q^2/2C$, where q is the charge on the capacitor, C) and that stored by the magnetic field, $W_B$, ($W_B = Li^2/2$, where i is the current through the inductor, L) of the resonator. In the absence of any losses in the system, energy would continually be exchanged between the electric field in the capacitor 104 and the magnetic field in the inductor 108. The frequency at which this energy is exchanged may be called the characteristic frequency, the natural frequency, or the resonant frequency of the resonator, and is given by $\omega$, $$\omega = 2\pi f = \sqrt{\frac{1}{LC}}.$$

The resonant frequency of the resonator may be changed by tuning the inductance, L, and/or the capacitance, C, of the resonator. The resonator frequency may be design to operate at the so-called ISM (Industrial, Scientific and Medical) frequencies as specified by the FCC. The resonator frequency may be chosen to meet certain field limit specifications, specific absorption rate (SAR) limit specifications, electromagnetic compatibility (EMC) specifications, electromagnetic interference (EMI) specifications, component size, cost or performance specifications, and the like.

Quality Factor of an Electromagnetic Resonator

Figure 6:
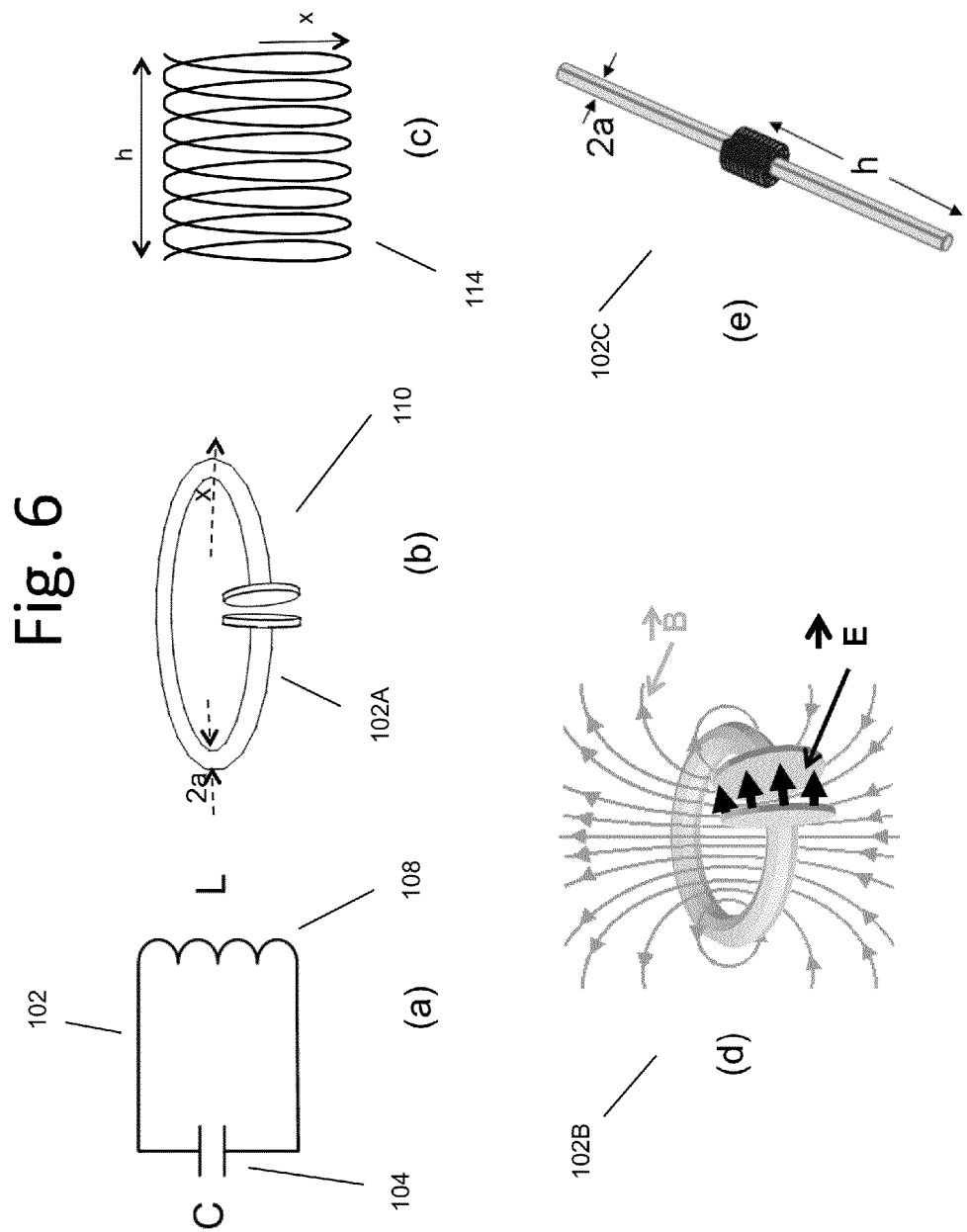
FIG. 6(a) shows a circuit diagram of one example of a resonator (b) shows a diagram of one example of a capacitively-loaded inductor loop magnetic resonator, (c) shows a drawing of a self-resonant coil with distributed capacitance and inductance, (d) shows a simplified drawing of the electric and magnetic field lines associated with an exemplary magnetic resonator of the current disclosure, and (e) shows a diagram of one example of an electric resonator.

The energy in the resonators 102 shown in FIG. 6 may decay or be lost by intrinsic losses including absorptive losses (also called ohmic or resistive losses) and/or radiative losses. The Quality Factor, or Q, of the resonator, which characterizes the energy decay, is inversely proportional to these losses. Absorptive losses may be caused by the finite conductivity of the conductor used to form the inductor as well as by losses in other elements, components, connectors, and the like, in the resonator. An inductor formed from low loss materials may be referred to as a "high-Q inductive element" and elements, components, connectors and the like with low losses may be referred to as having "high resistive Q's". In general, the total absorptive loss for a resonator may be calculated as the appropriate series and/or parallel combination of resistive losses for the various elements and components that make up the resonator. That is, in the absence of any significant radiative or component/connection losses, the Q of the resonator may be given by, $Q_{abs}$, $$Q_{abs} = \frac{\omega L}{R_{abs}},$$

where $\omega$, is the resonant frequency, L, is the total inductance of the resonator and the resistance for the conductor used to form the inductor, for example, may be given by $R_{abs}=l\rho/A$, (l is the length of the wire, $\rho$ is the resistivity of the conductor material, and A is the cross-sectional area over which current flows in the wire). For alternating currents, the cross-sectional area over which current flows may be less than the physical cross-sectional area of the conductor owing to the skin effect. Therefore, high-Q magnetic resonators may be composed of conductors with high conductivity, relatively large surface areas and/or with specially designed profiles (e.g. Litz wire) to minimize proximity effects and reduce the AC resistance.

The magnetic resonator structures may include high-Q inductive elements composed of high conductivity wire, coated wire, Litz wire, ribbon, strapping or plates, tubing, paint, gels, traces, and the like. The magnetic resonators may be self-resonant, or they may include external coupled elements such as capacitors, inductors, switches, diodes, transistors, transformers, and the like. The magnetic resonators may include distributed and lumped capacitance and inductance. In general, the Q of the resonators will be determined by the Q's of all the individual components of the resonator.

Because Q is proportional to inductance, L, resonators may be designed to increase L, within certain other constraints. One way to increase L, for example, is to use more than one turn of the conductor to form the inductor in the resonator. Design techniques and trade-offs may depend on the application, and a wide variety of structures, conductors, components, and resonant frequencies may be chosen in the design of high-Q magnetic resonators.

In the absence of significant absorption losses, the Q of the resonator may be determined primarily by the radiation losses, and given by, $Q_{rad}=\omega L/R_{rad}$, where $R_{rad}$ is the radiative loss of the resonator and may depend on the size of the resonator relative to the frequency, $\omega$, or wavelength, $\lambda$, of operation. For the magnetic resonators discussed above, radiative losses may scale as $R_{rad} \Box (x/\lambda)^4$ (characteristic of magnetic dipole radiation), where x is a characteristic dimension of the resonator, such as the radius of the inductive element shown in FIG. 6b, and where $\lambda=c/f$, where c is the speed of light and f is as defined above. The size of the magnetic resonator may be much less than the wavelength of operation so radiation losses may be very small. Such structures may be referred to as sub-wavelength resonators. Radiation may be a loss mechanism for non-radiative wireless energy transfer systems and designs may be chosen to reduce or minimize $R_{rad}$. Note that a high-$Q_{rad}$ may be desirable for non-radiative wireless energy transfer schemes.

Note too that the design of resonators for non-radiative wireless energy transfer differs from antennas designed for communication or far-field energy transmission purposes. Specifically, capacitively-loaded conductive loops may be used as resonant antennas (for example in cell phones), but those operate in the far-field regime where the radiation Q's are intentionally designed to be small to make the antenna efficient at radiating energy. Such designs are not appropriate for the efficient near-field wireless energy transfer technique disclosed in this application.

Figure 7:
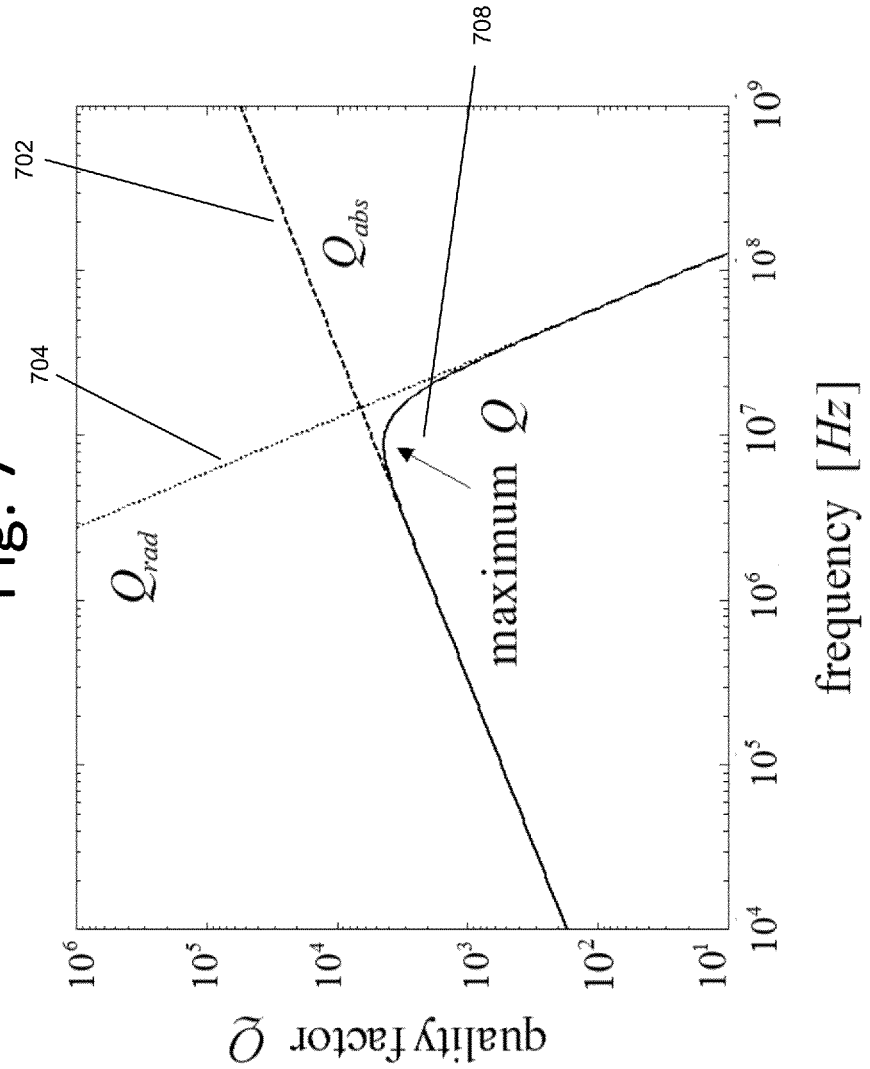
FIG. 7 shows a plot of the "quality factor", Q (solid line), as a function of frequency, of an exemplary resonator that may be used for wireless power transmission at MHz frequencies. The absorptive Q (dashed line) increases with frequency, while the radiative Q (dotted line) decreases with frequency, thus leading the overall Q to peak at a particular frequency.

The quality factor of a resonator including both radiative and absorption losses is $Q=\omega L/(R_{abs}+R_{rad})$. Note that there may be a maximum Q value for a particular resonator and that resonators may be designed with special consideration given to the size of the resonator, the materials and elements used to construct the resonator, the operating frequency, the connection mechanisms, and the like, in order to achieve a high-Q resonator. FIG. 7 shows a plot of Q of an exemplary magnetic resonator (in this case a coil with a diameter of 60 cm made of copper pipe with an outside diameter (OD) of 4 cm) that may be used for wireless power transmission at MHz frequencies. The absorptive Q (dashed line) 702 increases with frequency, while the radiative Q (dotted line) 704 decreases with frequency, thus leading the overall Q to peak 708 at a particular frequency. Note that the Q of this exemplary resonator is greater than 100 over a wide frequency range. Magnetic resonators may be designed to have high-Q over a range of frequencies and system operating frequency may set to any frequency in that range.

When the resonator is being described in terms of loss rates, the Q may be defined using the intrinsic decay rate, $2\Gamma$, as described previously. The intrinsic decay rate is the rate at which an uncoupled and undriven resonator loses energy. For the magnetic resonators described above, the intrinsic loss rate may be given by $\Gamma=(R_{abs}+R_{rad})/2L$, and the quality factor, Q, of the resonator is given by $Q=\omega/2\Gamma$.

Note that a quality factor related only to a specific loss mechanism may be denoted as $Q_{mechanism}$, if the resonator is not specified, or as $Q_{1,mechanism}$, if the resonator is specified (e.g. resonator 1). For example, $Q_{1,rad}$ is the quality factor for resonator 1 related to its radiation losses.

Electromagnetic Resonator Near-Fields

The high-Q electromagnetic resonators used in the near-field wireless energy transfer system disclosed here may be sub-wavelength objects. That is, the physical dimensions of the resonator may be much smaller than the wavelength corresponding to the resonant frequency. Sub-wavelength magnetic resonators may have most of the energy in the region surrounding the resonator stored in their magnetic near-fields, and these fields may also be described as stationary or non-propagating because they do not radiate away from the resonator. The extent of the near-field in the area surrounding the resonator is typically set by the wavelength, so it may extend well beyond the resonator itself for a sub-wavelength resonator. The limiting surface, where the field behavior changes from near-field behavior to far-field behavior may be called the "radiation caustic".

The strength of the near-field is reduced the farther one gets away from the resonator. While the field strength of the resonator near-fields decays away from the resonator, the fields may still interact with objects brought into the general vicinity of the resonator. The degree to which the fields interact depends on a variety of factors, some of which may be controlled and designed, and some of which may not. The wireless energy transfer schemes described herein may be realized when the distance between coupled resonators is such that one resonator lies within the radiation caustic of the other.

The near-field profiles of the electromagnetic resonators may be similar to those commonly associated with dipole resonators or oscillators. Such field profiles may be described as omni-directional, meaning the magnitudes of the fields are non-zero in all directions away from the object.

Characteristic Size of an Electromagnetic Resonator

Spatially separated and/or offset magnetic resonators of sufficient Q may achieve efficient wireless energy transfer over distances that are much larger than have been seen in the prior art, even if the sizes and shapes of the resonator structures are different. Such resonators may also be operated to achieve more efficient energy transfer than was achievable with previous techniques over shorter range distances. We describe such resonators as being capable of mid-range energy transfer.

Mid-range distances may be defined as distances that are larger than the characteristic dimension of the smallest of the resonators involved in the transfer, where the distance is measured from the center of one resonator structure to the center of a spatially separated second resonator structure. In this definition, two-dimensional resonators are spatially separated when the areas circumscribed by their inductive elements do not intersect and three-dimensional resonators are spatially separated when their volumes do not intersect. A two-dimensional resonator is spatially separated from a three-dimensional resonator when the area circumscribed by the former is outside the volume of the latter.

Figure 8:
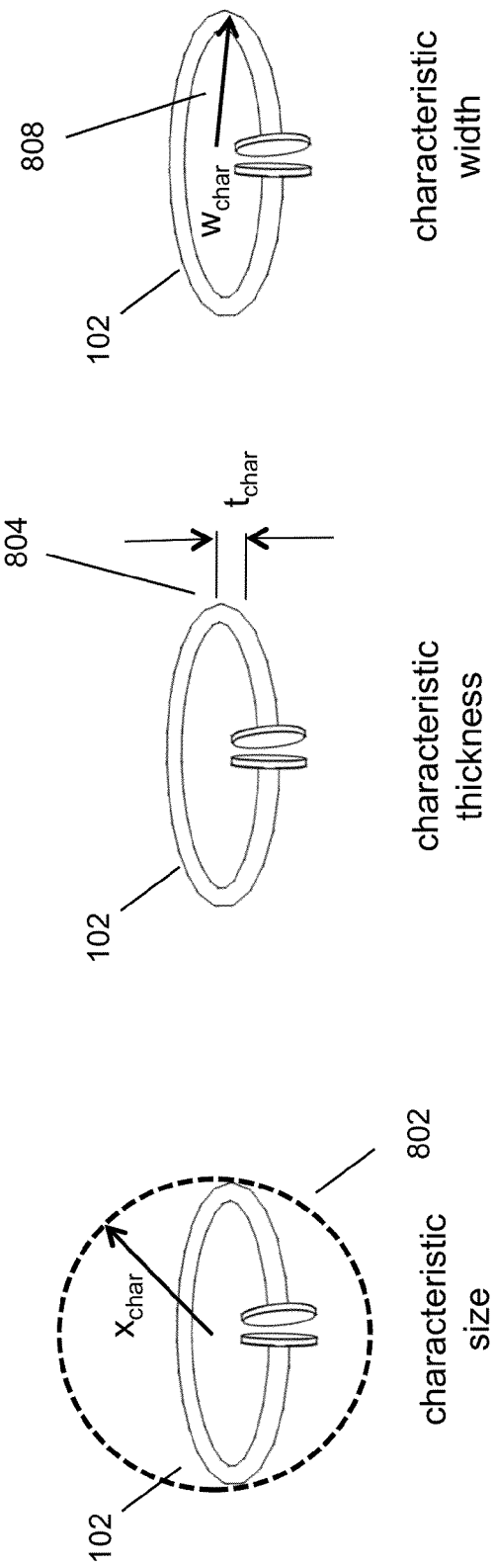
FIG. 8 shows a drawing of a resonator structure with its characteristic size, thickness and width indicated.

FIG. 8 shows some example resonators with their characteristic dimensions labeled. It is to be understood that the characteristic sizes 802 of resonators 102 may be defined in terms of the size of the conductor and the area circumscribed or enclosed by the inductive element in a magnetic resonator and the length of the conductor forming the capacitive element of an electric resonator. Then, the characteristic size 802 of a resonator 102, $x_{char}$, may be equal to the radius of the smallest sphere that can fit around the inductive or capacitive element of the magnetic or electric resonator respectively, and the center of the resonator structure is the center of the sphere. The characteristic thickness 804, $t_{char}$, of a resonator 102 may be the smallest possible height of the highest point of the inductive or capacitive element in the magnetic or capacitive resonator respectively, measured from a flat surface on which it is placed. The characteristic width 808 of a resonator 102, $w_{char}$, may be the radius of the smallest possible circle through which the inductive or capacitive element of the magnetic or electric resonator respectively, may pass while traveling in a straight line. For example, the characteristic width 808 of a cylindrical resonator may be the radius of the cylinder.

In this inventive wireless energy transfer technique, energy may be exchanged efficiently over a wide range of distances, but the technique is distinguished by the ability to exchange useful energy for powering or recharging devices over mid-range distances and between resonators with different physical dimensions, components and orientations. Note that while k may be small in these circumstances, strong coupling and efficient energy transfer may be realized by using high-Q resonators to achieve a high U, $U=k\sqrt{Q_sQ_d}$. That is, increases in Q may be used to at least partially overcome decreases in k, to maintain useful energy transfer efficiencies.

Note too that while the near-field of a single resonator may be described as omni-directional, the efficiency of the energy exchange between two resonators may depend on the relative position and orientation of the resonators. That is, the efficiency of the energy exchange may be maximized for particular relative orientations of the resonators. The sensitivity of the transfer efficiency to the relative position and orientation of two uncompensated resonators may be captured in the calculation of either k or κ. While coupling may be achieved between resonators that are offset and/or rotated relative to each other, the efficiency of the exchange may depend on the details of the positioning and on any feedback, tuning, and compensation techniques implemented during operation.

High-Q Magnetic Resonators

In the near-field regime of a sub-wavelength capacitively-loaded loop magnetic resonator ($x<<\lambda$), the resistances associated with a circular conducting loop inductor composed of N turns of wire whose radius is larger than the skin depth, are approximately $R_{abs}=\sqrt{\mu_o\rho\omega/2}\cdot Nx/a$ and $R_{rad}=\pi/6\cdot\eta_oN^2(\omega x/c)^4$, where ρ is the resistivity of the conductor material and $\eta_o\approx120\pi\Omega$ is the impedance of free space. The inductance, L, for such a N-turn loop is approximately $N^2$ times the inductance of a single-turn loop given previously. The quality factor of such a resonator, $Q=\omega L/(R_{abs}+R_{rad})$, is highest for a particular frequency determined by the system parameters (FIG. 4). As described previously, at lower frequencies the Q is determined primarily by absorption losses and at higher frequencies the Q is determined primarily by radiation losses.

Note that the formulas given above are approximate and intended to illustrate the functional dependence of $R_{abs}$, $R_{rad}$ and L on the physical parameters of the structure. More accurate numerical calculations of these parameters that take into account deviations from the strict quasi-static limit, for example a non-uniform current/charge distribution along the conductor, may be useful for the precise design of a resonator structure.

Note that the absorptive losses may be minimized by using low loss conductors to form the inductive elements. The loss of the conductors may be minimized by using large surface area conductors such as conductive tubing, strapping, strips, machined objects, plates, and the like, by using specially designed conductors such as Litz wire, braided wires, wires of any cross-section, and other conductors with low proximity losses, in which case the frequency scaled behavior described above may be different, and by using low resistivity materials such as high-purity copper and silver, for example. One advantage of using conductive tubing as the conductor at higher operating frequencies is that it may be cheaper and lighter than a similar diameter solid conductor, and may have similar resistance because most of the current is traveling along the outer surface of the conductor owing to the skin effect.

To get a rough estimate of achievable resonator designs made from copper wire or copper tubing and appropriate for operation in the microwave regime, one may calculate the optimum Q and resonant frequency for a resonator composed of one circular inductive element (N=1) of copper wire ($\rho=1.69\cdot10^{-8}$ Ωm) with various cross sections. Then for an inductive element with characteristic size x=1 cm and conductor diameter a=1 mm, appropriate for a cell phone for example, the quality factor peaks at Q=1225 when f=380 MHz. For x=30 cm and a=2 mm, an inductive element size that might be appropriate for a laptop or a household robot, Q=1103 at f=17 MHz. For a larger source inductive element that might be located in the ceiling for example, x=1 m and a=4 mm, Q may be as high as Q=1315 at f=5 MHz. Note that a number of practical examples yield expected quality factors of Q≈1000-1500 at $\lambda/x\approx50-80$. Measurements of a wider variety of coil shapes, sizes, materials and operating frequencies than described above show that Q's>100 may be realized for a variety of magnetic resonator structures using commonly available materials.

As described above, the rate for energy transfer between two resonators of characteristic size $x_1$ and $x_2$, and separated by a distance D between their centers, may be given by κ. To give an example of how the defined parameters scale, consider the cell phone, laptop, and ceiling resonator examples from above, at three (3) distances; D/x=10, 8, 6. In the examples considered here, the source and device resonators are the same size, $x_1=x_2$, and shape, and are oriented as shown in FIG. 1(b). In the cell phone example, ω/2κ=3033, 1553, 655 respectively. In the laptop example, ω/2κ=7131, 3651, 1540 respectively and for the ceiling resonator example, $\omega/2\kappa$=6481, 3318, 1400. The corresponding coupling-to-loss ratios peak at the frequency where the inductive element Q peaks and are $\kappa/\Gamma$=0.4, 0.79, 1.97 and 0.15, 0.3, 0.72 and 0.2, 0.4, 0.94 for the three inductive element sizes and distances described above. An example using different sized inductive elements is that of an $x_1$=1 m inductor (e.g. source in the ceiling) and an $x_2$=30 cm inductor (e.g. household robot on the floor) at a distance D=3 m apart (e.g. room height). In this example, the strong-coupling figure of merit, U=$\kappa/\sqrt{\Gamma_1\Gamma_2}$=0.88, for an efficiency of approximately 14%, at the optimal operating frequency of f=6.4 MHz. Here, the optimal system operating frequency lies between the peaks of the individual resonator Q's.

Figure 9:
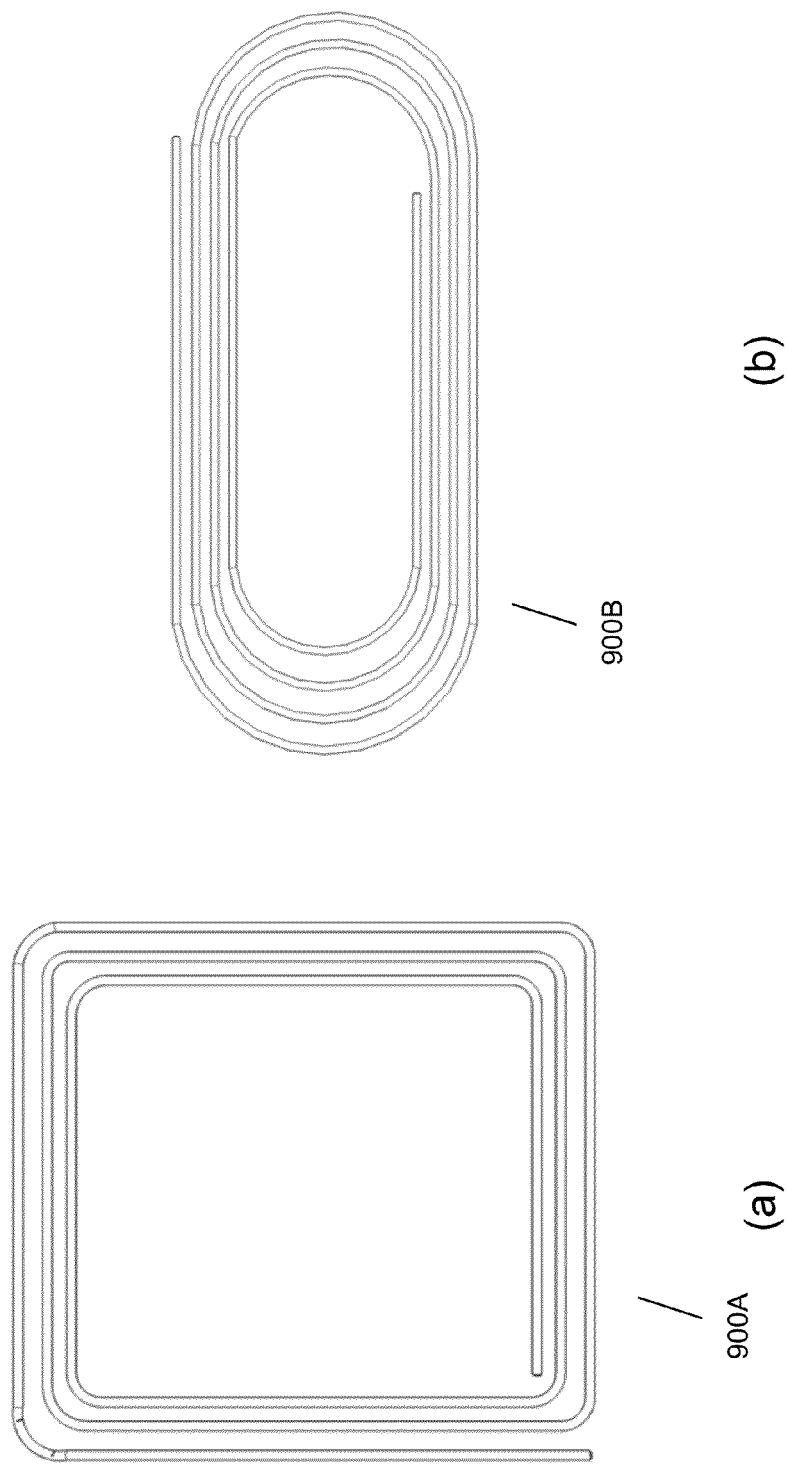
FIG. 9(a) and (b) show drawings of exemplary inductive loop elements.

Inductive elements may be formed for use in high-Q magnetic resonators. We have demonstrated a variety of high-Q magnetic resonators based on copper conductors that are formed into inductive elements that enclose a surface. Inductive elements may be formed using a variety of conductors arranged in a variety of shapes, enclosing any size or shaped area, and they may be single turn or multiple turn elements. Drawings of exemplary inductive elements 900A-B are shown in FIG. 9. The inductive elements may be formed to enclose a circle, a rectangle, a square, a triangle, a shape with rounded corners, a shape that follows the contour of a particular structure or device, a shape that follows, fills, or utilizes, a dedicated space within a structure or device, and the like. The designs may be optimized for size, cost, weight, appearance, performance, and the like.

These conductors may be bent or formed into the desired size, shape, and number of turns. However, it may be difficult to accurately reproduce conductor shapes and sizes using manual techniques. In addition, it may be difficult to maintain uniform or desired center-to-center spacings between the conductor segments in adjacent turns of the inductive elements. Accurate or uniform spacing may be important in determining the self capacitance of the structure as well as any proximity effect induced increases in AC resistance, for example.

Molds may be used to replicate inductor elements for high-Q resonator designs. In addition, molds may be used to accurately shape conductors into any kind of shape without creating kinks, buckles or other potentially deleterious effects in the conductor. Molds may be used to form the inductor elements and then the inductor elements may be removed from the forms. Once removed, these inductive elements may be built into enclosures or devices that may house the high-Q magnetic resonator. The formed elements may also or instead remain in the mold used to form them.

The molds may be formed using standard CNC (computer numerical control) routing or milling tools or any other known techniques for cutting or forming grooves in blocks. The molds may also or instead be formed using machining techniques, injection molding techniques, casting techniques, pouring techniques, vacuum techniques, thermoforming techniques, cut-in-place techniques, compression forming techniques and the like.

The formed element may be removed from the mold or it may remain in the mold. The mold may be altered with the inductive element inside. The mold may be covered, machined, attached, painted and the like. The mold and conductor combination may be integrated into another housing, structure or device. The grooves cut into the molds may be any dimension and may be designed to form conducting tubing, wire, strapping, strips, blocks, and the like into the desired inductor shapes and sizes.

The inductive elements used in magnetic resonators may contain more than one loop and may spiral inward or outward or up or down or in some combination of directions. In general, the magnetic resonators may have a variety of shapes, sizes and number of turns and they may be composed of a variety of conducing materials.

The magnetic resonators may be free standing or they may be enclosed in an enclosure, container, sleeve or housing. The magnetic resonators may include the form used to make the inductive element. These various forms and enclosures may be composed of almost any kind of material. Low loss materials such as Teflon, REXOLITE, styrene, and the like may be preferable for some applications. These enclosures may contain fixtures that hold the inductive elements.

Magnetic resonators may be composed of self-resonant coils of copper wire or copper tubing. Magnetic resonators composed of self resonant conductive wire coils may include a wire of length l, and cross section radius a, wound into a helical coil of radius x, height h, and number of turns N, which may for example be characterized as $N=\sqrt{l^2-h^2}/2\pi x$.

A magnetic resonator structure may be configured so that x is about 30 cm, h is about 20 cm, a is about 3 mm and N is about 5.25, and, during operation, a power source coupled to the magnetic resonator may drive the resonator at a resonant frequency, f, where f is about 10.6 MHz. Where x is about 30 cm, h is about 20 cm, a is about 1 cm and N is about 4, the resonator may be driven at a frequency, f, where f is about 13.4 MHz. Where x is about 10 cm, h is about 3 cm, a is about 2 mm and N is about 6, the resonator may be driven at a frequency, f, where f is about 21.4 MHz.

High-Q inductive elements may be designed using printed circuit board traces. Printed circuit board traces may have a variety of advantages compared to mechanically formed inductive elements including that they may be accurately reproduced and easily integrated using established printed circuit board fabrication techniques, that their AC resistance may be lowered using custom designed conductor traces, and that the cost of mass-producing them may be significantly reduced.

High-Q inductive elements may be fabricated using standard PCB techniques on any PCB material such as FR-4 (epoxy E-glass), multi-functional epoxy, high performance epoxy, bismalaimide triazine/epoxy, polyimide, Cyanate Ester, polytetraflouroethylene (Teflon), FR-2, FR-3, CEM-1, CEM-2, Rogers, Resolute, and the like. The conductor traces may be formed on printed circuit board materials with lower loss tangents.

The conducting traces may be composed of copper, silver, gold, aluminum, nickel and the like, and they may be composed of paints, inks, or other cured materials. The circuit board may be flexible and it may be a flex-circuit. The conducting traces may be formed by chemical deposition, etching, lithography, spray deposition, cutting, and the like. The conducting traces may be applied to form the desired patterns and they may be formed using crystal and structure growth techniques.

The dimensions of the conducting traces, as well as the number of layers containing conducting traces, the position, size and shape of those traces and the architecture for interconnecting them may be designed to achieve or optimize certain system specifications such as resonator Q, $Q_{(p)}$, resonator size, resonator material and fabrication costs, U, $U_{(p)}$, and the like.

As an example, a three-turn high-Q inductive element 1001A was fabricated on a four-layer printed circuit board using the rectangular copper trace pattern as shown in FIG.

10(*a*). The copper trace is shown in black and the PCB in white. The width and thickness of the copper traces in this example was approximately 1 cm (400 mils) and 43 µm (1.7 mils) respectively. The edge-to-edge spacing between turns of the conducting trace on a single layer was approximately 0.75 cm (300 mils) and each board layer thickness was approximately 100 µm (4 mils). The pattern shown in FIG. 10(*a*) was repeated on each layer of the board and the conductors were connected in parallel. The outer dimensions of the 3-loop structure were approximately 30 cm by 20 cm. The measured inductance of this PCB loop was 5.3 µH. A magnetic resonator using this inductor element and tunable capacitors had a quality factor, Q, of 550 at its designed resonance frequency of 6.78 MHz. The resonant frequency could be tuned by changing the inductance and capacitance values in the magnetic resonator.

Figure 10:
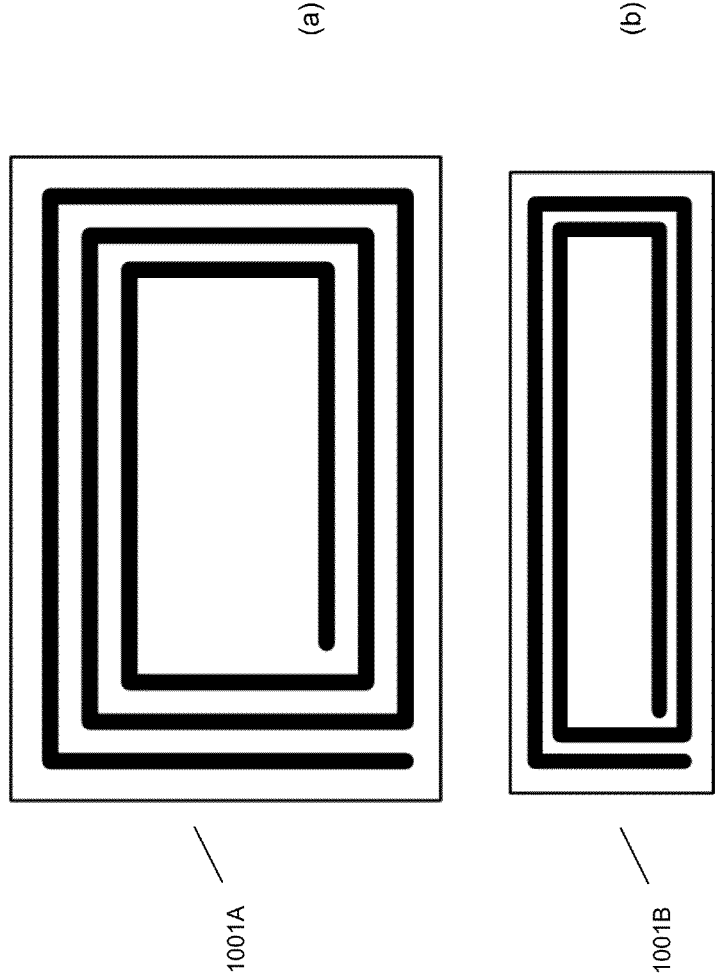
FIG. 10(a) and (b) show two examples of trace structures formed on printed circuit boards and used to realize the inductive element in magnetic resonator structures.

As another example, a two-turn inductor 1001B was fabricated on a four-layer printed circuit board using the rectangular copper trace pattern shown in FIG. 10(*b*). The copper trace is shown in black and the PCB in white. The width and height of the copper traces in this example were approximately 0.75 cm (300 mils) and 43 µm (1.7 mils) respectively. The edge-to-edge spacing between turns of the conducting trace on a single layer was approximately 0.635 cm (250 mils) and each board layer thickness was approximately 100 µm (4 mils). The pattern shown in FIG. 10(*b*) was repeated on each layer of the board and the conductors were connected in parallel. The outer dimensions of the two-loop structure were approximately 7.62 cm by 26.7 cm. The measured inductance of this PCB loop was 1.3 µH. Stacking two boards together with a vertical separation of approximately 0.635 cm (250 mils) and connecting the two boards in series produced a PCB inductor with an inductance of approximately 3.4 µH. A magnetic resonator using this stacked inductor loop and tunable capacitors had a quality factor, Q, of 390 at its designed resonance frequency of 6.78 MHz. The resonant frequency could be tuned by changing the inductance and capacitance values in the magnetic resonator.

The inductive elements may be formed using magnetic materials of any size, shape thickness, and the like, and of materials with a wide range of permeability and loss values. These magnetic materials may be solid blocks, they may enclose hollow volumes, they may be formed from many smaller pieces of magnetic material tiled and or stacked together, and they may be integrated with conducting sheets or enclosures made from highly conducting materials. Wires may be wrapped around the magnetic materials to generate the magnetic near-field. These wires may be wrapped around one or more than one axis of the structure. Multiple wires may be wrapped around the magnetic materials and combined in parallel, or in series, or via a switch to form customized near-field patterns.

The magnetic resonator may include 15 turns of Litz wire wound around a 19.2 cm×10 cm×5 mm tiled block of 3F3 ferrite material. The Litz wire may be wound around the ferrite material in any direction or combination of directions to achieve the desire resonator performance. The number of turns of wire, the spacing between the turns, the type of wire, the size and shape of the magnetic materials and the type of magnetic material are all design parameters that may be varied or optimized for different application scenarios.

High-Q Magnetic Resonators Using Magnetic Material Structures

It may be possible to use magnetic materials assembled to form an open magnetic circuit, albeit one with an air gap on the order of the size of the whole structure, to realize a magnetic resonator structure. In these structures, high conductivity materials are wound around a structure made from magnetic material to form the inductive element of the magnetic resonator. Capacitive elements may be connected to the high conductivity materials, with the resonant frequency then determined as described above. These magnetic resonators have their dipole moment in the plane of the two dimensional resonator structures, rather than perpendicular to it, as is the case for the capacitively-loaded inductor loop resonators.

Figure 11:
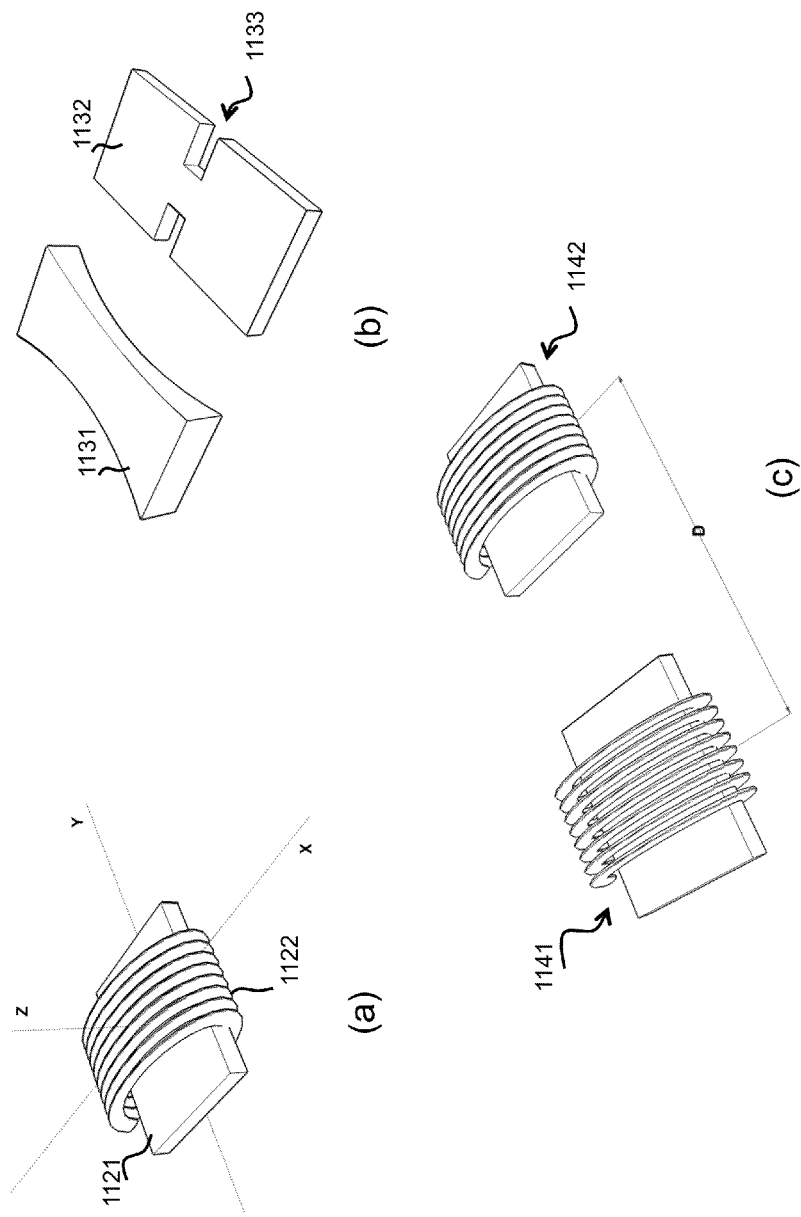
FIG. 11(a) shows a perspective view diagram of a planar magnetic resonator, (b) shows a perspective view diagram of a two planar magnetic resonator with various geometries, and c) shows is a perspective view diagram of a two planar magnetic resonators separated by a distance D.

A diagram of a single planar resonator structure is shown in FIG. 11(*a*). The planar resonator structure is constructed of a core of magnetic material 1121, such as ferrite with a loop or loops of conducting material 1122 wrapped around the core 1121. The structure may be used as the source resonator that transfers power and the device resonator that captures energy. When used as a source, the ends of the conductor may be coupled to a power source. Alternating electrical current flowing through the conductor loops excites alternating magnetic fields. When the structure is being used to receive power, the ends of the conductor may be coupled to a power drain or load. Changing magnetic fields induce an electromotive force in the loop or loops of the conductor wound around the core magnetic material. The dipole moment of these types of structures is in the plane of the structures and is, for example, directed along the Y axis for the structure in FIG. 11(*a*). Two such structures have strong coupling when placed substantially in the same plane (i.e. the X,Y plane of FIG. 11). The structures of FIG. 11(*a*) have the most favorable orientation when the resonators are aligned in the same plane along their Y axis.

The geometry and the coupling orientations of the described planar resonators may be preferable for some applications. The planar or flat resonator shape may be easier to integrate into many electronic devices that are relatively flat and planar. The planar resonators may be integrated into the whole back or side of a device without requiring a change in geometry of the device. Due to the flat shape of many devices, the natural position of the devices when placed on a surface is to lay with their largest dimension being parallel to the surface they are placed on. A planar resonator integrated into a flat device is naturally parallel to the plane of the surface and is in a favorable coupling orientation relative to the resonators of other devices or planar resonator sources placed on a flat surface.

As mentioned, the geometry of the planar resonators may allow easier integration into devices. Their low profile may allow a resonator to be integrated into or as part of a complete side of a device. When a whole side of a device is covered by the resonator, magnetic flux can flow through the resonator core without being obstructed by lossy material that may be part of the device or device circuitry.

The core of the planar resonator structure may be of a variety of shapes and thicknesses and may be flat or planar such that the minimum dimension does not exceed 30% of the largest dimension of the structure. The core may have complex geometries and may have indentations, notches, ridges, and the like. Geometric enhancements may be used to reduce the coupling dependence on orientation and they may be used to facilitate integration into devices, packaging, packages, enclosures, covers, skins, and the like. Two exemplary variations of core geometries are shown in FIG. 11(*b*). For example, the planar core 1131 may be shaped such that the ends are substantially wider than the middle of the structure to create an indentation for the conductor winding. The core material may be of varying thickness with ends that are thicker and wider than the middle. The core material 1132 may have any number of notches or cutouts 1133 of various depths, width, and shapes to accommodate conductor loops, housing, packaging, and the like.

The shape and dimensions of the core may be further dictated by the dimensions and characteristics of the device that they are integrated into. The core material may curve to follow the contours of the device, or may require non-symmetric notches or cutouts to allow clearance for parts of the device. The core structure may be a single monolithic piece of magnetic material or may be composed of a plurality of tiles, blocks, or pieces that are arranged together to form the larger structure. The different layers, tiles, blocks, or pieces of the structure may be of similar or may be of different materials. It may be desirable to use materials with different magnetic permeability in different locations of the structure. Core structures with different magnetic permeability may be useful for guiding the magnetic flux, improving coupling, and affecting the shape or extent of the active area of a system.

The conductor of the planar resonator structure may be wound at least once around the core. In certain circumstances, it may be preferred to wind at least three loops. The conductor can be any good conductor including conducting wire, Litz wire, conducting tubing, sheets, strips, gels, inks, traces and the like.

The size, shape, or dimensions of the active area of source may be further enhanced, altered, or modified with the use of materials that block, shield, or guide magnetic fields. To create non-symmetric active area around a source once side of the source may be covered with a magnetic shield to reduce the strength of the magnetic fields in a specific direction. The shield may be a conductor or a layered combination of conductor and magnetic material which can be used to guide magnetic fields away from a specific direction. Structures composed of layers of conductors and magnetic materials may be used to reduce energy losses that may occur due to shielding of the source.

Figure 12:
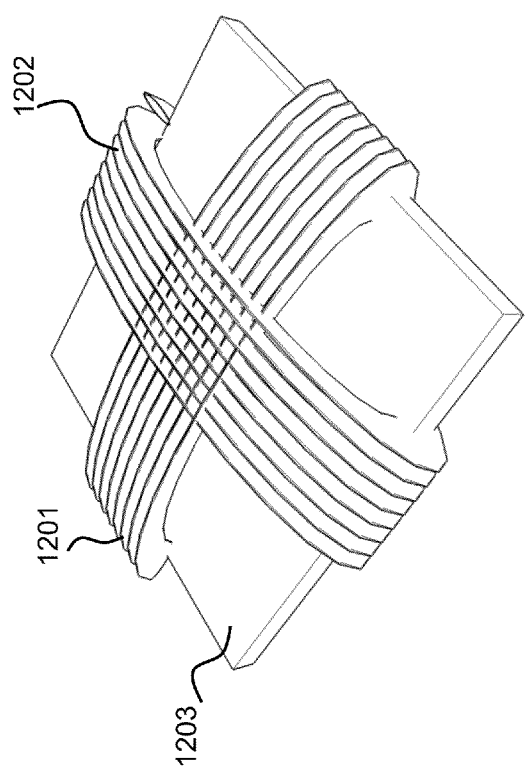
FIG. 12 is a perspective view of an example of a planar magnetic resonator.

The plurality of planar resonators may be integrated or combined into one planar resonator structure. A conductor or conductors may be wound around a core structure such that the loops formed by the two conductors are not coaxial. An example of such a structure is shown in FIG. 12 where two conductors 1201,1202 are wrapped around a planar rectangular core 1203 at orthogonal angles. The core may be rectangular or it may have various geometries with several extensions or protrusions. The protrusions may be useful for wrapping of a conductor, reducing the weight, size, or mass of the core, or may be used to enhance the directionality or omni-directionality of the resonator. A multi wrapped planar resonator with four protrusions is shown by the inner structure 1310 in FIG. 13, where four conductors 1301, 1302, 1303, 1304 are wrapped around the core. The core may have extensions 1305,1306,1307,1308 with one or more conductor loops. A single conductor may be wrapped around a core to form loops that are not coaxial. The four conductor loops of FIG. 13, for example, may be formed with one continuous piece of conductor, or using two conductors where a single conductor is used to make all coaxial loops.

Non-uniform or asymmetric field profiles around the resonator comprising a plurality of conductor loops may be generated by driving some conductor loops with non-identical parameters. Some conductor loops of a source resonator with a plurality of conductor loops may be driven by a power source with a different frequency, voltage, power level, duty cycle, and the like all of which may be used to affect the strength of the magnetic field generated by each conductor.

Figure 13:
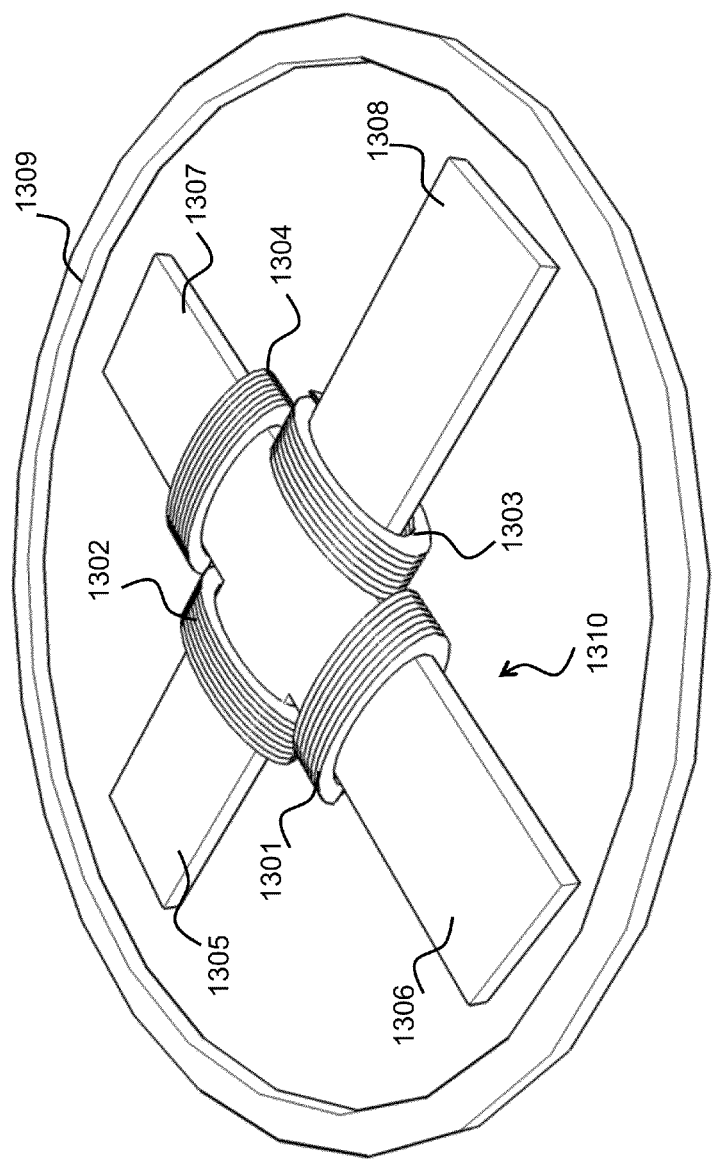
FIG. 13 is a perspective view of a planar magnetic resonator arrangement with a circular resonator coil.

The planar resonator structures may be combined with a capacitively-loaded inductor resonator coil to provide an omni-directional active area all around, including above and below the source while maintaining a flat resonator structure. As shown in FIG. 13, an additional resonator loop coil 1309 comprising of a loop or loops of a conductor, may be placed in a common plane as the planar resonator structure 1310. The outer resonator coil provides an active area that is substantially above and below the source. The resonator coil can be arranged with any number of planar resonator structures and arrangements described herein.

Figure 14:
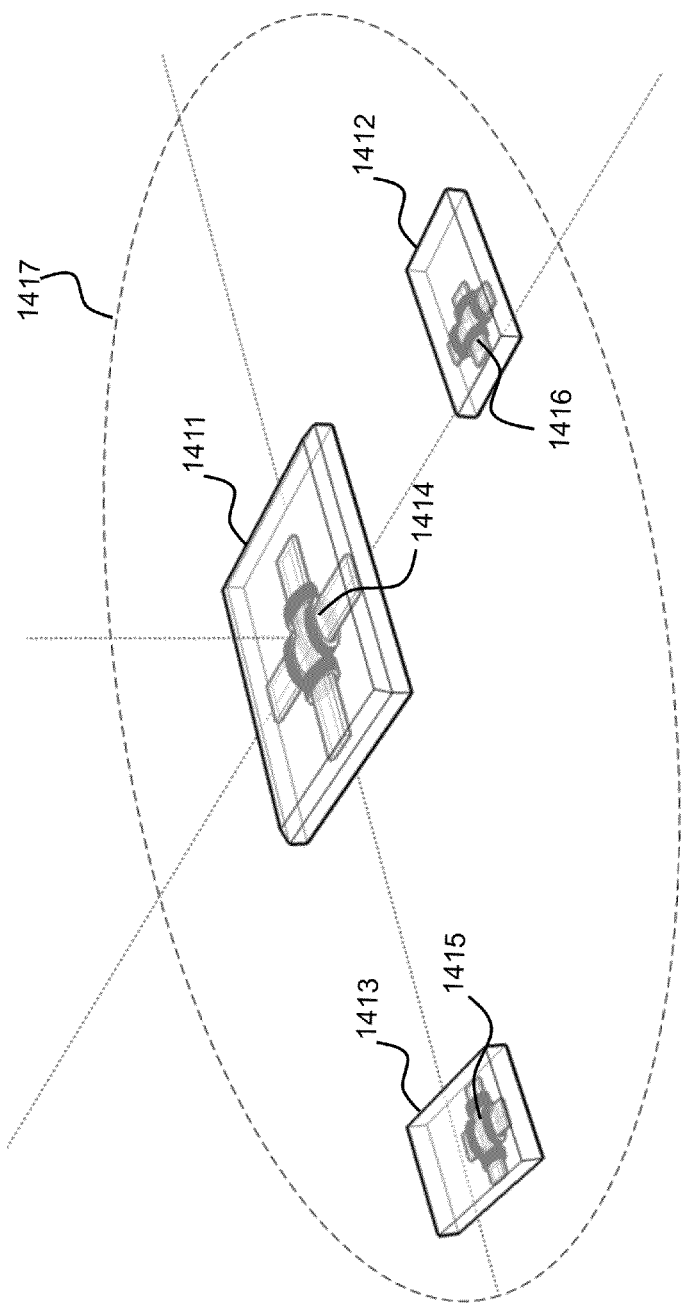
FIG. 14 is a perspective view of an active area of a planar magnetic resonator.

The planar resonator structures may be enclosed in magnetically permeable packaging or integrated into other devices. The planar profile of the resonators within a single, common plane allows packaging and integration into flat devices. A diagram illustrating the application of the resonators is shown in FIG. 14. A flat source 1411 comprising one or more planar resonators 1414 each with one or more conductor loops may transfer power to devices 1412,1413 that are integrated with other planar resonators 1415,1416 and placed within an active area 1417 of the source. The devices may comprise a plurality of planar resonators such that regardless of the orientation of the device with respect to the source the active area of the source does not change. In addition to invariance to rotational misalignment, a flat device comprising of planar resonators may be turned upside down without substantially affecting the active area since the planar resonator is still in the plane of the source.

Figure 15:
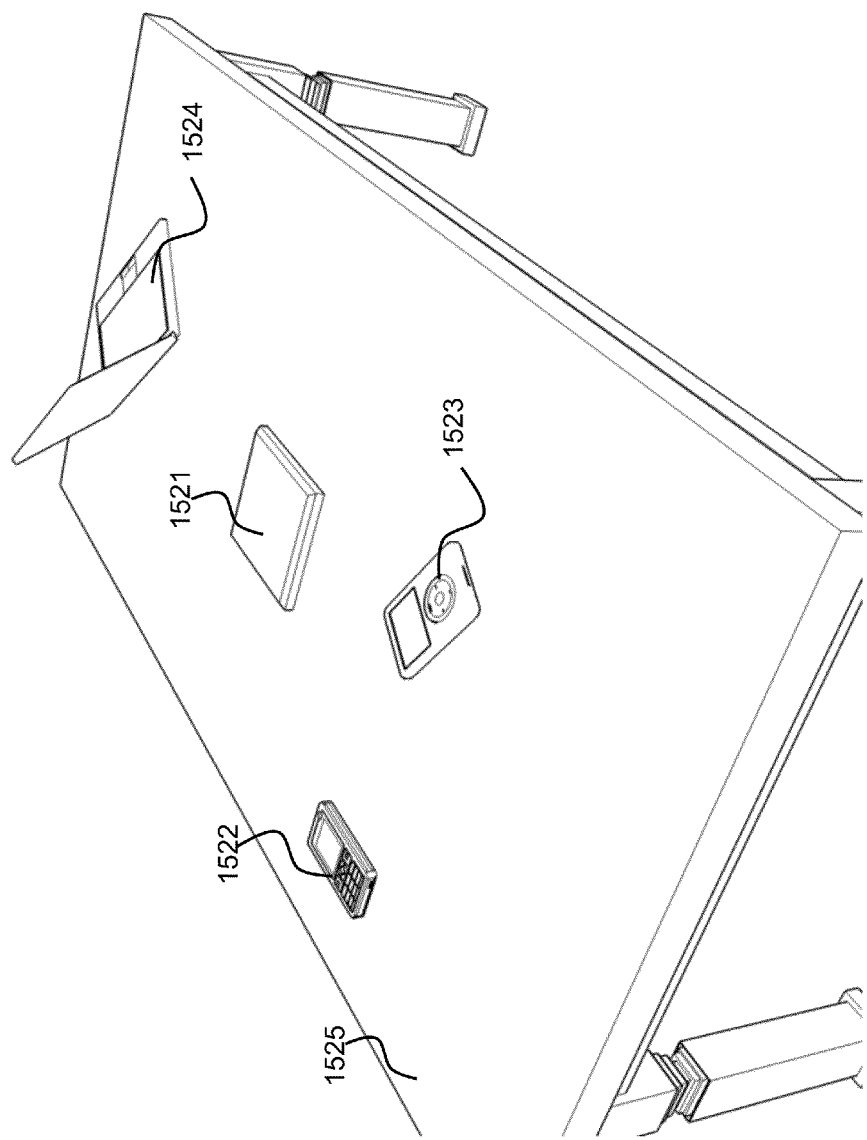
FIG. 15 is a perspective view of an application of the wireless power transfer system with a source at the center of a table powering several devices placed around the source.

Another diagram illustrating a possible use of a power transfer system using the planar resonator structures is shown in FIG. 15. A planar source 1521 placed on top of a surface 1525 may create an active area that covers a substantial surface area creating an "energized surface" area. Devices such as computers 1524, mobile handsets 1522, games, and other electronics 1523 that are coupled to their respective planar device resonators may receive energy from the source when placed within the active area of the source, which may be anywhere on top of the surface. Several devices with different dimensions may be placed in the active area and used normally while charging or being powered from the source without having strict placement or alignment constraints. The source may be placed under the surface of a table, countertop, desk, cabinet, and the like, allowing it to be completely hidden while energizing the top surface of the table, countertop, desk, cabinet and the like, creating an active area on the surface that is much larger than the source.

The source may include a display or other visual, auditory, or vibration indicators to show the direction of charging devices or what devices are being charged, error or problems with charging, power levels, charging time, and the like.

The source resonators and circuitry may be integrated into any number of other devices. The source may be integrated into devices such as clocks, keyboards, monitors, picture frames, and the like. For example, a keyboard integrated with the planar resonators and appropriate power and control circuitry may be used as a source for devices placed around the keyboard such as computer mice, webcams, mobile handsets, and the like without occupying any additional desk space.

While the planar resonator structures have been described in the context of mobile devices it should be clear to those skilled in the art that a flat planar source for wireless power transfer with an active area that extends beyond its physical dimensions has many other consumer and industrial applications. The structures and configuration may be useful for a large number of applications where electronic or electric devices and a power source are typically located, positioned, or manipulated in substantially the same plane and alignment. Some of the possible application scenarios include devices on walls, floor, ceilings or any other substantially planar surfaces.

Flat source resonators may be integrated into a picture frame or hung on a wall thereby providing an active area within the plane of the wall where other electronic devices such as digital picture frames, televisions, lights, and the like can be mounted and powered without wires. Planar resonators may be integrated into a floor resulting in an energized floor or active area on the floor on which devices can be placed to receive power. Audio speakers, lamps, heaters, and the like can be placed within the active are and receive power wirelessly.

The planar resonator may have additional components coupled to the conductor. Components such as capacitors, inductors, resistors, diodes, and the like may be coupled to the conductor and may be used to adjust or tune the resonant frequency and the impedance matching for the resonators.

A planar resonator structure of the type described above and shown in FIG. 11(*a*), may be created, for example, with a quality factor, Q, of 100 or higher and even Q of 1,000 or higher. Energy may be wirelessly transferred from one planar resonator structure to another over a distance larger than the characteristic size of the resonators, as shown in FIG. 11(*c*).

Figure 16:
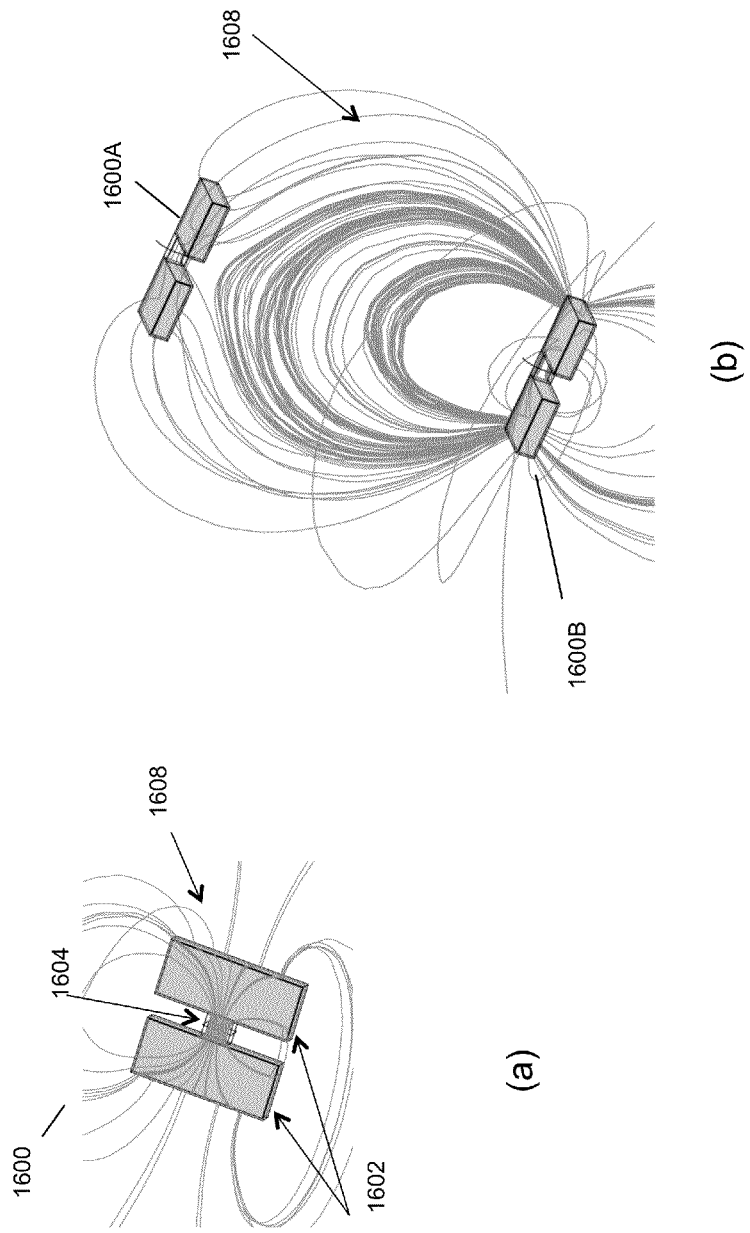
FIG. 16(a) shows a 3D finite element model of a copper and magnetic material structure driven by a square loop of current around the choke point at its center. In this example, a structure may be composed of two boxes made of a conducting material such as copper, covered by a layer of magnetic material, and connected by a block of magnetic material. The inside of the two conducting boxes in this example would be shielded from AC electromagnetic fields generated outside the boxes and may house lossy objects that might lower the Q of the resonator or sensitive components that might be adversely affected by the AC electromagnetic fields. Also shown are the calculated magnetic field streamlines generated by this structure, indicating that the magnetic field lines tend to follow the lower reluctance path in the magnetic material.
FIG. 16(b) shows interaction, as indicated by the calculated magnetic field streamlines, between two identical structures as shown in (a). Because of symmetry, and to reduce computational complexity, only one half of the system is modeled (but the computation assumes the symmetrical arrangement of the other half).

In addition to utilizing magnetic materials to realize a structure with properties similar to the inductive element in the magnetic resonators, it may be possible to use a combination of good conductor materials and magnetic material to realize such inductive structures. FIG. 16(*a*) shows a magnetic resonator structure 1602 that may include one or more enclosures made of high-conductivity materials (the inside of which would be shielded from AC electromagnetic fields generated outside) surrounded by at least one layer of magnetic material and linked by blocks of magnetic material 1604.

A structure may include a high-conductivity sheet of material covered on one side by a layer of magnetic material. The layered structure may instead be applied conformally to an electronic device, so that parts of the device may be covered by the high-conductivity and magnetic material layers, while other parts that need to be easily accessed (such as buttons or screens) may be left uncovered. The structure may also or instead include only layers or bulk pieces of magnetic material. Thus, a magnetic resonator may be incorporated into an existing device without significantly interfering with its existing functions and with little or no need for extensive redesign. Moreover, the layers of good conductor and/or magnetic material may be made thin enough (of the order of a millimeter or less) that they would add little extra weight and volume to the completed device. An oscillating current applied to a length of conductor wound around the structure, as shown by the square loop in the center of the structure in FIG. 16 may be used to excite the electromagnetic fields associated with this structure.

Quality Factor of the Structure

A structure of the type described above may be created with a quality factor, Q, of the order of 1,000 or higher. This high-Q is possible even if the losses in the magnetic material are high, if the fraction of magnetic energy within the magnetic material is small compared to the total magnetic energy associated with the object. For structures composed of layers conducting materials and magnetic materials, the losses in the conducting materials may be reduced by the presence of the magnetic materials as described previously. In structures where the magnetic material layer's thickness is of the order of 1/100 of the largest dimension of the system (e.g., the magnetic material may be of the order of 1 mm thick, while the area of the structure is of the order of 10 cm×10 cm), and the relative permeability is of the order of 1,000, it is possible to make the fraction of magnetic energy contained within the magnetic material only a few hundredths of the total magnetic energy associated with the object or resonator. To see how that comes about, note that the expression for the magnetic energy contained in a volume is $U_m = \int_V dr B(r)^2/(2\mu_r\mu_0)$, so as long as B (rather than H) is the main field conserved across the magnetic material-air interface (which is typically the case in open magnetic circuits), the fraction of magnetic energy contained in the high-$\mu_r$ region may be significantly reduced compared to what it is in air.

If the fraction of magnetic energy in the magnetic material is denoted by frac, and the loss tangent of the material is tan δ, then the Q of the resonator, assuming the magnetic material is the only source of losses, is Q=1/(frac×tan δ). Thus, even for loss tangents as high as 0.1, it is possible to achieve Q's of the order of 1,000 for these types of resonator structures.

Figure 17:
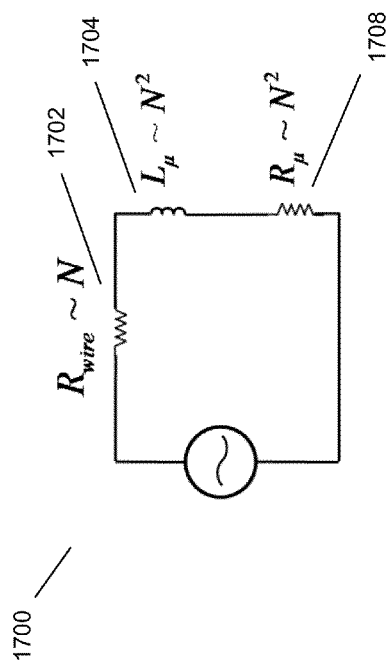
FIG. 17 shows an equivalent circuit representation of a magnetic resonator including a conducting wire wrapped N times around a structure, possibly containing magnetically permeable material. The inductance is realized using conducting loops wrapped around a structure comprising a magnetic material and the resistors represent loss mechanisms in the system ($R_{wire}$ for resistive losses in the loop, $R_\mu$ denoting the equivalent series resistance of the structure surrounded by the loop). Losses may be minimized to realize high-Q resonators.

If the structure is driven with N turns of wire wound around it, the losses in the excitation inductor loop can be ignored if N is sufficiently high. FIG. 17 shows an equivalent circuit 1700 schematic for these structures and the scaling of the loss mechanisms and inductance with the number of turns, N, wound around a structure made of conducting and magnetic material. If proximity effects can be neglected (by using an appropriate winding, or a wire designed to minimize proximity effects, such as Litz wire and the like), the resistance 1702 due to the wire in the looped conductor scales linearly with the length of the loop, which is in turn proportional to the number of turns. On the other hand, both the equivalent resistance 1708 and equivalent inductance 1704 of these special structures are proportional to the square of the magnetic field inside the structure. Since this magnetic field is proportional to N, the equivalent resistance 1708 and equivalent inductance 1704 are both proportional to $N^2$. Thus, for large enough N, the resistance 1702 of the wire is much smaller than the equivalent resistance 1708 of the magnetic structure, and the Q of the resonator asymptotes to $Q_{max}=\omega L_\mu/R_\mu$.

FIG. 16(*a*) shows a drawing of a copper and magnetic material structure 1602 driven by a square loop of current around the narrowed segment at the center of the structure 1604 and the magnetic field streamlines generated by this structure 1608. This exemplary structure includes two 20 cm×8 cm×2 cm hollow regions enclosed with copper and then completely covered with a 2 mm layer of magnetic material having the properties $\mu_r'=1,400$, $\mu_r''=5$, and σ=0.5 S/m. These two parallelepipeds are spaced 4 cm apart and are connected by a 2 cm×4 cm×2 cm block of the same magnetic material. The excitation loop is wound around the center of this block. At a frequency of 300 kHz, this structure has a calculated Q of 890. The conductor and magnetic material structure may be shaped to optimize certain system parameters. For example, the size of the structure enclosed by the excitation loop may be small to reduce the resistance of the excitation loop, or it may be large to mitigate losses in the magnetic material associated with large magnetic fields. Note that the magnetic streamlines and Q's associated with the same structure composed of magnetic material only would be similar to the layer conductor and magnetic material design shown here.

Electromagnetic Resonators Interacting with Other Objects

For electromagnetic resonators, extrinsic loss mechanisms that perturb the intrinsic Q may include absorption losses inside the materials of nearby extraneous objects and radiation losses related to scattering of the resonant fields from nearby extraneous objects. Absorption losses may be associated with materials that, over the frequency range of interest, have non-zero, but finite, conductivity, σ, (or equivalently a non-zero and finite imaginary part of the dielectric permittivity), such that electromagnetic fields can penetrate it and induce currents in it, which then dissipate energy through resistive losses. An object may be described as lossy if it at least partly includes lossy materials.

Consider an object including a homogeneous isotropic material of conductivity, σ and magnetic permeability, μ. The penetration depth of electromagnetic fields inside this object is given by the skin depth, $\delta=\sqrt{2/\omega\mu\sigma}$. The power dissipated inside the object, $P_d$, can be determined from $P_d=\int_V dr\sigma|E|^2 = \int_V dr|J|^2/\sigma$ where we made use of Ohm's law, J=σE, and where E is the electric field and J is the current density.

If over the frequency range of interest, the conductivity, σ, of the material that composes the object is low enough that the material's skin depth, δ, may be considered long, (i.e. δ is longer than the objects' characteristic size, or δ is longer than the characteristic size of the portion of the object that is lossy) then the electromagnetic fields, E and H, where H is the magnetic field, may penetrate significantly into the object. Then, these finite-valued fields may give rise to a dissipated power that scales as $P_d \sim \sigma V_{ol} \langle |E|^2 \rangle$, where $V_{ol}$ is the volume of the object that is lossy and $\langle |E|^2 \rangle$ is the spatial average of the electric-field squared, in the volume under consideration. Therefore, in the low-conductivity limit, the dissipated power scales proportionally to the conductivity and goes to zero in the limit of a non-conducting (purely dielectric) material.

If over the frequency range of interest, the conductivity, σ, of the material that composes the object is high enough that the material's skin depth may be considered short, then the electromagnetic fields, E and H, may penetrate only a short distance into the object (namely they stay close to the 'skin' of the material, where δ is smaller than the characteristic thickness of the portion of the object that is lossy). In this case, the currents induced inside the material may be concentrated very close to the material surface, approximately within a skin depth, and their magnitude may be approximated by the product of a surface current density (mostly determined by the shape of the incident electromagnetic fields and, as long as the thickness of the conductor is much larger than the skin-depth, independent of frequency and conductivity to first order) K(x,y) (where x and y are coordinates parameterizing the surface) and a function decaying exponentially into the surface: exp(−z/δ)/δ (where z denotes the coordinate locally normal to the surface): J(x,y,z)=K(x,y) exp(−z/δ)/δ. Then, the dissipated power, $P_d$, may be estimated by, $$P_d = \int^V dr|J(r)|^2/\sigma \square (^S dxdy|K(x,y)|^2)(\int_0^\infty dz \exp(2z/\delta)/(\sigma\delta^2)) = \sqrt{\mu\omega/8\sigma}(^S dxdy|K(x,y)|^2)$$

Therefore, in the high-conductivity limit, the dissipated power scales inverse proportionally to the square-root of the conductivity and goes to zero in the limit of a perfectly-conducting material.

If over the frequency range of interest, the conductivity, σ, of the material that composes the object is finite, then the material's skin depth, δ, may penetrate some distance into the object and some amount of power may be dissipated inside the object, depending also on the size of the object and the strength of the electromagnetic fields. This description can be generalized to also describe the general case of an object including multiple different materials with different properties and conductivities, such as an object with an arbitrary inhomogeneous and anisotropic distribution of the conductivity inside the object.

Note that the magnitude of the loss mechanisms described above may depend on the location and orientation of the extraneous objects relative to the resonator fields as well as the material composition of the extraneous objects. For example, high-conductivity materials may shift the resonant frequency of a resonator and detune it from other resonant objects. This frequency shift may be fixed by applying a feedback mechanism to a resonator that corrects its frequency, such as through changes in the inductance and/or capacitance of the resonator. These changes may be realized using variable capacitors and inductors, in some cases achieved by changes in the geometry of components in the resonators. Other novel tuning mechanisms, described below, may also be used to change the resonator frequency.

Where external losses are high, the perturbed Q may be low and steps may be taken to limit the absorption of resonator energy inside such extraneous objects and materials. Because of the functional dependence of the dissipated power on the strength of the electric and magnetic fields, one might optimize system performance by designing a system so that the desired coupling is achieved with shorter evanescent resonant field tails at the source resonator and longer at the device resonator, so that the perturbed Q of the source in the presence of other objects is optimized (or vice versa if the perturbed Q of the device needs to be optimized).

Note that many common extraneous materials and objects such as people, animals, plants, building materials, and the like, may have low conductivities and therefore may have little impact on the wireless energy transfer scheme disclosed here. An important fact related to the magnetic resonator designs we describe is that their electric fields may be confined primarily within the resonator structure itself, so it should be possible to operate within the commonly accepted guidelines for human safety while providing wireless power exchange over mid range distances.

Electromagnetic Resonators with Reduced Interactions

One frequency range of interest for near-field wireless power transmission is between 10 kHz and 100 MHz. In this frequency range, a large variety of ordinary non-metallic materials, such as for example several types of wood and plastic may have relatively low conductivity, such that only small amounts of power may be dissipated inside them. In addition, materials with low loss tangents, tan Δ, where tan $\Delta=\in''/\in'$, and $\in''$ and $\in'$ are the imaginary and real parts of the permittivity respectively, may also have only small amounts of power dissipated inside them. Metallic materials, such as copper, silver, gold, and the like, with relatively high conductivity, may also have little power dissipated in them, because electromagnetic fields are not able to significantly penetrate these materials, as discussed earlier. These very high and very low conductivity materials, and low loss tangent materials and objects may have a negligible impact on the losses of a magnetic resonator.

However, in the frequency range of interest, there are materials and objects such as some electronic circuits and some lower-conductivity metals, which may have moderate (in general inhomogeneous and anisotropic) conductivity, and/or moderate to high loss tangents, and which may have relatively high dissipative losses. Relatively larger amounts of power may be dissipated inside them. These materials and objects may dissipate enough energy to reduce $Q_{(p)}$ by non-trivial amounts, and may be referred to as "lossy objects".

One way to reduce the impact of lossy materials on the $Q_{(p)}$ of a resonator is to use high-conductivity materials to shape the resonator fields such that they avoid the lossy objects. The process of using high-conductivity materials to tailor electromagnetic fields so that they avoid lossy objects in their vicinity may be understood by visualizing high-conductivity materials as materials that deflect or reshape the fields. This picture is qualitatively correct as long as the thickness of the conductor is larger than the skin-depth because the boundary conditions for electromagnetic fields at the surface of a good conductor force the electric field to be nearly completely perpendicular to, and the magnetic field to be nearly completely tangential to, the conductor surface. Therefore, a perpendicular magnetic field or a tangential electric field will be "deflected away" from the conducting surface. Furthermore, even a tangential magnetic field or a perpendicular electric field may be forced to decrease in magnitude on one side and/or in particular locations of the conducting surface, depending on the relative position of the sources of the fields and the conductive surface.

Figure 18:
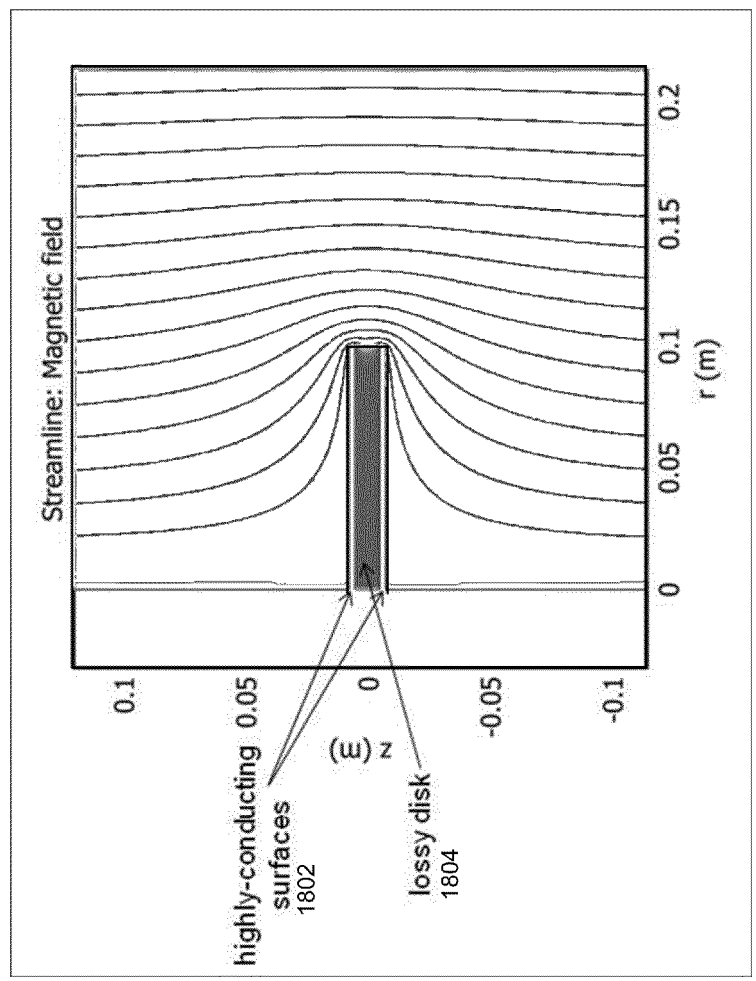
FIG. 18 shows a Finite Element Method (FEM) simulation of two high conductivity surfaces above and below a disk composed of lossy dielectric material, in an external magnetic field of frequency 6.78 MHz. Note that the magnetic field was uniform before the disk and conducting materials were introduced to the simulated environment. This simulation is performed in cylindrical coordinates. The image is azimuthally symmetric around the r=0 axis. The lossy dielectric disk has $\in_r=1$ and σ=10 S/m.

As an example, FIG. 18 shows a finite element method (FEM) simulation of two high conductivity surfaces 1802 above and below a lossy dielectric material 1804 in an external, initially uniform, magnetic field of frequency f=6.78 MHz. The system is azimuthally symmetric around the r=0 axis. In this simulation, the lossy dielectric material 1804 is sandwiched between two conductors 1802, shown as the white lines at approximately z=±0.01 m. In the absence of the conducting surfaces above and below the dielectric disk, the magnetic field (represented by the drawn magnetic field lines) would have remained essentially uniform (field lines straight and parallel with the z-axis), indicating that the magnetic field would have passed straight through the lossy dielectric material. In this case, power would have been dissipated in the lossy dielectric disk. In the presence of conducting surfaces, however, this simulation shows the magnetic field is reshaped. The magnetic field is forced to be tangential to surface of the conductor and so is deflected around those conducting surfaces 1802, minimizing the amount of power that may be dissipated in the lossy dielectric material 1804 behind or between the conducting surfaces. As used herein, an axis of electrical symmetry refers to any axis about which a fixed or time-varying electrical or magnetic field is substantially symmetric during an exchange of energy as disclosed herein.

A similar effect is observed even if only one conducting surface, above or below, the dielectric disk, is used. If the dielectric disk is thin, the fact that the electric field is essentially zero at the surface, and continuous and smooth close to it, means that the electric field is very low everywhere close to the surface (i.e. within the dielectric disk). A single surface implementation for deflecting resonator fields away from lossy objects may be preferred for applications where one is not allowed to cover both sides of the lossy material or object (e.g. an LCD screen). Note that even a very thin surface of conducting material, on the order of a few skin-depths, may be sufficient (the skin depth in pure copper at 6.78 MHz is ~20 µm, and at 250 kHz is ~100 µm) to significantly improve the $Q_{(p)}$ of a resonator in the presence of lossy materials.

Lossy extraneous materials and objects may be parts of an apparatus, in which a high-Q resonator is to be integrated. The dissipation of energy in these lossy materials and objects may be reduced by a number of techniques including:

by positioning the lossy materials and objects away from the resonator, or, in special positions and orientations relative to the resonator.

by using a high conductivity material or structure to partly or entirely cover lossy materials and objects in the vicinity of a resonator by placing a closed surface (such as a sheet or a mesh) of high-conductivity material around a lossy object to completely cover the lossy object and shape the resonator fields such that they avoid the lossy object.

by placing a surface (such as a sheet or a mesh) of a high-conductivity material around only a portion of a lossy object, such as along the top, the bottom, along the side, and the like, of an object or material.

by placing even a single surface (such as a sheet or a mesh) of high-conductivity material above or below or on one side of a lossy object to reduce the strength of the fields at the location of the lossy object.

Figure 19:
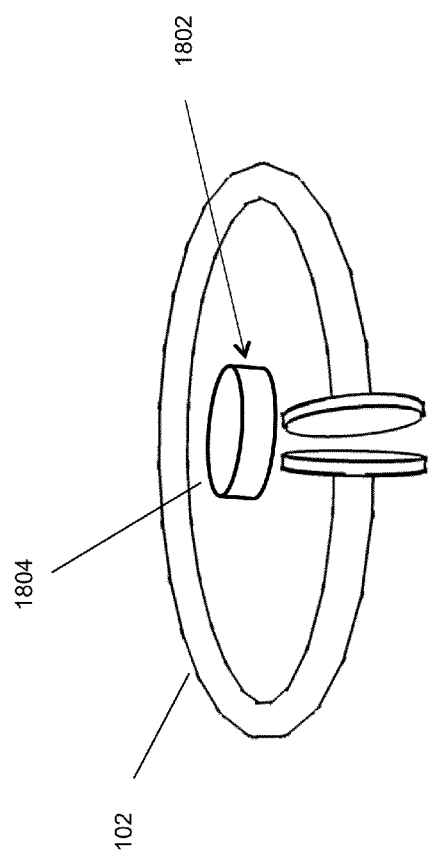
FIG. 19 shows a drawing of a magnetic resonator with a lossy object in its vicinity completely covered by a high-conductivity surface.

FIG. 19 shows a capacitively-loaded loop inductor forming a magnetic resonator 102 and a disk-shaped surface of high-conductivity material 1802 that completely surrounds a lossy object 1804 placed inside the loop inductor. Note that some lossy objects may be components, such as electronic circuits, that may need to interact with, communicate with, or be connected to the outside environment and thus cannot be completely electromagnetically isolated. Partially covering a lossy material with high conductivity materials may still reduce extraneous losses while enabling the lossy material or object to function properly.

Figure 20:
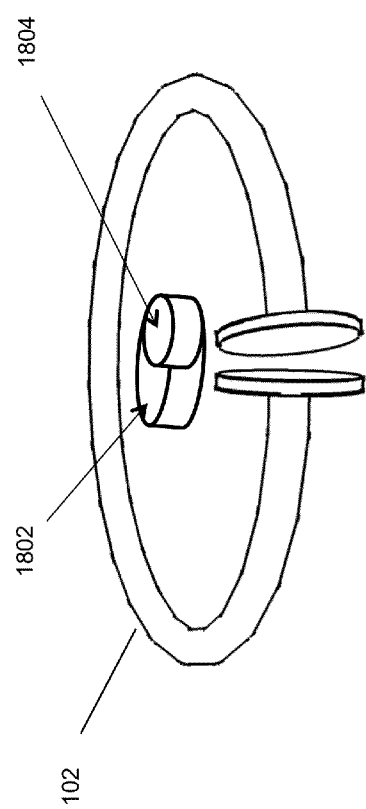
FIG. 20 shows a drawing of a magnetic resonator with a lossy object in its vicinity partially covered by a high-conductivity surface.

FIG. 20 shows a capacitively-loaded loop inductor that is used as the resonator 102 and a surface of high-conductivity material 1802, surrounding only a portion of a lossy object 1804, that is placed inside the inductor loop.

Figure 21:
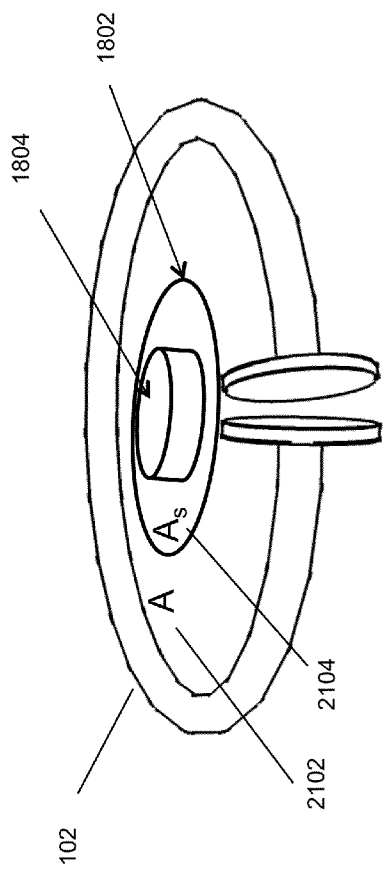
FIG. 21 shows a drawing of a magnetic resonator with a lossy object in its vicinity placed on top of a high-conductivity surface.

Extraneous losses may be reduced, but may not be completely eliminated, by placing a single surface of high-conductivity material above, below, on the side, and the like, of a lossy object or material. An example is shown in FIG. 21, where a capacitively-loaded loop inductor is used as the resonator 102 and a surface of high-conductivity material 1802 is placed inside the inductor loop under a lossy object 1804 to reduce the strength of the fields at the location of the lossy object. It may be preferable to cover only one side of a material or object because of considerations of cost, weight, assembly complications, air flow, visual access, physical access, and the like.

A single surface of high-conductivity material may be used to avoid objects that cannot or should not be covered from both sides (e.g. LCD or plasma screens). Such lossy objects may be avoided using optically transparent conductors. High-conductivity optically opaque materials may instead be placed on only a portion of the lossy object, instead of, or in addition to, optically transparent conductors. The adequacy of single-sided vs. multi-sided covering implementations, and the design trade-offs inherent therein may depend on the details of the wireless energy transfer scenario and the properties of the lossy materials and objects.

Figure 22:
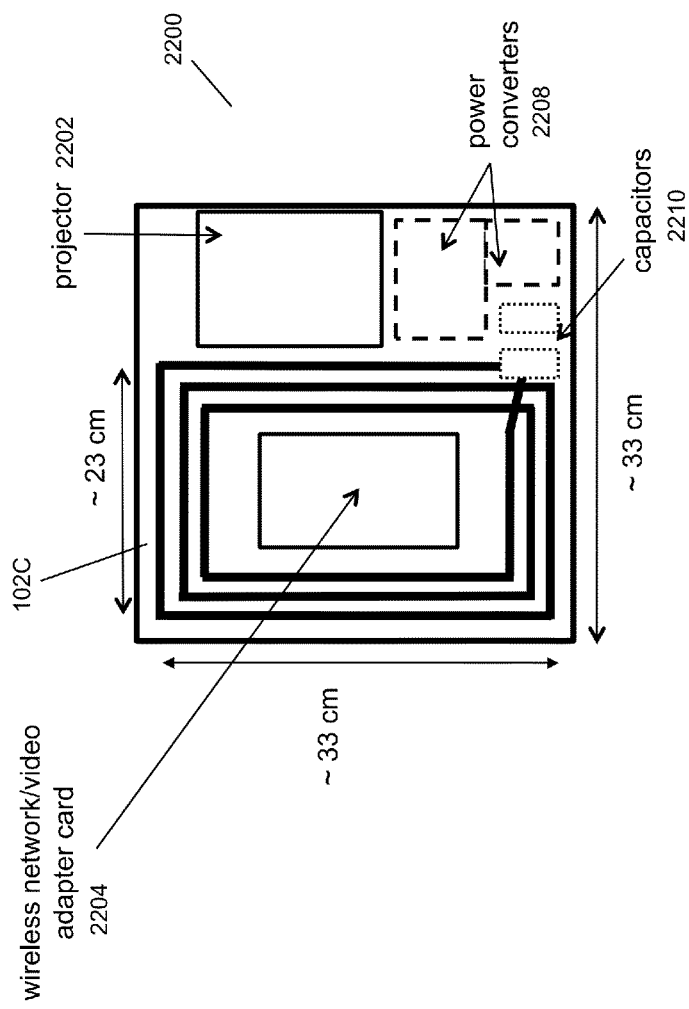
FIG. 22 shows a diagram of a completely wireless projector.

Below we describe an example using high-conductivity surfaces to improve the Q-insensitivity, $\Theta_{(p)}$, of an integrated magnetic resonator used in a wireless energy-transfer system. FIG. 22 shows a wireless projector 2200. The wireless projector may include a device resonator 102C, a projector 2202, a wireless network/video adapter 2204, and power conversion circuits 2208, arranged as shown. The device resonator 102C may include a three-turn conductor loop, arranged to enclose a surface, and a capacitor network 2210. The conductor loop may be designed so that the device resonator 102C has a high Q (e.g., >100) at its operating resonant frequency. Prior to integration in the completely wireless projector 2200, this device resonator 102C has a Q of approximately 477 at the designed operating resonant frequency of 6.78 MHz. Upon integration, and placing the wireless network/video adapter card 2204 in the center of the resonator loop inductor, the resonator $Q_{(integrated)}$ was decreased to approximately 347. At least some of the reduction from Q to $Q_{(integrated)}$ was attributed to losses in the perturbing wireless network/video adapter card. As described above, electromagnetic fields associated with the magnetic resonator 102C may induce currents in and on the wireless network/video adapter card 2204, which may be dissipated in resistive losses in the lossy materials that compose the card. We observed that $Q_{(integrated)}$ of the resonator may be impacted differently depending on the composition, position, and orientation, of objects and materials placed in its vicinity.

In a completely wireless projector example, covering the network/video adapter card with a thin copper pocket (a folded sheet of copper that covered the top and the bottom of the wireless network/video adapter card, but not the communication antenna) improved the $Q_{(integrated)}$ of the magnetic resonator to a $Q_{(integrated+copper\ pocket)}$ of approximately 444. In other words, most of the reduction in $Q_{(integrated)}$ due to the perturbation caused by the extraneous network/video adapter card could be eliminated using a copper pocket to deflect the resonator fields away from the lossy materials.

In another completely wireless projector example, covering the network/video adapter card with a single copper sheet placed beneath the card provided a $Q_{(integrated+copper\ sheet)}$ approximately equal to $Q_{(integrated+copper\ pocket)}$. In that example, the high perturbed Q of the system could be maintained with a single high-conductivity sheet used to deflect the resonator fields away from the lossy adapter card.

It may be advantageous to position or orient lossy materials or objects, which are part of an apparatus including a high-Q electromagnetic resonator, in places where the fields produced by the resonator are relatively weak, so that little or no power may be dissipated in these objects and so that the Q-insensitivity, $\Theta_{(p)}$, may be large. As was shown earlier, materials of different conductivity may respond differently to electric versus magnetic fields. Therefore, according to the conductivity of the extraneous object, the positioning technique may be specialized to one or the other field.

Figure 23:
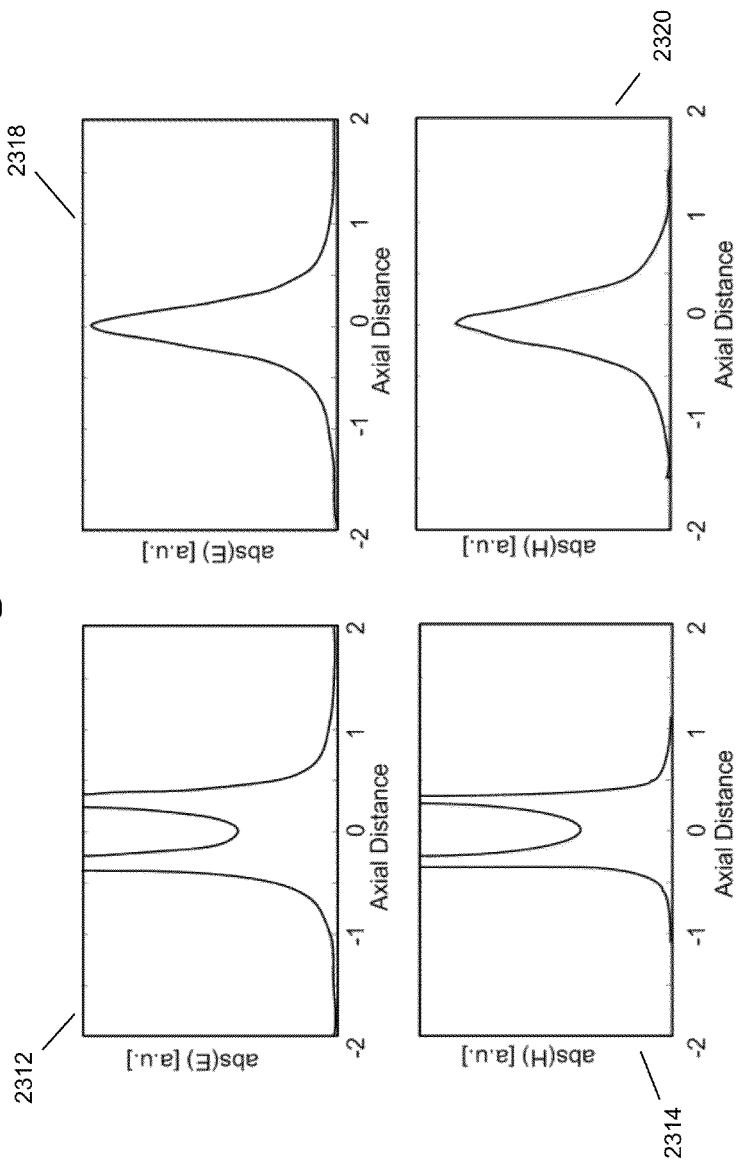
FIG. 23 shows the magnitude of the electric and magnetic fields along a line that contains the diameter of the circular loop inductor and along the axis of the loop inductor.
Figure 24:
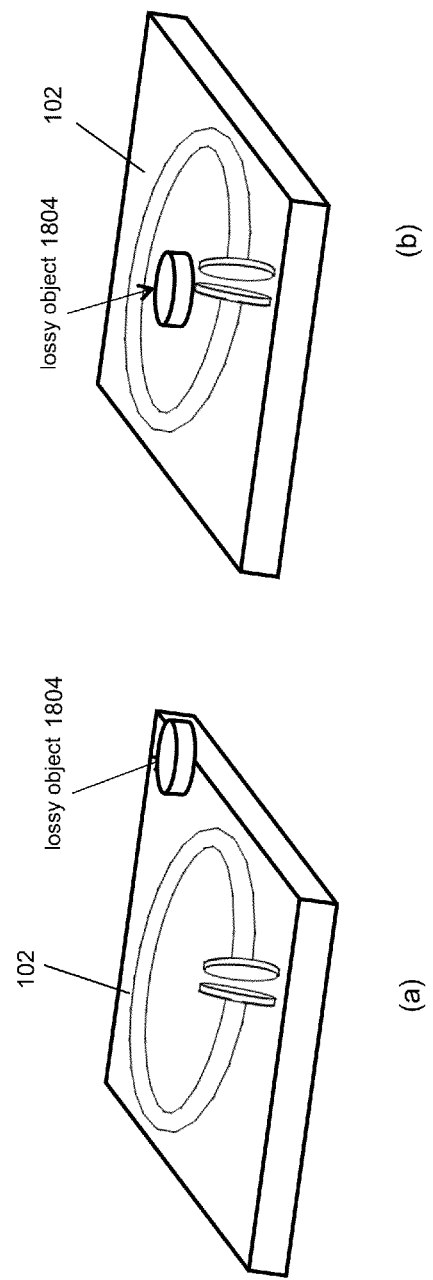
FIG. 24 shows a drawing of a magnetic resonator and its enclosure along with a necessary but lossy object placed either (a) in the corner of the enclosure, as far away from the resonator structure as possible or (b) in the center of the surface enclosed by the inductive element in the magnetic resonator.

FIG. 23 shows the magnitude of the electric 2312 and magnetic fields 2314 along a line that contains the diameter of the circular loop inductor and the electric 2318 and magnetic fields 2320 along the axis of the loop inductor for a capacitively-loaded circular loop inductor of wire of radius 30 cm, resonant at 10 MHz. It can be seen that the amplitude of the resonant near-fields reach their maxima close to the wire and decay away from the loop, 2312, 2314. In the plane of the loop inductor 2318, 2320, the fields reach a local minimum at the center of the loop. Therefore, given the finite size of the apparatus, it may be that the fields are weakest at the extrema of the apparatus or it may be that the field magnitudes have local minima somewhere within the apparatus. This argument holds for any other type of electromagnetic resonator 102 and any type of apparatus. Examples are shown in FIGS. 24a and 24b, where a capacitively-loaded inductor loop forms a magnetic resonator 102 and an extraneous lossy object 1804 is positioned where the electromagnetic fields have minimum magnitude.

In a demonstration example, a magnetic resonator was formed using a three-turn conductor loop, arranged to enclose a square surface (with rounded corners), and a capacitor network. The Q of the resonator was approximately 619 at the designed operating resonant frequency of 6.78 MHz. The perturbed Q of this resonator depended on the placement of the perturbing object, in this case a pocket projector, relative to the resonator. When the perturbing projector was located inside the inductor loop and at its center or on top of the inductor wire turns, $Q_{(projector)}$ was approximately 96, lower than when the perturbing projector was placed outside of the resonator, in which case $Q_{(projector)}$ was approximately 513. These measurements support the analysis that shows the fields inside the inductor loop may be larger than those outside it, so lossy objects placed inside such a loop inductor may yield lower perturbed Q's for the system than when the lossy object is placed outside the loop inductor. Depending on the resonator designs and the material composition and orientation of the lossy object, the arrangement shown in FIG. 24b may yield a higher Q-insensitivity, $\Theta_{(projector)}$, than the arrangement shown in FIG. 24a.

High-Q resonators may be integrated inside an apparatus. Extraneous materials and objects of high dielectric permittivity, magnetic permeability, or electric conductivity may be part of the apparatus into which a high-Q resonator is to be integrated. For these extraneous materials and objects in the vicinity of a high-Q electromagnetic resonator, depending on their size, position and orientation relative to the resonator, the resonator field-profile may be distorted and deviate significantly from the original unperturbed field-profile of the resonator. Such a distortion of the unperturbed fields of the resonator may significantly decrease the Q to a lower $Q_{(p)}$, even if the extraneous objects and materials are lossless.

It may be advantageous to position high-conductivity objects, which are part of an apparatus including a high-Q electromagnetic resonator, at orientations such that the surfaces of these objects are, as much as possible, perpendicular to the electric field lines produced by the unperturbed resonator and parallel to the magnetic field lines produced by the unperturbed resonator, thus distorting the resonant field profiles by the smallest amount possible. Other common objects that may be positioned perpendicular to the plane of a magnetic resonator loop include screens (LCD, plasma, etc), batteries, cases, connectors, radiative antennas, and the like. The Q-insensitivity, $\Theta_{(p)}$, of the resonator may be much larger than if the objects were positioned at a different orientation with respect to the resonator fields.

Figure 25:
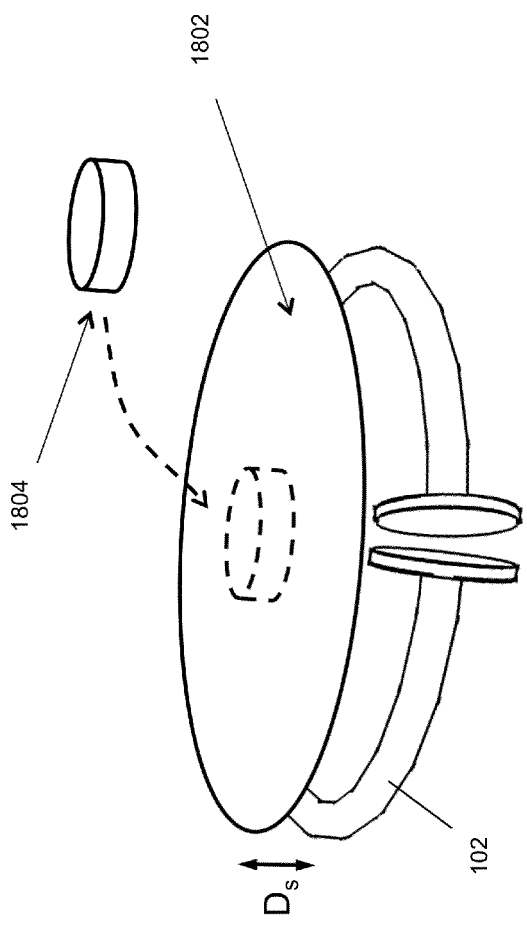
FIG. 25 shows a drawing of a magnetic resonator with a high-conductivity surface above it and a lossy object, which may be brought into the vicinity of the resonator, but above the high-conductivity sheet.

Lossy extraneous materials and objects, which are not part of the integrated apparatus including a high-Q resonator, may be located or brought in the vicinity of the resonator, for example, during the use of the apparatus. It may be advantageous in certain circumstances to use high conductivity materials to tailor the resonator fields so that they avoid the regions where lossy extraneous objects may be located or introduced to reduce power dissipation in these materials and objects and to increase Q-insensitivity, $\Theta_{(p)}$. An example is shown in FIG. 25, where a capacitively-loaded loop inductor and capacitor are used as the resonator 102 and a surface of high-conductivity material 1802 is placed above the inductor loop to reduce the magnitude of the fields in the region above the resonator, where lossy extraneous objects 1804 may be located or introduced.

Note that a high-conductivity surface brought in the vicinity of a resonator to reshape the fields may also lead to $Q_{(cond.\ surface)} < Q$. The reduction in the perturbed Q may be due to the dissipation of energy inside the lossy conductor or to the distortion of the unperturbed resonator field profiles associated with matching the field boundary conditions at the surface of the conductor. Therefore, while a high-conductivity surface may be used to reduce the extraneous losses due to dissipation inside an extraneous lossy object, in some cases, especially in some of those where this is achieved by significantly reshaping the electromagnetic fields, using such a high-conductivity surface so that the fields avoid the lossy object may result effectively in $Q_{(p+cond.\ surface)} < Q_{(p)}$ rather than the desired result $Q_{(p+cond.\ surface)} > Q_{(p)}$.

As described above, in the presence of loss inducing objects, the perturbed quality factor of a magnetic resonator may be improved if the electromagnetic fields associated with the magnetic resonator are reshaped to avoid the loss inducing objects. Another way to reshape the unperturbed resonator fields is to use high permeability materials to completely or partially enclose or cover the loss inducing objects, thereby reducing the interaction of the magnetic field with the loss inducing objects.

Magnetic field shielding has been described previously, for example in *Electrodynamics* 3$^{rd}$ Ed., Jackson, pp. 201-203. There, a spherical shell of magnetically permeable material was shown to shield its interior from external magnetic fields. For example, if a shell of inner radius a, outer radius b, and relative permeability $\mu_r$, is placed in an initially uniform magnetic field $H_0$, then the field inside the shell will have a constant magnitude, $9\mu_r H_0/[(2\mu_r+1)(\mu_r+2)-2(a/b)^3(\mu_r-1)^2]$, which tends to $9H_0/2\mu_r(1-(a/b)^3)$ if $\mu_r \gg 1$. This result shows that an incident magnetic field (but not necessarily an incident electric field) may be greatly attenuated inside the shell, even if the shell is quite thin, provided the magnetic permeability is high enough. It may be advantageous in certain circumstances to use high permeability materials to partly or entirely cover lossy materials and objects so that they are avoided by the resonator magnetic fields and so that little or no power is dissipated in these materials and objects. In such an approach, the Q-insensitivity, $\Theta_{(p)}$, may be larger than if the materials and objects were not covered, possibly larger than 1.

It may be desirable to keep both the electric and magnetic fields away from loss inducing objects. As described above, one way to shape the fields in such a manner is to use high-conductivity surfaces to either completely or partially enclose or cover the loss inducing objects. A layer of magnetically permeable material, also referred to as magnetic material, (any material or meta-material having a non-trivial magnetic permeability), may be placed on or around the high-conductivity surfaces. The additional layer of magnetic material may present a lower reluctance path (compared to free space) for the deflected magnetic field to follow and may partially shield the electric conductor underneath it from the incident magnetic flux. This arrangement may reduce the losses due to induced currents in the high-conductivity surface. Under some circumstances the lower reluctance path presented by the magnetic material may improve the perturbed Q of the structure.

FIG. 26a shows an axially symmetric FEM simulation of a thin conducting 2604 (copper) disk (20 cm in diameter, 2 cm in height) exposed to an initially uniform, externally applied magnetic field (gray flux lines) along the z-axis. The axis of symmetry is at r=0. The magnetic streamlines shown originate at z=−∞, where they are spaced from r=3 cm to r=10 cm in intervals of 1 cm. The axes scales are in meters. Imagine, for example, that this conducing cylinder encloses loss-inducing objects within an area circumscribed by a magnetic resonator in a wireless energy transfer system such as shown in FIG. 19.

This high-conductivity enclosure may increase the perturbing Q of the lossy objects and therefore the overall perturbed Q of the system, but the perturbed Q may still be less than the unperturbed Q because of induced losses in the conducting surface and changes to the profile of the electromagnetic fields. Decreases in the perturbed Q associated with the high-conductivity enclosure may be at least partially recovered by including a layer of magnetic material along the outer surface or surfaces of the high-conductivity enclosure. FIG. 26b shows an axially symmetric FEM simulation of the thin conducting 2604A (copper) disk (20 cm in diameter, 2 cm in height) from FIG. 26a, but with an additional layer of magnetic material placed directly on the outer surface of the high-conductivity enclosure. Note that the presence of the magnetic material may provide a lower reluctance path for the magnetic field, thereby at least partially shielding the underlying conductor and reducing losses due to induced eddy currents in the conductor.

Figure 26:
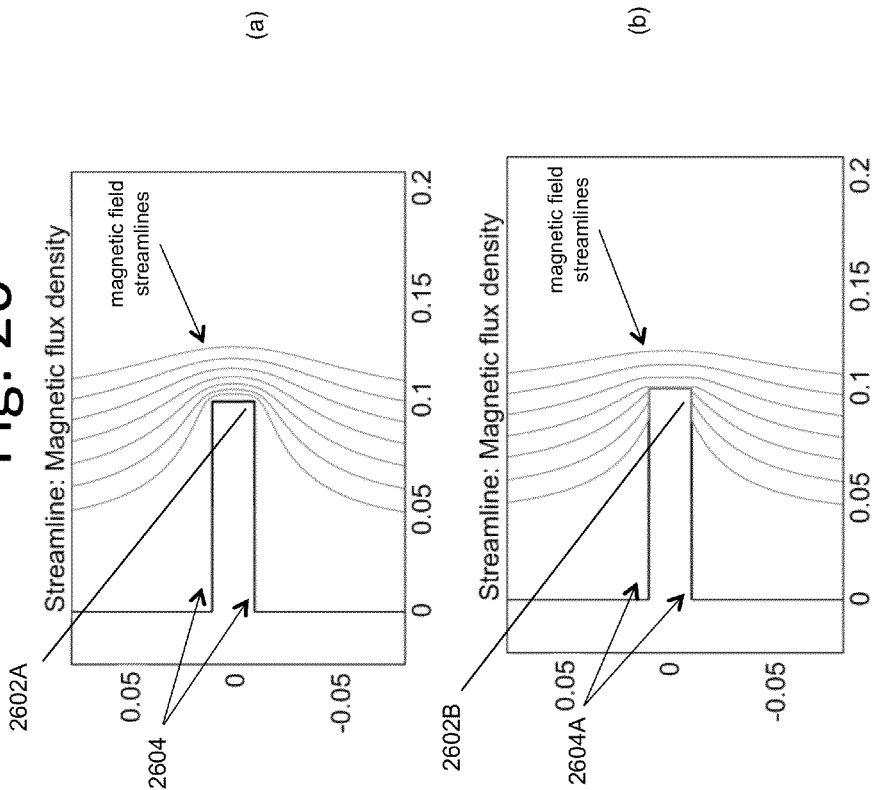
FIG. 26(a) shows an axially symmetric FEM simulation of a thin conducting (copper) cylinder or disk (20 cm in diameter, 2 cm in height) exposed to an initially uniform, externally applied magnetic field (gray flux lines) along the z-axis. The axis of symmetry is at r=0. The magnetic streamlines shown originate at z=−∞, where they are spaced from r=3 cm to r=10 cm in intervals of 1 cm. The axes scales are in meters.
FIG. 26(b) shows the same structure and externally applied field as in (a), except that the conducting cylinder has been modified to include a 0.25 mm layer of magnetic material (not visible) with $\mu_r'=40$, on its outside surface. Note that the magnetic streamlines are deflected away from the cylinder significantly less than in (a).
Figure 27:
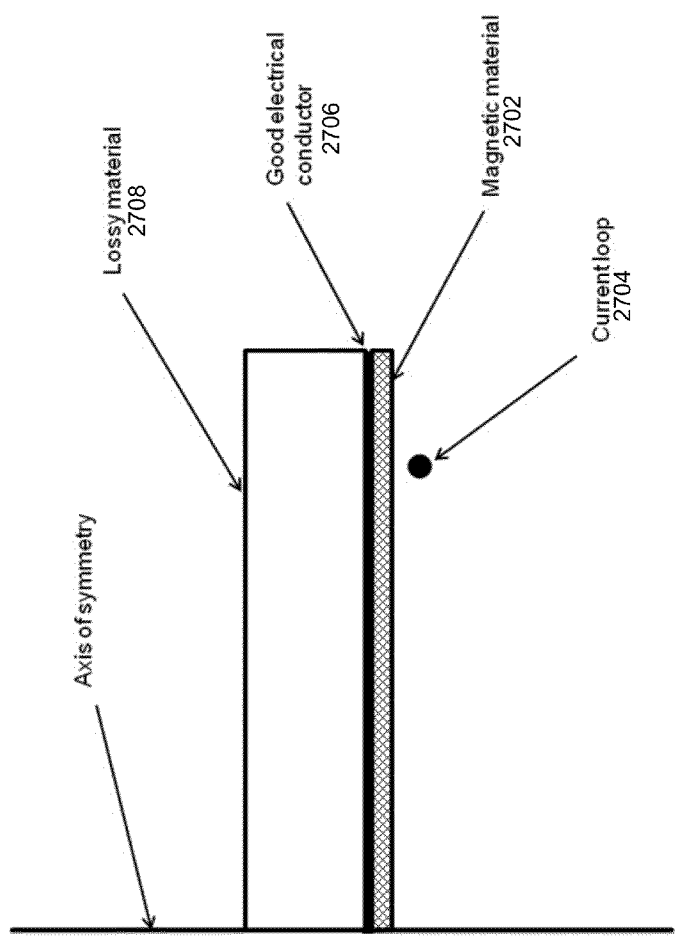
FIG. 27 shows an axi-symmetric view of a variation based on the system shown in FIG. 26. Only one surface of the lossy material is covered by a layered structure of copper and magnetic materials. The inductor loop is placed on the side of the copper and magnetic material structure opposite to the lossy material as shown.

FIG. 27 depicts a variation (in axi-symmetric view) to the system shown in FIG. 26 where not all of the lossy material 2708 may be covered by a high-conductivity surface 2706. In certain circumstances it may be useful to cover only one side of a material or object, such as due to considerations of cost, weight, assembly complications, air flow, visual access, physical access, and the like. In the exemplary arrangement shown in FIG. 27, only one surface of the lossy material 2708 is covered and the resonator inductor loop is placed on the opposite side of the high-conductivity surface.

Mathematical models were used to simulate a high-conductivity enclosure made of copper and shaped like a 20 cm diameter by 2 cm high cylindrical disk placed within an area circumscribed by a magnetic resonator whose inductive element was a single-turn wire loop with loop radius r=11 cm and wire radius a=1 mm. Simulations for an applied 6.78 MHz electromagnetic field suggest that the perturbing quality factor of this high-conductivity enclosure, $\delta Q_{(enclosure)}$, is 1,870. When the high-conductivity enclosure was modified to include a 0.25 cm-thick layer of magnetic material with real relative permeability, $\mu_r'=40$, and imaginary relative permeability, $\mu_r''=10^{-2}$, simulations suggest the perturbing quality factor is increased to $\delta Q_{(enclosure+magnetic\ material)}=5,060$.

The improvement in performance due to the addition of thin layers of magnetic material 2702 may be even more dramatic if the high-conductivity enclosure fills a larger portion of the area circumscribed by the resonator's loop inductor 2704. In the example above, if the radius of the inductor loop 2704 is reduced so that it is only 3 mm away from the surface of the high-conductivity enclosure, the perturbing quality factor may be improved from 670 (conducting enclosure only) to 2,730 (conducting enclosure with a thin layer of magnetic material) by the addition of a thin layer of magnetic material 2702 around the outside of the enclosure.

The resonator structure may be designed to have highly confined electric fields, using shielding, or distributed capacitors, for example, which may yield high, even when the resonator is very close to materials that would typically induce loss.

Coupled Electromagnetic Resonators

The efficiency of energy transfer between two resonators may be determined by the strong-coupling figure-of-merit, $U=\kappa/\sqrt{\Gamma_s\Gamma_d}=(2\kappa/\sqrt{\omega_s\omega_d})\sqrt{Q_sQ_d}$. In magnetic resonator implementations the coupling factor between the two resonators may be related to the inductance of the inductive elements in each of the resonators, $L_1$ and $L_2$, and the mutual inductance, M, between them by $\kappa_{12}=\omega M/2\sqrt{L_1L_2}$. Note that this expression assumes there is negligible coupling through electric-dipole coupling. For capacitively-loaded inductor loop resonators where the inductor loops are formed by circular conducting loops with N turns, separated by a distance D, and oriented as shown in FIG. 1(b), the mutual inductance is $M=\pi/4\cdot\mu_o N_1 N_2 (x_1 x_2)^2/D^3$ where $x_1$, $N_1$ and $x_2$, $N_2$ are the characteristic size and number of turns of the conductor loop of the first and second resonators respectively. Note that this is a quasi-static result, and so assumes that the resonator's size is much smaller than the wavelength and the resonators' distance is much smaller than the wavelength, but also that their distance is at least a few times their size. For these circular resonators operated in the quasi-static limit and at mid-range distances, as described above, $k=2\kappa/\sqrt{\omega_1\omega_2}\sim(\sqrt{x_1 x_2}/D)^3$. Strong coupling (a large U) between resonators at mid-range distances may be established when the quality factors of the resonators are large enough to compensate for the small k at mid-range distances For electromagnetic resonators, if the two resonators include conducting parts, the coupling mechanism may be that currents are induced on one resonator due to electric and magnetic fields generated from the other. The coupling factor may be proportional to the flux of the magnetic field produced from the high-Q inductive element in one resonator crossing a closed area of the high-Q inductive element of the second resonator.

Coupled Electromagnetic Resonators with Reduced Interactions

As described earlier, a high-conductivity material surface may be used to shape resonator fields such that they avoid lossy objects, p, in the vicinity of a resonator, thereby reducing the overall extraneous losses and maintaining a high Q-insensitivity $\Theta_{(p+cond.\ surface)}$ of the resonator. However, such a surface may also lead to a perturbed coupling factor, $k_{(p+cond.\ surface)}$, between resonators that is smaller than the perturbed coupling factor, $k_{(p)}$ and depends on the size, position, and orientation of the high-conductivity material relative to the resonators. For example, if high-conductivity materials are placed in the plane and within the area circumscribed by the inductive element of at least one of the magnetic resonators in a wireless energy transfer system, some of the magnetic flux through the area of the resonator, mediating the coupling, may be blocked and k may be reduced.

Consider again the example of FIG. 19. In the absence of the high-conductivity disk enclosure, a certain amount of the external magnetic flux may cross the circumscribed area of the loop. In the presence of the high-conductivity disk enclosure, some of this magnetic flux may be deflected or blocked and may no longer cross the area of the loop, thus leading to a smaller perturbed coupling factor $k_{12(p+cond.\ surfaces)}$. However, because the deflected magnetic-field lines may follow the edges of the high-conductivity surfaces closely, the reduction in the flux through the loop circumscribing the disk may be less than the ratio of the areas of the face of the disk to the area of the loop.

One may use high-conductivity material structures, either alone, or combined with magnetic materials to optimize perturbed quality factors, perturbed coupling factors, or perturbed efficiencies.

Consider the example of FIG. 21. Let the lossy object have a size equal to the size of the capacitively-loaded inductor loop resonator, thus filling its area A 2102. A high-conductivity surface 1802 may be placed under the lossy object 1804. Let this be resonator 1 in a system of two coupled resonators 1 and 2, and let us consider how $U_{12(object+cond.\ surface)}$ scales compared to $U_{12}$ as the area $A_s$ 2104 of the conducting surface increases. Without the conducting surface 1802 below the lossy object 1804, the k-insensitivity, $\beta_{12(object)}$, may be approximately one, but the Q-insensitivity, $\Theta_{1(object)}$, may be small, so the U-insensitivity $\Xi_{12(object)}$ may be small.

Where the high-conductivity surface below the lossy object covers the entire area of the inductor loop resonator ($A_s$=A), $k_{12(object+cond.\ surface)}$ may approach zero, because little flux is allowed to cross the inductor loop, so $U_{12(object+cond.\ surface)}$ may approach zero. For intermediate sizes of the high-conductivity surface, the suppression of extrinsic losses and the associated Q-insensitivity, $\Theta_{1(object+cond.\ surface)}$, may be large enough compared to $\Theta_{1(object)}$, while the reduction in coupling may not be significant and the associated k-insensitivity, $U_{12(object+cond.\ surface)}$, may be not much smaller than $\beta_{12(object)}$, so that the overall $U_{12(object+cond.\ surface)}$ may be increased compared to $U_{12(object)}$. The optimal degree of avoiding of extraneous lossy objects via high-conductivity surfaces in a system of wireless energy transfer may depend on the details of the system configuration and the application.

We describe using high-conductivity materials to either completely or partially enclose or cover loss inducing objects in the vicinity of high-Q resonators as one potential method to achieve high perturbed Q's for a system. However, using a good conductor alone to cover the objects may reduce the coupling of the resonators as described above, thereby reducing the efficiency of wireless power transfer. As the area of the conducting surface approaches the area of the magnetic resonator, for example, the perturbed coupling factor, $k_{(p)}$, may approach zero, making the use of the conducting surface incompatible with efficient wireless power transfer.

One approach to addressing the aforementioned problem is to place a layer of magnetic material around the high-conductivity materials because the additional layer of permeable material may present a lower reluctance path (compared to free space) for the deflected magnetic field to follow and may partially shield the electric conductor underneath it from incident magnetic flux. Under some circumstances the lower reluctance path presented by the magnetic material may improve the electromagnetic coupling of the resonator to other resonators. Decreases in the perturbed coupling factor associated with using conducting materials to tailor resonator fields so that they avoid lossy objects in and around high-Q magnetic resonators may be at least partially recovered by including a layer of magnetic material along the outer surface or surfaces of the conducting materials. The magnetic materials may increase the perturbed coupling factor relative to its initial unperturbed value.

Note that the simulation results in FIG. 26 show that an incident magnetic field may be deflected less by a layered magnetic material and conducting structure than by a conducting structure alone. If a magnetic resonator loop with a radius only slightly larger than that of the disks shown in FIGS. 26(a) and 26(b) circumscribed the disks, it is clear that more flux lines would be captured in the case illustrated in FIG. 26(b) than in FIG. 26(a), and therefore $k_{(disk)}$ would be larger for the case illustrated in FIG. 26(b). Therefore, including a layer of magnetic material on the conducting material may improve the overall system performance. System analyses may be performed to determine whether these materials should be partially, totally, or minimally integrated into the resonator.

As described above, FIG. 27 depicts a layered conductor 2706 and magnetic material 2702 structure that may be appropriate for use when not all of a lossy material 2708 may be covered by a conductor and/or magnetic material structure. It was shown earlier that for a copper conductor disk with a 20 cm diameter and a 2 cm height, circumscribed by a resonator with an inductor loop radius of 11 cm and a wire radius a=1 mm, the calculated perturbing Q for the copper cylinder was 1,870. If the resonator and the conducting disk shell are placed in a uniform magnetic field (aligned along the axis of symmetry of the inductor loop), we calculate that the copper conductor has an associated coupling factor insensitivity of 0.34. For comparison, we model the same arrangement but include a 0.25 cm-thick layer of magnetic material with a real relative permeability, $\mu_r'$=40, and an imaginary relative permeability, $\mu_r'$=$10^{-2}$. Using the same model and parameters described above, we find that the coupling factor insensitivity is improved to 0.64 by the addition of the magnetic material to the surface of the conductor.

Magnetic materials may be placed within the area circumscribed by the magnetic resonator to increase the coupling in wireless energy transfer systems. Consider a solid sphere of a magnetic material with relative permeability, $\mu_r$, placed in an initially uniform magnetic field. In this example, the lower reluctance path offered by the magnetic material may cause the magnetic field to concentrate in the volume of the sphere. We find that the magnetic flux through the area circumscribed by the equator of the sphere is enhanced by a factor of $3\mu_r/$ ($\mu_r$+2), by the addition of the magnetic material. If $\mu_r \gg 1$, this enhancement factor may be close to 3.

One can also show that the dipole moment of a system comprising the magnetic sphere circumscribed by the inductive element in a magnetic resonator would have its magnetic dipole enhanced by the same factor. Thus, the magnetic sphere with high permeability practically triples the dipole magnetic coupling of the resonator. It is possible to keep most of this increase in coupling if we use a spherical shell of magnetic material with inner radius a, and outer radius b, even if this shell is on top of block or enclosure made from highly conducting materials. In this case, the enhancement in the flux through the equator is $$\frac{3\mu_r\left(1-\left(\frac{a}{b}\right)^3\right)}{\mu_r\left(1-\left(\frac{a}{b}\right)^3\right)+2\left(1+\frac{1}{2}\left(\frac{a}{b}\right)^3\right)}.$$

For $\mu_r=1,000$ and (a/b)=0.99, this enhancement factor is still 2.73, so it possible to significantly improve the coupling even with thin layers of magnetic material.

As described above, structures containing magnetic materials may be used to realize magnetic resonators. FIG. 16(*a*) shows a 3 dimensional model of a copper and magnetic material structure 1600 driven by a square loop of current around the choke point at its center. FIG. 16(*b*) shows the interaction, indicated by magnetic field streamlines, between two identical structures 1600A-B with the same properties as the one shown in FIG. 16(*a*). Because of symmetry, and to reduce computational complexity, only one half of the system is modeled. If we fix the relative orientation between the two objects and vary their center-to-center distance (the image shown is at a relative separation of 50 cm), we find that, at 300 kHz, the coupling efficiency varies from 87% to 55% as the separation between the structures varies from 30 cm to 60 cm. Each of the example structures shown 1600A-B includes two 20 cm×8 cm×2 cm parallelepipeds made of copper joined by a 4 cm×4 cm×2 cm block of magnetic material and entirely covered with a 2 mm layer of the same magnetic material (assumed to have $\mu_r$=1,400+j5). Resistive losses in the driving loop are ignored. Each structure has a calculated Q of 815.

Electromagnetic Resonators and Impedance Matching

Impedance Matching Architectures for Low-Loss Inductive Elements

For purposes of the present discussion, an inductive element may be any coil or loop structure (the 'loop') of any conducting material, with or without a (gapped or ungapped) core made of magnetic material, which may also be coupled inductively or in any other contactless way to other systems. The element is inductive because its impedance, including both the impedance of the loop and the so-called 'reflected' impedances of any potentially coupled systems, has positive reactance, X, and resistance, R.

Consider an external circuit, such as a driving circuit or a driven load or a transmission line, to which an inductive element may be connected. The external circuit (e.g. a driving circuit) may be delivering power to the inductive element and the inductive element may be delivering power to the external circuit (e.g. a driven load). The efficiency and amount of power delivered between the inductive element and the external circuit at a desired frequency may depend on the impedance of the inductive element relative to the properties of the external circuit. Impedance-matching networks and external circuit control techniques may be used to regulate the power delivery between the external circuit and the inductive element, at a desired frequency, f.

The external circuit may be a driving circuit configured to form a amplifier of class A, B, C, D, DE, E, F and the like, and may deliver power at maximum efficiency (namely with minimum losses within the driving circuit) when it is driving a resonant network with specific impedance $Z_o^*$, where $Z_o$ may be complex and * denotes complex conjugation. The external circuit may be a driven load configured to form a rectifier of class A, B, C, D, DE, E, F and the like, and may receive power at maximum efficiency (namely with minimum losses within the driven load) when it is driven by a resonant network with specific impedance $Z_o^*$, where $Z_o$ may be complex. The external circuit may be a transmission line with characteristic impedance, $Z_o$, and may exchange power at maximum efficiency (namely with zero reflections) when connected to an impedance $Z_o^*$. We will call the characteristic impedance $Z_o$ of an external circuit the complex conjugate of the impedance that may be connected to it for power exchange at maximum efficiency.

Typically the impedance of an inductive element, R+jX, may be much different from $Z_o^*$. For example, if the inductive element has low loss (a high X/R), its resistance, R, may be much lower than the real part of the characteristic impedance, $Z_0$, of the external circuit. Furthermore, an inductive element by itself may not be a resonant network. An impedance-matching network connected to an inductive element may typically create a resonant network, whose impedance may be regulated.

Therefore, an impedance-matching network may be designed to maximize the efficiency of the power delivered between the external circuit and the inductive element (including the reflected impedances of any coupled systems). The efficiency of delivered power may be maximized by matching the impedance of the combination of an impedance-matching network and an inductive element to the characteristic impedance of an external circuit (or transmission line) at the desired frequency.

An impedance-matching network may be designed to deliver a specified amount of power between the external circuit and the inductive element (including the reflected impedances of any coupled systems). The delivered power may be determined by adjusting the complex ratio of the impedance of the combination of the impedance-matching network and the inductive element to the impedance of the external circuit (or transmission line) at the desired frequency.

Impedance-matching networks connected to inductive elements may create magnetic resonators. For some applications, such as wireless power transmission using strongly-coupled magnetic resonators, a high Q may be desired for the resonators. Therefore, the inductive element may be chosen to have low losses (high X/R).

Since the matching circuit may typically include additional sources of loss inside the resonator, the components of the matching circuit may also be chosen to have low losses. Furthermore, in high-power applications and/or due to the high resonator Q, large currents may run in parts of the resonator circuit and large voltages may be present across some circuit elements within the resonator. Such currents and voltages may exceed the specified tolerances for particular circuit elements and may be too high for particular components to withstand. In some cases, it may be difficult to find or implement components, such as tunable capacitors for example, with size, cost and performance (loss and current/voltage-rating) specifications sufficient to realize high-Q and high-power resonator designs for certain applications. We disclose matching circuit designs, methods, implementations and techniques that may preserve the high Q for magnetic resonators, while reducing the component requirements for low loss and/or high current/voltage-rating.

Matching-circuit topologies may be designed that minimize the loss and current-rating requirements on some of the elements of the matching circuit. The topology of a circuit matching a low-loss inductive element to an impedance, $Z_0$, may be chosen so that some of its components lie outside the associated high-Q resonator by being in series with the external circuit. The requirements for low series loss or high current-ratings for these components may be reduced. Relieving the low series loss and/or high-current-rating requirement on a circuit element may be particularly useful when the element needs to be variable and/or to have a large voltage-rating and/or low parallel loss.

Matching-circuit topologies may be designed that minimize the voltage rating requirements on some of the elements of the matching circuit. The topology of a circuit matching a low-loss inductive element to an impedance, $Z_0$, may be chosen so that some of its components lie outside the associated high-Q resonator by being in parallel with $Z_0$. The requirements for low parallel loss or high voltage-rating for these components may be reduced. Relieving the low parallel loss and/or high-voltage requirement on a circuit element may be particularly useful when the element needs to be variable and/or to have a large current-rating and/or low series loss.

The topology of the circuit matching a low-loss inductive element to an external characteristic impedance, $Z_0$, may be chosen so that the field pattern of the associated resonant mode and thus its high Q are preserved upon coupling of the resonator to the external impedance. Otherwise inefficient coupling to the desired resonant mode may occur (potentially due to coupling to other undesired resonant modes), resulting in an effective lowering of the resonator Q.

For applications where the low-loss inductive element or the external circuit, may exhibit variations, the matching circuit may need to be adjusted dynamically to match the inductive element to the external circuit impedance, $Z_0$, at the desired frequency, f. Since there may typically be two tuning objectives, matching or controlling both the real and imaginary part of the impedance level, $Z_0$, at the desired frequency, f, there may be two variable elements in the matching circuit. For inductive elements, the matching circuit may need to include at least one variable capacitive element.

A low-loss inductive element may be matched by topologies using two variable capacitors, or two networks of variable capacitors. A variable capacitor may, for example, be a tunable butterfly-type capacitor having, e.g., a center terminal for connection to a ground or other lead of a power source or load, and at least one other terminal across which a capacitance of the tunable butterfly-type capacitor can be varied or tuned, or any other capacitor having a user-configurable, variable capacitance.

A low-loss inductive element may be matched by topologies using one, or a network of, variable capacitor(s) and one, or a network of, variable inductor(s).

A low-loss inductive element may be matched by topologies using one, or a network of, variable capacitor(s) and one, or a network of, variable mutual inductance(s), which transformer-couple the inductive element either to an external circuit or to other systems.

In some cases, it may be difficult to find or implement tunable lumped elements with size, cost and performance specifications sufficient to realize high-Q, high-power, and potentially high-speed, tunable resonator designs. The topology of the circuit matching a variable inductive element to an external circuit may be designed so that some of the variability is assigned to the external circuit by varying the frequency, amplitude, phase, waveform, duty cycle, and the like, of the drive signals applied to transistors, diodes, switches and the like, in the external circuit.

The variations in resistance, R, and inductance, L, of an inductive element at the resonant frequency may be only partially compensated or not compensated at all. Adequate system performance may thus be preserved by tolerances designed into other system components or specifications. Partial adjustments, realized using fewer tunable components or less capable tunable components, may be sufficient.

Matching-circuit architectures may be designed that achieve the desired variability of the impedance matching circuit under high-power conditions, while minimizing the voltage/current rating requirements on its tunable elements and achieving a finer (i.e. more precise, with higher resolution) overall tunability. The topology of the circuit matching a variable inductive element to an impedance, $Z_0$, may include appropriate combinations and placements of fixed and variable elements, so that the voltage/current requirements for the variable components may be reduced and the desired tuning range may be covered with finer tuning resolution. The voltage/current requirements may be reduced on components that are not variable.

The disclosed impedance matching architectures and techniques may be used to achieve the following:
  To maximize the power delivered to, or to minimize impedance mismatches between, the source low-loss inductive elements (and any other systems wirelessly coupled to them) from the power driving generators.
  To maximize the power delivered from, or to minimize impedance mismatches between, the device low-loss inductive elements (and any other systems wirelessly coupled to them) to the power driven loads.
  To deliver a controlled amount of power to, or to achieve a certain impedance relationship between, the source low-loss inductive elements (and any other systems wirelessly coupled to them) from the power driving generators.
  To deliver a controlled amount of power from, or to achieve a certain impedance relationship between, the device low-loss inductive elements (and any other systems wirelessly coupled to them) to the power driven loads.

Topologies for Preservation of Mode Profile (High-Q)

The resonator structure may be designed to be connected to the generator or the load wirelessly (indirectly) or with a hard-wired connection (directly).

Figure 28:
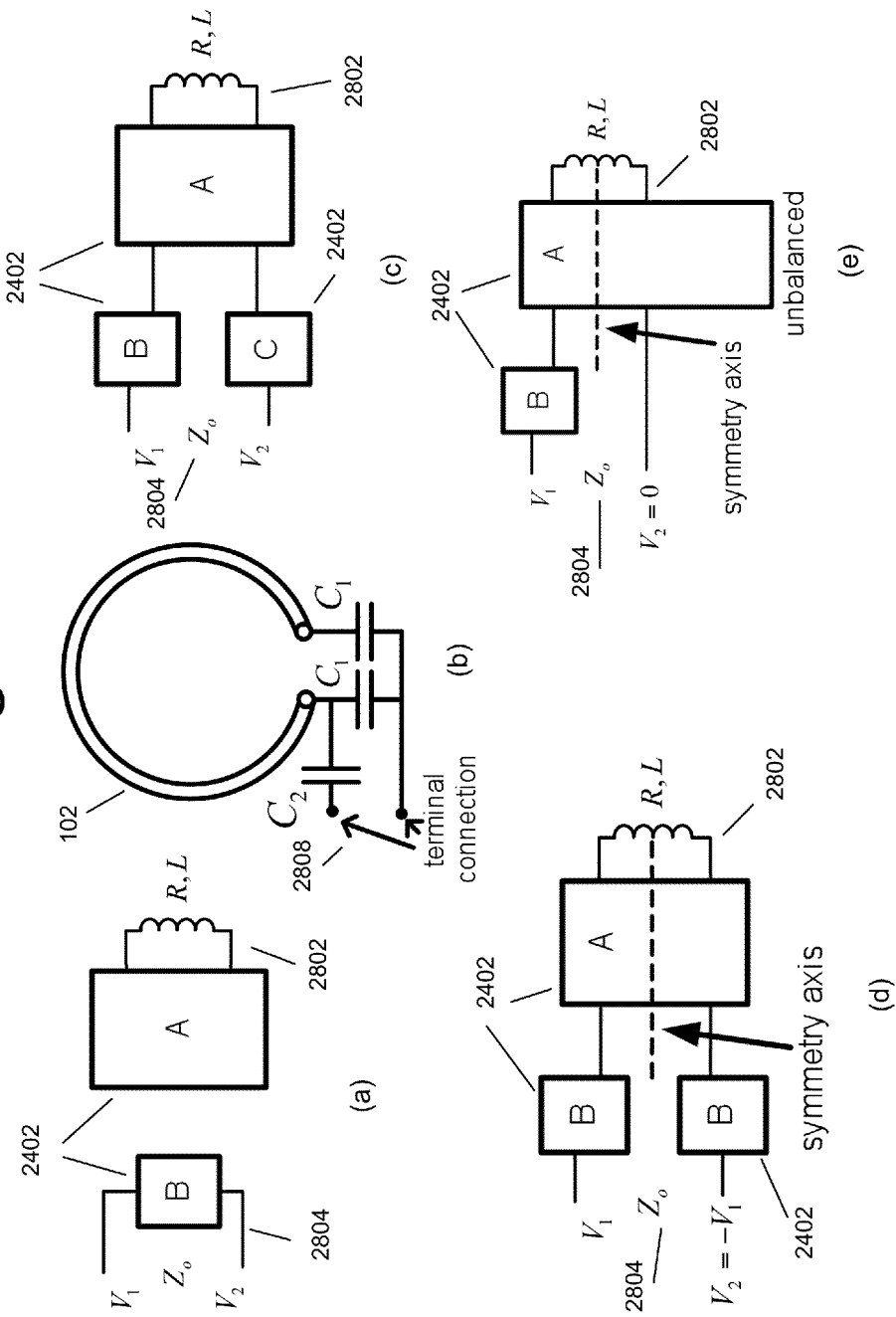
FIG. 28(a) depicts a general topology of a matching circuit including an indirect coupling to a high-Q inductive element.
FIG. 28(b) shows a block diagram of a magnetic resonator that includes a conductor loop inductor and a tunable impedance network. Physical electrical connections to this resonator may be made to the terminal connections.
FIG. 28(c) depicts a general topology of a matching circuit directly coupled to a high-Q inductive element.
FIG. 28(d) depicts a general topology of a symmetric matching circuit directly coupled to a high-Q inductive element and driven anti-symmetrically (balanced drive).
FIG. 28(e) depicts a general topology of a matching circuit directly coupled to a high-Q inductive element and connected to ground at a point of symmetry of the main resonator (unbalanced drive).

Consider a general indirectly coupled matching topology such as that shown by the block diagram in FIG. 28(a). There, an inductive element 2802, labeled as (R,L) and represented by the circuit symbol for an inductor, may be any of the inductive elements discussed in this disclosure or in the references provided herein, and where an impedance-matching circuit 2402 includes or consists of parts A and B. B may be the part of the matching circuit that connects the impedance 2804, $Z_0$, to the rest of the circuit (the combination of A and the inductive element (A+(R,L)) via a wireless connection (an inductive or capacitive coupling mechanism).

The combination of A and the inductive element 2802 may form a resonator 102, which in isolation may support a high-Q resonator electromagnetic mode, with an associated current and charge distribution. The lack of a wired connection between the external circuit, $Z_0$ and B, and the resonator, A+(R,L), may ensure that the high-Q resonator electromagnetic mode and its current/charge distributions may take the form of its intrinsic (in-isolation) profile, so long as the degree of wireless coupling is not too large. That is, the electromagnetic mode, current/charge distributions, and thus the high-Q of the resonator may be automatically maintained using an indirectly coupled matching topology.

This matching topology may be referred to as indirectly coupled, or transformer-coupled, or inductively-coupled, in the case where inductive coupling is used between the external circuit and the inductor loop. This type of coupling scenario was used to couple the power supply to the source resonator and the device resonator to the light bulb in the demonstration of wireless energy transfer over mid-range distances described in the referenced *Science* article.

Next consider examples in which the inductive element may include the inductive element and any indirectly coupled systems. In this case, as disclosed above, and again because of the lack of a wired connection between the external circuit or the coupled systems and the resonator, the coupled systems may not, with good approximation for not-too-large degree of indirect coupling, affect the resonator electromagnetic mode profile and the current/charge distributions of the resonator. Therefore, an indirectly-coupled matching circuit may work equally well for any general inductive element as part of a resonator as well as for inductive elements wirelessly-coupled to other systems, as defined herein. Throughout this disclosure, the matching topologies we disclose refer to matching topologies for a general inductive element of this type, that is, where any additional systems may be indirectly coupled to the low-loss inductive element, and it is to be understood that those additional systems do not greatly affect the resonator electromagnetic mode profile and the current/charge distributions of the resonator.

Based on the argument above, in a wireless power transmission system of any number of coupled source resonators, device resonators and intermediate resonators the wireless magnetic (inductive) coupling between resonators does not affect the electromagnetic mode profile and the current/charge distributions of each one of the resonators. Therefore, when these resonators have a high (unloaded and unperturbed) Q, their (unloaded and unperturbed) Q may be preserved in the presence of the wireless coupling. (Note that the loaded Q of a resonator may be reduced in the presence of wireless coupling to another resonator, but we may be interested in preserving the unloaded Q, which relates only to loss mechanisms and not to coupling/loading mechanisms.)

Consider a matching topology such as is shown in FIG. 28(b). The capacitors shown in FIG. 28(b) may represent capacitor circuits or networks. The capacitors shown may be used to form the resonator 102 and to adjust the frequency and/or impedance of the source and device resonators. This resonator 102 may be directly coupled to an impedance, $Z_0$, using the ports labeled "terminal connections" 2808. FIG. 28(c) shows a generalized directly coupled matching topology, where the impedance-matching circuit 2602 includes or consists of parts A, B and C. Here, circuit elements in A, B and C may be considered part of the resonator 102 as well as part of the impedance matching 2402 (and frequency tuning) topology. B and C may be the parts of the matching circuit 2402 that connect the impedance $Z_0$ 2804 (or the network terminals) to the rest of the circuit (A and the inductive element) via a single wire connection each. Note that B and C could be empty (short-circuits). If we disconnect or open circuit parts B and C (namely those single wire connections), then, the combination of A and the inductive element (R,L) may form the resonator.

The high-Q resonator electromagnetic mode may be such that the profile of the voltage distribution along the inductive element has nodes, namely positions where the voltage is zero. One node may be approximately at the center of the length of the inductive element, such as the center of the conductor used to form the inductive element, (with or without magnetic materials) and at least one other node may be within A. The voltage distribution may be approximately anti-symmetric along the inductive element with respect to its voltage node. A high Q may be maintained by designing the matching topology (A, B, C) and/or the terminal voltages (V1, V2) so that this high-Q resonator electromagnetic mode distribution may be approximately preserved on the inductive element. This high-Q resonator electromagnetic mode distribution may be approximately preserved on the inductive element by preserving the voltage node (approximately at the center) of the inductive element. Examples that achieve these design goals are provided herein.

A, B, and C may be arbitrary (namely not having any special symmetry), and V1 and V2 may be chosen so that the voltage across the inductive element is symmetric (voltage node at the center inductive). These results may be achieved using simple matching circuits but potentially complicated terminal voltages, because a topology-dependent common-mode signal (V1+V2)/2 may be required on both terminals.

Consider an 'axis' that connects all the voltage nodes of the resonator, where again one node is approximately at the center of the length of the inductive element and the others within A. (Note that the 'axis' is really a set of points (the voltage nodes) within the electric-circuit topology and may not necessarily correspond to a linear axis of the actual physical structure. The 'axis' may align with a physical axis in cases where the physical structure has symmetry.) Two points of the resonator are electrically symmetric with respect to the 'axis', if the impedances seen between each of the two points and a point on the 'axis', namely a voltage-node point of the resonator, are the same.

B and C may be the same (C=B), and the two terminals may be connected to any two points of the resonator (A+(R,L)) that are electrically symmetric with respect to the 'axis' defined above and driven with opposite voltages (V2=−V1) as shown in FIG. 28(d). The two electrically symmetric points of the resonator 102 may be two electrically symmetric points on the inductor loop. The two electrically symmetric points of the resonator may be two electrically symmetric points inside A. If the two electrically symmetric points, (to which each of the equal parts B and C is connected), are inside A, A may need to be designed so that these electrically-symmetric points are accessible as connection points within the circuit. This topology may be referred to as a 'balanced drive' topology. These balanced-drive examples may have the advantage that any common-mode signal that may be present on the ground line, due to perturbations at the external circuitry or the power network, for example, may be automatically rejected (and may not reach the resonator). In some balanced-drive examples, this topology may require more components than other topologies.

In other examples, C may be chosen to be a short-circuit and the corresponding terminal to be connected to ground (V=0) and to any point on the electric-symmetry (zero-voltage) 'axis' of the resonator, and B to be connected to any other point of the resonator not on the electric-symmetry 'axis', as shown in FIG. 28(e). The ground-connected point on the electric-symmetry 'axis' may be the voltage node on the inductive element, approximately at the center of its conductor length. The ground-connected point on the electric-symmetry 'axis' may be inside the circuit A. Where the ground-connected point on the electric-symmetry 'axis' is inside A, A may need to be designed to include one such point on the electrical-symmetric 'axis' that is electrically accessible, namely where connection is possible.

This topology may be referred to as an 'unbalanced drive' topology. The approximately anti-symmetric voltage distribution of the electromagnetic mode along the inductive element may be approximately preserved, even though the resonator may not be driven exactly symmetrically. The reason is that the high Q and the large associated R-vs.-$Z_0$ mismatch necessitate that a small current may run through B and ground, compared to the much larger current that may flow inside the resonator, (A+(R,L)). In this scenario, the perturbation on the resonator mode may be weak and the location of the voltage node may stay at approximately the center location of the inductive element. These unbalanced-drive examples may have the advantage that they may be achieved using simple matching circuits and that there is no restriction on the driving voltage at the V1 terminal. In some unbalanced-drive examples, additional designs may be required to reduce common-mode signals that may appear at the ground terminal.

The directly-coupled impedance-matching circuit, generally including or consisting of parts A, B and C, as shown in FIG. 28(c), may be designed so that the wires and components of the circuit do not perturb the electric and magnetic field profiles of the electromagnetic mode of the inductive element and/or the resonator and thus preserve the high resonator Q. The wires and metallic components of the circuit may be oriented to be perpendicular to the electric field lines of the electromagnetic mode. The wires and components of the circuit may be placed in regions where the electric and magnetic field of the electromagnetic mode are weak.

Topologies for Alleviating Low-Series-Loss and High-Current-Rating Requirements on Elements If the matching circuit used to match a small resistance, R, of a low-loss inductive element to a larger characteristic impedance, $Z_0$, of an external circuit may be considered lossless, then $I_{Z_o}^2 Z_o = I_R^2 R \leftrightarrow I_{Z_o}/I_R = \sqrt{R/Z_o}$ and the current flowing through the terminals is much smaller than the current flowing through the inductive element. Therefore, elements connected immediately in series with the terminals (such as in directly-coupled B, C (FIG. 28(c))) may not carry high currents. Then, even if the matching circuit has lossy elements, the resistive loss present in the elements in series with the terminals may not result in a significant reduction in the high-Q of the resonator. That is, resistive loss in those series elements may not significantly reduce the efficiency of power transmission from $Z_0$ to the inductive element or vice versa. Therefore, strict requirements for low-series-loss and/or high current-ratings may not be necessary for these components. In general, such reduced requirements may lead to a wider selection of components that may be designed into the high-Q and/or high-power impedance matching and resonator topologies. These reduced requirements may be especially helpful in expanding the variety of variable and/or high voltage and/or low-parallel-loss components that may be used in these high-Q and/or high-power impedance-matching circuits.

Topologies for Alleviating Low-Parallel-Loss and High-Voltage-Rating Requirements on Elements If, as above, the matching circuit used to match a small resistance, R, of a low-loss inductive element to a larger characteristic impedance, $Z_0$, of an external circuit is lossless, then using the previous analysis, $$|V_{Z_o}/V_{load}| = |I_{Z_o} Z_o / I_R(R+jX)| \approx \sqrt{R/Z_o} \cdot Z_o/X = \sqrt{Z_o/R}/(X/R),$$

and, for a low-loss (high-X/R) inductive element, the voltage across the terminals may be typically much smaller than the voltage across the inductive element. Therefore, elements connected immediately in parallel to the terminals may not need to withstand high voltages. Then, even if the matching circuit has lossy elements, the resistive loss present in the elements in parallel with the terminals may not result in a significant reduction in the high-Q of the resonator. That is, resistive loss in those parallel elements may not significantly reduce the efficiency of power transmission from $Z_0$ to the inductive element or vice versa. Therefore, strict requirements for low-parallel-loss and/or high voltage-ratings may not be necessary for these components. In general, such reduced requirements may lead to a wider selection of components that may be designed into the high-Q and/or high-power impedance matching and resonator topologies. These reduced requirements may be especially helpful in expanding the variety of variable and/or high current and/or low-series-loss components that may be used in these high-Q and/or high-power impedance-matching and resonator circuits.

Note that the design principles above may reduce currents and voltages on various elements differently, as they variously suggest the use of networks in series with $Z_0$ (such as directly-coupled B, C) or the use of networks in parallel with $Z_0$. The preferred topology for a given application may depend on the availability of low-series-loss/high-current-rating or low-parallel-loss/high-voltage-rating elements.

Combinations of Fixed and Variable Elements for Achieving Fine Tunability and Alleviating High-Rating Requirements on Variable Elements Circuit Topologies Variable circuit elements with satisfactory low-loss and high-voltage or current ratings may be difficult or expensive to obtain. In this disclosure, we describe impedance-matching topologies that may incorporate combinations of fixed and variable elements, such that large voltages or currents may be assigned to fixed elements in the circuit, which may be more likely to have adequate voltage and current ratings, and alleviating the voltage and current rating requirements on the variable elements in the circuit.

Variable circuit elements may have tuning ranges larger than those required by a given impedance-matching application and, in those cases, fine tuning resolution may be difficult to obtain using only such large-range elements. In this disclosure, we describe impedance-matching topologies that incorporate combinations of both fixed and variable elements, such that finer tuning resolution may be accomplished with the same variable elements.

Therefore, topologies using combinations of both fixed and variable elements may bring two kinds of advantages simultaneously: reduced voltage across, or current through, sensitive tuning components in the circuit and finer tuning resolution. Note that the maximum achievable tuning range may be related to the maximum reduction in voltage across, or current through, the tunable components in the circuit designs.

Element Topologies

A single variable circuit-element (as opposed to the network of elements discussed above) may be implemented by a topology using a combination of fixed and variable components, connected in series or in parallel, to achieve a reduction in the rating requirements of the variable components and a finer tuning resolution. This can be demonstrated mathematically by the fact that:

If $x_{|total|} = x_{|fixed|} + x_{|variable|}$, then $\Delta x_{|total|} / x_{|total|} = \Delta x_{|variable|} / (x_{|fixed|} + x_{|variable|})$, and $X_{variable} / X_{total} = X_{variable} / (X_{fixed} + X_{variable})$, where $x_{|subscript|}$ is any element value (e.g. capacitance, inductance), X is voltage or current, and the "+ sign" denotes the appropriate (series-addition or parallel-addition) combination of elements. Note that the subscript format for $x_{|subscript|}$ is chosen to easily distinguish it from the radius of the area enclosed by a circular inductive element (e.g. x, $x_1$, etc.).

Furthermore, this principle may be used to implement a variable electric element of a certain type (e.g. a capacitance or inductance) by using a variable element of a different type, if the latter is combined appropriately with other fixed elements.

In conclusion, one may apply a topology optimization algorithm that decides on the required number, placement, type and values of fixed and variable elements with the required tunable range as an optimization constraint and the minimization of the currents and/or voltages on the variable elements as the optimization objective.

EXAMPLES

In the following schematics, we show different specific topology implementations for impedance matching to and resonator designs for a low-loss inductive element. In addition, we indicate for each topology: which of the principles described above are used, the equations giving the values of the variable elements that may be used to achieve the matching, and the range of the complex impedances that may be matched (using both inequalities and a Smith-chart description). For these examples, we assume that $Z_0$ is real, but an extension to a characteristic impedance with a non-zero imaginary part is straightforward, as it implies only a small adjustment in the required values of the components of the matching network. We will use the convention that the subscript, n, on a quantity implies normalization to (division by) $Z_0$.

Figure 29:
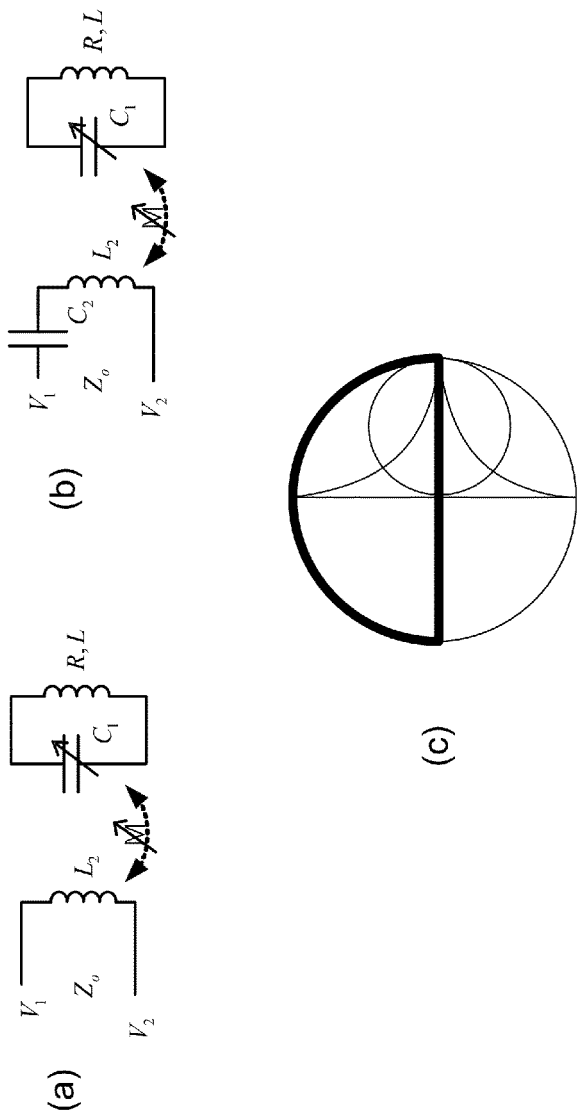
FIGS. 29(a) and 29(b) depict two topologies of matching circuits transformer-coupled (i.e. indirectly or inductively) to a high-Q inductive element. The highlighted portion of the Smith chart in (c) depicts the complex impedances (arising from L and R of the inductive element) that may be matched to an arbitrary real impedance $Z_0$ by the topology of FIG. 31(b) in the case $\omega L_2 = 1/\omega C_2$.

FIG. 29 shows two examples of a transformer-coupled impedance-matching circuit, where the two tunable elements are a capacitor and the mutual inductance between two inductive elements. If we define respectively $X_2 = \omega L_2$ for FIG. 29(a) and $X_2 = \omega L_2 - 1/\omega C_2$ for FIG. 29(b), and $X \equiv \omega L$, then the required values of the tunable elements are:

$$\omega C_1 = \frac{1}{X + RX_{2n}}$$

$$\omega M = \sqrt{Z_o R(1 + X_{2n}^2)}.$$

For the topology of FIG. 29(b), an especially straightforward design may be to choose $X_2 = 0$. In that case, these topologies may match the impedances satisfying the inequalities:

$R_n > 0, X_n > 0,$ which are shown by the area enclosed by the bold lines on the Smith chart of FIG. 29(c).

Given a well pre-chosen fixed M, one can also use the above matching topologies with a tunable $C_2$ instead.

Figure 30:
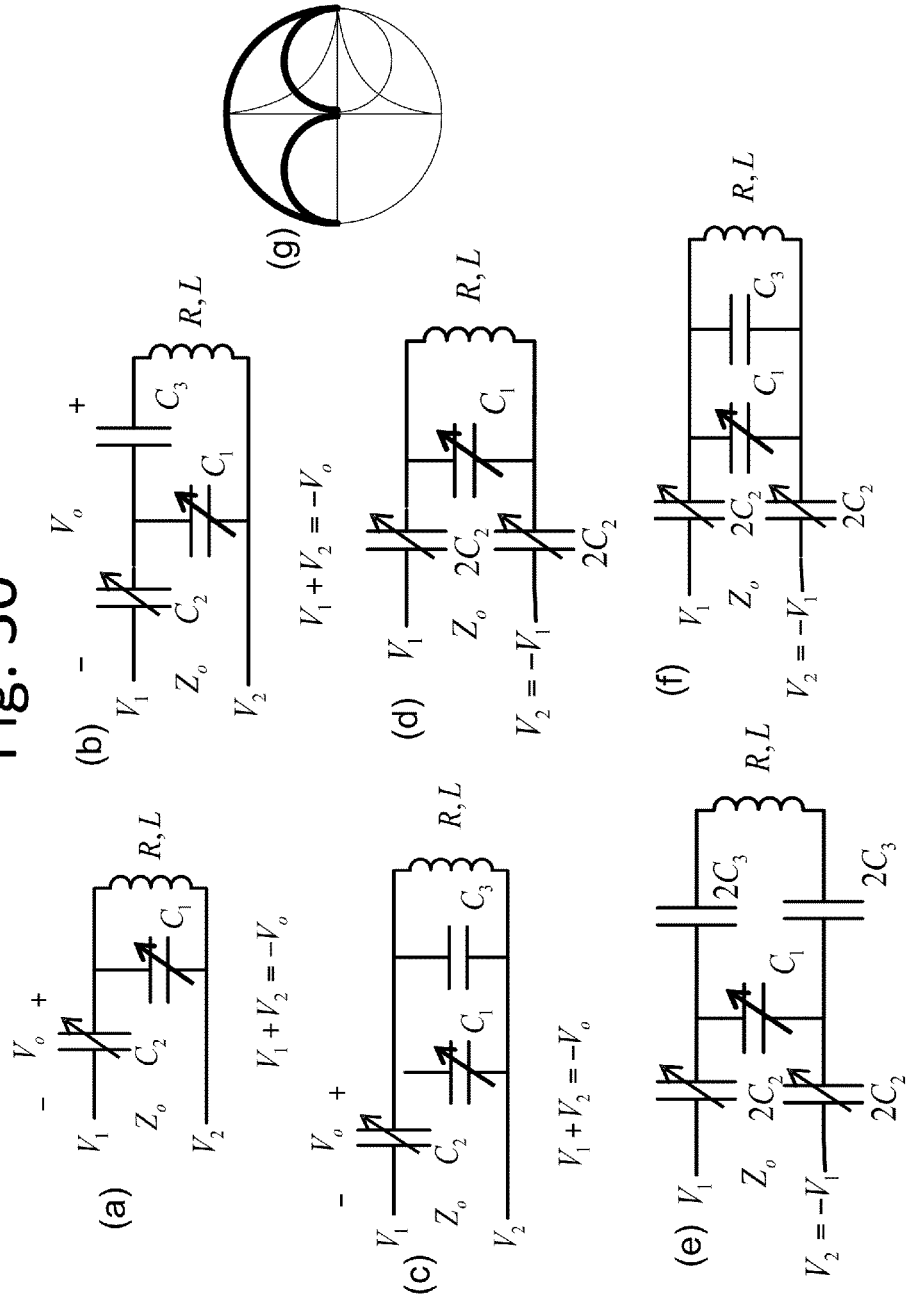
FIGS. 30(a),(b),(c),(d),(e),(f) depict six topologies of matching circuits directly coupled to a high-Q inductive element and including capacitors in series with $Z_0$. The topologies shown in FIGS. 30(a),(b),(c) are driven with a common-mode signal at the input terminals, while the topologies shown in FIGS. 30(d),(e),(f) are symmetric and receive a balanced drive. The highlighted portion of the Smith chart in 30(g) depicts the complex impedances that may be matched by these topologies.
FIGS. 30(h),(i),(j),(k),(l),(m) depict six topologies of matching circuits directly coupled to a high-Q inductive element and including inductors in series with $Z_0$.
Figure 30:
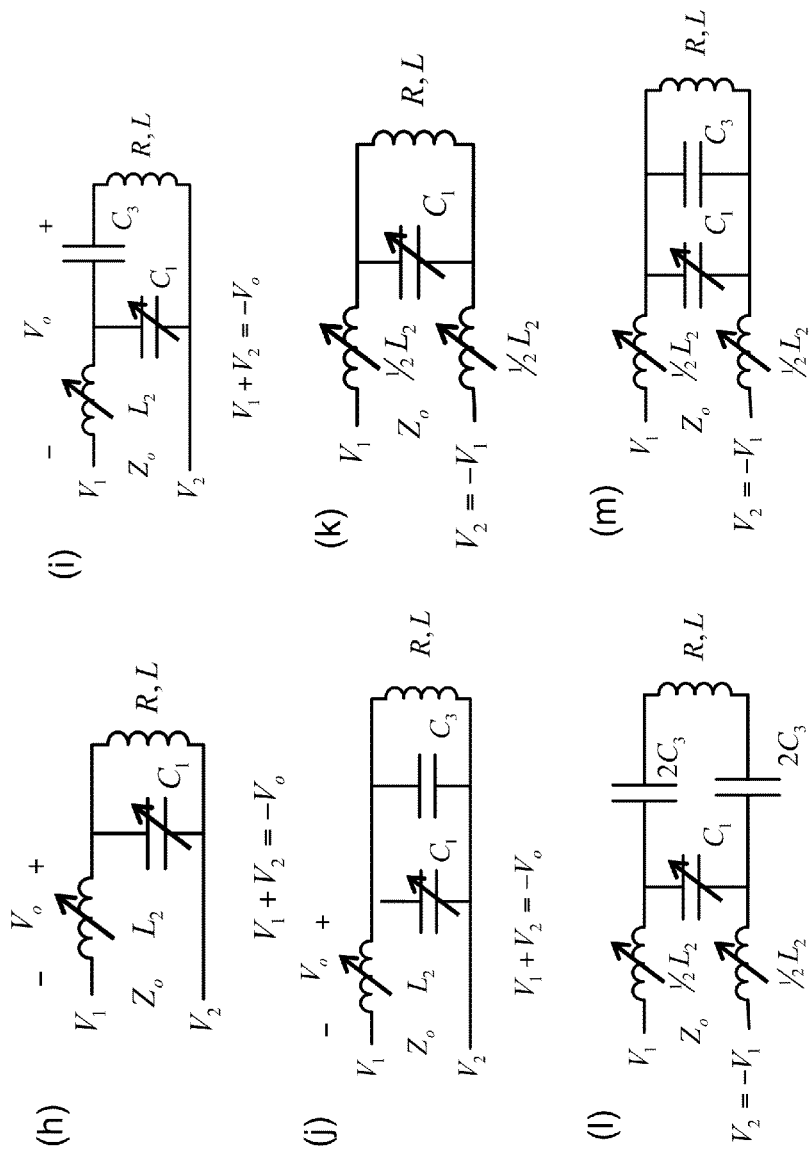

FIG. 30 shows six examples (a)-(f) of directly-coupled impedance-matching circuits, where the two tunable elements are capacitors, and six examples (h)-(m) of directly-coupled impedance-matching circuits, where the two tunable elements are one capacitor and one inductor. For the topologies of FIGS. 30(a),(b),(c),(h),(i),(j), a common-mode signal may be required at the two terminals to preserve the voltage node of the resonator at the center of the inductive element and thus the high Q. Note that these examples may be described as implementations of the general topology shown in FIG. 28(c). For the symmetric topologies of FIGS. 30(d), (e),(f),(k),(l),(m), the two terminals may need to be driven anti-symmetrically (balanced drive) to preserve the voltage node of the resonator at the center of the inductive element and thus the high Q. Note that these examples may be described as implementations of the general topology shown in FIG. 28(d). It will be appreciated that a network of capacitors, as used herein, may in general refer to any circuit topology including one or more capacitors, including without limitation any of the circuits specifically disclosed herein using capacitors, or any other equivalent or different circuit structure(s), unless another meaning is explicitly provided or otherwise clear from the context.

Let us define respectively $Z = R + j\omega L$ for FIGS. 30(a),(d), (h),(k), $Z = R + j\omega L + 1/j\omega C_3$ for FIGS. 30(b),(e),(i),(l), and $Z = (R + j\omega L) \| (1/j\omega C_3)$ for FIGS. 30(c),(f),(j),(m), where the symbol "$\|$" means "the parallel combination of", and then $R \equiv \text{Re}\{Z\}$, $X \equiv \text{Im}\{Z\}$. Then, for FIGS. 30(a)-(f) the required values of the tunable elements may be given by:

$$\omega C_1 = \frac{X - \sqrt{X^2 R_n - R^2(1 - R_n)}}{X^2 + R^2},$$

$$\omega C_2 = \frac{R_n \omega C_1}{1 - X\omega C_1 - R_n},$$

and these topologies can match the impedances satisfying the inequalities:

$R_n \leq 1, X_n \geq \sqrt{R_n(1 - R_n)}$ which are shown by the area enclosed by the bold lines on the Smith chart of FIG. 30(g). For FIGS. 30(h)-(m) the required values of the tunable elements may be given by:

$$\omega C_1 = \frac{X + \sqrt{X^2 R_n - R^2(1 - R_n)}}{X^2 + R^2},$$

$$\omega L_2 = \frac{1 - X\omega C_1 - R_n}{R_n \omega C_1}.$$

Figure 31:
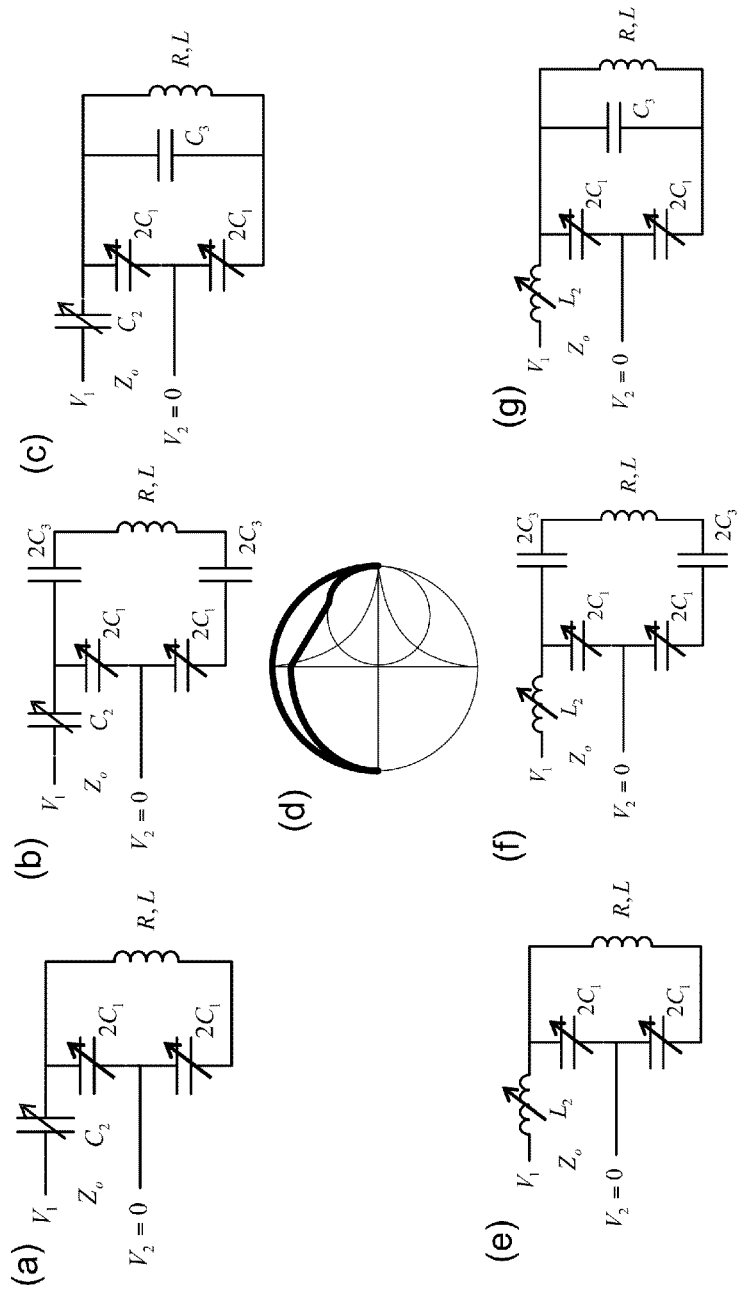
FIGS. 31(a),(b),(c) depict three topologies of matching circuits directly coupled to a high-Q inductive element and including capacitors in series with $Z_0$. They are connected to ground at the center point of a capacitor and receive an unbalanced drive. The highlighted portion of the Smith chart in FIG. 31(d) depicts the complex impedances that may be matched by these topologies.
FIGS. 31(e),(f),(g) depict three topologies of matching circuits directly coupled to a high-Q inductive element and including inductors in series with $Z_0$.

FIG. 31 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 31(a),(b),(c),(e),(f),(g), the ground terminal is connected between two equal-value capacitors, $2C_1$, (namely on the axis of symmetry of the main resonator) to preserve the voltage node of the resonator at the center of the inductive element and thus the high Q. Note that these examples may be described as implementations of the general topology shown in FIG. 28(e).

Let us define respectively $Z = R + j\omega L$ for FIGS. 31(a),(e), $Z = R + j\omega L + 1/j\omega C_3$ for FIGS. 31(b),(f), and $Z = (R + j\omega L) \| (1/j\omega C_3)$ for FIG. 31(c),(g), and then $R \equiv \text{Re}\{Z\}$, $X \equiv \text{Im}\{Z\}$. Then, for FIGS. 31(a)-(c) the required values of the tunable elements may be given by:

$$\omega C_1 = \frac{X - \frac{1}{2}\sqrt{X^2 R_n - R^2(4 - R_n)}}{X^2 + R^2},$$

$$\omega C_2 = \frac{R_n \omega C_1}{1 - X\omega C_1 - \frac{R_n}{2}},$$

and these topologies can match the impedances satisfying the inequalities:

$$R_n \leq 1, X_n \geq \sqrt{\frac{R_n}{1 - R_n}}(2 - R_n)$$

which are shown by the area enclosed by the bold lines on the Smith chart of FIG. 31(d). For FIGS. 31(e)-(g) the required values of the tunable elements may be given by:

$$\omega C_1 = \frac{X + \frac{1}{2}\sqrt{X^2 R_n - R^2(4 - R_n)}}{X^2 + R^2},$$

$$\omega L_2 = -\frac{1 - X\omega C_1 - \frac{R_n}{2}}{R_n \omega C_1}.$$

Figure 32:
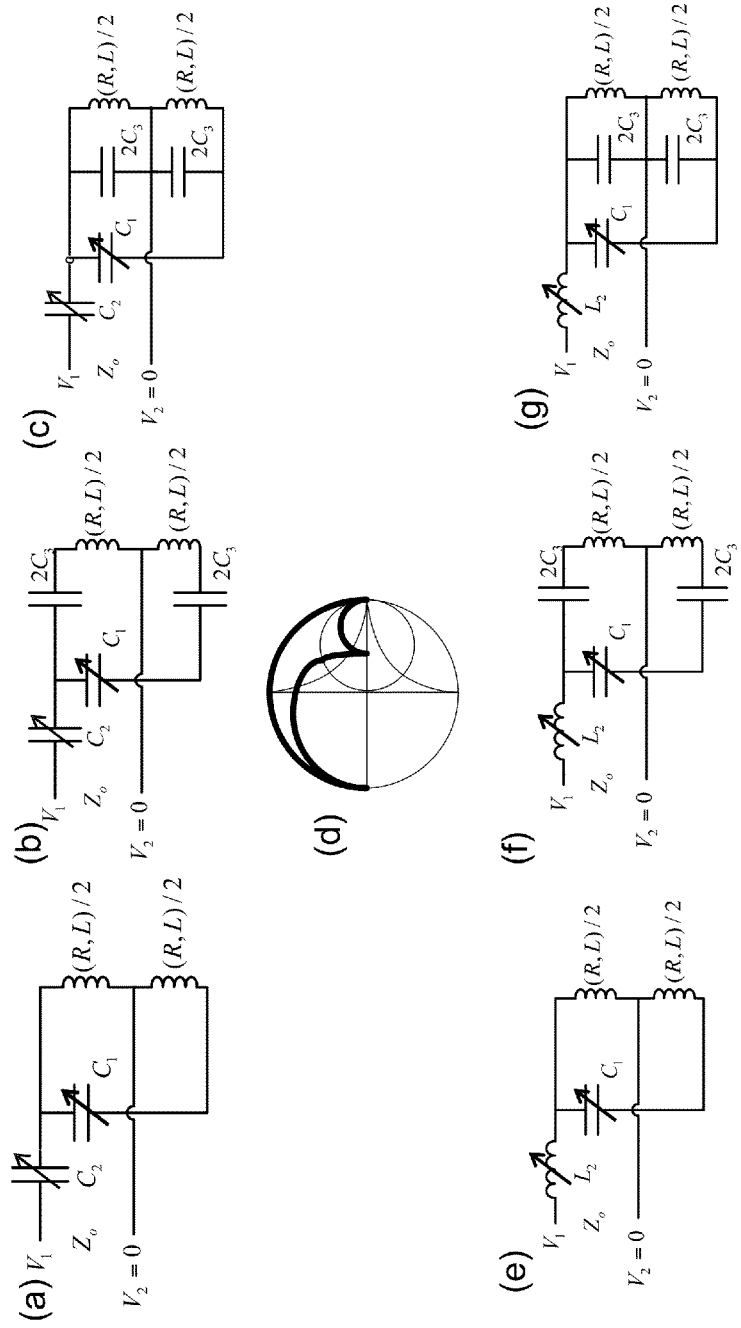
FIGS. 32(a),(b),(c) depict three topologies of matching circuits directly coupled to a high-Q inductive element and including capacitors in series with $Z_0$. They are connected to ground by tapping at the center point of the inductor loop and receive an unbalanced drive. The highlighted portion of the Smith chart in (d) depicts the complex impedances that may be matched by these topologies, (e),(f),(g) depict three topologies of matching circuits directly coupled to a high-Q inductive element and including inductors in series with $Z_0$.

FIG. 32 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 32(a),(b),(c),(e),(f),(g), the ground terminal may be connected at the center of the inductive element to preserve the voltage node of the resonator at that point and thus the high Q. Note that these example may be described as implementations of the general topology shown in FIG. 28(e).

Let us define respectively Z=R+jωL for FIG. 32(a), Z=R+jωL+1/jωC$_3$ for FIG. 32(b), and Z=(R+jωL)∥(1/jωC$_3$) for FIG. 32(c), and then R≡Re{Z}, X≡Im{Z}. Then, for FIGS. 32(a)-(c) the required values of the tunable elements may be given by:

$$\omega C_1 = \frac{X - \sqrt{\frac{X^2 R_n - 2R^2(2 - R_n)}{4 - R_n}}}{X^2 + R^2},$$

$$\omega C_2 = \frac{R_n \omega C_1}{1 - X\omega C_1 - \frac{R_n}{2} + \frac{R_n X \omega C_1}{2(1+k)}},$$

where k is defined by M'=−kL', where L' is the inductance of each half of the inductor loop and M' is the mutual inductance between the two halves, and these topologies can match the impedances satisfying the inequalities:

$$R_n \leq 2, X_n \geq \sqrt{2R_n(2 - R_n)}$$

which are shown by the area enclosed by the bold lines on the Smith chart of FIG. 32(d). For FIGS. 32(e)-(g) the required values of the tunable elements may be given by:

$$\omega C_1 = \frac{X + \sqrt{\frac{X^2 R_n - 2R^2(2 - R_n)}{4 - R_n}}}{X^2 + R^2},$$

In the circuits of FIGS. 30, 31, 32, the capacitor, C$_2$, or the inductor, L$_2$, is (or the two capacitors, 2C$_2$, or the two inductors, L$_2$/2, are) in series with the terminals and may not need to have very low series-loss or withstand a large current.

Figure 33:
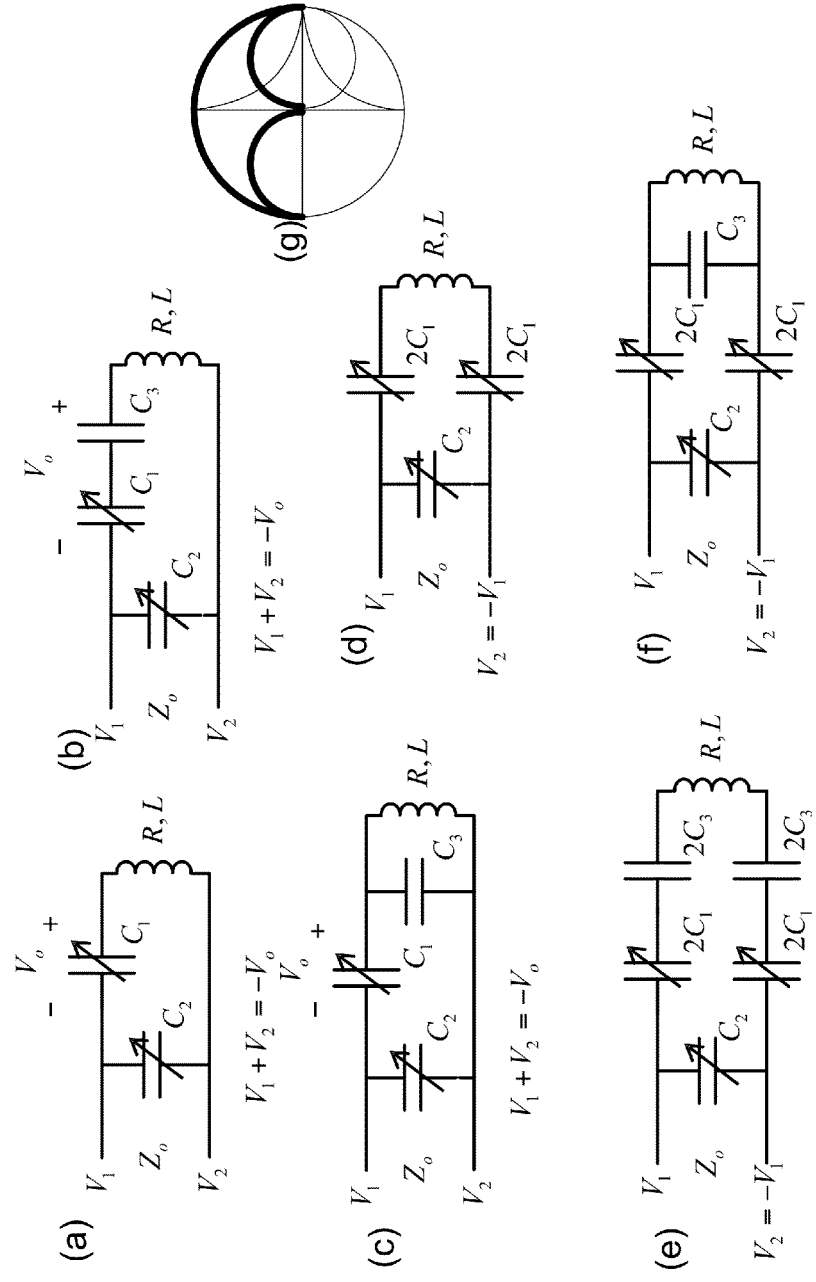
FIGS. 33(a),(b),(c),(d),(e),(f) depict six topologies of matching circuits directly coupled to a high-Q inductive element and including capacitors in parallel with $Z_0$. The topologies shown in FIGS. 33(a),(b),(c) are driven with a common-mode signal at the input terminals, while the topologies shown in FIGS. 33(d),(e),(f) are symmetric and receive a balanced drive. The highlighted portion of the Smith chart in FIG. 33(g) depicts the complex impedances that may be matched by these topologies.
FIGS. 33(h),(i),(j),(k),(l),(m) depict six topologies of matching circuits directly coupled to a high-Q inductive element and including inductors in parallel with $Z_0$.
Figure 33:
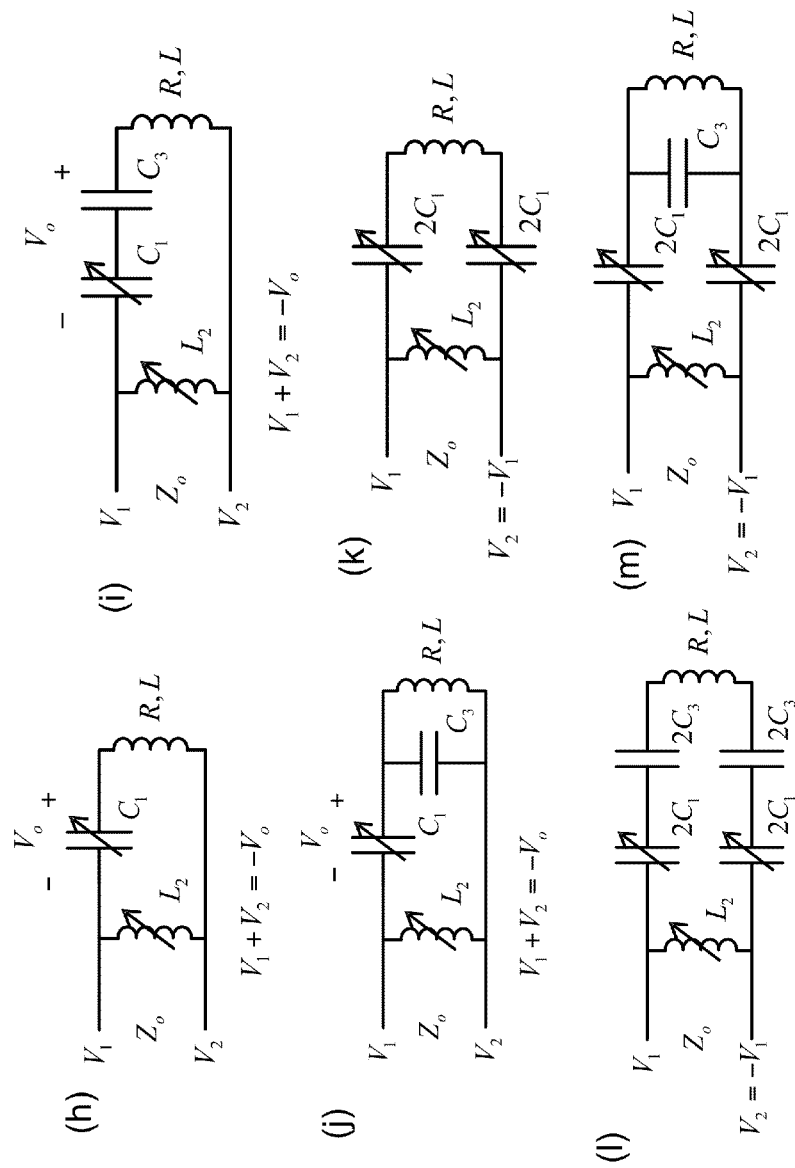

FIG. 33 shows six examples (a)-(f) of directly-coupled impedance-matching circuits, where the two tunable elements are capacitors, and six examples (h)-(m) of directly-coupled impedance-matching circuits, where the two tunable elements are one capacitor and one inductor. For the topologies of FIGS. 33(a),(b),(c),(h),(i),(j), a common-mode signal may be required at the two terminals to preserve the voltage node of the resonator at the center of the inductive element and thus the high Q. Note that these examples may be described as implementations of the general topology shown in FIG. 28(c), where B and C are short-circuits and A is not balanced. For the symmetric topologies of FIGS. 33(d),(e),(f),(k),(l),(m), the two terminals may need to be driven anti-symmetrically (balanced drive) to preserve the voltage node of the resonator at the center of the inductive element and thus the high Q. Note that these examples may be described as implementations of the general topology shown in FIG. 28(d), where B and C are short-circuits and A is balanced.

Let us define respectively Z=R+jωL for FIGS. 33(a),(d), (h),(k), Z=R+jωL+1/jωC$_3$ for FIGS. 33(b),(e),(i),(l), and Z=(R+jωL)∥(1/jωC$_3$) for FIGS. 33(c),(f),(j),(m), and then R≡Re{Z}, X≡Im{Z}. Then, for FIGS. 33(a)-(f) the required values of the tunable elements may be given by:

$$\omega C_1 = \frac{1}{X - Z_o \sqrt{R_n(1 - R_n)}},$$

$$\omega C_2 = \frac{1}{Z_o}\sqrt{\frac{1}{R_n} - 1},$$

and these topologies can match the impedances satisfying the inequalities:

$$R_n \leq 1, X_n \geq \sqrt{R_n(1 - R_n)}$$

which are shown by the area enclosed by the bold lines on the Smith chart of FIG. 33(g). For FIGS. 35(h)-(m) the required values of the tunable elements may be given by:

$$\omega C_1 = \frac{1}{X + Z_o \sqrt{R_n(1 - R_n)}},$$

$$\omega L_2 = \frac{Z_o}{\sqrt{\frac{1}{R_n} - 1}}.$$

Figure 34:
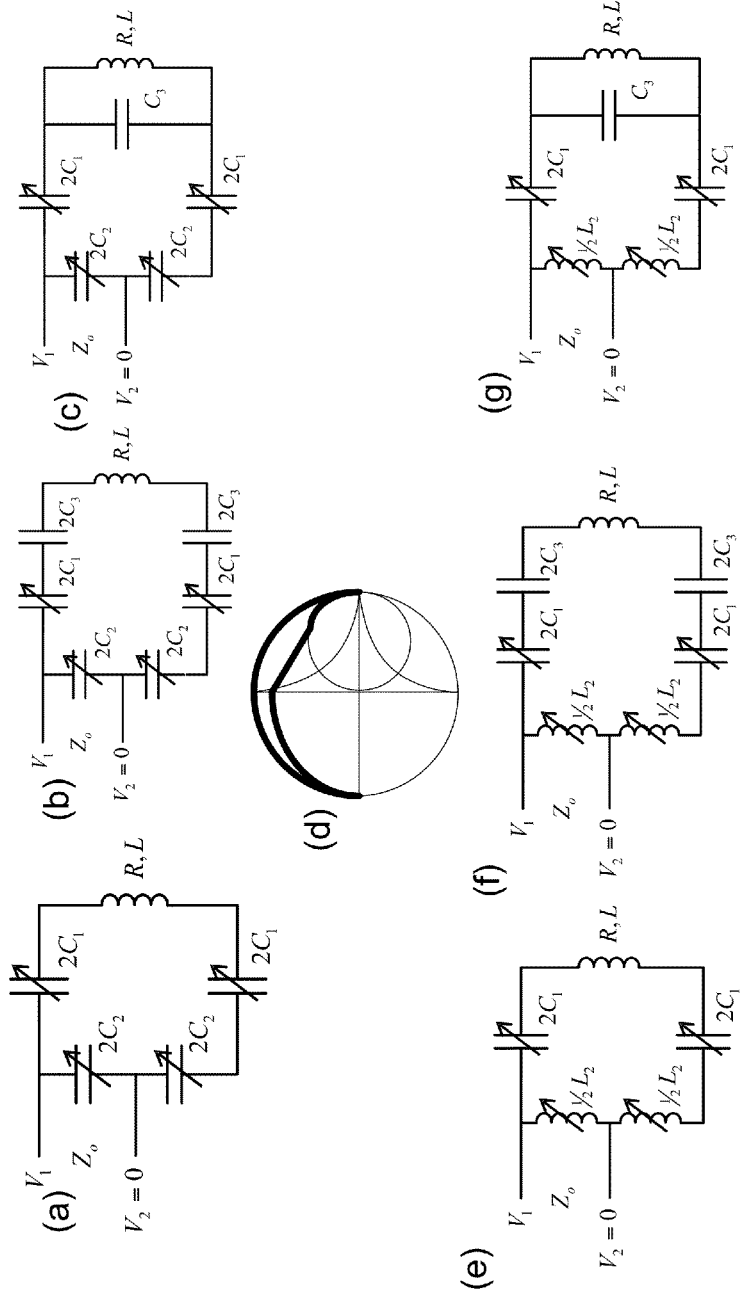
FIGS. 34(a),(b),(c) depict three topologies of matching circuits directly coupled to a high-Q inductive element and including capacitors in parallel with $Z_0$. They are connected to ground at the center point of a capacitor and receive an unbalanced drive. The highlighted portion of the Smith chart in (d) depicts the complex impedances that may be matched by these topologies.
FIGS. 34(e),(f),(g) depict three topologies of matching circuits directly coupled to a high-Q inductive element and including inductors in parallel with $Z_0$.

FIG. 34 shows three examples (a)-(c) of directly-coupled impedance-matching circuits, where the two tunable elements are capacitors, and three examples (e)-(g) of directly-coupled impedance-matching circuits, where the two tunable elements are one capacitor and one inductor. For the topologies of FIGS. 34(a),(b),(c),(e),(f),(g), the ground terminal is connected between two equal-value capacitors, 2C$_2$, (namely on the axis of symmetry of the main resonator) to preserve the voltage node of the resonator at the center of the inductive element and thus the high Q. Note that these examples may be described as implementations of the general topology shown in FIG. 28(e).

Let us define respectively $Z=R+j\omega L$ for FIG. 34(a),(e), $Z=R+j\omega L+1/j\omega C_3$ for FIG. 34(b),(f), and $Z=(R+j\omega L)\|(1/j\omega C_3)$ for FIG. 34(c),(g), and then $R\equiv Re\{Z\}$, $X\equiv Im\{Z\}$. Then, for FIGS. 34(a)-(c) the required values of the tunable elements may be given by:

$$\omega C_1 = \frac{1}{X - Z_o\sqrt{\frac{1-R_n}{R_n}}(2-R_n)},$$

$$\omega C_2 = \frac{1}{2Z_o}\sqrt{\frac{1}{R_n}-1},$$

and these topologies can match the impedances satisfying the inequalities:

$$R_n \leq 1, X_n \geq \sqrt{\frac{R_n}{1-R_n}}(2-R_n)$$

which are shown by the area enclosed by the bold lines on the Smith chart of FIG. 34(d). For FIGS. 34(e)-(g) the required values of the tunable elements may be given by:

$$\omega C_1 = \frac{1}{X + Z_o\sqrt{\frac{1-R_n}{R_n}}(2-R_n)},$$

$$\omega L_2 = \frac{2Z_o}{\sqrt{\frac{1}{R_n}-1}}.$$

Figure 35:
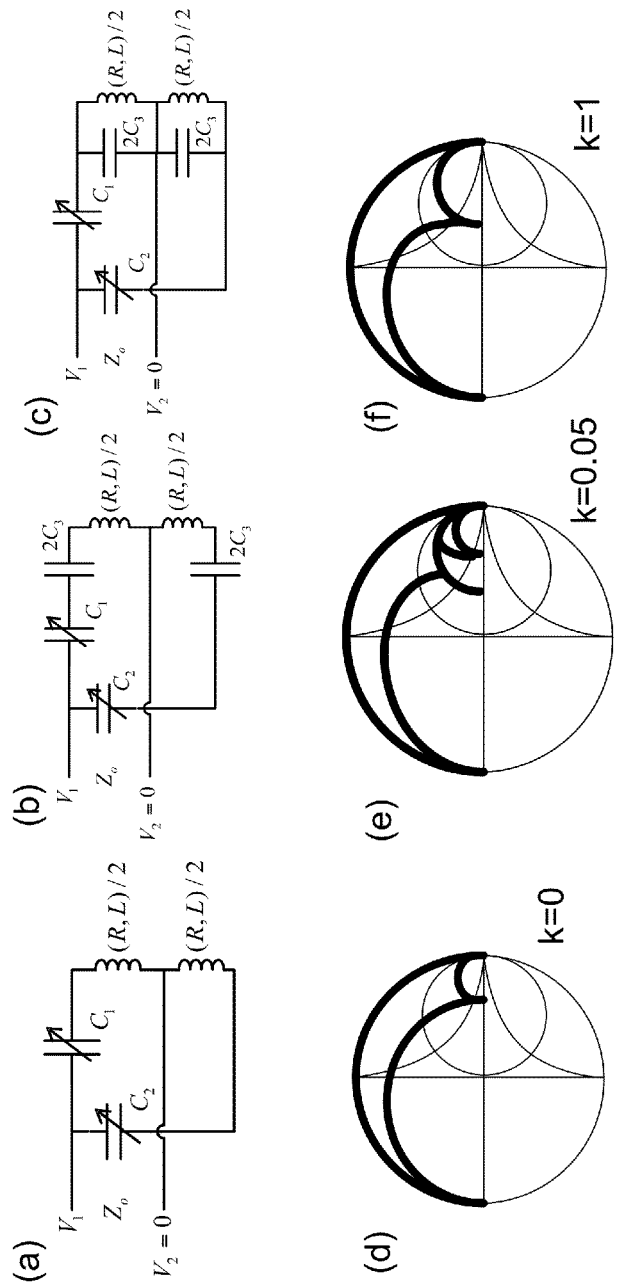
FIGS. 35(a),(b),(c) depict three topologies of matching circuits directly coupled to a high-Q inductive element and including capacitors in parallel with $Z_0$. They are connected to ground by tapping at the center point of the inductor loop and receive an unbalanced drive. The highlighted portion of the Smith chart in FIGS. 35(d),(e), and (f) depict the complex impedances that may be matched by these topologies.

FIG. 35 shows three examples of directly-coupled impedance-matching circuits, where the two tunable elements are capacitors. For the topologies of FIGS. 35, the ground terminal may be connected at the center of the inductive element to preserve the voltage node of the resonator at that point and thus the high Q. Note that these examples may be described as implementations of the general topology shown in FIG. 28(e).

Let us define respectively $Z=R+j\omega L$ for FIG. 35(a), $Z=R+j\omega L+1/j\omega C_3$ for FIG. 35(b), and $Z=(R+j\omega L)\|(1/j\omega C_3)$ for FIG. 35(c), and then $R\equiv Re\{Z\}$, $X\equiv Im\{Z\}$. Then, the required values of the tunable elements may be given by:

$$\omega C_1 = \frac{2}{X(1+a) - \sqrt{Z_o R(4-R_n)(1+a^2)}},$$

$$\omega C_2 = \frac{2}{X(1+a) + \sqrt{Z_o R(4-R_n)(1+a^2)}},$$

where $$a = \frac{R}{2Z_o - R} \cdot \frac{k}{1+k}$$

and k is defined by $M'=-kL'$, where $L'$ is the inductance of each half of the inductive element and $M'$ is the mutual inductance between the two halves. These topologies can match the impedances satisfying the inequalities:

$$R_n \leq 2 \,\&\, \frac{2}{\gamma} \leq R_n \leq 4,$$

$$X_n \geq \sqrt{\frac{R_n(4-R_n)(2-R_n)}{2-\gamma R_n}},$$

where $$\gamma = \frac{1-6k+k^2}{1+2k+k^2} \leq 1$$

which are shown by the area enclosed by the bold lines on the three Smith charts shown in FIG. 35(d) for k=0, FIG. 35(e) for k=0.05, and FIG. 35(f) for k=1. Note that for 0<k<1 there are two disconnected regions of the Smith chart that this topology can match.

In the circuits of FIGS. 33, 34, 35, the capacitor, $C_2$, or the inductor, $L_2$, is (or one of the two capacitors, $2C_2$, or one of the two inductors, $2L_2$, are) in parallel with the terminals and thus may not need to have a high voltage-rating. In the case of two capacitors, $2C_2$, or two inductors, $2L_2$, both may not need to have a high voltage-rating, since approximately the same current flows through them and thus they experience approximately the same voltage across them.

For the topologies of FIGS. 30-35, where a capacitor, $C_3$, is used, the use of the capacitor, $C_3$, may lead to finer tuning of the frequency and the impedance. For the topologies of FIGS. 30-35, the use of the fixed capacitor, $C_3$, in series with the inductive element may ensure that a large percentage of the high inductive-element voltage will be across this fixed capacitor, $C_3$, thus potentially alleviating the voltage rating requirements for the other elements of the impedance matching circuit, some of which may be variable. Whether or not such topologies are preferred depends on the availability, cost and specifications of appropriate fixed and tunable components.

In all the above examples, a pair of equal-value variable capacitors without a common terminal may be implemented using ganged-type capacitors or groups or arrays of varactors or diodes biased and controlled to tune their values as an ensemble. A pair of equal-value variable capacitors with one common terminal can be implemented using a tunable butterfly-type capacitor or any other tunable or variable capacitor or group or array of varactors or diodes biased and controlled to tune their capacitance values as an ensemble.

Another criterion which may be considered upon the choice of the impedance matching network is the response of the network to different frequencies than the desired operating frequency. The signals generated in the external circuit, to which the inductive element is coupled, may not be monochromatic at the desired frequency but periodic with the desired frequency, as for example the driving signal of a switching amplifier or the reflected signal of a switching rectifier. In some such cases, it may be desirable to suppress the amount of higher-order harmonics that enter the inductive element (for example, to reduce radiation of these harmonics from this element). Then the choice of impedance matching network may be one that sufficiently suppresses the amount of such harmonics that enters the inductive element.

The impedance matching network may be such that the impedance seen by the external circuit at frequencies higher than the fundamental harmonic is high, when the external periodic signal is a signal that can be considered to behave as a voltage-source signal (such as the driving signal of a class-D amplifier with a series resonant load), so that little current flows through the inductive element at higher frequencies. Among the topologies of FIGS. 30-35, those which use an inductor, $L_2$, may then be preferable, as this inductor presents a high impedance at high frequencies.

The impedance matching network may be such that the impedance seen by the external circuit at frequencies higher than the fundamental harmonic is low, when the external periodic signal is a signal that can be considered to behave as a current-source signal, so that little voltage is induced across the inductive element at higher frequencies. Among the topologies of FIGS. 30-35, those which use a capacitor, $C_2$, are then preferable, as this capacitor presents a low impedance at high frequencies.

Figure 36:
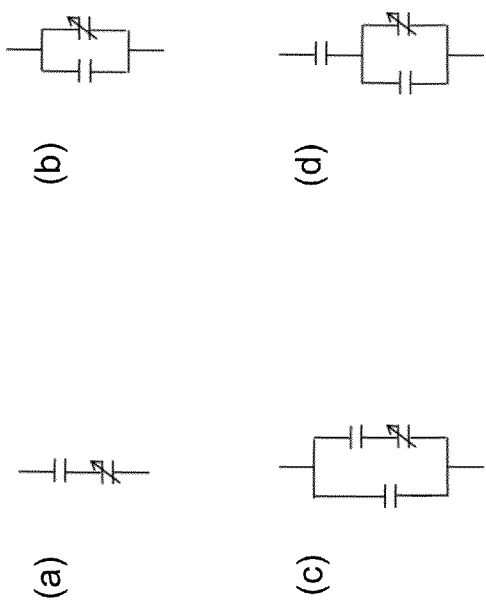
FIGS. 36(a),(b),(c),(d) depict four topologies of networks of fixed and variable capacitors designed to produce an overall variable capacitance with finer tuning resolution and some with reduced voltage on the variable capacitor.

FIG. 36 shows four examples of a variable capacitance, using networks of one variable capacitor and the rest fixed capacitors. Using these network topologies, fine tunability of the total capacitance value may be achieved. Furthermore, the topologies of FIGS. 36(a),(c),(d), may be used to reduce the voltage across the variable capacitor, since most of the voltage may be assigned across the fixed capacitors.

Figure 37:
FIGS. 37(a) and 37(b) depict two topologies of networks of fixed capacitors and a variable inductor designed to produce an overall variable capacitance.

FIG. 37 shows two examples of a variable capacitance, using networks of one variable inductor and fixed capacitors. In particular, these networks may provide implementations for a variable reactance, and, at the frequency of interest, values for the variable inductor may be used such that each network corresponds to a net negative variable reactance, which may be effectively a variable capacitance.

Tunable elements such as tunable capacitors and tunable inductors may be mechanically-tunable, electrically-tunable, thermally-tunable and the like. The tunable elements may be variable capacitors or inductors, varactors, diodes, Schottky diodes, reverse-biased PN diodes, varactor arrays, diode arrays, Schottky diode arrays and the like. The diodes may be Si diodes, GaN diodes, SiC diodes, and the like. GaN and SiC diodes may be particularly attractive for high power applications. The tunable elements may be electrically switched capacitor banks, electrically-switched mechanically-tunable capacitor banks, electrically-switched varactor-array banks, electrically-switched transformer-coupled inductor banks, and the like. The tunable elements may be combinations of the elements listed above.

As described above, the efficiency of the power transmission between coupled high-Q magnetic resonators may be impacted by how closely matched the resonators are in resonant frequency and how well their impedances are matched to the power supplies and power consumers in the system. Because a variety of external factors including the relative position of extraneous objects or other resonators in the system, or the changing of those relative positions, may alter the resonant frequency and/or input impedance of a high-Q magnetic resonator, tunable impedance networks may be required to maintain sufficient levels of power transmission in various environments or operating scenarios.

The capacitance values of the capacitors shown may be adjusted to adjust the resonant frequency and/or the impedance of the magnetic resonator. The capacitors may be adjusted electrically, mechanically, thermally, or by any other known methods. They may be adjusted manually or automatically, such as in response to a feedback signal. They may be adjusted to achieve certain power transmission efficiencies or other operating characteristics between the power supply and the power consumer.

The inductance values of the inductors and inductive elements in the resonator may be adjusted to adjust the frequency and/or impedance of the magnetic resonator. The inductance may be adjusted using coupled circuits that include adjustable components such as tunable capacitors, inductors and switches. The inductance may be adjusted using transformer coupled tuning circuits. The inductance may be adjusted by switching in and out different sections of conductor in the inductive elements and/or using ferro-magnetic tuning and/or mu-tuning, and the like.

The resonant frequency of the resonators may be adjusted to or may be allowed to change to lower or higher frequencies. The input impedance of the resonator may be adjusted to or may be allowed to change to lower or higher impedance values. The amount of power delivered by the source and/or received by the devices may be adjusted to or may be allowed to change to lower or higher levels of power. The amount of power delivered to the source and/or received by the devices from the device resonator may be adjusted to or may be allowed to change to lower or higher levels of power. The resonator input impedances, resonant frequencies, and power levels may be adjusted depending on the power consumer or consumers in the system and depending on the objects or materials in the vicinity of the resonators. The resonator input impedances, frequencies, and power levels may be adjusted manually or automatically, and may be adjusted in response to feedback or control signals or algorithms.

Circuit elements may be connected directly to the resonator, that is, by physical electrical contact, for example to the ends of the conductor that forms the inductive element and/or the terminal connectors. The circuit elements may be soldered to, welded to, crimped to, glued to, pinched to, or closely position to the conductor or attached using a variety of electrical components, connectors or connection techniques. The power supplies and the power consumers may be connected to magnetic resonators directly or indirectly or inductively. Electrical signals may be supplied to, or taken from, the resonators through the terminal connections.

It is to be understood by one of ordinary skill in the art that in real implementations of the principles described herein, there may be an associated tolerance, or acceptable variation, to the values of real components (capacitors, inductors, resistors and the like) from the values calculated via the herein stated equations, to the values of real signals (voltages, currents and the like) from the values suggested by symmetry or anti-symmetry or otherwise, and to the values of real geometric locations of points (such as the point of connection of the ground terminal close to the center of the inductive element or the 'axis' points and the like) from the locations suggested by symmetry or otherwise.

EXAMPLES

System Block Diagrams

We disclose examples of high-Q resonators for wireless power transmission systems that may wirelessly power or charge devices at mid-range distances. High-Q resonator wireless power transmission systems also may wirelessly power or charge devices with magnetic resonators that are different in size, shape, composition, arrangement, and the like, from any source resonators in the system.

Figure 38:
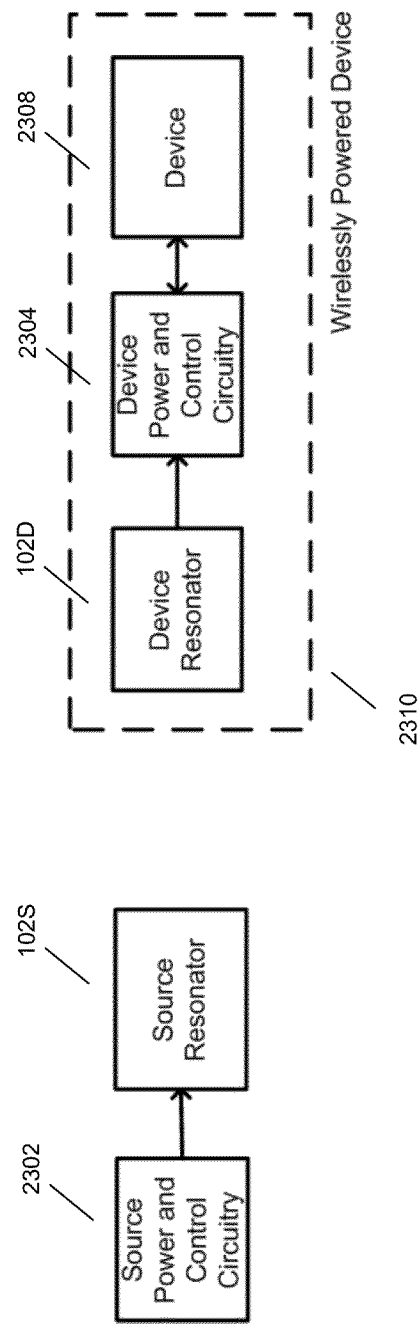
FIG. 38 depicts a high level block diagram of a wireless power transmission system.

FIG. 1(a)(b) shows high level diagrams of two exemplary two-resonator systems. These exemplary systems each have a single source resonator 102S or 104S and a single device resonator 102D or 104D. FIG. 38 shows a high level block diagram of a system with a few more features highlighted.

The wirelessly powered or charged device 2310 may include or consist of a device resonator 102D, device power and control circuitry 2304, and the like, along with the device 2308 or devices, to which either DC or AC or both AC and DC power is transferred. The energy or power source for a system may include the source power and control circuitry 2302, a source resonator 102S, and the like. The device 2308 or devices that receive power from the device resonator 102D and power and control circuitry 2304 may be any kind of device 2308 or devices as described previously. The device resonator 102D and circuitry 2304 delivers power to the device/devices 2308 that may be used to recharge the battery of the device/devices, power the device/devices directly, or both when in the vicinity of the source resonator 102S.

The source and device resonators may be separated by many meters or they may be very close to each other or they may be separated by any distance in between. The source and device resonators may be offset from each other laterally or axially. The source and device resonators may be directly aligned (no lateral offset), or they may be offset by meters, or anything in between. The source and device resonators may be oriented so that the surface areas enclosed by their inductive elements are approximately parallel to each other. The source and device resonators may be oriented so that the surface areas enclosed by their inductive elements are approximately perpendicular to each other, or they may be oriented for any relative angle (0 to 360 degrees) between them.

The source and device resonators may be free standing or they may be enclosed in an enclosure, container, sleeve or housing. These various enclosures may be composed of almost any kind of material. Low loss tangent materials such as Teflon, REXOLITE, styrene, and the like may be preferable for some applications. The source and device resonators may be integrated in the power supplies and power consumers. For example, the source and device resonators may be integrated into keyboards, computer mice, displays, cell phones, etc. so that they are not visible outside these devices. The source and device resonators may be separate from the power supplies and power consumers in the system and may be connected by a standard or custom wires, cables, connectors or plugs.

The source 102S may be powered from a number of DC or AC voltage, current or power sources including a USB port of a computer. The source 102S may be powered from the electric grid, from a wall plug, from a battery, from a power supply, from an engine, from a solar cell, from a generator, from another source resonator, and the like. The source power and control circuitry 2302 may include circuits and components to isolate the source electronics from the power source, so that any reflected power or signals are not coupled out through the source input terminals. The source power and control circuits 2302 may include power factor correction circuits and may be configured to monitor power usage for monitoring accounting, billing, control, and like functionalities.

The system may be operated bi-directionally. That is, energy or power that is generated or stored in a device resonator may be fed back to a power source including the electric grid, a battery, any kind of energy storage unit, and the like. The source power and control circuits may include power factor correction circuits and may be configured to monitor power usage for monitoring accounting, billing, control, and like functionalities for bi-directional energy flow. Wireless energy transfer systems may enable or promote vehicle-to-grid (V2G) applications.

The source and the device may have tuning capabilities that allow adjustment of operating points to compensate for changing environmental conditions, perturbations, and loading conditions that can affect the operation of the source and device resonators and the efficiency of the energy exchange. The tuning capability may also be used to multiplex power delivery to multiple devices, from multiple sources, to multiple systems, to multiple repeaters or relays, and the like. The tuning capability may be manually controlled, or automatically controlled and may be performed continuously, periodically, intermittently or at scheduled times or intervals.

The device resonator and the device power and control circuitry may be integrated into any portion of the device, such as a battery compartment, or a device cover or sleeve, or on a mother board, for example, and may be integrated alongside standard rechargeable batteries or other energy storage units. The device resonator may include a device field reshaper which may shield any combination of the device resonator elements and the device power and control electronics from the electromagnetic fields used for the power transfer and which may deflect the resonator fields away from the lossy device resonator elements as well as the device power and control electronics. A magnetic material and/or high-conductivity field reshaper may be used to increase the perturbed quality factor Q of the resonator and increase the perturbed coupling factor of the source and device resonators.

The source resonator and the source power and control circuitry may be integrated into any type of furniture, structure, mat, rug, picture frame (including digital picture frames, electronic frames), plug-in modules, electronic devices, vehicles, and the like. The source resonator may include a source field reshaper which may shield any combination of the source resonator elements and the source power and control electronics from the electromagnetic fields used for the power transfer and which may deflect the resonator fields away from the lossy source resonator elements as well as the source power and control electronics. A magnetic material and/or high-conductivity field reshaper may be used to increase the perturbed quality factor Q of the resonator and increase the perturbed coupling factor of the source and device resonators.

Figure 39:
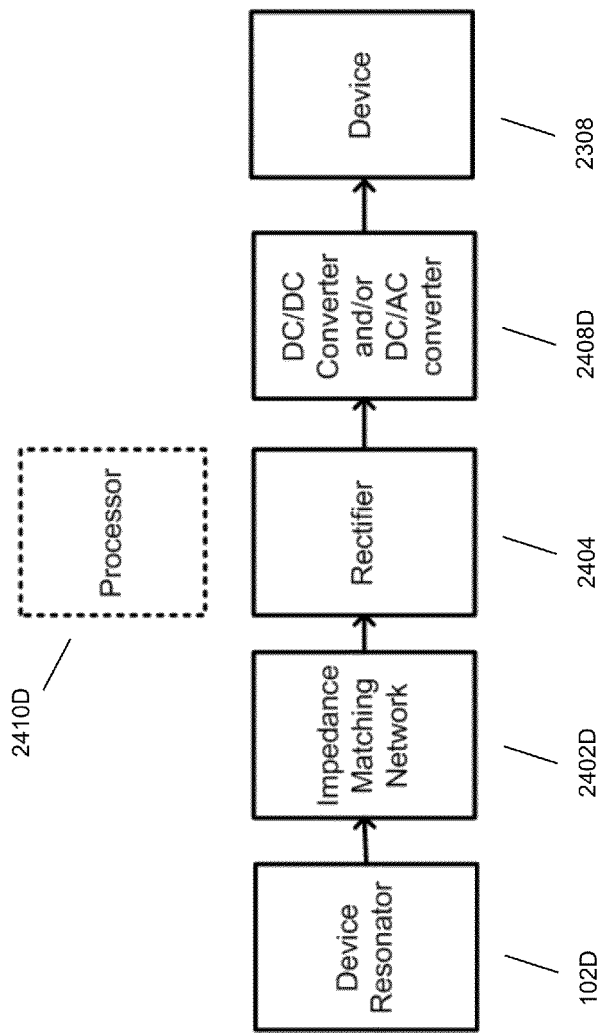
FIG. 39 depicts a block diagram of an exemplary wirelessly powered device.

A block diagram of the subsystems in an example of a wirelessly powered device is shown in FIG. 39. The power and control circuitry may be designed to transform the alternating current power from the device resonator 102D and convert it to stable direct current power suitable for powering or charging a device. The power and control circuitry may be designed to transform an alternating current power at one frequency from the device resonator to alternating current power at a different frequency suitable for powering or charging a device. The power and control circuitry may include or consist of impedance matching circuitry 2402D, rectification circuitry 2404, voltage limiting circuitry (not shown), current limiting circuitry (not shown), AC-to-DC converter 2408 circuitry, DC-to-DC converter 2408 circuitry, DC-to-AC converter 2408 circuitry, AC-to-AC converter 2408 circuitry, battery charge control circuitry (not shown), and the like.

The impedance-matching 2402D network may be designed to maximize the power delivered between the device resonator 102D and the device power and control circuitry 2304 at the desired frequency. The impedance matching elements may be chosen and connected such that the high-Q of the resonators is preserved. Depending on the operating conditions, the impedance matching circuitry 2402D may be varied or tuned to control the power delivered from the source to the device, from the source to the device resonator, between the device resonator and the device power and control circuitry, and the like. The power, current and voltage signals may be monitored at any point in the device circuitry and feedback algorithms circuits, and techniques, may be used to control components to achieve desired signal levels and system operation. The feedback algorithms may be implemented using analog or digital circuit techniques and the circuits may include a microprocessor, a digital signal processor, a field programmable gate array processor and the like.

The third block of FIG. 39 shows a rectifier circuit 2404 that may rectify the AC voltage power from the device resonator into a DC voltage. In this configuration, the output of the rectifier 2404 may be the input to a voltage clamp circuit. The voltage clamp circuit (not shown) may limit the maximum voltage at the input to the DC-to-DC converter 2408D or DC-to-AC converter 2408D. In general, it may be desirable to use a DC-to-DC/AC converter with a large input voltage dynamic range so that large variations in device position and operation may be tolerated while adequate power is delivered to the device. For example, the voltage level at the output of the rectifier may fluctuate and reach high levels as the power input and load characteristics of the device change. As the device performs different tasks it may have varying power demands. The changing power demands can cause high voltages at the output of the rectifier as the load characteristics change. Likewise as the device and the device resonator are brought closer and further away from the source, the power delivered to the device resonator may vary and cause changes in the voltage levels at the output of the rectifier. A voltage clamp circuit may prevent the voltage output from the rectifier circuit from exceeding a predetermined value which is within the operating range of the DC-to-DC/AC converter. The voltage clamp circuitry may be used to extend the operating modes and ranges of a wireless energy transfer system.

The next block of the power and control circuitry of the device is the DC-to-DC converter 2408D that may produce a stable DC output voltage. The DC-to-DC converter may be a boost converter, buck converter, boost-buck converter, single ended primary inductance converter (SEPIC), or any other DC-DC topology that fits the requirements of the particular application. If the device requires AC power, a DC-to-AC converter may be substituted for the DC-to-DC converter, or the DC-to-DC converter may be followed by a DC-to-AC converter. If the device contains a rechargeable battery, the final block of the device power and control circuitry may be a battery charge control unit which may manage the charging and maintenance of the battery in battery powered devices.

The device power and control circuitry 2304 may contain a processor 2410D, such as a microcontroller, a digital signal processor, a field programmable gate array processor, a microprocessor, or any other type of processor. The processor may be used to read or detect the state or the operating point of the power and control circuitry and the device resonator. The processor may implement algorithms to interpret and adjust the operating point of the circuits, elements, components, subsystems and resonator. The processor may be used to adjust the impedance matching, the resonator, the DC to DC converters, the DC to AC converters, the battery charging unit, the rectifier, and the like of the wirelessly powered device.

The processor may have wireless or wired data communication links to other devices or sources and may transmit or receive data that can be used to adjust the operating point of the system. Any combination of power, voltage, and current signals at a single, or over a range of frequencies, may be monitored at any point in the device circuitry. These signals may be monitored using analog or digital or combined analog and digital techniques. These monitored signals may be used in feedback loops or may be reported to the user in a variety of known ways or they may be stored and retrieved at later times. These signals may be used to alert a user of system failures, to indicate performance, or to provide audio, visual, vibrational, and the like, feedback to a user of the system.

Figure 40:
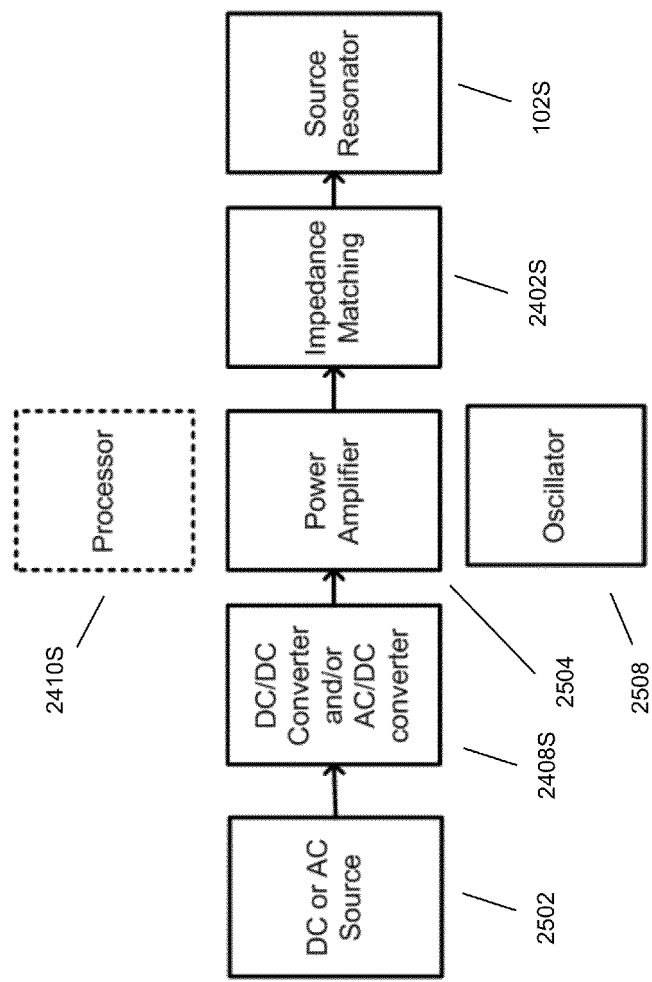
FIG. 40 depicts a block diagram of the source of an exemplary wireless power transfer system.

FIG. 40 shows components of source power and control circuitry 2302 of an exemplary wireless power transfer system configured to supply power to a single or multiple devices. The source power and control circuitry 2302 of the exemplary system may be powered from an AC voltage source 2502 such as a home electrical outlet, a DC voltage source such as a battery, a USB port of a computer, a solar cell, another wireless power source, and the like. The source power and control circuitry 2302 may drive the source resonator 102S with alternating current, such as with a frequency greater than 10 kHz and less than 100 MHz. The source power and control circuitry 2302 may drive the source resonator 102S with alternating current of frequency less than less than 10 GHz. The source power and control circuitry 2302 may include a DC-to-DC converter 2408S, an AC-to-DC converter 2408S, or both an AC-to-DC converter 2408S and a DC-to-DC 2408S converter, an oscillator 2508, a power amplifier 2504, an impedance matching network 2402S, and the like.

The source power and control circuitry 2302 may be powered from multiple AC-or-DC voltage sources 2502 and may contain AC-to-DC and DC-to-DC converters 2408S to provide necessary voltage levels for the circuit components as well as DC voltages for the power amplifiers that may be used to drive the source resonator. The DC voltages may be adjustable and may be used to control the output power level of the power amplifier. The source may contain power factor correction circuitry.

The oscillator 2508 output may be used as the input to a power amplifier 2504 that drives the source resonator 102S. The oscillator frequency may be tunable and the amplitude of the oscillator signal may be varied as one means to control the output power level from the power amplifier. The frequency, amplitude, phase, waveform, and duty cycle of the oscillator signal may be controlled by analog circuitry, by digital circuitry or by a combination of analog and digital circuitry. The control circuitry may include a processor 2410S, such as a microprocessor, a digital signal processor, a field programmable gate array processor, and the like.

The impedance matching blocks 2402 of the source and device resonators may be used to tune the power and control circuits and the source and device resonators. For example, tuning of these circuits may adjust for perturbation of the quality factor Q of the source or device resonators due to extraneous objects or changes in distance between the source and device in a system. Tuning of these circuits may also be used to sense the operating environment, control power flow to one or more devices, to control power to a wireless power network, to reduce power when unsafe or failure mode conditions are detected, and the like.

Any combination of power, voltage, and current signals may be monitored at any point in the source circuitry. These signals may be monitored using analog or digital or combined analog and digital techniques. These monitored signals may be used in feedback circuits or may be reported to the user in a variety of known ways or they may be stored and retrieved at later times. These signals may be used to alert a user to system failures, to alert a user to exceeded safety thresholds, to indicate performance, or to provide audio, visual, vibrational, and the like, feedback to a user of the system.

The source power and control circuitry may contain a processor. The processor may be used to read the state or the operating point of the power and control circuitry and the source resonator. The processor may implement algorithms to interpret and adjust the operating point of the circuits, elements, components, subsystems and resonator. The processor may be used to adjust the impedance matching, the resonator, the DC-to-DC converters, the AC-to-DC converters, the oscillator, the power amplifier of the source, and the like. The processor and adjustable components of the system may be used to implement frequency and/or time power delivery multiplexing schemes. The processor may have wireless or wired data communication links to devices and other sources and may transmit or receive data that can be used to adjust the operating point of the system.

Although detailed and specific designs are shown in these block diagrams, it should be clear to those skilled in the art that many different modifications and rearrangements of the components and building blocks are possible within the spirit of the exemplary system. The division of the circuitry was outlined for illustrative purposes and it should be clear to those skilled in the art that the components of each block may be further divided into smaller blocks or merged or shared. In equivalent examples the power and control circuitry may be composed of individual discrete components or larger integrated circuits. For example, the rectifier circuitry may be composed of discrete diodes, or use diodes integrated on a single chip. A multitude of other circuits and integrated devices can be substituted in the design depending on design criteria such as power or size or cost or application. The whole of the power and control circuitry or any portion of the source or device circuitry may be integrated into one chip.

The impedance matching network of the device and or source may include a capacitor or networks of capacitors, an inductor or networks of inductors, or any combination of capacitors, inductors, diodes, switches, resistors, and the like. The components of the impedance matching network may be adjustable and variable and may be controlled to affect the efficiency and operating point of the system. The impedance matching may be performed by controlling the connection point of the resonator, adjusting the permeability of a magnetic material, controlling a bias field, adjusting the frequency of excitation, and the like. The impedance matching may use or include any number or combination of varactors, varactor arrays, switched elements, capacitor banks, switched and tunable elements, reverse bias diodes, air gap capacitors, compression capacitors, BZT electrically tuned capacitors, MEMS-tunable capacitors, voltage variable dielectrics, transformer coupled tuning circuits, and the like. The variable components may be mechanically tuned, thermally tuned, electrically tuned, piezo-electrically tuned, and the like. Elements of the impedance matching may be silicon devices, gallium nitride devices, silicon carbide devices and the like. The elements may be chosen to withstand high currents, high voltages, high powers, or any combination of current, voltage and power. The elements may be chosen to be high-Q elements.

The matching and tuning calculations of the source may be performed on an external device through a USB port that powers the device. The device may be a computer a PDA or other computational platform.

A demonstration system used a source resonator, coupled to a device resonator, to wirelessly power/recharge multiple electronic consumer devices including, but not limited to, a laptop, a DVD player, a projector, a cell-phone, a display, a television, a projector, a digital picture frame, a light, a TV/DVD player, a portable music player, a circuit breaker, a hand-held tool, a personal digital assistant, an external battery charger, a mouse, a keyboard, a camera, an active load, and the like. A variety of devices may be powered simultaneously from a single device resonator. Device resonators may be operated simultaneously as source resonators.

The power supplied to a device resonator may pass through additional resonators before being delivered to its intended device resonator.

Monitoring, Feedback and Control

So-called port parameter measurement circuitry may measure or monitor certain power, voltage, and current, signals in the system and processors or control circuits may adjust certain settings or operating parameters based on those measurements. In addition to these port parameter measurements, the magnitude and phase of voltage and current signals, and the magnitude of the power signals, throughout the system may be accessed to measure or monitor the system performance. The measured signals referred to throughout this disclosure may be any combination of the port parameter signals, as well as voltage signals, current signals, power signals, and the like. These parameters may be measured using analog or digital signals, they may be sampled and processed, and they may be digitized or converted using a number of known analog and digital processing techniques. Measured or monitored signals may be used in feedback circuits or systems to control the operation of the resonators and/or the system. In general, we refer to these monitored or measured signals as reference signals, or port parameter measurements or signals, although they are sometimes also referred to as error signals, monitor signals, feedback signals, and the like. We will refer to the signals that are used to control circuit elements such as the voltages used to drive voltage controlled capacitors as the control signals.

In some cases the circuit elements may be adjusted to achieve a specified or predetermined impedance value for the source and device resonators. In other cases the impedance may be adjusted to achieve a desired impedance value for the source and device resonators when the device resonator is connected to a power consumer or consumers. In other cases the impedance may be adjusted to mitigate changes in the resonant frequency, or impedance or power level changes owing to movement of the source and/or device resonators, or changes in the environment (such as the movement of interacting materials or objects) in the vicinity of the resonators. In other cases the impedance of the source and device resonators may be adjusted to different impedance values.

The coupled resonators may be made of different materials and may include different circuits, components and structural designs or they may be the same. The coupled resonators may include performance monitoring and measurement circuitry, signal processing and control circuitry or a combination of measurement and control circuitry. Some or all of the high-Q magnetic resonators may include tunable impedance circuits. Some or all of the high-Q magnetic resonators may include automatically controlled tunable impedance circuits.

Figure 41:
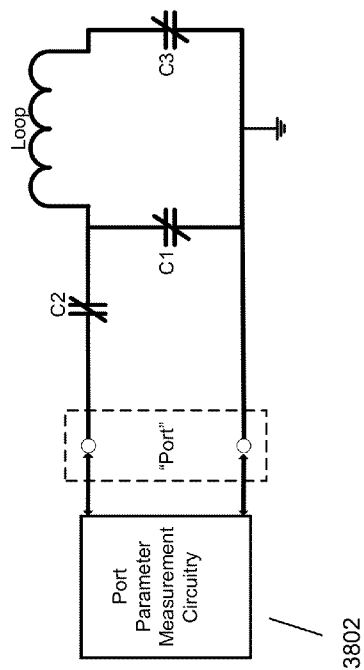
FIG. 41 shows an equivalent circuit diagram of a magnetic resonator. The slash through the capacitor symbol indicates that the represented capacitor may be fixed or variable. The port parameter measurement circuitry may be configured to measure certain electrical signals and may measure the magnitude and phase of signals.

FIG. 41 shows a magnetic resonator with port parameter measurement circuitry 3802 configured to measure certain parameters of the resonator. The port parameter measurement circuitry may measure the input impedance of the structure, or the reflected power. Port parameter measurement circuits may be included in the source and/or device resonator designs and may be used to measure two port circuit parameters such as S-parameters (scattering parameters), Z-parameters (impedance parameters), Y-parameters (admittance parameters), T-parameters (transmission parameters), H-parameters (hybrid parameters), ABCD-parameters (chain, cascade or transmission parameters), and the like. These parameters may be used to describe the electrical behavior of linear electrical networks when various types of signals are applied.

Different parameters may be used to characterize the electrical network under different operating or coupling scenarios. For example, S-parameters may be used to measure matched and unmatched loads. In addition, the magnitude and phase of voltage and current signals within the magnetic resonators and/or within the sources and devices themselves may be monitored at a variety of points to yield system performance information. This information may be presented to users of the system via a user interface such as a light, a read-out, a beep, a noise, a vibration or the like, or it may be presented as a digital signal or it may be provided to a processor in the system and used in the automatic control of the system. This information may be logged, stored, or may be used by higher level monitoring and control systems.

Figure 42:
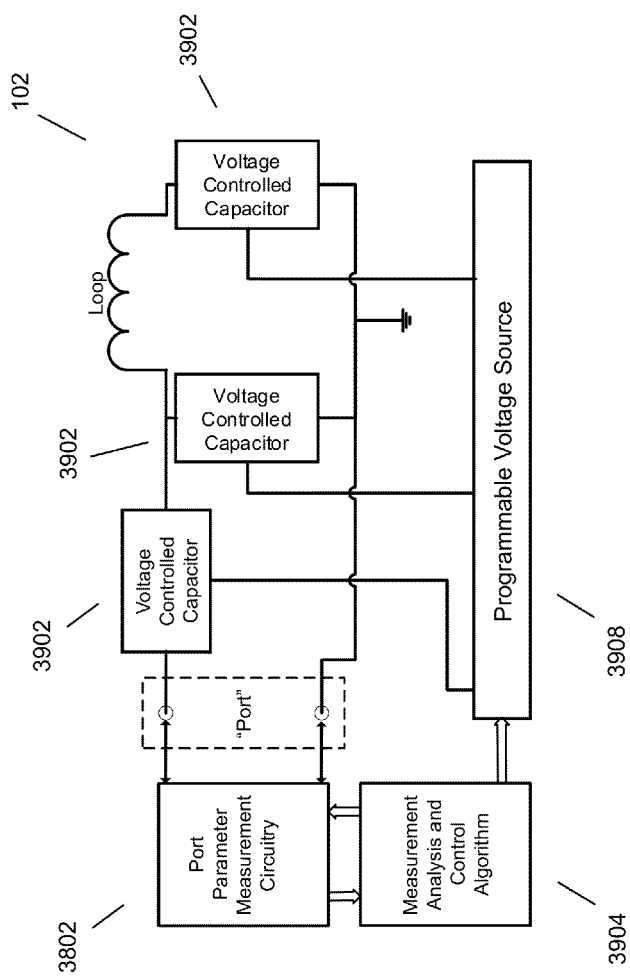
FIG. 42 shows a circuit diagram of a magnetic resonator where the tunable impedance network is realized with voltage controlled capacitors. Such an implementation may be adjusted, tuned or controlled by electrical circuits including programmable or controllable voltage sources and/or computer processors. The voltage controlled capacitors may be adjusted in response to data measured by the port parameter measurement circuitry and processed by measurement analysis and control algorithms and hardware. The voltage controlled capacitors may be a switched bank of capacitors.

FIG. 42 shows a circuit diagram of a magnetic resonator where the tunable impedance network may be realized with voltage controlled capacitors 3902 or capacitor networks. Such an implementation may be adjusted, tuned or controlled by electrical circuits and/or computer processors, such as a programmable voltage source 3908, and the like. For example, the voltage controlled capacitors may be adjusted in response to data acquired by the port parameter measurement circuitry 3802 and processed by a measurement analysis and control algorithm subsystem 3904. Reference signals may be derived from the port parameter measurement circuitry or other monitoring circuitry designed to measure the degree of deviation from a desired system operating point. The measured reference signals may include voltage, current, complex-impedance, reflection coefficient, power levels and the like, at one or several points in the system and at a single frequency or at multiple frequencies.

The reference signals may be fed to measurement analysis and control algorithm subsystem modules that may generate control signals to change the values of various components in a tunable impedance matching network. The control signals may vary the resonant frequency and/or the input impedance of the magnetic resonator, or the power level supplied by the source, or the power level drawn by the device, to achieve the desired power exchange between power supplies/generators and power drains/loads.

Adjustment algorithms may be used to adjust the frequency and/or impedance of the magnetic resonators. The algorithms may take in reference signals related to the degree of deviation from a desired operating point for the system and output correction or control signals related to that deviation that control variable or tunable elements of the system to bring the system back towards the desired operating point or points. The reference signals for the magnetic resonators may be acquired while the resonators are exchanging power in a wireless power transmission system, or they may be switched out of the circuit during system operation. Corrections to the system may be applied or performed continuously, periodically, upon a threshold crossing, digitally, using analog methods, and the like.

Figure 43:
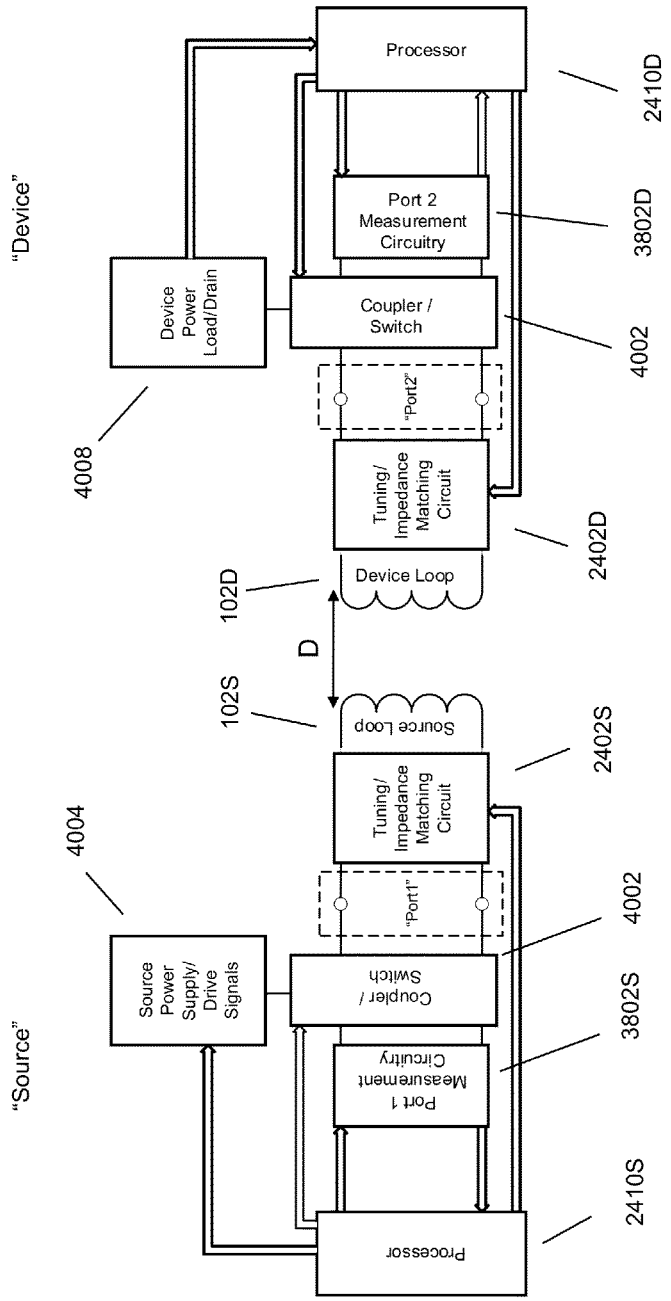
FIG. 43 shows an end-to-end wireless power transmission system. In this example, both the source and the device contain port measurement circuitry and a processor. The box labeled "coupler/switch" indicates that the port measurement circuitry may be connected to the resonator by a directional coupler or a switch, enabling the measurement, adjustment and control of the source and device resonators to take place in conjunction with, or separate from, the power transfer functionality.

FIG. 43 shows an end-to-end wireless power transmission system. Both the source and the device may include port measurement circuitry 3802 and a processor 2410. The box labeled "coupler/switch" 4002 indicates that the port measurement circuitry 3802 may be connected to the resonator 102 by a directional coupler or a switch, enabling the measurement, adjustment and control of the source and device resonators to take place in conjunction with, or separate from, the power transfer functionality.

The port parameter measurement and/or processing circuitry may reside with some, any, or all resonators in a system. The port parameter measurement circuitry may utilize portions of the power transmission signal or may utilize excitation signals over a range of frequencies to measure the source/device resonator response (i.e. transmission and reflection between any two ports in the system), and may contain amplitude and/or phase information. Such measurements may be achieved with a swept single frequency signal or a multi-frequency signal. The signals used to measure and monitor the resonators and the wireless power transmission system may be generated by a processor or processors and standard input/output (I/O) circuitry including digital to analog converters (DACs), analog to digital converters (ADCs), amplifiers, signal generation chips, passive components and the like. Measurements may be achieved using test equipment such as a network analyzer or using customized circuitry. The measured reference signals may be digitized by ADCs and processed using customized algorithms running on a computer, a microprocessor, a DSP chip, an ASIC, and the like. The measured reference signals may be processed in an analog control loop.

The measurement circuitry may measure any set of two port parameters such as S-parameters, Y-parameters, Z-parameters, H-parameters, G-parameters, T-parameters, ABCD-parameters, and the like. Measurement circuitry may be used to characterize current and voltage signals at various points in the drive and resonator circuitry, the impedance and/or admittance of the source and device resonators at opposite ends of the system, i.e. looking into the source resonator matching network ("port 1" in FIG. 43) towards the device and vice versa.

The device may measure relevant signals and/or port parameters, interpret the measurement data, and adjust its matching network to optimize the impedance looking into the coupled system independently of the actions of the source. The source may measure relevant port parameters, interpret the measurement data, and adjust its matching network to optimize the impedance looking into the coupled system independently of the actions of the device.

FIG. 43 shows a block diagram of a source and device in a wireless power transmission system. The system may be configured to execute a control algorithm that actively adjusts the tuning/matching networks in either of or both the source and device resonators to optimize performance in the coupled system. Port measurement circuitry 3802S may measure signals in the source and communicate those signals to a processor 2410. A processor 2410 may use the measured signals in a performance optimization or stabilization algorithm and generate control signals based on the outputs of those algorithms. Control signals may be applied to variable circuit elements in the tuning/impedance matching circuits 2402S to adjust the source's operating characteristics, such as power in the resonator and coupling to devices. Control signals may be applied to the power supply or generator to turn the supply on or off, to increase or decrease the power level, to modulate the supply signal and the like.

The power exchanged between sources and devices may depend on a variety of factors. These factors may include the effective impedance of the sources and devices, the Q's of the sources and devices, the resonant frequencies of the sources and devices, the distances between sources and devices, the interaction of materials and objects in the vicinity of sources and devices and the like. The port measurement circuitry and processing algorithms may work in concert to adjust the resonator parameters to maximize power transfer, to hold the power transfer constant, to controllably adjust the power transfer, and the like, under both dynamic and steady state operating conditions.

Figure 44:
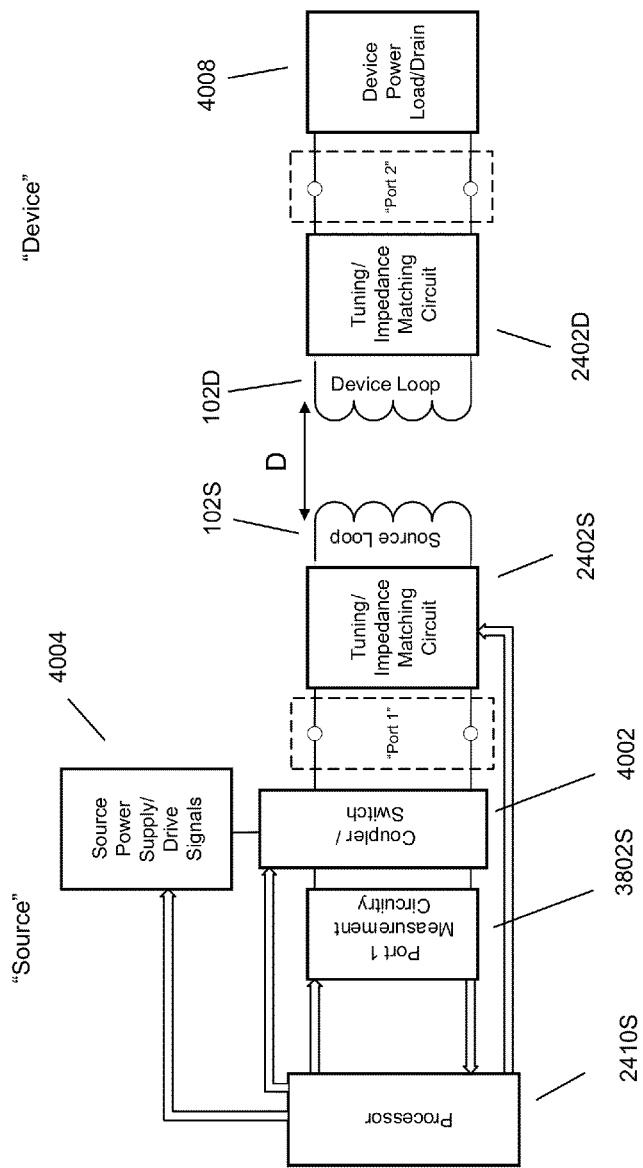
FIG. 44 shows an end-to-end wireless power transmission system. In this example, only the source contains port measurement circuitry and a processor. In this case, the device resonator operating characteristics may be fixed or may be adjusted by analog control circuitry and without the need for control signals generated by a processor.

Some, all or none of the sources and devices in a system implementation may include port measurement circuitry 3802S and processing 2410 capabilities. FIG. 44 shows an end-to-end wireless power transmission system in which only the source 102S contains port measurement circuitry 3802 and a processor 2410S. In this case, the device resonator 102D operating characteristics may be fixed or may be adjusted by analog control circuitry and without the need for control signals generated by a processor.

Figure 45:
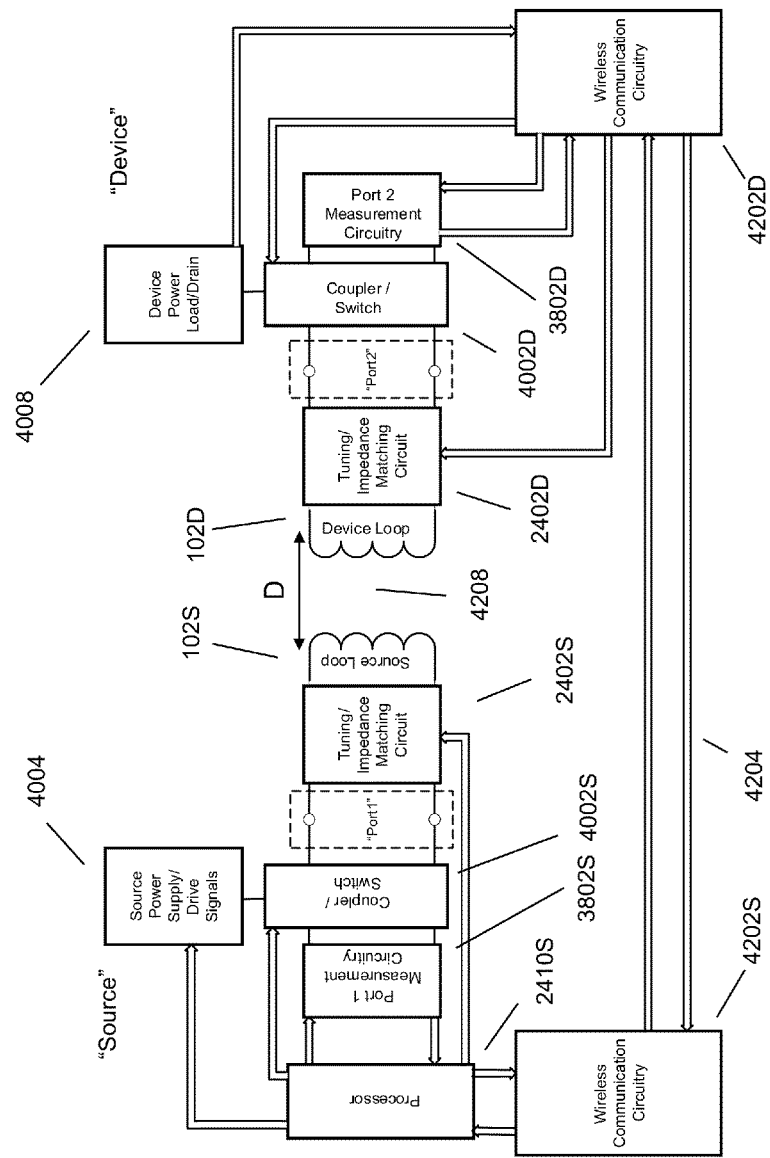
FIG. 45 shows an end-to-end wireless power transmission system. In this example, both the source and the device contain port measurement circuitry but only the source contains a processor. Data from the device is transmitted through a wireless communication channel, which could be implemented either with a separate antenna, or through some modulation of the source drive signal.

FIG. 45 shows an end-to-end wireless power transmission system. Both the source and the device may include port measurement circuitry 3802 but in the system of FIG. 45, only the source contains a processor 2410S. The source and device may be in communication with each other and the adjustment of certain system parameters may be in response to control signals that have been wirelessly communicated, such as though wireless communications circuitry 4202, between the source and the device. The wireless communication channel 4204 may be separate from the wireless power transfer channel 4208, or it may be the same. That is, the resonators 102 used for power exchange may also be used to exchange information. In some cases, information may be exchanged by modulating a component a source or device circuit and sensing that change with port parameter or other monitoring equipment.

Implementations where only the source contains a processor 2410 may be beneficial for multi-device systems where the source can handle all of the tuning and adjustment "decisions" and simply communicate the control signals back to the device(s). This implementation may make the device smaller and cheaper because it may eliminate the need for, or reduce the required functionality of, a processor in the device. A portion of or an entire data set from each port measurement at each device may be sent back to the source microprocessor for analysis, and the control instructions may be sent back to the devices. These communications may be wireless communications.

Figure 46:
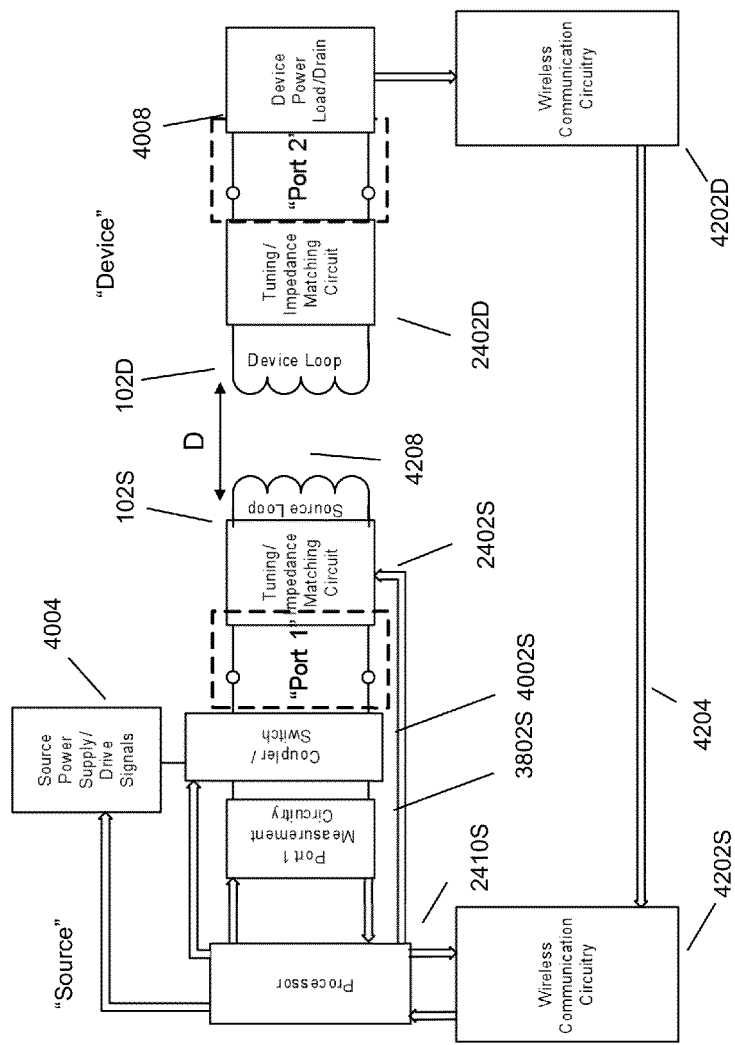
FIG. 46 shows an end-to-end wireless power transmission system. In this example, only the source contains port measurement circuitry and a processor. Data from the device is transmitted through a wireless communication channel, which could be implemented either with a separate antenna, or through some modulation of the source drive signal.

FIG. 46 shows an end-to-end wireless power transmission system. In this example, only the source contains port measurement circuitry 3802 and a processor 2410S. The source and device may be in communication, such as via wireless communication circuitry 4202, with each other and the adjustment of certain system parameters may be in response to control signals that have been wirelessly communicated between the source and the device.

Figure 47:
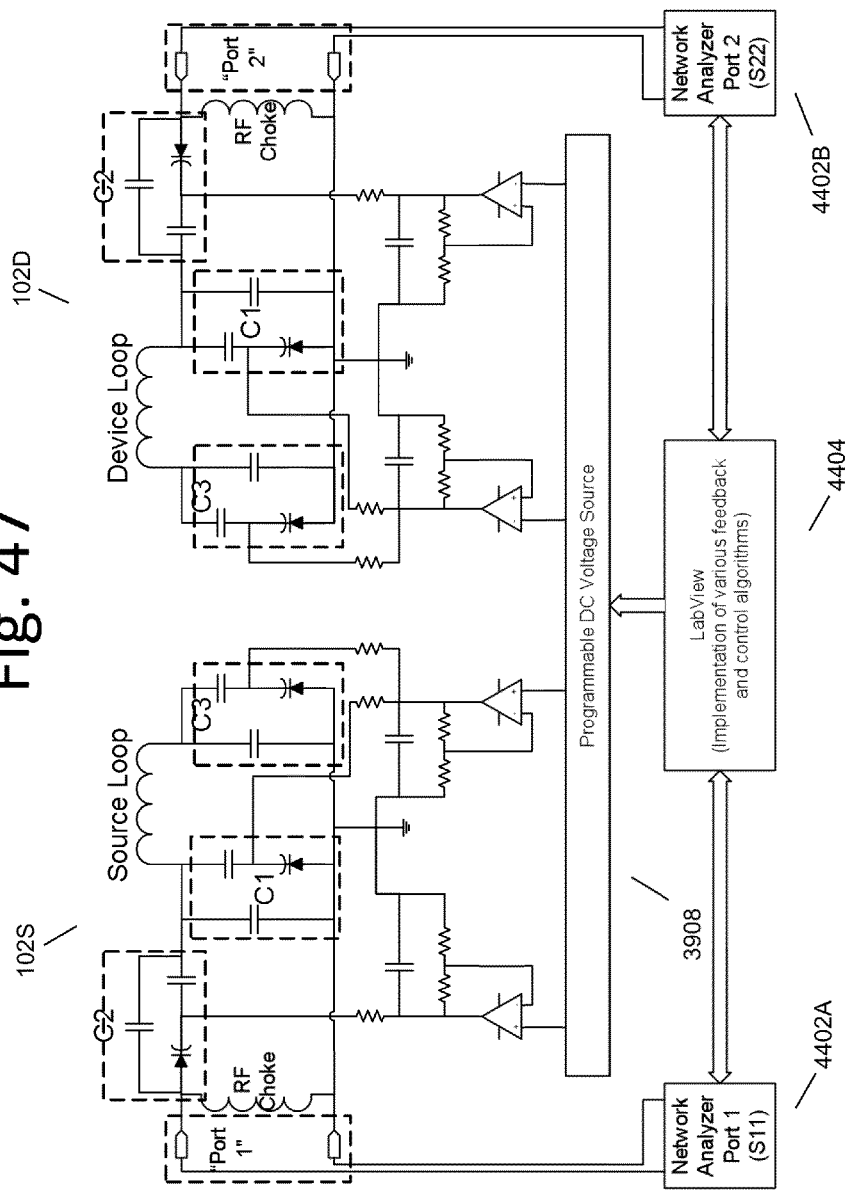
FIG. 47 shows coupled magnetic resonators whose frequency and impedance may be automatically adjusted using algorithms implemented using a processor or a computer.

FIG. 47 shows coupled electromagnetic resonators 102 whose frequency and impedance may be automatically adjusted using a processor or a computer. Resonant frequency tuning and continuous impedance adjustment of the source and device resonators may be implemented with reverse biased diodes, Schottky diodes and/or varactor elements contained within the capacitor networks shown as C1, C2, and C3 in FIG. 47. The circuit topology that was built and demonstrated and is described here is exemplary and is not meant to limit the discussion of automatic system tuning and control in any way. Other circuit topologies could be utilized with the measurement and control architectures discussed in this disclosure.

Device and source resonator impedances and resonant frequencies may be measured with a network analyzer 4402A-B, or by other means described above, and implemented with a controller, such as with Lab View 4404. The measurement circuitry or equipment may output data to a computer or a processor that implements feedback algorithms and dynamically adjusts the frequencies and impedances via a programmable DC voltage source.

In one arrangement, the reverse biased diodes (Schottky, semiconductor junction, and the like) used to realize the tunable capacitance drew very little DC current and could be reverse biased by amplifiers having large series output resistances. This implementation may enable DC control signals to be applied directly to the controllable circuit elements in the resonator circuit while maintaining a very high-Q in the magnetic resonator.

C2 biasing signals may be isolated from C1 and/or C3 biasing signals with a DC blocking capacitor as shown in FIG. 47, if the required DC biasing voltages are different. The output of the biasing amplifiers may be bypassed to circuit ground to isolate RF voltages from the biasing amplifiers, and to keep non-fundamental RF voltages from being injected into the resonator. The reverse bias voltages for some of the capacitors may instead be applied through the inductive element in the resonator itself, because the inductive element acts as a short circuit at DC.

The port parameter measurement circuitry may exchange signals with a processor (including any required ADCs and DACs) as part of a feedback or control system that is used to automatically adjust the resonant frequency, input impedance, energy stored or captured by the resonator or power delivered by a source or to a device load. The processor may also send control signals to tuning or adjustment circuitry in or attached to the magnetic resonator.

When utilizing varactors or diodes as tunable capacitors, it may be beneficial to place fixed capacitors in parallel and in series with the tunable capacitors operating at high reverse bias voltages in the tuning/matching circuits. This arrangement may yield improvements in circuit and system stability and in power handling capability by optimizing the operating voltages on the tunable capacitors.

Figure 48:
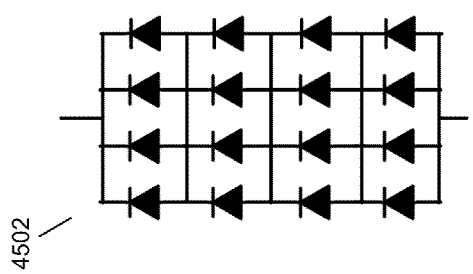
FIG. 48 shows a varactor array.

Varactors or other reverse biased diodes may be used as a voltage controlled capacitor. Arrays of varactors may be used when higher voltage compliance or different capacitance is required than that of a single varactor component. Varactors may be arranged in an N by M array connected serially and in parallel and treated as a single two terminal component with different characteristics than the individual varactors in the array. For example, an N by N array of equal varactors where components in each row are connected in parallel and components in each column are connected in series may be used as a two terminal device with the same capacitance as any single varactor in the array but with a voltage compliance that is N times that of a single varactor in the array. Depending on the variability and differences of parameters of the individual varactors in the array additional biasing circuits composed of resistors, inductors, and the like may be needed. A schematic of a four by four array of unbiased varactors 4502 that may be suitable for magnetic resonator applications is shown in FIG. 48.

Further improvements in system performance may be realized by careful selection of the fixed value capacitor(s) that are placed in parallel and/or in series with the tunable (varactor/diode/capacitor) elements. Multiple fixed capacitors that are switched in or out of the circuit may be able to compensate for changes in resonator Q's, impedances, resonant frequencies, power levels, coupling strengths, and the like, that might be encountered in test, development and operational wireless power transfer systems. Switched capacitor banks and other switched element banks may be used to assure the convergence to the operating frequencies and impedance values required by the system design.

An exemplary control algorithm for isolated and coupled magnetic resonators may be described for the circuit and system elements shown in FIG. 47. One control algorithm first adjusts each of the source and device resonator loops "in isolation", that is, with the other resonators in the system "shorted out" or "removed" from the system. For practical purposes, a resonator can be "shorted out" by making it resonant at a much lower frequency such as by maximizing the value of C1 and/or C3. This step effectively reduces the coupling between the resonators, thereby effectively reducing the system to a single resonator at a particular frequency and impedance.

Tuning a magnetic resonator in isolation includes varying the tunable elements in the tuning and matching circuits until the values measured by the port parameter measurement circuitry are at their predetermined, calculated or measured relative values. The desired values for the quantities measured by the port parameter measurement circuitry may be chosen based on the desired matching impedance, frequency, strong coupling parameter, and the like. For the exemplary algorithms disclosed below, the port parameter measurement circuitry measures S-parameters over a range of frequencies. The range of frequencies used to characterize the resonators may be a compromise between the system performance information obtained and computation/measurement speed. For the algorithms described below the frequency range may be approximately +/−20% of the operating resonant frequency.

Each isolated resonator may be tuned as follows. First, short out the resonator not being adjusted. Next minimize C1, C2, and C3, in the resonator that is being characterized and adjusted. In most cases there will be fixed circuit elements in parallel with C1, C2, and C3, so this step does not reduce the capacitance values to zero. Next, start increasing C2 until the resonator impedance is matched to the "target" real impedance at any frequency in the range of measurement frequencies described above. The initial "target" impedance may be less than the expected operating impedance for the coupled system.

C2 may be adjusted until the initial "target" impedance is realized for a frequency in the measurement range. Then C1 and/or C3 may be adjusted until the loop is resonant at the desired operating frequency.

Each resonator may be adjusted according to the above algorithm. After tuning each resonator in isolation, a second feedback algorithm may be applied to optimize the resonant frequencies and/or input impedances for wirelessly transferring power in the coupled system.

The required adjustments to C1 and/or C2 and/or C3 in each resonator in the coupled system may be determined by measuring and processing the values of the real and imaginary parts of the input impedance from either and/or both "port(s)" shown in FIG. 43. For coupled resonators, changing the input impedance of one resonator may change the input impedance of the other resonator. Control and tracking algorithms may adjust one port to a desired operating point based on measurements at that port, and then adjust the other port based on measurements at that other port. These steps may be repeated until both sides converge to the desired operating point.

S-parameters may be measured at both the source and device ports and the following series of measurements and adjustments may be made. In the description that follows, $Z_0$ is an input impedance and may be the target impedance. In some cases $Z_0$ is 50 ohms or is near 50 ohms. $Z_1$ and $Z_2$ are intermediate impedance values that may be the same value as $Z_0$ or may be different than $Z_0$. Re{value} means the real part of a value and Im{value} means the imaginary part of a value.

An algorithm that may be used to adjust the input impedance and resonant frequency of two coupled resonators is set forth below:

1) Adjust each resonator "in isolation" as described above.
2) Adjust source C1/C3 until, at $\omega_o$, Re{S11}=$(Z_1+/-\in_{Re})$ as follows:

If Re{S11 @ $\omega_o$}>$(Z_1+\in_{Re})$, decrease C1/C3. If Re{S11 @ $\omega_o$}<$(Z_o-\in_{Re})$, increase C1/C3.
3) Adjust source C2 until, at $\omega_o$, Im{S11}=$(+/-\in_{Im})$ as follows:

If Im{S11 @ $\omega_o$}>$\in_{Im}$, decrease C2. If Im{S11 @ $\omega_o$}<$-\in_{Im}$, increase C2.
4) Adjust device C1/C3 until, at $\omega_0$, Re{S22}=$(Z_2+/-\in_{Re})$ as follows:

If Re{S22 @ $\omega_o$}>$(Z_2+\in_{Re})$ decrease C1/C3. If Re{S22 @ $\omega_o$}<$(Z_o-C_{Re})$, increase C1/C3.
5) Adjust device C2 until, at $\omega_o$, Im{S22}=0 as follows:

If Im{S22 @ $\omega_o$}>$\in_{Im}$, decrease C2. If Im{S22 @ $\omega_o$}<$-\in_{Im}$, increase C2.

We have achieved a working system by repeating steps 1-4 until both (Re{S11}, Im{S11}) and (Re{S22}, Im{S22}) converge to $((Z_0+/-\in_{Re}), (+/-\in_{Im}))$ at $\omega_o$, where $Z_0$ is the desired matching impedance and $\omega_o$ is the desired operating frequency. Here, $\in_{Im}$ represents the maximum deviation of the imaginary part, at $\omega_o$, from the desired value of 0, and $\in_{Re}$ represents the maximum deviation of the real part from the desired value of $Z_0$. It is understood that $\in_{Im}$ and $\in_{Re}$ can be adjusted to increase or decrease the number of steps to convergence at the potential cost of system performance (efficiency). It is also understood that steps 1-4 can be performed in a variety of sequences and a variety of ways other than that outlined above (i.e. first adjust the source imaginary part, then the source real part; or first adjust the device real part, then the device imaginary part, etc.) The intermediate impedances $Z_1$ and $Z_2$ may be adjusted during steps 1-4 to reduce the number of steps required for convergence. The desire or target impedance value may be complex, and may vary in time or under different operating scenarios.

Steps 1-4 may be performed in any order, in any combination and any number of times. Having described the above algorithm, variations to the steps or the described implementation may be apparent to one of ordinary skill in the art. The algorithm outlined above may be implemented with any equivalent linear network port parameter measurements (i.e., Z-parameters, Y-parameters, T-parameters, H-parameters, ABCD-parameters, etc.) or other monitor signals described above, in the same way that impedance or admittance can be alternatively used to analyze a linear circuit to derive the same result.

The resonators may need to be retuned owing to changes in the "loaded" resistances, Rs and Rd, caused by changes in the mutual inductance M (coupling) between the source and device resonators. Changes in the inductances, Ls and Ld, of the inductive elements themselves may be caused by the influence of external objects, as discussed earlier, and may also require compensation. Such variations may be mitigated by the adjustment algorithm described above.

A directional coupler or a switch may be used to connect the port parameter measurement circuitry to the source resonator and tuning/adjustment circuitry. The port parameter measurement circuitry may measure properties of the magnetic resonator while it is exchanging power in a wireless power transmission system, or it may be switched out of the circuit during system operation. The port parameter measurement circuitry may measure the parameters and the processor may control certain tunable elements of the magnetic resonator at start-up, or at certain intervals, or in response to changes in certain system operating parameters.

A wireless power transmission system may include circuitry to vary or tune the impedance and/or resonant frequency of source and device resonators. Note that while tuning circuitry is shown in both the source and device resonators, the circuitry may instead be included in only the source or the device resonators, or the circuitry may be included in only some of the source and/or device resonators. Note too that while we may refer to the circuitry as "tuning" the impedance and or resonant frequency of the resonators, this tuning operation simply means that various electrical parameters such as the inductance or capacitance of the structure are being varied. In some cases, these parameters may be varied to achieve a specific predetermined value, in other cases they may be varied in response to a control algorithm or to stabilize a target performance value that is changing. In some cases, the parameters are varied as a function of temperature, of other sources or devices in the area, of the environment, at the like.

Applications

For each listed application, it will be understood by one of ordinary skill-in-the-art that there are a variety of ways that the resonator structures used to enable wireless power transmission may be connected or integrated with the objects that are supplying or being powered. The resonator may be physically separate from the source and device objects. The resonator may supply or remove power from an object using traditional inductive techniques or through direct electrical connection, with a wire or cable for example. The electrical connection may be from the resonator output to the AC or DC power input port on the object. The electrical connection may be from the output power port of an object to the resonator input.

Figure 49:
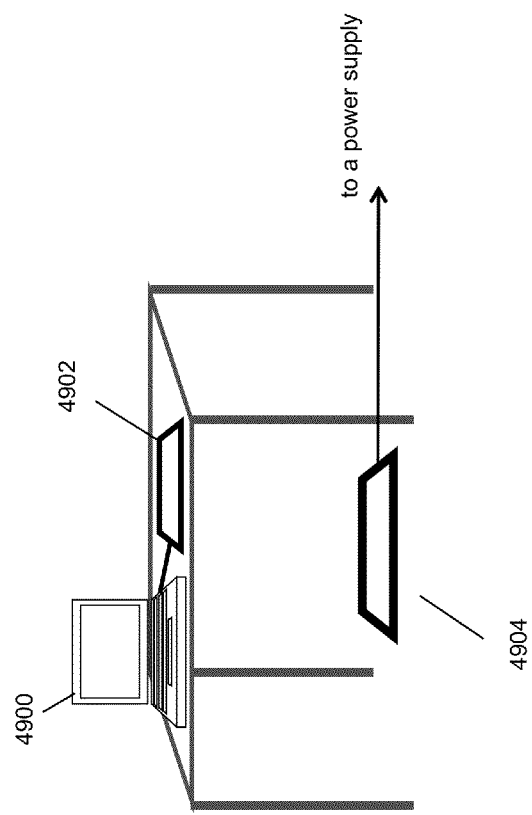
FIG. 49 shows a device (laptop computer) being wirelessly powered or charged by a source, where both the source and device resonator are physically separated from, but electrically connected to, the source and device.

FIG. 49 shows a source resonator 4904 that is physically separated from a power supply and a device resonator 4902 that is physically separated from the device 4900, in this illustration a laptop computer. Power may be supplied to the source resonator, and power may be taken from the device resonator directly, by an electrical connection. One of ordinary skill in the art will understand from the materials incorporated by reference that the shape, size, material composition, arrangement, position and orientation of the resonators above are provided by way of non-limiting example, and that a wide variation in any and all of these parameters could be supported by the disclosed technology for a variety of applications.

Figure 50:
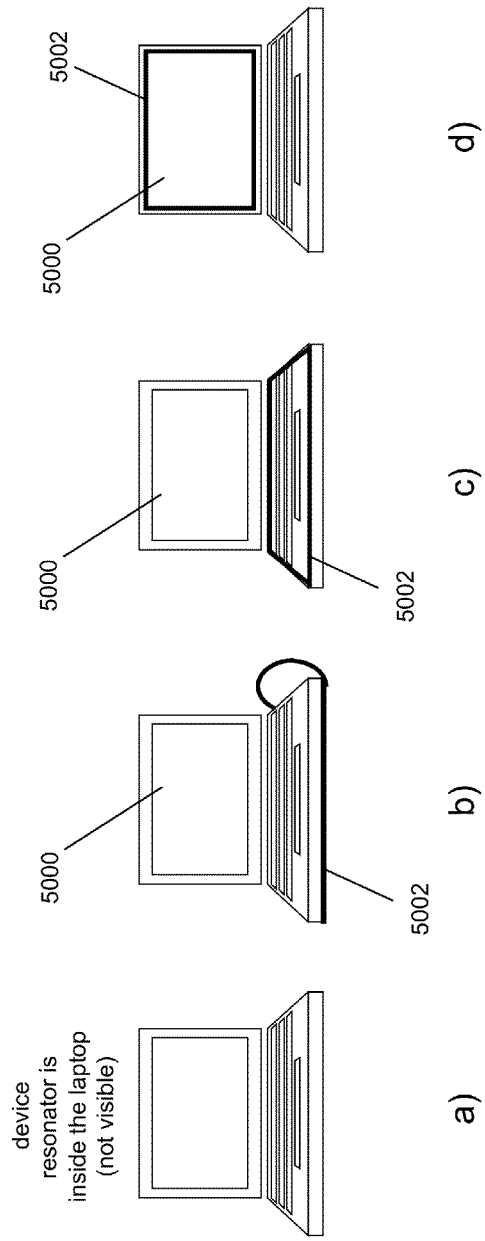
FIG. 50(a) is an illustration of a wirelessly powered or charged laptop application where the device resonator is inside the laptop case and is not visible.
FIG. 50(b) is an illustration of a wirelessly powered or charged laptop application where the resonator is underneath the laptop base and is electrically connected to the laptop power input by an electrical cable.
FIG. 50(c) is an illustration of a wirelessly powered or charged laptop application where the resonator is attached to the laptop base.
FIG. 50(d) is an illustration of a wirelessly powered or charged laptop application where the resonator is attached to the laptop display.

Continuing with the example of the laptop, and without limitation, the device resonator may be physically connected to the device it is powering or charging. For example, as shown in FIG. 50a and FIG. 50b, the device resonator 5002 may be (a) integrated into the housing of the device 5000 or (b) it may be attached by an adapter. The resonator 5002 may (FIG. 50b-d) or may not (FIG. 50a) be visible on the device. The resonator may be affixed to the device, integrated into the device, plugged into the device, and the like.

The source resonator may be physically connected to the source supplying the power to the system. As described above for the devices and device resonators, there are a variety of ways the resonators may be attached to, connected to or integrated with the power supply. One of ordinary skill in the art will understand that there are a variety of ways the resonators may be integrated in the wireless power transmission system, and that the sources and devices may utilize similar or different integration techniques.

Continuing again with the example of the laptop computer, and without limitation, the laptop computer may be powered, charged or recharged by a wireless power transmission system. A source resonator may be used to supply wireless power and a device resonator may be used to capture the wireless power. A device resonator 5002 may be integrated into the edge of the screen (display) as illustrated in FIG. 50d, and/or into the base of the laptop as illustrated in FIG. 50c. The source resonator 5002 may be integrated into the base of the laptop and the device resonator may be integrated into the edge of the screen. The resonators may also or instead be affixed to the power source and/or the laptop. The source and device resonators may also or instead be physically separated from the power supply and the laptop and may be electrically connected by a cable. The source and device resonators may also or instead be physically separated from the power supply and the laptop and may be electrically coupled using a traditional inductive technique. One of ordinary skill in the art will understand that, while the preceding examples relate to wireless power transmission to a laptop, that the methods and systems disclosed for this application may be suitably adapted for use with other electrical or electronic devices. In general, the source resonator may be external to the source and supplying power to a device resonator that in turn supplies power the device, or the source resonator may be connected to the source and supplying power to a device resonator that in turn supplies power to a portion of the device, or the source resonator may internal to the source and supplying power to a device resonator that in turn supplies power to a portion of the device, as well as any combination of these.

A system or method disclosed herein may provide power to an electrical or electronics device, such as, and not limited to, phones, cell phones, cordless phones, smart phones, PDAs, audio devices, music players, MP3 players, radios, portable radios and players, wireless headphones, wireless headsets, computers, laptop computers, wireless keyboards, wireless mouse, televisions, displays, flat screen displays, computer displays, displays embedded in furniture, digital picture frames, electronic books, (e.g. the Kindle, e-ink books, magazines, and the like), remote control units (also referred to as controllers, game controllers, commanders, clickers, and the like, and used for the remote control of a plurality of electronics devices, such as televisions, video games, displays, computers, audio visual equipment, lights, and the like), lighting devices, cooling devices, air circulation devices, purification devices, personal hearing aids, power tools, security systems, alarms, bells, flashing lights, sirens, sensors, loudspeakers, electronic locks, electronic keypads, light switches, other electrical switches, and the like. Here the term electronic lock is used to indicate a door lock which operates electronically (e.g. with electronic combo-key, magnetic card, RFID card, and the like) which is placed on a door instead of a mechanical key-lock. Such locks are often battery operated, risking the possibility that the lock might stop working when a battery dies, leaving the user locked-out. This may be avoided where the battery is either charged or completely replaced by a wireless power transmission implementation as described herein.

Here, the term light switch (or other electrical switch) is meant to indicate any switch (e.g. on a wall of a room) in one part of the room that turns on/off a device (e.g. light fixture at the center of the ceiling) in another part of the room. To install such a switch by direct connection, one would have to run a wire all the way from the device to the switch. Once such a switch is installed at a particular spot, it may be very difficult to move. Alternately, one can envision a 'wireless switch', where "wireless" means the switching (on/off) commands are communicated wirelessly, but such a switch has traditionally required a battery for operation. In general, having too many battery operated switches around a house may be impractical, because those many batteries will need to be replaced periodically. So, a wirelessly communicating switch may be more convenient, provided it is also wirelessly powered. For example, there already exist communications wireless doorbells that are battery powered, but where one still has to replace the battery in them periodically. The remote doorbell button may be made to be completely wireless, where there may be no need to ever replace the battery again. Note that here, the term 'cordless' or 'wireless' or 'communications wireless' is used to indicate that there is a cordless or wireless communications facility between the device and another electrical component, such as the base station for a cordless phone, the computer for a wireless keyboard, and the like. One skilled in the art will recognize that any electrical or electronics device may include a wireless communications facility, and that the systems and methods described herein may be used to add wireless power transmission to the device. As described herein, power to the electrical or electronics device may be delivered from an external or internal source resonator, and to the device or portion of the device. Wireless power transmission may significantly reduce the need to charge and/or replace batteries for devices that enter the near vicinity of the source resonator and thereby may reduce the downtime, cost and disposal issues often associated with batteries.

The systems and methods described herein may provide power to lights without the need for either wired power or batteries. That is, the systems and methods described herein may provide power to lights without wired connection to any power source, and provide the energy to the light non-radiatively across mid-range distances, such as across a distance of a quarter of a meter, one meter, three meters, and the like. A 'light' as used herein may refer to the light source itself, such as an incandescent light bulb, florescent light bulb lamps, Halogen lamps, gas discharge lamps, fluorescent lamps, neon lamps, high-intensity discharge lamps, sodium vapor lamps, Mercury-vapor lamps, electroluminescent lamps, light emitting diodes (LED) lamps, and the like; the light as part of a light fixture, such as a table lamp, a floor lamp, a ceiling lamp, track lighting, recessed light fixtures, and the like; light fixtures integrated with other functions, such as a light/ceiling fan fixture, and illuminated picture frame, and the like. As such, the systems and methods described herein may reduce the complexity for installing a light, such as by minimizing the installation of electrical wiring, and allowing the user to place or mount the light with minimal regard to sources of wired power. For instance, a light may be placed anywhere in the vicinity of a source resonator, where the source resonator may be mounted in a plurality of different places with respect to the location of the light, such as on the floor of the room above, (e.g. as in the case of a ceiling light and especially when the room above is the attic); on the wall of the next room, on the ceiling of the room below, (e.g. as in the case of a floor lamp); in a component within the room or in the infrastructure of the room as described herein; and the like. For example, a light/ceiling fan combination is often installed in a master bedroom, and the master bedroom often has the attic above it. In this instance a user may more easily install the light/ceiling fan combination in the master bedroom, such as by simply mounting the light/ceiling fan combination to the ceiling, and placing a source coil (plugged into the house wired AC power) in the attic above the mounted fixture. In another example, the light may be an external light, such as a flood light or security light, and the source resonator mounted inside the structure. This way of installing lighting may be particularly beneficial to users who rent their homes, because now they may be able to mount lights and such other electrical components without the need to install new electrical wiring. The control for the light may also be communicated by near-field communications as described herein, or by traditional wireless communications methods.

The systems and methods described herein may provide power from a source resonator to a device resonator that is either embedded into the device component, or outside the device component, such that the device component may be a traditional electrical component or fixture. For instance, a ceiling lamp may be designed or retrofitted with a device resonator integrated into the fixture, or the ceiling lamp may be a traditional wired fixture, and plugged into a separate electrical facility equipped with the device resonator. In an example, the electrical facility may be a wireless junction box designed to have a device resonator for receiving wireless power, say from a source resonator placed on the floor of the room above (e.g. the attic), and which contains a number of traditional outlets that are powered from the device resonator. The wireless junction box, mounted on the ceiling, may now provide power to traditional wired electrical components on the ceiling (e.g. a ceiling light, track lighting, a ceiling fan). Thus, the ceiling lamp may now be mounted to the ceiling without the need to run wires through the infrastructure of the building. This type of device resonator to traditional outlet junction box may be used in a plurality of applications, including being designed for the interior or exterior of a building, to be made portable, made for a vehicle, and the like. Wireless power may be transferred through common building materials, such as wood, wall board, insulation, glass. brick, stone, concrete, and the like. The benefits of reduced installation cost, re-configurability, and increased application flexibility may provide the user significant benefits over traditional wired installations. The device resonator for a traditional outlet junction box may include a plurality of electrical components for facilitating the transfer of power from the device resonator to the traditional outlets, such as power source electronics which convert the specific frequencies needed to implement efficient power transfer to line voltage, power capture electronics which may convert high frequency AC to usable voltage and frequencies (AC and/or DC), controls which synchronize the capture device and the power output and which ensure consistent, safe, and maximally efficient power transfer, and the like.

The systems and methods described herein may provide advantages to lights or electrical components that operate in environments that are wet, harsh, controlled, and the like, such has outside and exposed to the rain, in a pool/sauna/shower, in a maritime application, in hermetically sealed components, in an explosive-proof room, on outside signage, a harsh industrial environment in a volatile environment (e.g. from volatile vapors or airborne organics, such as in a grain silo or bakery), and the like. For example, a light mounted under the water level of a pool is normally difficult to wire up, and is required to be water-sealed despite the need for external wires. But a pool light using the principles disclosed herein may more easily be made water sealed, as there may be no external wires needed. In another example, an explosion proof room, such as containing volatile vapors, may not only need to be hermetically sealed, but may need to have all electrical contacts (that could create a spark) sealed. Again, the principles disclosed herein may provide a convenient way to supply sealed electrical components for such applications.

The systems and methods disclosed herein may provide power to game controller applications, such as to a remote handheld game controller. These game controllers may have been traditionally powered solely by batteries, where the game controller's use and power profile caused frequent changing of the battery, battery pack, rechargeable batteries, and the like, that may not have been ideal for the consistent use to the game controller, such as during extended game play. A device resonator may be placed into the game controller, and a source resonator, connected to a power source, may be placed in the vicinity. Further, the device resonator in the game controller may provide power directly to the game controller electronics without a battery; provide power to a battery, battery pack, rechargeable battery, and the like, which then provides power to the game controller electronics; and the like. The game controller may utilize multiple battery packs, where each battery pack is equipped with a device resonator, and thus may be constantly recharging while in the vicinity of the source resonator, whether plugged into the game controller or not. The source resonator may be resident in a main game controller facility for the game, where the main game controller facility and source resonator are supplied power from AC 'house' power; resident in an extension facility form AC power, such as in a source resonator integrated into an 'extension cord'; resident in a game chair, which is at least one of plugged into the wall AC, plugged into the main game controller facility, powered by a battery pack in the game chair; and the like. The source resonator may be placed and implemented in any of the configurations described herein.

The systems and methods disclosed herein may integrate device resonators into battery packs, such as battery packs that are interchangeable with other battery packs. For instance, some portable devices may use up electrical energy at a high rate such that a user may need to have multiple interchangeable battery packs on hand for use, or the user may operate the device out of range of a source resonator and need additional battery packs to continue operation, such as for power tools, portable lights, remote control vehicles, and the like. The use of the principles disclosed herein may not only provide a way for device resonator enabled battery packs to be recharged while in use and in range, but also for the recharging of battery packs not currently in use and placed in range of a source resonator. In this way, battery packs may always be ready to use when a user runs down the charge of a battery pack being used. For example, a user may be working with a wireless power tool, where the current requirements may be greater than can be realized through direct powering from a source resonator. In this case, despite the fact that the systems and methods described herein may be providing charging power to the in-use battery pack while in range, the battery pack may still run down, as the power usage may have exceeded the recharge rate. Further, the user may simply be moving in and out of range, or be completely out of range while using the device. However, the user may have placed additional battery packs in the vicinity of the source resonator, which have been recharged while not in use, and are now charged sufficiently for use. In another example, the user may be working with the power tool away from the vicinity of the source resonator, but leave the supplemental battery packs to charge in the vicinity of the source resonator, such as in a room with a portable source resonator or extension cord source resonator, in the user's vehicle, in user's tool box, and the like. In this way, the user may not have to worry about taking the time to, and/or remembering to plug in their battery packs for future use. The user may only have to change out the used battery pack for the charged battery pack and place the used one in the vicinity of the source resonator for recharging. Device resonators may be built into enclosures with known battery form factors and footprints and may replace traditional chemical batteries in known devices and applications. For example, device resonators may be built into enclosures with mechanical dimensions equivalent to AA batteries, AAA batteries, D batteries, 9V batteries, laptop batteries, cell phone batteries, and the like. The enclosures may include a smaller "button battery" in addition to the device resonator to store charge and provide extended operation, either in terms of time or distance. Other energy storage devices in addition to or instead of button batteries may be integrated with the device resonators and any associated power conversion circuitry. These new energy packs may provide similar voltage and current levels as provided by traditional batteries, but may be composed of device resonators, power conversion electronics, a small battery, and the like. These new energy packs may last longer than traditional batteries because they may be more easily recharged and may be recharging constantly when they are located in a wireless power zone. In addition, such energy packs may be lighter than traditional batteries, may be safer to use and store, may operate over wider temperature and humidity ranges, may be less harmful to the environment when thrown away, and the like. As described herein, these energy packs may last beyond the life of the product when used in wireless power zones as described herein.

The systems and methods described herein may be used to power visual displays, such as in the case of the laptop screen, but more generally to include the great variety and diversity of displays utilized in today's electrical and electronics components, such as in televisions, computer monitors, desktop monitors, laptop displays, digital photo frames, electronic books, mobile device displays (e.g. on phones, PDAs, games, navigation devices, DVD players), and the like. Displays that may be powered through one or more of the wireless power transmission systems described herein may also include embedded displays, such as embedded in electronic components (e.g. audio equipment, home appliances, automotive displays, entertainment devices, cash registers, remote controls), in furniture, in building infrastructure, in a vehicle, on the surface of an object (e.g. on the surface of a vehicle, building, clothing, signs, transportation), and the like. Displays may be very small with tiny resonant devices, such as in a smart card as described herein, or very large, such as in an advertisement sign. Displays powered using the principles disclosed herein may also be any one of a plurality of imaging technologies, such as liquid crystal display (LCD), thin film transistor LCD, passive LCD, cathode ray tube (CRT), plasma display, projector display (e.g. LCD, DLP, LCOS), surface-conduction electron-emitter display (SED), organic light-emitting diode (OLED), and the like. Source coil configurations may include attaching to a primary power source, such as building power, vehicle power, from a wireless extension cord as described herein, and the like; attached to component power, such as the base of an electrical component (e.g. the base of a computer, a cable box for a TV); an intermediate relay source coil; and the like. For example, hanging a digital display on the wall may be very appealing, such as in the case of a digital photo frame that receives its information signals wirelessly or through a portable memory device, but the need for an unsightly power cord may make it aesthetically unpleasant. However, with a device coil embedded in the digital photo frame, such as wrapped within the frame portion, may allow the digital photo frame to be hung with no wires at all. The source resonator may then be placed in the vicinity of the digital photo frame, such as in the next room on the other side of the wall, plugged directly into a traditional power outlet, from a wireless extension cord as described herein, from a central source resonator for the room, and the like.

The systems and methods described herein may provide wireless power transmission between different portions of an electronics facility. Continuing with the example of the laptop computer, and without limitation, the screen of the laptop computer may require power from the base of the laptop. In this instance, the electrical power has been traditionally routed via direct electrical connection from the base of the laptop to the screen over a hinged portion of the laptop between the screen and the base. When a wired connection is utilized, the wired connection may tend to wear out and break, the design functionality of the laptop computer may be limited by the required direct electrical connection, the design aesthetics of the laptop computer may be limited by the required direct electrical connection, and the like. However, a wireless connection may be made between the base and the screen. In this instance, the device resonator may be placed in the screen portion to power the display, and the base may be either powered by a second device resonator, by traditional wired connections, by a hybrid of resonator-battery-direct electrical connection, and the like. This may not only improve the reliability of the power connection due to the removal of the physical wired connection, but may also allow designers to improve the functional and/or aesthetic design of the hinge portion of the laptop in light of the absence of physical wires associated with the hinge. Again, the laptop computer has been used here to illustrate how the principles disclosed herein may improve the design of an electric or electronic device, and should not be taken as limiting in any way. For instance, many other electrical devices with separated physical portions could benefit from the systems and methods described herein, such as a refrigerator with electrical functions on the door, including an ice maker, a sensor system, a light, and the like; a robot with movable portions, separated by joints; a car's power system and a component in the car's door; and the like. The ability to provide power to a device via a device resonator from an external source resonator, or to a portion of the device via a device resonator from either external or internal source resonators, will be recognized by someone skilled in the art to be widely applicable across the range of electric and electronic devices.

The systems and methods disclosed herein may provide for a sharing of electrical power between devices, such as between charged devices and uncharged devices. For instance a charged up device or appliance may act like a source and send a predetermined amount of energy, dialed in amount of energy, requested and approved amount of energy, and the like, to a nearby device or appliance. For example, a user may have a cell phone and a digital camera that are both capable of transmitting and receiving power through embedded source and device resonators, and one of the devices, say the cell phone, is found to be low on charge. The user may then transfer charge from the digital camera to the cell phone. The source and device resonators in these devices may utilize the same physical resonator for both transmission and reception, utilize separate source and device resonators, one device may be designed to receive and transmit while the other is designed to receive only, one device may be designed to transmit only and the other to receive only, and the like.

To prevent complete draining the battery of a device it may have a setting allowing a user to specify how much of the power resource the receiving device is entitled to. It may be useful, for example, to put a limit on the amount of power available to external devices and to have the ability to shut down power transmission when battery power falls below a threshold.

The systems and methods described herein may provide wireless power transfer to a nearby electrical or electronics component in association with an electrical facility, where the source resonator is in the electrical facility and the device resonator is in the electronics component. The source resonator may also be connected to, plugged into, attached to the electrical facility, such as through a universal interface (e.g. a USB interface, PC card interface), supplemental electrical outlet, universal attachment point, and the like, of the electrical facility. For example, the source resonator may be inside the structure of a computer on a desk, or be integrated into some object, pad, and the like, that is connected to the computer, such as into one of the computer's USB interfaces. In the example of the source resonator embedded in the object, pad, and the like, and powered through a USB interface, the source resonator may then be easily added to a user's desktop without the need for being integrated into any other electronics device, thus conveniently providing a wireless energy zone around which a plurality of electric and/or electronics devices may be powered. The electrical facility may be a computer, a light fixture, a dedicated source resonator electrical facility, and the like, and the nearby components may be computer peripherals, surrounding electronics components, infrastructure devices, and the like, such as computer keyboards, computer mouse, fax machine, printer, speaker system, cell phone, audio device, intercom, music player, PDA, lights, electric pencil sharpener, fan, digital picture frame, calculator, electronic games, and the like. For example, a computer system may be the electrical facility with an integrated source resonator that utilizes a 'wireless keyboard' and 'wireless mouse', where the use of the term wireless here is meant to indicate that there is wireless communication facility between each device and the computer, and where each device must still contain a separate battery power source. As a result, batteries would need to be replaced periodically, and in a large company, may result in a substantial burden for support personnel for replacement of batteries, cost of batteries, and proper disposal of batteries. Alternatively, the systems and methods described herein may provide wireless power transmission from the main body of the computer to each of these peripheral devices, including not only power to the keyboard and mouse, but to other peripheral components such as a fax, printer, speaker system, and the like, as described herein. A source resonator integrated into the electrical facility may provide wireless power transmission to a plurality of peripheral devices, user devices, and the like, such that there is a significant reduction in the need to charge and/or replace batteries for devices in the near vicinity of the source resonator integrated electrical facility. The electrical facility may also provide tuning or auto-tuning software, algorithms, facilities, and the like, for adjusting the power transfer parameters between the electrical facility and the wirelessly powered device. For example, the electrical facility may be a computer on a user's desktop, and the source resonator may be either integrated into the computer or plugged into the computer (e.g. through a USB connection), where the computer provides a facility for providing the tuning algorithm (e.g. through a software program running on the computer).

The systems and methods disclosed herein may provide wireless power transfer to a nearby electrical or electronics component in association with a facility infrastructure component, where the source resonator is in, or mounted on, the facility infrastructure component and the device resonator is in the electronics component. For instance, the facility infrastructure component may be a piece of furniture, a fixed wall, a movable wall or partition, the ceiling, the floor, and the source resonator attached or integrated into a table or desk (e.g. just below/above the surface, on the side, integrated into a table top or table leg), a mat placed on the floor (e.g. below a desk, placed on a desk), a mat on the garage floor (e.g. to charge the car and/or devices in the car), in a parking lot/garage (e.g. on a post near where the car is parked), a television (e.g. for charging a remote control), a computer monitor (e.g. to power/charge a wireless keyboard, wireless mouse, cell phone), a chair (e.g. for powering electric blankets, medical devices, personal health monitors), a painting, office furniture, common household appliances, and the like. For example, the facility infrastructure component may be a lighting fixture in an office cubical, where the source resonator and light within the lighting fixture are both directly connected to the facility's wired electrical power. However, with the source resonator now provided in the lighting fixture, there would be no need to have any additional wired connections for those nearby electrical or electronics components that are connected to, or integrated with, a device resonator. In addition, there may be a reduced need for the replacement of batteries for devices with device resonators, as described herein.

The use of the systems and methods described herein to supply power to electrical and electronic devices from a central location, such as from a source resonator in an electrical facility, from a facility infrastructure component and the like, may minimize the electrical wiring infrastructure of the surrounding work area. For example, in an enterprise office space there are typically a great number of electrical and electronic devices that need to be powered by wired connections. With utilization of the systems and methods described herein, much of this wiring may be eliminated, saving the enterprise the cost of installation, decreasing the physical limitations associated with office walls having electrical wiring, minimizing the need for power outlets and power strips, and the like. The systems and methods described herein may save money for the enterprise through a reduction in electrical infrastructure associated with installation, re-installation (e.g., reconfiguring office space), maintenance, and the like. In another example, the principles disclosed herein may allow the wireless placement of an electrical outlet in the middle of a room. Here, the source could be placed on the ceiling of a basement below the location on the floor above where one desires to put an outlet. The device resonator could be placed on the floor of the room right above it. Installing a new lighting fixture (or any other electric device for that matter, e.g. camera, sensor, etc., in the center of the ceiling may now be substantially easier for the same reason).

In another example, the systems and methods described herein may provide power "through" walls. For instance, suppose one has an electric outlet in one room (e.g. on a wall), but one would like to have an outlet in the next room, but without the need to call an electrician, or drill through a wall, or drag a wire around the wall, or the like. Then one might put a source resonator on the wall in one room, and a device resonator outlet/pickup on the other side of the wall. This may power a flat-screen TV or stereo system or the like (e.g. one may not want to have an ugly wire climbing up the wall in the living room, but doesn't mind having a similar wire going up the wall in the next room, e.g. storage room or closet, or a room with furniture that blocks view of wires running along the wall). The systems and methods described herein may be used to transfer power from an indoor source to various electric devices outside of homes or buildings without requiring holes to be drilled through, or conduits installed in, these outside walls. In this case, devices could be wirelessly powered outside the building without the aesthetic or structural damage or risks associated with drilling holes through walls and siding. In addition, the systems and methods described herein may provide for a placement sensor to assist in placing an interior source resonator for an exterior device resonator equipped electrical component. For example, a home owner may place a security light on the outside of their home which includes a wireless device resonator, and now needs to adequately or optimally position the source resonator inside the home. A placement sensor acting between the source and device resonators may better enable that placement by indicating when placement is good, or to a degree of good, such as in a visual indication, an audio indication, a display indication, and the like. In another example, and in a similar way, the systems and methods described herein may provide for the installation of equipment on the roof of a home or building, such as radio transmitters and receivers, solar panels and the like. In the case of the solar panel, the source resonator may be associated with the panel, and power may be wirelessly transferred to a distribution panel inside the building without the need for drilling through the roof. The systems and methods described herein may allow for the mounting of electric or electrical components across the walls of vehicles (such as through the roof) without the need to drill holes, such as for automobiles, water craft, planes, trains, and the like. In this way, the vehicle's walls may be left intact without holes being drilled, thus maintaining the value of the vehicle, maintaining watertightness, eliminating the need to route wires, and the like. For example, mounting a siren or light to the roof of a police car decreases the future resale of the car, but with the systems and methods described herein, any light, horn, siren, and the like, may be attached to the roof without the need to drill a hole.

The systems and methods described herein may be used for wireless transfer of power from solar photovoltaic (PV) panels. PV panels with wireless power transfer capability may have several benefits including simpler installation, more flexible, reliable, and weatherproof design. Wireless power transfer may be used to transfer power from the PV panels to a device, house, vehicle, and the like. Solar PV panels may have a wireless source resonator allowing the PV panel to directly power a device that is enabled to receive the wireless power. For example, a solar PV panel may be mounted directly onto the roof of a vehicle, building, and the like. The energy captured by the PV panel may be wirelessly transferred directly to devices inside the vehicle or under the roof of a building. Devices that have resonators can wirelessly receive power from the PV panel. Wireless power transfer from PV panels may be used to transfer energy to a resonator that is coupled to the wired electrical system of a house, vehicle, and the like allowing traditional power distribution and powering of conventional devices without requiring any direct contact between the exterior PV panels and the internal electrical system.

With wireless power transfer significantly simpler installation of rooftop PV panels is possible because power may be transmitted wirelessly from the panel to a capture resonator in the house, eliminating all outside wiring, connectors, and conduits, and any holes through the roof or walls of the structure. Wireless power transfer used with solar cells may have a benefit in that it can reduced roof danger since it eliminates the need for electricians to work on the roof to interconnect panels, strings, and junction boxes. Installation of solar panels integrated with wireless power transfer may require less skilled labor since fewer electrical contacts need to be made. Less site specific design may be required with wireless power transfer since the technology gives the installer the ability to individually optimize and position each solar PV panel, significantly reducing the need for expensive engineering and panel layout services. There may not be need to carefully balance the solar load on every panel and no need for specialized DC wiring layout and interconnections.

Figure 51:
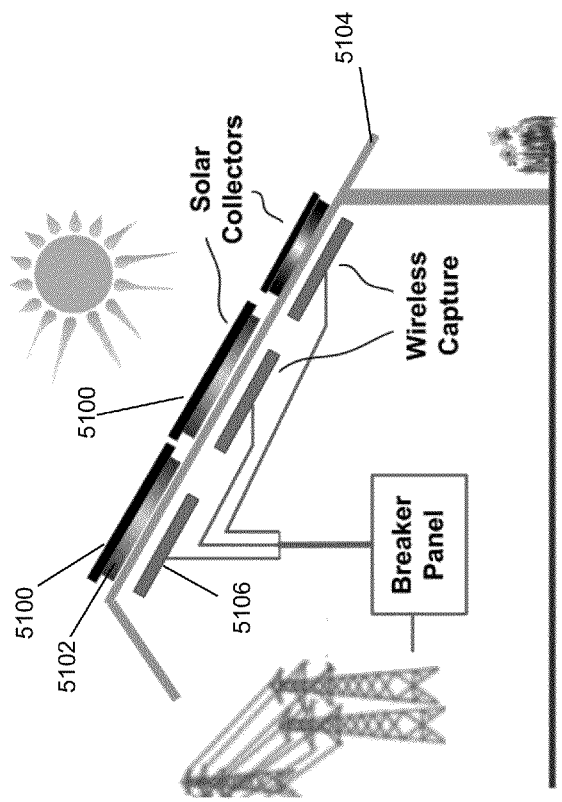
FIG. 51 is a diagram of rooftop PV panels with wireless power transfer.

For rooftop or on-wall installations of PV panels, the capture resonator may be mounted on the underside of the roof, inside the wall, or in any other easily accessible inside space within a foot or two of the solar PV panel. A diagram showing a possible general rooftop PV panel installation is shown in FIG. 51. Various PV solar collectors may be mounted in top of a roof with wireless power capture coils mounted inside the building under the roof. The resonator coils in the PV panels can transfer their energy wirelessly through the roof to the wireless capture coils. The captured energy from the PV cells may be collected and coupled to the electrical system of the house to power electric and electronic devices or coupled to the power grid when more power than needed is generated. Energy is captured from the PV cells without requiring holes or wires that penetrate the roof or the walls of the building. Each PV panel may have a resonator that is coupled to a corresponding resonator on the interior of the vehicle or building. Multiple panels may utilize wireless power transfer between each other to transfer or collect power to one or a couple of designated panels that are coupled to resonators on the interior of the vehicle of house. Panels may have wireless power resonators on their sides or in their perimeter that can couple to resonators located in other like panels allowing transfer of power from panel to panel. An additional bus or connection structure may be provided that wirelessly couples the power from multiple panels on the exterior of a building or vehicle and transfers power to one or a more resonators on the interior of building or vehicle.

For example, as shown in FIG. 51, a source resonator 5102 may be coupled to a PV cell 5100 mounted on top of roof 5104 of a building. A corresponding capture resonator 5106 is placed inside the building. The solar energy captured by the PV cells can then be transferred between the source resonators 5102 outside to the device resonators 5106 inside the building without having direct holes and connections through the building.

Each solar PV panel with wireless power transfer may have its own inverter, significantly improving the economics of these solar systems by individually optimizing the power production efficiency of each panel, supporting a mix of panel sizes and types in a single installation, including single panel "pay-as-you-grow" system expansions. Reduction of installation costs may make a single panel economical for installation. Eliminating the need for panel string designs and careful positioning and orienting of multiple panels, and eliminating a single point of failure for the system.

Wireless power transfer in PV solar panels may enable more solar deployment scenarios because the weather-sealed solar PV panels eliminate the need to drill holes for wiring through sealed surfaces such as car roofs and ship decks, and eliminate the requirement that the panels be installed in fixed locations. With wireless power transfer, PV panels may be deployed temporarily, and then moved or removed, without leaving behind permanent alterations to the surrounding structures. They may be placed out in a yard on sunny days, and moved around to follow the sun, or brought inside for cleaning or storage, for example. For backyard or mobile solar PV applications, an extension cord with a wireless energy capture device may be thrown on the ground or placed near the solar unit. The capture extension cord can be completely sealed from the elements and electrically isolated, so that it may be used in any indoor or outdoor environment.

With wireless power transfer no wires or external connections may be necessary and the PV solar panels can be completely weather sealed. Significantly improved reliability and lifetime of electrical components in the solar PV power generation and transmission circuitry can be expected since the weather-sealed enclosures can protect components from UV radiation, humidity, weather, and the like. With wireless power transfer and weather-sealed enclosures it may be possible to use less expensive components since they will no longer be directly exposed to external factors and weather elements and it may reduce the cost of PV panels.

Power transfer between the PV panels and the capture resonators inside a building or a vehicle may be bidirectional. Energy may be transmitted from the house grid to the PV panels to provide power when the panels do not have enough energy to perform certain tasks such. Reverse power flow can be used to melt snow from the panels, or power motors that will position the panels in a more favorable positions with respect to the sun energy. Once the snow is melted or the panels are repositioned and the PV panels can generate their own energy the direction of power transfer can be returned to normal delivering power from the PV panels to buildings, vehicles, or devices.

PV panels with wireless power transfer may include auto-tuning on installation to ensure maximum and efficient power transfer to the wireless collector. Variations in roofing materials or variations in distances between the PV panels and the wireless power collector in different installations may affect the performance or perturb the properties of the resonators of the wireless power transfer. To reduce the installation complexity the wireless power transfer components may include a tuning capability to automatically adjust their operating point to compensate for any effects due to materials or distance. Frequency, impedance, capacitance, inductance, duty cycle, voltage levels and the like may be adjusted to ensure efficient and safe power transfer The systems and methods described herein may be used to provide a wireless power zone on a temporary basis or in extension of traditional electrical outlets to wireless power zones, such as through the use of a wireless power extension cord. For example, a wireless power extension cord may be configured as a plug for connecting into a traditional power outlet, a long wire such as in a traditional power extension cord, and a resonant source coil on the other end (e.g. in place of, or in addition to, the traditional socket end of the extension The wireless extension cord may also be configured where there are source resonators at a plurality of locations along the wireless extension cord. This configuration may then replace any traditional extension cord where there are wireless power configured devices, such as providing wireless power to a location where there is no convenient power outlet (e.g. a location in the living room where there's no outlet), for temporary wireless power where there is no wired power infrastructure (e.g. a construction site), out into the yard where there are no outlets (e.g. for parties or for yard grooming equipment that is wirelessly powered to decrease the chances of cutting the traditional electrical cord), and the like. The wireless extension cord may also be used as a drop within a wall or structure to provide wireless power zones within the vicinity of the drop. For example, a wireless extension cord could be run within a wall of a new or renovated room to provide wireless power zones without the need for the installation of traditional electrical wiring and outlets.

The systems and methods described herein may be utilized to provide power between moving parts or rotating assemblies of a vehicle, a robot, a mechanical device, a wind turbine, or any other type of rotating device or structure with moving parts such as robot arms, construction vehicles, movable platforms and the like. Traditionally, power in such systems may have been provided by slip rings or by rotary joints for example. Using wireless power transfer as described herein, the design simplicity, reliability and longevity of these devices may be significantly improved because power can be transferred over a range of distances without any physical connections or contact points that may wear down or out with time. In particular, the preferred coaxial and parallel alignment of the source and device coils may provide wireless power transmission that is not severely modulated by the relative rotational motion of the two coils.

The systems and methods described herein may be utilized to extend power needs beyond the reach of a single source resonator by providing a series of source-device-source-device resonators. For instance, suppose an existing detached garage has no electrical power and the owner now wants to install a new power service. However, the owner may not want to run wires all over the garage, or have to break into the walls to wire electrical outlets throughout the structure. In this instance, the owner may elect to connect a source resonator to the new power service, enabling wireless power to be supplied to device resonator outlets throughout the back of the garage. The owner may then install a device-source 'relay' to supply wireless power to device resonator outlets in the front of the garage. That is, the power relay may now receive wireless power from the primary source resonator, and then supply available power to a second source resonator to supply power to a second set of device resonators in the front of the garage. This configuration may be repeated again and again to extend the effective range of the supplied wireless power.

Multiple resonators may be used to extend power needs around an energy blocking material. For instance, it may be desirable to integrate a source resonator into a computer or computer monitor such that the resonator may power devices placed around and especially in front of the monitor or computer such as keyboards, computer mice, telephones, and the like. Due to aesthetics, space constraints, and the like an energy source that may be used for the source resonator may only be located or connected to in the back of the monitor or computer. In many designs of computer or monitors metal components and metal containing circuits are used in the design and packaging which may limit and prevent power transfer from source resonator in the back of the monitor or computer to the front of the monitor or computer. An additional repeater resonator may be integrated into the base or pedestal of the monitor or computer that couples to the source resonator in the back of the monitor or computer and allows power transfer to the space in front of the monitor or computer. The intermediate resonator integrated into the base or pedestal of the monitor or computer does not require an additional power source, it captures power from the source resonator and transfers power to the front around the blocking or power shielding metal components of the monitor or computer.

The systems and methods described herein may be built-into, placed on, hung from, embedded into, integrated into, and the like, the structural portions of a space, such as a vehicle, office, home, room, building, outdoor structure, road infrastructure, and the like. For instance, one or more sources may be built into, placed on, hung from, embedded or integrated into a wall, a ceiling or ceiling panel, a floor, a divider, a doorway, a stairwell, a compartment, a road surface, a sidewalk, a ramp, a fence, an exterior structure, and the like. One or more sources may be built into an entity within or around a structure, for instance a bed, a desk, a chair, a rug, a mirror, a clock, a display, a television, an electronic device, a counter, a table, a piece of furniture, a piece of artwork, an enclosure, a compartment, a ceiling panel, a floor or door panel, a dashboard, a trunk, a wheel well, a post, a beam, a support or any like entity. For example, a source resonator may be integrated into the dashboard of a user's car so that any device that is equipped with or connected to a device resonator may be supplied with power from the dashboard source resonator. In this way, devices brought into or integrated into the car may be constantly charged or powered while in the car.

The systems and methods described herein may provide power through the walls of vehicles, such as boats, cars, trucks, busses, trains, planes, satellites and the like. For instance, a user may not want to drill through the wall of the vehicle in order to provide power to an electric device on the outside of the vehicle. A source resonator may be placed inside the vehicle and a device resonator may be placed outside the vehicle (e.g. on the opposite side of a window, wall or structure). In this way the user may achieve greater flexibility in optimizing the placement, positioning and attachment of the external device to the vehicle, (such as without regard to supplying or routing electrical connections to the device). In addition, with the electrical power supplied wirelessly, the external device may be sealed such that it is water tight, making it safe if the electric device is exposed to weather (e.g. rain), or even submerged under water. Similar techniques may be employed in a variety of applications, such as in charging or powering hybrid vehicles, navigation and communications equipment, construction equipment, remote controlled or robotic equipment and the like, where electrical risks exist because of exposed conductors. The systems and methods described herein may provide power through the walls of vacuum chambers or other enclosed spaces such as those used in semiconductor growth and processing, material coating systems, aquariums, hazardous materials handling systems and the like. Power may be provided to translation stages, robotic arms, rotating stages, manipulation and collection devices, cleaning devices and the like.

The systems and methods described herein may provide wireless power to a kitchen environment, such as to counter-top appliances, including mixers, coffee makers, toasters, toaster ovens, grills, griddles, electric skillets, electric pots, electric woks, waffle makers, blenders, food processors, crock pots, warming trays, induction cooktops, lights, computers, displays, and the like. This technology may improve the mobility and/or positioning flexibility of devices, reduce the number of power cords stored on and strewn across the counter-top, improve the washability of the devices, and the like. For example, an electric skillet may traditionally have separate portions, such as one that is submersible for washing and one that is not submersible because it includes an external electrical connection (e.g. a cord or a socket for a removable cord). However, with a device resonator integrated into the unit, all electrical connections may be sealed, and so the entire device may now be submersed for cleaning. In addition, the absence of an external cord may eliminate the need for an available electrical wall outlet, and there is no longer a need for a power cord to be placed across the counter or for the location of the electric griddle to be limited to the location of an available electrical wall outlet.

The systems and methods described herein may provide continuous power/charging to devices equipped with a device resonator because the device doesn't leave the proximity of a source resonator, such as fixed electrical devices, personal computers, intercom systems, security systems, household robots, lighting, remote control units, televisions, cordless phones, and the like. For example, a household robot (e.g. ROOMBA) could be powered/charged via wireless power, and thus work arbitrarily long without recharging. In this way, the power supply design for the household robot may be changed to take advantage of this continuous source of wireless power, such as to design the robot to only use power from the source resonator without the need for batteries, use power from the source resonator to recharge the robot's batteries, use the power from the source resonator to trickle charge the robot's batteries, use the power from the source resonator to charge a capacitive energy storage unit, and the like. Similar optimizations of the power supplies and power circuits may be enabled, designed, and realized, for any and all of the devices disclosed herein.

The systems and methods described herein may be able to provide wireless power to electrically heated blankets, heating pads/patches, and the like. These electrically heated devices may find a variety of indoor and outdoor uses. For example, hand and foot warmers supplied to outdoor workers such as guards, policemen, construction workers and the like might be remotely powered from a source resonator associated with or built into a nearby vehicle, building, utility pole, traffic light, portable power unit, and the like.

The systems and methods described herein may be used to power a portable information device that contains a device resonator and that may be powered up when the information device is near an information source containing a source resonator. For instance, the information device may be a card (e.g. credit card, smart card, electronic card, and the like) carried in a user's pocket, wallet, purse, vehicle, bike, and the like. The portable information device may be powered up when it is in the vicinity of an information source that then transmits information to the portable information device that may contain electronic logic, electronic processors, memory, a display, an LCD display, LEDs, RFID tags, and the like. For example, the portable information device may be a credit card with a display that "turns on" when it is near an information source, and provide the user with some information such as, "You just received a coupon for 50% off your next Coca Cola purchase". The information device may store information such as coupon or discount information that could be used on subsequent purchases. The portable information device may be programmed by the user to contain tasks, calendar appointments, to-do lists, alarms and reminders, and the like. The information device may receive up-to-date price information and inform the user of the location and price of previously selected or identified items.

The systems and methods described herein may provide wireless power transmission to directly power or recharge the batteries in sensors, such as environmental sensors, security sensors, agriculture sensors, appliance sensors, food spoilage sensors, power sensors, and the like, which may be mounted internal to a structure, external to a structure, buried underground, installed in walls, and the like. For example, this capability may replace the need to dig out old sensors to physically replace the battery, or to bury a new sensor because the old sensor is out of power and no longer operational. These sensors may be charged up periodically through the use of a portable sensor source resonator charging unit. For instance, a truck carrying a source resonator equipped power source, say providing ~kW of power, may provide enough power to a ~mW sensor in a few minutes to extend the duration of operation of the sensor for more than a year. Sensors may also be directly powered, such as powering sensors that are in places where it is difficult to connect to them with a wire but they are still within the vicinity of a source resonator, such as devices outside of a house (security camera), on the other side of a wall, on an electric lock on a door, and the like. In another example, sensors that may need to be otherwise supplied with a wired power connection may be powered through the systems and methods described herein. For example, a ground fault interrupter breaker combines residual current and over-current protection in one device for installation into a service panel. However, the sensor traditionally has to be independently wired for power, and this may complicate the installation. However, with the systems and methods described herein the sensor may be powered with a device resonator, where a single source resonator is provided within the service panel, thus simplifying the installation and wiring configuration within the service panel. In addition, the single source resonator may power device resonators mounted on either side of the source resonator mounted within the service panel, throughout the service panel, to additional nearby service panels, and the like. The systems and methods described herein may be employed to provide wireless power to any electrical component associated with electrical panels, electrical rooms, power distribution and the like, such as in electric switchboards, distribution boards, circuit breakers, transformers, backup batteries, fire alarm control panels, and the like. Through the use of the systems and methods described herein, it may be easier to install, maintain, and modify electrical distribution and protection components and system installations.

In another example, sensors that are powered by batteries may run continuously, without the need to change the batteries, because wireless power may be supplied to periodically or continuously recharge or trickle charge the battery. In such applications, even low levels of power may adequately recharge or maintain the charge in batteries, significantly extending their lifetime and usefulness. In some cases, the battery life may be extended to be longer than the lifetime of the device it is powering, making it essentially a battery that "lasts forever".

The systems and methods described herein may be used for charging implanted medical device batteries, such as in an artificial heart, pacemaker, heart pump, insulin pump, implanted coils for nerve or acupressure/acupuncture point stimulation, and the like. For instance, it may not be convenient or safe to have wires sticking out of a patient because the wires may be a constant source of possible infection and may generally be very unpleasant for the patient. The systems and methods described herein may also be used to charge or power medical devices in or on a patient from an external source, such as from a bed or a hospital wall or ceiling with a source resonator. Such medical devices may be easier to attach, read, use and monitor the patient. The systems and methods described herein may ease the need for attaching wires to the patient and the patient's bed or bedside, making it more convenient for the patient to move around and get up out of bed without the risk of inadvertently disconnecting a medical device. This may, for example, be usefully employed with patients that have multiple sensors monitoring them, such as for measuring pulse, blood pressure, glucose, and the like. For medical and monitoring devices that utilize batteries, the batteries may need to be replaced quite often, perhaps multiple times a week. This may present risks associated with people forgetting to replace batteries, not noticing that the devices or monitors are not working because the batteries have died, infection associated with improper cleaning of the battery covers and compartments, and the like.

The systems and methods described herein may reduce the risk and complexity of medical device implantation procedures. Today many implantable medical devices such as ventricular assist devices, pacemakers, defibrillators and the like, require surgical implantation due to their device form factor, which is heavily influenced by the volume and shape of the long-life battery that is integrated in the device. In one aspect, there is described herein a non-invasive method of recharging the batteries so that the battery size may be dramatically reduced, and the entire device may be implanted, such as via a catheter. A catheter implantable device may include an integrated capture or device coil. A catheter implantable capture or device coil may be designed so that it may be wired internally, such as after implantation. The capture or device coil may be deployed via a catheter as a rolled up flexible coil (e.g. rolled up like two scrolls, easily unrolled internally with a simple spreader mechanism). The power source coil may be worn in a vest or article of clothing that is tailored to fit in such a way that places the source in proper position, may be placed in a chair cushion or bed cushion, may be integrated into a bed or piece of furniture, and the like.

The systems and methods described herein may enable patients to have a 'sensor vest', sensor patch, and the like, that may include at least one of a plurality of medical sensors and a device resonator that may be powered or charged when it is in the vicinity of a source resonator. Traditionally, this type of medical monitoring facility may have required batteries, thus making the vest, patch, and the like, heavy, and potentially impractical. But using the principles disclosed herein, no batteries (or a lighter rechargeable battery) may be required, thus making such a device more convenient and practical, especially in the case where such a medical device could be held in place without straps, such as by adhesive, in the absence of batteries or with substantially lighter batteries. A medical facility may be able to read the sensor data remotely with the aim of anticipating (e.g. a few minutes ahead of) a stroke, a heart-attack, or the like. When the vest is used by a person in a location remote from the medical facility, such as in their home, the vest may then be integrated with a cell-phone or communications device to call an ambulance in case of an accident or a medical event. The systems and methods described herein may be of particular value in the instance when the vest is to be used by an elderly person, where traditional non-wireless recharging practices (e.g. replacing batteries, plugging in at night, and the like) may not be followed as required. The systems and methods described herein may also be used for charging devices that are used by or that aid handicapped or disabled people who may have difficulty replacing or recharging batteries, or reliably supplying power to devices they enjoy or rely on.

The systems and methods described herein may be used for the charging and powering of artificial limbs. Artificial limbs have become very capable in terms of replacing the functionality of original limbs, such as arms, legs, hands and feet. However, an electrically powered artificial limb may require substantial power, (such as 10-20W) which may translate into a substantial battery. In that case, the amputee may be left with a choice between a light battery that doesn't last very long, and a heavy battery that lasts much longer, but is more difficult to 'carry' around. The systems and methods described herein may enable the artificial limb to be powered with a device resonator, where the source resonator is either carried by the user and attached to a part of the body that may more easily support the weight (such as on a belt around the waist, for example) or located in an external location where the user will spend an adequate amount of time to keep the device charged or powered, such as at their desk, in their car, in their bed, and the like.

The systems and methods described herein may be used for charging and powering of electrically powered exo-skeletons, such as those used in industrial and military applications, and for elderly/weak/sick people. An electrically powered exo-skeleton may provide up to a 10-to-20 times increase in "strength" to a person, enabling the person to perform physically strenuous tasks repeatedly without much fatigue. However, exo-skeletons may require more than 100 W of power under certain use scenarios, so battery powered operation may be limited to 30 minutes or less. The delivery of wireless power as described herein may provide a user of an exo-skeleton with a continuous supply of power both for powering the structural movements of the exo-skeleton and for powering various monitors and sensors distributed throughout the structure. For instance, an exo-skeleton with an embedded device resonator(s) may be supplied with power from a local source resonator. For an industrial exo-skeleton, the source resonator may be placed in the walls of the facility. For a military exo-skeleton, the source resonator may be carried by an armored vehicle. For an exo-skeleton employed to assist a caretaker of the elderly, the source resonator(s) may be installed or placed in or the room(s) of a person's home.

The systems and methods described herein may be used for the powering/charging of portable medical equipment, such as oxygen systems, ventilators, defibrillators, medication pumps, monitors, and equipment in ambulances or mobile medical units, and the like. Being able to transport a patient from an accident scene to the hospital, or to move patients in their beds to other rooms or areas, and bring all the equipment that is attached with them and have it powered the whole time offers great benefits to the patients' health and eventual well-being. Certainly one can understand the risks and problems caused by medical devices that stop working because their battery dies or because they must be unplugged while a patient is transported or moved in any way. For example, an emergency medical team on the scene of an automotive accident might need to utilize portable medical equipment in the emergency care of patients in the field. Such portable medical equipment must be properly maintained so that there is sufficient battery life to power the equipment for the duration of the emergency. However, it is too often the case that the equipment is not properly maintained so that batteries are not fully charged and in some cases, necessary equipment is not available to the first responders. The systems and methods described herein may provide for wireless power to portable medical equipment (and associated sensor inputs on the patient) in such a way that the charging and maintaining of batteries and power packs is provided automatically and without human intervention. Such a system also benefits from the improved mobility of a patient unencumbered by a variety of power cords attached to the many medical monitors and devices used in their treatment.

The systems and methods described herein may be used to for the powering/charging of personal hearing aids. Personal hearing aids need to be small and light to fit into or around the ear of a person. The size and weight restrictions limit the size of batteries that can be used. Likewise, the size and weight restrictions of the device make battery replacement difficult due to the delicacy of the components. The dimensions of the devices and hygiene concerns make it difficult to integrate additional charging ports to allow recharging of the batteries. The systems and methods described herein may be integrated into the hearing aid and may reduce the size of the necessary batteries which may allow even smaller hearing aids. Using the principles disclosed herein, the batteries of the hearing aid may be recharged without requiring external connections or charging ports. Charging and device circuitry and a small rechargeable battery may be integrated into a form factor of a conventional hearing aid battery allowing retrofit into existing hearing aids. The hearing aid may be recharged while it is used and worn by a person. The energy source may be integrated into a pad or a cup allowing recharging when the hearing is placed on such a structure. The charging source may be integrated into a hearing aid dryer box allowing wireless recharging while the hearing aid is drying or being sterilized. The source and device resonator may be used to also heat the device reducing or eliminating the need for an additional heating element. Portable charging cases powered by batteries or AC adaptors may be used as storage and charging stations.

The source resonator for the medical systems described above may be in the main body of some or all of the medical equipment, with device resonators on the patient's sensors and devices; the source resonator may be in the ambulance with device resonators on the patient's sensors and the main body of some or all of the equipment; a primary source resonator may be in the ambulance for transferring wireless power to a device resonator on the medical equipment while the medical equipment is in the ambulance and a second source resonator is in the main body of the medical equipment and a second device resonator on the patient sensors when the equipment is away from the ambulance; and the like. The systems and methods described herein may significantly improve the ease with which medical personnel are able to transport patients from one location to another, where power wires and the need to replace or manually charge associated batteries may now be reduced.

The systems and methods described herein may be used for the charging of devices inside a military vehicle or facility, such as a tank, armored carrier, mobile shelter, and the like. For instance, when soldiers come back into a vehicle after "action" or a mission, they may typically start charging their electronic devices. If their electronic devices were equipped with device resonators, and there was a source resonator inside the vehicle, (e.g. integrated in the seats or on the ceiling of the vehicle), their devices would start charging immediately. In fact, the same vehicle could provide power to soldiers/robots (e.g. packbot from iRobot) standing outside or walking beside the vehicle. This capability may be useful in minimizing accidental battery-swapping with someone else (this may be a significant issue, as soldiers tend to trust only their own batteries); in enabling quicker exits from a vehicle under attack; in powering or charging laptops or other electronic devices inside a tank, as too many wires inside the tank may present a hazard in terms of reduced ability to move around fast in case of "trouble" and/or decreased visibility; and the like. The systems and methods described herein may provide a significant improvement in association with powering portable power equipment in a military environment.

The systems and methods described herein may provide wireless powering or charging capabilities to mobile vehicles such as golf carts or other types of carts, all-terrain vehicles, electric bikes, scooters, cars, mowers, bobcats and other vehicles typically used for construction and landscaping and the like. The systems and methods described herein may provide wireless powering or charging capabilities to miniature mobile vehicles, such as mini-helicopters, airborne drones, remote control planes, remote control boats, remote controlled or robotic rovers, remote controlled or robotic lawn mowers or equipment, bomb detection robots, and the like. For instance, mini-helicopter flying above a military vehicle to increase its field of view can fly for a few minutes on standard batteries. If these mini-helicopters were fitted with a device resonator, and the control vehicle had a source resonator, the mini-helicopter might be able to fly indefinitely. The systems and methods described herein may provide an effective alternative to recharging or replacing the batteries for use in miniature mobile vehicles. In addition, the systems and methods described herein may provide power/charging to even smaller devices, such as microelectromechanical systems (MEMS), nano-robots, nano devices, and the like. In addition, the systems and methods described herein may be implemented by installing a source device in a mobile vehicle or flying device to enable it to serve as an in-field or in-flight re-charger, that may position itself autonomously in proximity to a mobile vehicle that is equipped with a device resonator.

The systems and methods described herein may be used to provide power networks for temporary facilities, such as military camps, oil drilling setups, remote filming locations, and the like, where electrical power is required, such as for power generators, and where power cables are typically run around the temporary facility. There are many instances when it is necessary to set up temporary facilities that require power. The systems and methods described herein may enable a more efficient way to rapidly set up and tear down these facilities, and may reduce the number of wires that must be run throughout the faculties to supply power. For instance, when Special Forces move into an area, they may erect tents and drag many wires around the camp to provide the required electricity. Instead, the systems and methods described herein may enable an army vehicle, outfitted with a power supply and a source resonator, to park in the center of the camp, and provide all the power to nearby tents where the device resonator may be integrated into the tents, or some other piece of equipment associated with each tent or area. A series of source-device-source-device resonators may be used to extend the power to tents that are farther away. That is, the tents closest to the vehicle could then provide power to tents behind them. The systems and methods described herein may provide a significant improvement to the efficiency with which temporary installations may be set up and torn down, thus improving the mobility of the associated facility.

The systems and methods described herein may be used in vehicles, such as for replacing wires, installing new equipment, powering devices brought into the vehicle, charging the battery of a vehicle (e.g. for a traditional gas powered engine, for a hybrid car, for an electric car, and the like), powering devices mounted to the interior or exterior of the vehicle, powering devices in the vicinity of the vehicle, and the like. For example, the systems and methods described herein may be used to replace wires such as those are used to power lights, fans and sensors distributed throughout a vehicle. As an example, a typical car may have 50 kg of wires associated with it, and the use of the systems and methods described herein may enable the elimination of a substantial amount of this wiring. The performance of larger and more weight sensitive vehicles such as airplanes or satellites could benefit greatly from having the number of cables that must be run throughout the vehicle reduced. The systems and methods described herein may allow the accommodation of removable or supplemental portions of a vehicle with electric and electrical devices without the need for electrical harnessing. For example, a motorcycle may have removable side boxes that act as a temporary trunk space for when the cyclist is going on a long trip. These side boxes may have exterior lights, interior lights, sensors, auto equipment, and the like, and if not for being equipped with the systems and methods described herein might require electrical connections and harnessing.

An in-vehicle wireless power transmission system may charge or power one or more mobile devices used in a car: mobile phone handset, Bluetooth headset, blue tooth hands free speaker phone, GPS, MP3 player, wireless audio transceiver for streaming MP3 audio through car stereo via FM, Bluetooth, and the like. The in vehicle wireless power source may utilize source resonators that are arranged in any of several possible configurations including charging pad on dash, charging pad otherwise mounted on floor, or between seat and center console, charging "cup" or receptacle that fits in cup holder or on dash, and the like.

The wireless power transmission source may utilize a rechargeable battery system such that said supply battery gets charged whenever the vehicle power is on such that when the vehicle is turned off the wireless supply can draw power from the supply battery and can continue to wirelessly charge or power mobile devices that are still in the car.

The plug-in electric cars, hybrid cars, and the like, of the future need to be charged, and the user may need to plug in to an electrical supply when they get home or to a charging station. Based on a single over-night recharging, the user may be able to drive up to 50 miles the next day. Therefore, in the instance of a hybrid car, if a person drives less than 50 miles on most days, they will be driving mostly on electricity. However, it would be beneficial if they didn't have to remember to plug in the car at night. That is, it would be nice to simply drive into a garage, and have the car take care of its own charging. To this end, a source resonator may be built into the garage floor and/or garage side-wall, and the device resonator may be built into the bottom (or side) of the car. Even a few kW transfer may be sufficient to recharge the car over-night. The in-vehicle device resonator may measure magnetic field properties to provide feedback to assist in vehicle (or any similar device) alignment to a stationary resonating source. The vehicle may use this positional feedback to automatically position itself to achieve optimum alignment, thus optimum power transmission efficiency. Another method may be to use the positional feedback to help the human operator to properly position the vehicle or device, such as by making LED's light up, providing noises, and the like when it is well positioned. In such cases where the amount of power being transmitted could present a safety hazard to a person or animal that intrudes into the active field volume, the source or receiver device may be equipped with an active light curtain or some other external device capable of sensing intrusion into the active field volume, and capable of shutting off the source device and alert a human operator. In addition, the source device may be equipped with self-sensing capability such that it may detect that its expected power transmission rate has been interrupted by an intruding element, and in such case shut off the source device and alert a human operator. Physical or mechanical structures such as hinged doors or inflatable bladder shields may be incorporated as a physical barrier to prevent unwanted intrusions. Sensors such as optical, magnetic, capacitive, inductive, and the like may also be used to detect foreign structures or interference between the source and device resonators. The shape of the source resonator may be shaped such to prevent water or debris accumulation. The source resonator may be placed in a cone shaped enclosure or may have an enclosure with an angled top to allow water and debris to roll off. The source of the system may use battery power of the vehicle or its own battery power to transmit its presence to the source to initiate power transmission.

The source resonator may be mounted on an embedded or hanging post, on a wall, on a stand, and the like for coupling to a device resonator mounted on the bumper, hood, body panel, and the like, of an electric vehicle. The source resonator may be enclosed or embedded into a flexible enclosure such as a pillow, a pad, a bellows, a spring loaded enclosure and the like so that the electric vehicle may make contact with the structure containing the source coil without damaging the car in any way. The structure containing the source may prevent objects from getting between the source and device resonators. Because the wireless power transfer may be relatively insensitive to misalignments between the source and device coils, a variety of flexible source structures and parking procedures may be appropriate for this application.

The systems and methods described herein may be used to trickle charge batteries of electric, hybrid or combustion engine vehicles. Vehicles may require small amounts of power to maintain or replenish battery power. The power may be transferred wirelessly from a source to a device resonator that may be incorporated into the front grill, roof, bottom, or other parts of the vehicle. The device resonator may be designed to fit into a shape of a logo on the front of a vehicle or around the grill as not to obstruct air flow through the radiator. The device or source resonator may have additional modes of operation that allow the resonator to be used as a heating element which can be used to melt of snow or ice from the vehicle.

An electric vehicle or hybrid vehicle may require multiple device resonators, such as to increase the ease with which the vehicle may come in proximity with a source resonator for charging (i.e. the greater the number and varied position of device resonators are, the greater the chances that the vehicle can pull in and interface with a diversity of charging stations), to increase the amount of power that can be delivered in a period of time (e.g. additional device resonators may be required to keep the local heating due to charging currents to acceptable levels), to aid in automatic parking/docking the vehicle with the charging station, and the like. For example, the vehicle may have multiple resonators (or a single resonator) with a feedback system that provides guidance to either the driver or an automated parking/docking facility in the parking of the vehicle for optimized charging conditions (i.e., the optimum positioning of the vehicle's device resonator to the charging station's source resonator may provide greater power transfer efficiency). An automated parking/docking facility may allow for the automatic parking of the vehicle based on how well the vehicle is coupled.

The power transmission system may be used to power devices and peripherals of a vehicle. Power to peripherals may be provided while a vehicle is charging, or while not charging, or power may be delivered to conventional vehicles that do not need charging. For example, power may be transferred wirelessly to conventional non-electric cars to power air conditioning, refrigeration units, heaters, lights, and the like while parked to avoid running the engine which may be important to avoid exhaust build up in garage parking lots or loading docks. Power may for example be wirelessly transferred to a bus while it is parked to allow powering of lights, peripherals, passenger devices, and the like avoiding the use of onboard engines or power sources. Power may be wirelessly transferred to an airplane while parked on the tarmac or in a hanger to power instrumentation, climate control, de-icing equipment, and the like without having to use onboard engines or power sources.

Wireless power transmission on vehicles may be used to enable the concept of Vehicle to Grid (V2G). Vehicle to grid is based on utilizing electric vehicles and plug-in hybrid electric vehicles (PHEV) as distributed energy storage devices, charged at night when the electric grid is underutilized, and available to discharge back into the grid during episodes of peak demand that occur during the day. The wireless power transmission system on a vehicle and the respective infrastructure may be implemented in such a way as to enable bidirectional energy flow—so that energy can flow back into the grid from the vehicle—without requiring a plug in connection. Vast fleets of vehicles, parked at factories, offices, parking lots, can be viewed as "peaking power capacity" by the smart grid. Wireless power transmission on vehicles can make such a V2G vision a reality. By simplifying the process of connecting a vehicle to the grid, (i.e. by simply parking it in a wireless charging enabled parking spot), it becomes much more likely that a certain number of vehicles will be "dispatchable" when the grid needs to tap their power. Without wireless charging, electric and PHEV owners will likely charge their vehicles at home, and park them at work in conventional parking spots. Who will want to plug their vehicle in at work, if they do not need charging? With wireless charging systems capable of handling 3 kW, 100,000 vehicles can provide 300 Megawatts back to the grid—using energy generated the night before by cost effective base load generating capacity. It is the streamlined ergonomics of the cordless self charging PHEV and electric vehicles that make it a viable V2G energy source.

The systems and methods described herein may be used to power sensors on the vehicle, such as sensors in tires to measure air-pressure, or to run peripheral devices in the vehicle, such as cell phones, GPS devices, navigation devices, game players, audio or video players, DVD players, wireless routers, communications equipment, anti-theft devices, radar devices, and the like. For example, source resonators described herein may be built into the main compartment of the car in order to supply power to a variety of devices located both inside and outside of the main compartment of the car. Where the vehicle is a motorcycle or the like, devices described herein may be integrated into the body of the motorcycle, such as under the seat, and device resonators may be provided in a user's helmet, such as for communications, entertainment, signaling, and the like, or device resonators may be provided in the user's jacket, such as for displaying signals to other drivers for safety, and the like.

The systems and methods described herein may be used in conjunction with transportation infrastructure, such as roads, trains, planes, shipping, and the like. For example, source resonators may be built into roads, parking lots, rail-lines, and the like. Source resonators may be built into traffic lights, signs, and the like. For example, with source resonators embedded into a road, and device resonators built into vehicles, the vehicles may be provided power as they drive along the road or as they are parked in lots or on the side of the road. The systems and methods described herein may provide an effective way for electrical systems in vehicles to be powered and/or charged while the vehicle traverses a road network, or a portion of a road network. In this way, the systems and methods described herein may contribute to the powering/charging of autonomous vehicles, automatic guided vehicles, and the like. The systems and methods described herein may provide power to vehicles in places where they typically idle or stop, such as in the vicinity of traffic lights or signs, on highway ramps, or in parking lots.

The systems and methods described herein may be used in an industrial environment, such as inside a factory for powering machinery, powering/charging robots, powering and/or charging wireless sensors on robot arms, powering/charging tools and the like. For example, using the systems and methods described herein to supply power to devices on the arms of robots may help eliminate direct wire connections across the joints of the robot arm. In this way, the wearing out of such direct wire connections may be reduced, and the reliability of the robot increased. In this case, the device resonator may be out on the arm of the robot, and the source resonator may be at the base of the robot, in a central location near the robot, integrated into the industrial facility in which the robot is providing service, and the like. The use of the systems and methods described herein may help eliminate wiring otherwise associated with power distribution within the industrial facility, and thus benefit the overall reliability of the facility.

The systems and methods described herein may be used for underground applications, such as drilling, mining, digging, and the like. For example, electrical components and sensors associated with drilling or excavation may utilize the systems and methods described herein to eliminate cabling associated with a digging mechanism, a drilling bit, and the like, thus eliminating or minimizing cabling near the excavation point. In another example, the systems and methods described herein may be used to provide power to excavation equipment in a mining application where the power requirements for the equipment may be high and the distances large, but where there are no people to be subjected to the associated required fields. For instance, the excavation area may have device resonator powered digging equipment that has high power requirements and may be digging relatively far from the source resonator. As a result the source resonator may need to provide high field intensities to satisfy these requirements, but personnel are far enough away to be outside these high intensity fields. This high power, no personnel, scenario may be applicable to a plurality of industrial applications.

The systems and methods described herein may also use the near-field non-radiative resonant scheme for information transfer rather than, or in addition to, power transfer. For instance, information being transferred by near-field non-radiative resonance techniques may not be susceptible to eavesdropping and so may provide an increased level of security compared to traditional wireless communication schemes. In addition, information being transferred by near-field non-radiative resonance techniques may not interfere with the EM radiative spectrum and so may not be a source of EM interference, thereby allowing communications in an extended frequency range and well within the limits set by any regulatory bodies. Communication services may be provided between remote, inaccessible or hard-to-reach places such as between remote sensors, between sections of a device or vehicle, in tunnels, caves and wells (e.g. oil wells, other drill sites) and between underwater or underground devices, and the like. Communications services may be provided in places where magnetic fields experience less loss than electric fields.

The systems and methods described herein may enable the simultaneous transmission of power and communication signals between sources and devices in wireless power transmission systems, or it may enable the transmission of power and communication signals during different time periods or at different frequencies. The performance characteristics of the resonator may be controllably varied to preferentially support or limit the efficiency or range of either energy or information transfer. The performance characteristics of the resonators may be controlled to improve the security by reducing the range of information transfer, for example. The performance characteristics of the resonators may be varied continuously, periodically, or according to a predetermined, computed or automatically adjusted algorithm. For example, the power and information transfer enabled by the systems and methods described herein may be provided in a time multiplexed or frequency multiplexed manner. A source and device may signal each other by tuning, changing, varying, dithering, and the like, the resonator impedance which may affect the reflected impedance of other resonators that can be detected. The information transferred as described herein may include information regarding device identification, device power requirements, handshaking protocols, and the like.

The source and device may sense, transmit, process and utilize position and location information on any other sources and/or devices in a power network. The source and device may capture or use information such as elevation, tilt, latitude and longitude, and the like from a variety of sensors and sources that may be built into the source and device or may be part of a component the source or device connect. The positioning and orientation information may include sources such as global positioning sensors (GPS), compasses, accelerometers, pressure sensors, atmospheric barometric sensors, positioning systems which use Wi-Fi or cellular network signals, and the like. The source and device may use the position and location information to find nearby wireless power transmission sources. A source may broadcast or communicate with a central station or database identifying its location. A device may obtain the source location information from the central station or database or from the local broadcast and guide a user or an operator to the source with the aid of visual, vibrational, or auditory signals. Sources and devices may be nodes in a power network, in a communications network, in a sensor network, in a navigational network, and the like or in kind of combined functionality network.

The position and location information may also be used to optimize or coordinate power delivery. Additional information about the relative position of a source and a device may be used to optimize magnetic field direction and resonator alignment. The orientation of a device and a source which may be obtained from accelerometers and magnetic sensors, and the like, for example, may be used to identify the orientation of resonators and the most favorable direction of a magnetic field such that the magnetic flux is not blocked by the device circuitry. With such information a source with the most favorable orientation, or a combination of sources, may be used. Likewise, position and orientation information may be used to move or provide feedback to a user or operator of a device to place a device in a favorable orientation or location to maximize power transmission efficiency, minimize losses, and the like.

The source and device may include power metering and measuring circuitry and capability. The power metering may be used to track how much power was delivered to a device or how much power was transferred by a source. The power metering and power usage information may be used in fee based power delivery arrangements for billing purposes. Power metering may be also be used to enable power delivery policies to ensure power is distributed to multiple devices according to specific criteria. For example, the power metering may be used to categorize devices based on the amount of power they received and priority in power delivery may be given to those having received the least power. Power metering may be used to provide tiered delivery services such as "guaranteed power" and "best effort power" which may be billed at separate rates. Power metering may be used to institute and enforce hierarchical power delivery structures and may enable priority devices to demand and receive-more power under certain circumstances or use scenarios.

Power metering may be used to optimize power delivery efficiency and minimize absorption and radiation losses. Information related to the power received by devices may be used by a source in conjunction with information about the power output of the source to identify unfavorable operating environments or frequencies. For example, a source may compare the amount of power which was received by the devices and the amount of power which it transmitted to determine if the transmission losses may be unusually or unacceptably large. Large transmission losses may be due to an unauthorized device receiving power from the source and the source and other devices may initiate frequency hopping of the resonance frequency or other defensive measures to prevent or deter unauthorized use. Large transmission losses may be due to absorption losses for example, and the device and source may tune to alternate resonance frequencies to minimize such losses. Large transmission losses may also indicate the presence of unwanted or unknown objects or materials and the source may turn down or off its power level until the unwanted or unknown object is removed or identified, at which point the source may resume powering remote devices.

The source and device may include authentication capability. Authentication may be used to ensure that only compatible sources and devices are able to transmit and receive power. Authentication may be used to ensure that only authentic devices that are of a specific manufacturer and not clones or devices and sources from other manufacturers, or only devices that are part of a specific subscription or plan, are able to receive power from a source. Authentication may be based on cryptographic request and respond protocols or it may be based on the unique signatures of perturbations of specific devices allowing them to be used and authenticated based on properties similar to physically unclonable functions. Authentication may be performed locally between each source and device with local communication or it may be used with third person authentication methods where the source and device authenticate with communications to a central authority. Authentication protocols may use position information to alert a local source or sources of a genuine device.

The source and device may use frequency hopping techniques to prevent unauthorized use of a wireless power source. The source may continuously adjust or change the resonant frequency of power delivery. The changes in frequency may be performed in a pseudorandom or predetermined manner that is known, reproducible, or communicated to authorized device but difficult to predict. The rate of frequency hopping and the number of various frequencies used may be large and frequent enough to ensure that unauthorized use is difficult or impractical. Frequency hopping may be implemented by tuning the impedance network, tuning any of the driving circuits, using a plurality of resonators tuned or tunable to multiple resonant frequencies, and the like.

The source may have a user notification capability to show the status of the source as to whether it is coupled to a device resonator and transmitting power, if it is in standby mode, or if the source resonator is detuned or perturbed by an external object. The notification capability may include visual, auditory, and vibrational methods. The notification may be as simple as three color lights, one for each state, and optionally a speaker to provide notification in case of an error in operation. Alternatively, the notification capability may involve an interactive display that shows the status of the source and optionally provides instructions on how to fix or solve any errors or problems identified.

As another example, wireless power transfer may be used to improve the safety of electronic explosive detonators. Explosive devices are detonated with an electronic detonator, electric detonator, or shock tube detonator. The electronic detonator utilizes stored electrical energy (usually in a capacitor) to activate the igniter charge, with a low energy trigger signal transmitted conductively or by radio. The electric detonator utilizes a high energy conductive trigger signal to provide both the signal and the energy required to activate the igniter charge. A shock tube sends a controlled explosion through a hollow tube coated with explosive from the generator to the igniter charge. There are safety issues associated with the electric and electronic detonators, as there are cases of stray electromagnetic energy causing unintended activation. Wireless power transfer via sharply resonant magnetic coupling can improve the safety of such systems.

Using the wireless power transfer methods disclosed herein, one can build an electronic detonation system that has no locally stored energy, thus reducing the risk of unintended activation. A wireless power source can be placed in proximity (within a few meters) of the detonator. The detonator can be equipped with a resonant capture coil. The activation energy can be transferred when the wireless power source has been triggered. The triggering of the wireless power source can be initiated by any number of mechanisms: radio, magnetic near field radio, conductive signaling, ultrasonics, laser light. Wireless power transfer based on resonant magnetic coupling also has the benefit of being able to transfer power through materials such as rock, soil, concrete, water, and other dense materials. The use of very high Q coils as receivers and sources, having very narrow band response and sharply tuned to proprietary frequencies, further ensure that the detonator circuits cannot capture stray EMI and activate unintentionally.

The resonator of a wirelessly powered device may be external, or outside of the device, and wired to the battery of the device. The battery of the device may be modified to include appropriate rectification and control circuitry to receive the alternating currents of the device resonator. This can enable configurations with larger external coils, such as might be built into a battery door of a keyboard or mouse, or digital still camera, or even larger coils that are attached to the device but wired back to the battery/converter with ribbon cable. The battery door can be modified to provide interconnection from the external coil to the battery/converter (which will need an exposed contact that can touch the battery door contacts.

The wireless power transfer system may be provided as a kit. The kit may comprise the core components necessary for wireless power transfer. The components may be configurable and adjustable and may be used to design, modify, adapt, test, evaluate, or build wireless power transfer systems with different orientations, configurations, power levels, and the like.

A wireless power transfer kit may be used for educational purposes and may contain certain components, modules, instructions and learning materials for experimenting with wireless power transfer. A wireless power transfer kit may be used for evaluation purposes by manufacturers or designers to test various configurations or capabilities. A wireless power transfer kit may be used by manufacturers and designers for integrating or incorporating wireless power into products or devices.

A wireless power transfer kit may comprise a wireless power source and a wireless power device. The source may comprise at least one high-Q source magnetic resonator. The source may further comprise an amplifier for energizing the magnetic resonator, as well as any power and control circuit, that have been described herein, for controlling, tuning, or energizing the magnetic resonators. The device may comprise at least one high-Q device magnetic resonator. The device may further comprise power and control circuits, that have been described herein, for controlling, tuning, or the device magnetic resonators.

A wireless power kit may include instructions for arranging, configuring, optimizing, adapting, and the like, the kit components for wireless power transfer. The instructions may teach how to adapt, use, build, or evaluate components of the system such as power sources, amplifiers, resonators, enclosures, support structures, and the like.

A wireless power transfer kit may have a plurality of different sources which may differ in their size, power capability, amplifiers, resonator types, operating distances, operating orientations, and the like. A wireless power transfer kit may have a plurality of different devices which may differ in their size, power capability, resonator types, operating distances, operating orientations, and the like. The different types of sources and devices may be interchangeable and compatible allowing evaluation of various combinations of amplifiers, resonator types, resonator sizes, operating distances, operating orientations, and the like.

A wireless power kit may allow the evaluation of characteristics including the inter-coil distance effects on energy transfer, energy transfer performance as a function of source and capture coil size, effects of relative orientation of source and capture coils on energy transfer, and the like.

The electrical components of the wireless power transfer kit may have a plurality of electrical contacts to enable measurement of operating parameters, using measurement equipment such as an oscilloscope, a multimeter, a power meter, a current meter, a voltage meter, a probe, and the like.

In some embodiments of the wireless power transfer kit, the source and the device may have current, power, or voltage limiting/monitoring circuitry which may be important for safety or regulatory concerns.

In one embodiment of the wireless power transfer kit, the kit may include a DC power supply, a power amplifier configured for generating an oscillating output of less than 100 MHz, source resonators of various sizes including resonators with dimensions of 15 cm by 15 cm by 3 mm and 30 cm by 30 cm by 3 mm, devices with resonators of various sizes including resonators with dimensions 5 cm by 5 cm by 3 mm, 10 cm by 10 cm by 3 mm, and 15 cm by 15 cm by 3 mm.

In embodiments, the present invention may provide for a wireless energy transfer kit comprising at least one source magnetic resonator for generating an oscillating magnetic field, at least one wireless device magnetic resonator for capturing oscillating magnetic fields, at least one power amplifier for energizing the at least one source magnetic resonator, and the like. The wireless energy transfer kit may include instructions for adapting components for wireless power transfer between the source magnetic resonators and the device magnetic resonators. The output voltage of the device magnetic resonators may be regulated not to exceed 20 volts DC. The output current of the device magnetic resonators may be regulated not to exceed 100 mA. The output of the device magnetic resonators may be regulated not to exceed 10 W of power. The power amplifier may be configured to generate an oscillating voltage signal of a frequency less than 100 MHz. The power amplifier may include a connector for coupling to the source magnetic resonators. A power supply may be provided where the power supply has a connector for connecting to the amplifier. The magnetic resonators may be high-Q magnetic resonators. The quality factor of the magnetic resonators may be at least 100. The magnetic resonators may include a conductor wrapped around a core of magnetic material. The magnetic resonators may include capacitively loaded conductor loops. The magnetic resonators may include capacitively loaded conductor loops wrapped around a core of magnetic material. At least one of the source magnetic resonators may have a size of approximately 15 cm by 15 cm by 3 mm, 30 cm by 30 cm by 3 mm, and the like. At least one of the device magnetic resonators may have a size of less than 30 cm by 30 cm by 3 mm, and the like.

In embodiments, the present invention may provide for a wireless energy transfer kit comprising a source for generating oscillating magnetic fields, a plurality of wireless energy capture devices for capturing oscillating magnetic fields generated by the source, and the like. The source may be a source magnetic resonator. The energy capture devices may be a device magnetic resonator. The source may be a source magnetic resonator. The source magnetic resonators and device magnetic resonators may be high-Q magnetic resonators. The quality factors of the source magnetic resonators and the device magnetic resonators may be at least 100. A power amplifier may be provided where the power amplifier may be configured to generate an oscillating voltage signal of a frequency less than 100 MHz. The wireless energy transfer kit may include instructions for adapting components for wireless power transfer between the source and energy capture devices. Tunable electrical components may be electrically coupled to the source magnetic resonators. The device may include tunable electrical components electrically coupled to the device magnetic resonators. The tunable electrical components of the source and the energy transfer devices may include adjustable capacitors. The tunable electrical components of the source and the energy transfer devices may include adjustable inductors.

While the invention has been described in connection with certain preferred embodiments, other embodiments will be understood by one of ordinary skill in the art and are intended to fall within the scope of this disclosure, which is to be interpreted in the broadest sense allowable by law.

All documents referenced herein are hereby incorporated by reference.

What is claimed is:

1. A method comprising:
    providing a wireless energy transfer kit comprising:
        a source comprising a source magnetic resonator for generating oscillating magnetic fields; and
        a plurality of wireless energy capture devices each comprising a device magnetic resonator for capturing oscillating magnetic fields generated by said source; and
    providing instructions for adapting components for wireless power transfer between said source and said plurality of energy capture devices.

2. The method of claim 1, wherein the source magnetic resonators and device magnetic resonators are high-Q magnetic resonators.

3. The method of claim 2, wherein the quality factors of said source magnetic resonators and said device magnetic resonators are at least 100.

4. The method of claim 3, wherein said wireless energy transfer kit further comprises a power amplifier wherein said power amplifier is configured to generate an oscillating voltage signal of a frequency less than 100 MHz.

5. The method of claim 1, wherein said source further comprises tunable electrical components electrically coupled to said source magnetic resonators.

6. The method of claim 5, wherein each of said plurality of wireless energy capture devices further comprises tunable electrical components electrically coupled to said device magnetic resonators.

7. The method of claim 6, wherein said tunable electrical components of the source and said energy transfer devices include adjustable capacitors.

8. The method of claim 6, wherein said tunable electrical components of the source and said energy capture devices include adjustable inductors.

* * * * *